US012146087B2

(12) United States Patent
Kato et al.

(10) Patent No.: US 12,146,087 B2
(45) Date of Patent: Nov. 19, 2024

(54) COMPOUND AND ORGANIC ELECTROLUMINESCENCE DEVICE

(71) Applicant: IDEMITSU KOSAN CO.,LTD., Tokyo (JP)

(72) Inventors: Tomoki Kato, Sodegaura (JP); Keita Seda, Sodegaura (JP); Ryota Takahashi, Sodegaura (JP); Hidetsugu Ikeda, Sodegaura (JP); Yuki Nakano, Sodegaura (JP); Thomas Schaefer, Liestal (CH); Peter Murer, Oberwil (CH); Carsten Rothe, Dresden (DE)

(73) Assignee: IDEMITSU KOSAN CO., LTD., Tokyo (JP)

( * ) Notice: Subject to any disclaimer, the term of this patent is extended or adjusted under 35 U.S.C. 154(b) by 430 days.

(21) Appl. No.: 16/958,054

(22) PCT Filed: Dec. 28, 2018

(86) PCT No.: PCT/JP2018/048602

§ 371 (c)(1),
(2) Date: Jun. 25, 2020

(87) PCT Pub. No.: WO2019/132040

PCT Pub. Date: Jul. 4, 2019

(65) Prior Publication Data

US 2021/0062078 A1 Mar. 4, 2021

(30) Foreign Application Priority Data

Dec. 28, 2017 (JP) ................................ 2017-253215

(51) Int. Cl.
*C09K 11/06* (2006.01)
*C07F 5/02* (2006.01)
(Continued)

(52) U.S. Cl.
CPC ................ *C09K 11/06* (2013.01); *C07F 5/02* (2013.01); *H10K 85/211* (2023.02);
(Continued)

(58) Field of Classification Search
None
See application file for complete search history.

(56) References Cited

U.S. PATENT DOCUMENTS 10,374,166 B2 8/2019 Hatakeyama et al.
10,763,441 B2 9/2020 Nakano et al.
(Continued)

FOREIGN PATENT DOCUMENTS

CN 107501311 A 12/2017
CN 108358905 A 8/2018
(Continued)

OTHER PUBLICATIONS

Escande et al., Chem. Commun., 2015, 51, 6257-6274. (Year: 2015).*
(Continued)

*Primary Examiner* — Dawn L Garrett
(74) *Attorney, Agent, or Firm* — Foley & Lardner LLP

(57) ABSTRACT

A compound represented by the following formula (1), wherein in the formula (1), at least one of $R_1$ to $R_8$ is a group represented by the following formula (2).
(Continued)

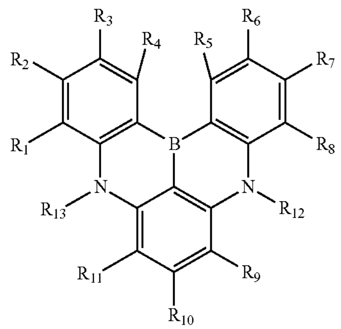

(1)

—$L_1$—HAr (2)

24 Claims, 1 Drawing Sheet

(51) Int. Cl.
*H10K 50/15* (2023.01)
*H10K 50/16* (2023.01)
*H10K 85/20* (2023.01)
*H10K 85/60* (2023.01)

(52) U.S. Cl.
CPC ..... *H10K 85/6574* (2023.02); *H10K 85/6576* (2023.02); *C09K 2211/1014* (2013.01); *C09K 2211/1055* (2013.01); *H10K 50/15* (2023.02); *H10K 50/16* (2023.02)

(56) References Cited

U.S. PATENT DOCUMENTS

| | | | | |
|---|---|---|---|---|
| 10,763,444 | B2 | 9/2020 | Nakano et al. | |
| 2015/0325800 | A1* | 11/2015 | Ito | H05B 33/20 548/440 |
| 2018/0094000 | A1* | 4/2018 | Hatakeyama | C09K 11/06 |
| 2018/0301629 | A1 | 10/2018 | Hatakeyama et al. | |
| 2019/0058124 | A1 | 2/2019 | Hatakeyama et al. | |
| 2019/0115538 | A1 | 4/2019 | Lim et al. | |
| 2019/0207112 | A1 | 7/2019 | Hatakeyama et al. | |
| 2019/0214579 | A1 | 7/2019 | Seda et al. | |
| 2019/0229277 | A1 | 7/2019 | Hatakeyama et al. | |
| 2019/0280209 | A1 | 9/2019 | Fujita | |
| 2019/0312207 | A1 | 10/2019 | Hatakeyama et al. | |
| 2019/0341571 | A1 | 11/2019 | Liaptsis et al. | |
| 2019/0372023 | A1 | 12/2019 | Hatakeyama et al. | |
| 2019/0378982 | A1 | 12/2019 | He et al. | |
| 2019/0393419 | A1 | 12/2019 | Hatakeyama et al. | |
| 2020/0020867 | A1 | 1/2020 | Lin et al. | |
| 2020/0028084 | A1 | 1/2020 | Song et al. | |
| 2020/0035921 | A1 | 1/2020 | Nakanotani et al. | |
| 2020/0035922 | A1 | 1/2020 | Ogiwara et al. | |
| 2020/0052212 | A1 | 2/2020 | Tasaki et al. | |
| 2020/0058874 | A1 | 2/2020 | Kim et al. | |
| 2020/0098991 | A1 | 3/2020 | Kim et al. | |
| 2020/0111962 | A1 | 4/2020 | Nakano et al. | |
| 2020/0144503 | A1 | 5/2020 | Hayano | |
| 2020/0144512 | A1 | 5/2020 | Lin et al. | |
| 2020/0176679 | A1 | 6/2020 | Jeong et al. | |
| 2020/0176680 | A1 | 6/2020 | Hatakeyama et al. | |
| 2020/0176684 | A1 | 6/2020 | Lee et al. | |
| 2020/0185632 | A1 | 6/2020 | Kim et al. | |
| 2020/0203610 | A1 | 6/2020 | Duan et al. | |
| 2020/0203617 | A1 | 6/2020 | Duan et al. | |
| 2020/0203651 | A1 | 6/2020 | Duan et al. | |
| 2020/0203652 | A1 | 6/2020 | Duan et al. | |
| 2020/0266350 | A1 | 8/2020 | Hatakeyama et al. | |
| 2021/0043841 | A1 | 2/2021 | Li et al. | |

FOREIGN PATENT DOCUMENTS

| | | | | |
|---|---|---|---|---|
| JP | 2018-043984 | A | 3/2018 | |
| KR | 2018046851 | A | 5/2018 | |
| KR | 1976556 | B1 | 5/2019 | |
| KR | 1990818 | B1 | 6/2019 | |
| KR | 2019138477 | A | 12/2019 | |
| KR | 2019139492 | A | 12/2019 | |
| WO | WO-2015/102118 | A1 | 7/2015 | |
| WO | WO-2016152418 | A1 * | 9/2016 | C07F 5/02 |
| WO | WO-2017/092508 | A1 | 6/2017 | |
| WO | WO-2017/188111 | A1 | 11/2017 | |
| WO | WO-2017/195669 | A1 | 11/2017 | |
| WO | WO-2018/095394 | A1 | 5/2018 | |
| WO | WO-2018/146894 | A1 | 8/2018 | |
| WO | WO-2018/181188 | A1 | 10/2018 | |
| WO | WO-2018/186374 | A1 | 10/2018 | |
| WO | WO-2018/186396 | A1 | 10/2018 | |
| WO | WO-2018/203666 | A1 | 11/2018 | |
| WO | WO-2018/216990 | A1 | 11/2018 | |
| WO | WO-2019/059611 | A1 | 3/2019 | |
| WO | WO-2019/120125 | A1 | 6/2019 | |
| WO | WO-2019/132028 | A1 | 7/2019 | |
| WO | WO-2019/163625 | A1 | 8/2019 | |
| WO | WO-2019/194298 | A1 | 10/2019 | |
| WO | WO-2019/197904 | A1 | 10/2019 | |
| WO | WO-2019/218968 | A1 | 11/2019 | |
| WO | WO-2019/218969 | A1 | 11/2019 | |
| WO | WO-2019/218971 | A1 | 11/2019 | |
| WO | WO-2019/221545 | A1 | 11/2019 | |
| WO | WO-2019/235475 | A1 | 12/2019 | |
| WO | WO-2019/240462 | A1 | 12/2019 | |
| WO | WO-2019/240464 | A1 | 12/2019 | |
| WO | WO-2020/022751 | A1 | 1/2020 | |
| WO | WO-2020/034805 | A1 | 2/2020 | |
| WO | WO-2020/036197 | A1 | 2/2020 | |
| WO | WO-2020/039930 | A1 | 2/2020 | |
| WO | WO-2020/040298 | A1 | 2/2020 | |
| WO | WO-2020/040514 | A1 | 2/2020 | |
| WO | WO-2020/054676 | A1 | 3/2020 | |
| WO | WO-2020/075757 | A1 | 4/2020 | |
| WO | WO-2020/075758 | A1 | 4/2020 | |
| WO | WO-2020/075759 | A1 | 4/2020 | |
| WO | WO-2020/075760 | A1 | 4/2020 | |
| WO | WO-2020/076108 | A1 | 4/2020 | |
| WO | WO-2020/076109 | A1 | 4/2020 | |
| WO | WO-2020/080416 | A1 | 4/2020 | |
| WO | WO-2020/080417 | A1 | 4/2020 | |
| WO | WO-2020/085829 | A1 | 4/2020 | |
| WO | WO-2020/096012 | A1 | 5/2020 | |
| WO | WO-2020/101001 | A1 | 5/2020 | |
| WO | WO-2020/108899 | A1 | 6/2020 | |
| WO | WO-2020/109269 | A1 | 6/2020 | |
| WO | WO-2020/116561 | A1 | 6/2020 | |
| WO | WO-2020/117026 | A1 | 6/2020 | |

OTHER PUBLICATIONS

Translation of WO 2015/102118 A1 (publication date: Jul. 2015). (Year: 2015).*

Wang, J. Y., & Pei, J. (2016). BN-embedded aromatics for optoelectronic applications. Chinese Chemical Letters, 27(8), 1139-1146. (Year: 2016).*

Huang, Jianhua, and Yuqing Li. "BN embedded polycyclic π-conjugated systems: Synthesis, optoelectronic properties, and photovoltaic applications." Frontiers in chemistry 6 (2018): 341. (Year: 2018).*

Gao, Y. et al., Realizing performance improvement of blue thermally activated delayed fluorescence molecule DABNA by introducing substituents on the para-position of born atom, Chemical Physics Letters, Apr. 17, 2018, vol. 701, pp. 98-102, ISSN: 0009-2614, DOI: 10.1016/j.cplett.2018.04.036.

International Preliminary Report on Patentability with Written Opinion dated Jun. 30, 2020 for corresponding International Patent Application No. PCT/JP2018/048602.

(56) References Cited

OTHER PUBLICATIONS

International Search Report dated Feb. 12, 2019 for corresponding International Patent Application No. PCT/JP2018/048602.

* cited by examiner

COMPOUND AND ORGANIC ELECTROLUMINESCENCE DEVICE

CROSS-REFERENCE TO RELATED APPLICATIONS

The present application claims priority under 37 U.S.C. § 371 to International Patent Application No. PCT/JP2018/048602, filed Dec. 28, 2018, which claims priority to and the benefit of Japanese Patent Application No. 2017-253215, filed on Dec. 28, 2017. The contents of these applications are hereby incorporated by reference in their entireties.

TECHNICAL FIELD

The invention relates to a novel compound and an organic electroluminescence device using the same.

BACKGROUND ART

When voltage is applied to an organic electroluminescence device (hereinafter, referred to as an organic EL device in several cases), holes and electrons are injected into an emitting layer from an anode and a cathode, respectively. Then, thus injected holes and electrons are recombined in the emitting layer, and excitons are formed therein.

The organic EL device includes the emitting layer between the anode and the cathode. Further, the organic EL device has a stacked structure including an organic layer such as a hole-injecting layer, a hole-transporting layer, an electron-injecting layer, and an electron-transporting layer in several cases.

Patent Document 1 discloses a compound used as a material for an organic electroluminescence device.

RELATED ART DOCUMENT

Patent Document

[Patent Document 1] WO 2015/102118 A1

SUMMARY OF THE INVENTION

It is an object of the invention to provide a novel compound which can be used as a material for an organic electroluminescence device, that makes the device to have high luminous efficiency, as well as an organic electroluminescence device which exhibits high luminous efficiency using the same.

According to an aspect of the invention, a compound represented by the following formula (1) is provided.

(1)

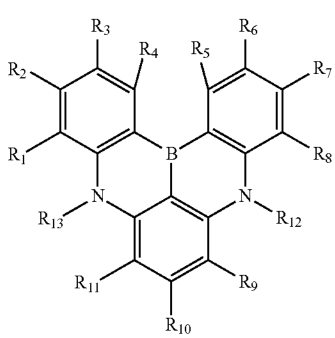

wherein in the formula (1), one or more pairs of adjacent two or more among $R_1$ to $R_{11}$ form a substituted or unsubstituted, saturated or unsaturated ring, or do not form a substituted or unsubstituted, saturated or unsaturated ring;

$R_1$ to $R_{11}$ which do not form the substituted or unsubstituted, saturated or unsaturated ring, and $R_{12}$ and $R_{13}$ are independently a hydrogen atom, a substituted or unsubstituted alkyl group including 1 to 50 carbon atoms, a substituted or unsubstituted haloalkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 carbon atoms that form a ring (hereinafter referred to as "ring carbon atoms"), a substituted or unsubstituted alkoxy group including 1 to 50 carbon atoms, a substituted or unsubstituted alkylthio group including 1 to 50 carbon atoms, a substituted or unsubstituted aryloxy group including 6 to 50 ring carbon atoms, a substituted or unsubstituted arylthio group including 6 to 50 ring carbon atoms, a substituted or unsubstituted aralkyl group including 7 to 50 carbon atoms, $-Si(R_{31})(R_{32})(R_{33})$, $—C(=O)R_{34}$, $—COOR_{35}$, $—N(R_{36})(R_{37})$, a halogen atom, a cyano group, a nitro group, a substituted or unsubstituted aryl group including 6 to 50 ring carbon atoms, a substituted or unsubstituted monovalent heterocyclic group including 5 to 50 atoms that form a ring (hereinafter referred to as "ring atoms"), or a group represented by the following formula (2);

$R_{31}$ to $R_{37}$ are independently a hydrogen atom, a substituted or unsubstituted alkyl group including 1 to 50 carbon atoms, a substituted or unsubstituted aryl group including 6 to 50 ring carbon atoms, or a substituted or unsubstituted monovalent heterocyclic group including 5 to 50 ring atoms;

when two or more of each of $R_{31}$ to $R_{37}$ are present, the two or more of each of $R_{31}$ to $R_{37}$ may be the same or different;

provided that at least one of $R_1$ to $R_8$ is a group represented by the following formula (2); and when two or more groups represented by the following formula (2) are present, the two or more groups represented by the following formula (2) may be the same or different:

$$-L_1\text{-HAr} \quad (2)$$

wherein in the formula (2), $L_1$ is a single bond, a substituted or unsubstituted arylene group including 6 to 30 ring carbon atoms, or a substituted or unsubstituted divalent heterocyclic group including 5 to 30 ring atoms; and HAr is a substituted or unsubstituted monovalent heterocyclic group including 5 to 50 ring atoms.

According to an aspect of the invention, a material for an organic electroluminescence device containing the compound represented by the formula (1) is provided.

According to an aspect of the invention, an organic electroluminescence device containing a cathode, an anode, and at least one organic layer disposed between the cathode and the anode, wherein at least one layer of the at least one organic layer contains the compound represented by the formula (1), is provided.

According to an aspect of the invention, an electronic appliance provided with the organic electroluminescence device is provided.

According to the invention, a novel compound which can be used as a material for an organic electroluminescence device that makes the device to have high luminous efficiency, and an organic electroluminescence device, that exhibits high luminous efficiency using the same can be provided.

MODE FOR CARRYING OUT THE INVENTION

Figure 1:
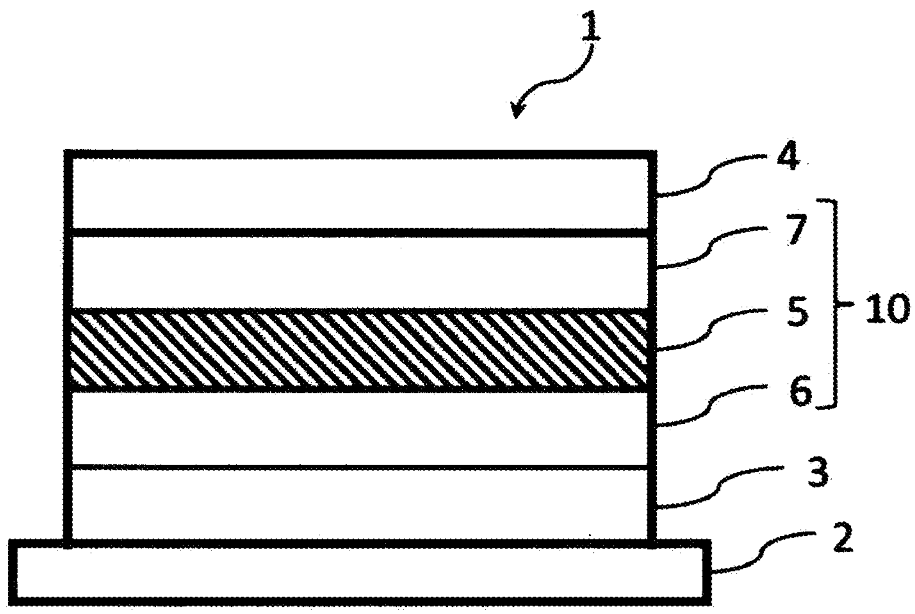
FIG. 1 is a diagram showing a schematic configuration of an embodiment of an organic EL device of the invention.

In the present specification, a hydrogen atom means an atom including isotopes different in the number of neutrons, namely, a protium, a deuterium and a tritium.

In the present specification, the number of "ring carbon atoms" represents the number of carbon atoms among the atoms which forms a subject ring itself of a compound having a structure in which atoms are bonded in a ring form (for example, a monocyclic compound, a fused ring compound, a cross-linked compound, a carbocyclic compound or a heterocyclic compound). When the subject ring is substituted by a substituent, the carbon contained in the substituent is not included in the number of ring carbon atoms. The same shall apply to the number of "ring carbon atoms" described below, unless otherwise noted. For example, a benzene ring includes 6 ring carbon atoms, a naphthalene ring includes 10 ring carbon atoms, a pyridinyl group includes 5 ring carbon atoms, and a furanyl group includes 4 ring carbon atoms. Further, when the benzene ring or the naphthalene ring is substituted by, for example, an alkyl group as a substituent, the number of carbon atoms of the alkyl group is not included in the number of ring carbon atoms. When a fluorene ring is bonded with, for example, a fluorene ring as a substituent (including a spirofluorene ring), the number of carbon atoms of the fluorene ring as a substituent is not included in the number of ring carbon atoms.

In the present specification, the term "the number of ring atoms" represents the number of atoms which forms a subject ring itself of a compound having a structure in which atoms are bonded in a ring form (an example of the structure includes a monocyclic ring, a fused ring and a ring assembly) (an example of the compound includes a monocyclic compound, a fused ring compound, a cross-linked compound, a carbocyclic compound and a heterocyclic compound). The atoms that do not form the ring (e.g., a hydrogen atom that terminates bonds which are not used to form the ring) or the atoms contained in a substituent where the ring is substituted by the substituent is not included in the number of ring atom. The same shall apply to the number of "ring atoms" described below, unless otherwise noted. For example, a pyridine ring includes 6 ring atoms, a quinazoline ring includes 10 ring atoms, and a furan ring includes 5 ring atoms. Hydrogen atoms are independently bonded with carbon atoms of the pyridine ring or the quinazoline ring or atoms forming the substituent are not included in the number of ring atoms. When a fluorene ring is bonded with, for example, a fluorene ring as a substituent (including a spirofluorene ring), the number of atoms of the fluorene ring as a substituent is not included in the number of ring atoms.

In the present specification, "including XX to YY carbon atoms" in the expression "a substituted or unsubstituted ZZ group including XX to YY carbon atoms" represents the number of carbon atoms when the ZZ group is unsubstituted, and does not include the number of carbon atoms of the substituent when the ZZ group is substituted. Here, "YY" is larger than "XX", and "XX" and "YY" independently mean an integer of 1 or more.

In the present specification, "including XX to YY atoms" in the expression "a substituted or unsubstituted ZZ group including XX to YY atoms" represents the number of atoms when the ZZ group is unsubstituted, and does not include the number of atoms of the substituent when the ZZ group is substituted. Here, "YY" is larger than "XX", and "XX" and "YY" independently mean an integer of 1 or more.

In the present specification, "substituted" in the context of "substituted or unsubstituted" means that a substituent other than a hydrogen atom is bonded.

In the present specification, "unsubstituted" in the context of "substituted or unsubstituted" means that a substituent is not bonded and a hydrogen atom is bonded.

In the present specification, the substituent in the case of "substituted or unsubstituted" (hereinafter referred to as an arbitrary substituent) is selected from the group consisting of an alkyl group including 1 to 50 carbon atoms, a haloalkyl group including 1 to 50 carbon atoms, an alkenyl group including 2 to 50 carbon atoms, an alkynyl group including 2 to 50 carbon atoms, a cycloalkyl group including 3 to 50 ring carbon atoms, an alkoxy group including 1 to 50 carbon atoms, an alkylthio group including 1 to 50 carbon atoms, an aryloxy group including 6 to 50 ring carbon atoms, an arylthio group including 6 to 50 ring carbon atoms, an aralkyl group including 7 to 50 carbon atoms, —$Si(R_{41})(R_{42})(R_{43})$, —$C(=O)R_{44}$, —$COOR_{45}$, —$S(=O)_2R_{46}$, —$P(=O)(R_{47})(R)$, —$Ge(R_{49})(R_{50})(R_{51})$, —$N(R_{52})(R_{53})$, a hydroxy group, a halogen atom, a cyano group, a nitro group, an aryl group including 6 to 50 ring carbon atoms, and a monovalent heterocyclic group including 5 to 50 ring atoms;

$R_{41}$ to $R_{53}$ are independently a hydrogen atom, an alkyl group including 1 to 50 carbon atoms, an aryl group including 6 to 50 ring carbon atoms, or a monovalent heterocyclic group including 5 to 50 ring atoms; and when two or more of each of $R_4$ to $R_5$ are present, the two or more of each of $R_{41}$ to $R_{53}$ may be the same or different.

In the present specification, adjacent arbitrary substituents (or non-adjacent arbitrary substituents which may form a ring) form a substituted or unsubstituted, saturated or unsaturated ring, or do not form a substituted or unsubstituted, saturated or unsaturated ring. To "form a substituted or unsubstituted, saturated or unsaturated ring" is the same as the following description of "substituted or unsubstituted" and "saturated or unsaturated ring." In the present specification, the arbitrary substituent may further have the substituent. Specific examples of the substituent that the arbitrary substituent further has include to the ones same as the arbitrary substituent described above.

Specific examples of each group and each substituent in the present specification include the following.

Examples of the unsubstituted alkyl group including 1 to 50 (preferably 1 to 30, more preferably 1 to 18, and even more preferably 1 to 5) carbon atoms include, for example, a methyl group, an ethyl group, a propyl group, an isopropyl group, a n-butyl group, a s-butyl group, an isobutyl group, a t-butyl group, a n-pentyl group, a n-hexyl group, a n-heptyl group, a n-octyl group, and the like.

Examples of the substituted alkyl group including 1 to 50 (preferably 1 to 30, more preferably 1 to 18, and more preferably 1 to 5) include a hydroxymethyl group, a 1-hydroxyethyl group, a 2-hydroxyethyl group, a 2-hydroxyisobutyl group, a 1,2-dihydroxyethyl group, a 1,3-dihydroxyisopropyl group, a 2,3-dihydroxy-t-butyl group, a 1,2,3-trihydroxypropyl group, a chloromethyl group, a 1-chloroethyl group, a 2-chloroethyl group, a 2-dichloroisobuthyl group, a 1,2-dichloroethyl group, a 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-tribromopropyl group, a iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, a cyanomethyl group, a 1-cyanoethyl group, a 2-cyanoethyl group, a 2-cyanoisobutyl group, a 1,2-dicyanoethyl group, a 1,3-dicyanoisopropyl group, a 2,3-dicyano-t-butyl group, a 1,2,3-tricyanopropyl group, a nitromethyl group, a 1-nitroethyl group, a 2-nitroethyl group, a 2-nitroisobutyl group, a 1,2-dinitroethyl group, a 1,3-dinitroisopropyl group, a 2,3-dinitro-t-butyl group, a 1,2,3-trinitropropyl group, a 1-pyrrolylmethyl group, a 2-(1-pyrrolyl)ethyl group, a 1-hydroxy-2-phenylisopropyl group, a 1-chloro-2-phenylisopropyl group, and the like.

The substituted or unsubstituted haloalkyl group including 1 to 50 carbon atoms is a group in which one or more of hydrogen atoms of the alkyl group is substituted by a halogen atom. As the substituted or unsubstituted haloalkyl group including 1 to 50 carbon atoms, a group obtained by substituting one or more halogen atoms in the above-mentioned substituted or unsubstituted alkyl group including 1 to 50 carbon atoms can be given.

Examples of the alkenyl group including 2 to 50 (preferably 2 to 30, and more preferably 2 to 18) carbon atoms include, for example, a vinyl group, an allyl group, a 1-butenyl group, a 2-butenyl group, a 3-butenyl group, a 1,3-butanedienyl group, a 1-methylvinyl group, a 1-methylallyl group, a 1,1-dimethylallyl group, a 2-methylally group, a 1,2-dimethylallyl group, and the like.

As the unsubstituted alkynyl group including 2 to 50 (preferably 2 to 30, more preferably 2 to 18) carbon atoms, an ethynyl group or the like can be given.

Examples of the unsubstituted cycloalkyl group including 3 to 50 (preferably 3 to 30, more preferably 3 to 18, and still more preferably 3 to 6) include a cyclopropyl group, a cyclobutyl group, a cyclopentyl group, a cyclohexyl group, a 4-methylcyclohexyl group, a 1-adamantyl group, a 2-adamantyl group, a 1-norbornyl group, a 2-norbornyl group, and the like.

The unsubstituted alkoxy group including 1 to 50 (preferably 1 to 30, more preferably 1 to 18) carbon atoms is represented by —OX. As examples of X, the alkyl group including 1 to 50 carbon atoms mentioned above can be given, for example.

The unsubstituted alkylthio group including 1 to 50 (preferably 1 to 30, more preferably 1 to 18) carbon atoms is represented by —SX. As examples of X, the alkyl group including 1 to 50 carbon atoms mentioned above can be given, for example.

As the unsubstituted aryl group including 6 to 50 (preferably 6 to 30, more preferably 6 to 18) ring carbon atoms, a phenyl group, a p-biphenylyl group, a m-biphenylyl group, an o-biphenylyl group, a p-terphenyl-4-yl group, a p-terphenyl-3-yl group, a p-terphenyl-2-yl group, a m-terphenyl-4-yl group, a m-terphenyl-3-yl group, a m-terphenyl-2-yl group, an o-terphenyl-4-yl group, an o-terphenyl-3-yl group, an o-terphenyl-2-yl group, a 1-naphthyl group, a 2-naphthyl group, an anthryl group, a benzanthryl group, a phenanthryl group, a benzophenanthryl group, a phenalenyl group, a pyrenyl group, a chrysenyl group, a benzochrysenyl group, a triphenylenyl group, a benzotriphenylenyl group, a tetracenyl group, a pentacenyl group, a fluorenyl group, a benzofluorenyl group, a dibenzofluorenyl group, a fluoranthenyl group, a benzofluoranthenyl group or the like can be given.

Among these, a phenyl group, a biphenyl group, a terphenyl group, a naphthyl group, a phenanthryl group, and a fluorenyl group are preferable, and a phenyl group, a naphthyl group, and a biphenyl group are more preferable.

As the substituted aryl group including 6 to 50 (preferably 6 to 30, more preferably 6 to 18) ring carbon atoms, an o-tolyl group, a m-tolyl group, a p-tolyl group, a para-xylyl group, a meta-xylyl group, an ortho-xylyl group, a para-isopropylphenyl group, a meta-isopropylphenyl group, an ortho-isopropylphenyl group, a para-t-butylphenyl group, a meta-t-butylphenyl group, an ortho-t-butylphenyl group, a 3,4,5-trimethylphenyl group, a 9,9-dimethylfluorenyl group, a 9,9-diphenylfluorenyl group, a 9,9'-spirobifluorenyl group, a 9,9-di(4-methylphenyl)fluorenyl group, a 9,9-di(4-isopropylphenyl)fluorenyl group, 9,9-di(4-t-butylphenyl)fluorenyl group, a cyanophenyl group, a triphenylsilylphenyl group, a trimethylsilylphenyl group or the like can be given.

As the substituted or unsubstituted arylene group including 6 to 30 (preferably 6 to 20, more preferably 6 to 18) ring carbon atoms, for example, a divalent group derive from the unsubstituted aryl group including 6 to 50 ring carbon atoms and an aromatic hydrocarbon ring constituting the substituted aryl group including 6 to 50 ring carbon atoms exemplified above can be given.

The substituted or unsubstituted arylene group including 6 to 30 ring carbon atoms is selected, for example, from the group consisting of a substituted or unsubstituted phenylene group represented by the following formulas (L1-1a) to (L1-1c), a substituted or unsubstituted biphenylyl group represented by the following formulas (L1-2a) to (L1-2g), a substituted or unsubstituted dialkylfluorenylene group represented by the following formulas (L1-3a) to (L1-3k), and a substituted or unsubstituted naphthylene group represented by the following formulas (L1-4a) to (L1-4j):

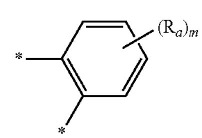

(L1-1a)

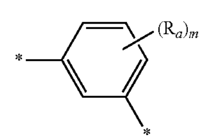

(L1-1b)

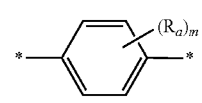

(L1-1c)

-continued
(L1-2a)
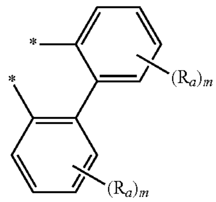
(L1-2b)
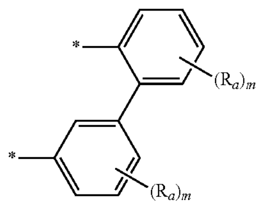
(L1-2c)
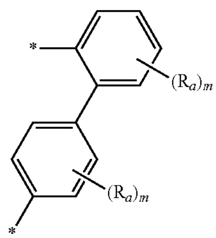
(L1-2d)
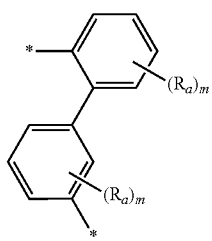
(L1-2e)
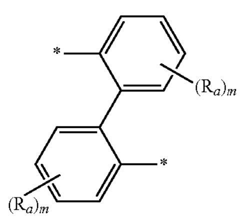
(L1-2f)
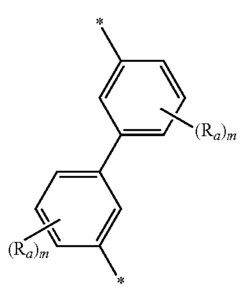
(L1-2g)
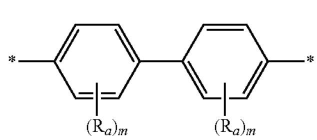
-continued
(L1-3a)
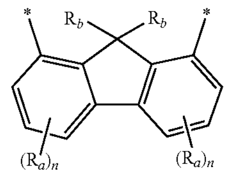
(L1-3b)
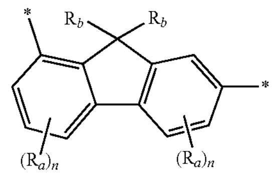
(L1-3c)
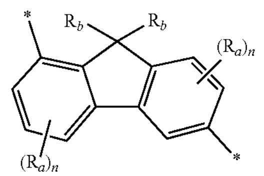
(L1-3d)
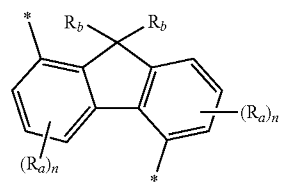
(L1-3e)
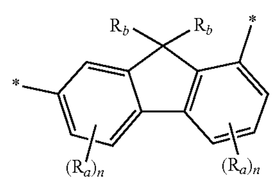
(L1-3f)
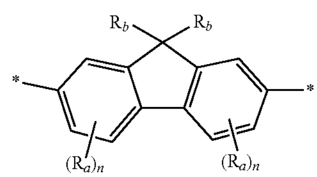
(L1-3g)
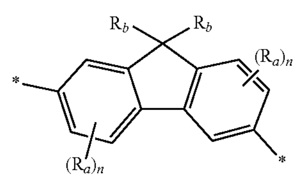
(L1-3h)
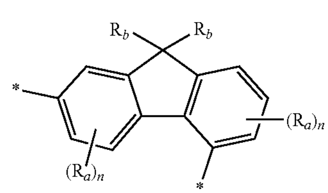
(L1-3i)
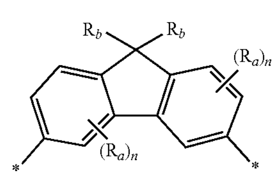

-continued (L1-3j)

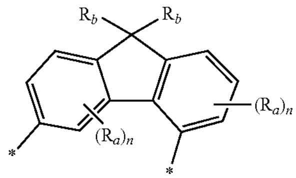

(L1-3k)

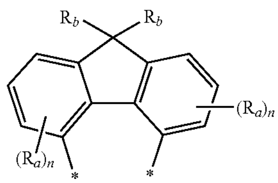

(L1-4a)

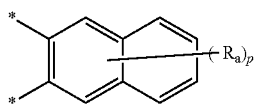

(L1-4b)

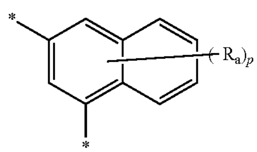

(L1-4c)

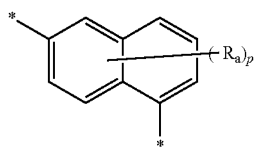

(L1-4d)

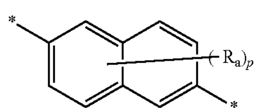

(L1-4e)

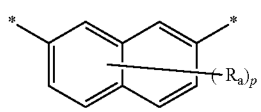

(L1-4f)

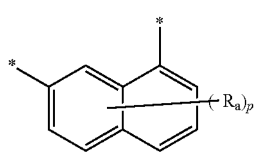

(L1-4g)

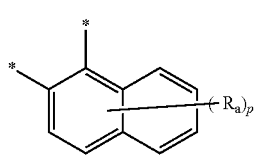

(L1-4h)

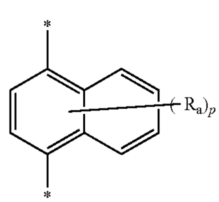

-continued (L1-4i)

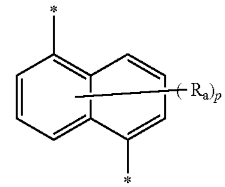

(L1-4j)

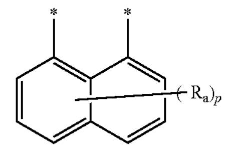

wherein in the formulas (L1-4a) to (L1-4j), (Ra)p is bonded with an arbitrary carbon atom.

In the formulas (L1-1a) to (L1-1c), ($L_1$-2a) to (L1-2g), (L1-3a) to (L1-3k) and (L1-4a) to (L1-4j), $R_a$'s are independently an arbitrary substituent.

$R_b$'s are independently a substituted or unsubstituted alkyl group including 1 to 50 (preferably 1 to 30, more preferably 1 to 18, still more preferably 1 to 5) carbon atoms.

m are independently an integer of 0 to 4, n are independently an integer of 0 to 3, and p's are independently an integer of 0 to 6.

When m is two or more, two or more $R_a$'s may be the same or different. When n is two or more, two or more $R_a$'s may be the same or different. When p is two or more, two or more $R_a$'s may be the same or different. When m is two or more, two or more $R_a$'s are not bonded with each other. When n is two or more, two or more $R_a$'s are not bonded with each other. When p is two or more, two or more $R_a$'s are not bonded with each other.

Preferably, m is 0.

Preferably, n is 0.

Preferably, p is 0.

Two "*"s (asterisks) in the formulas are a chemical bonding site.

The unsubstituted aryloxy group including 6 to 50 (preferably 6 to 30, more preferably 6 to 18) ring carbon atoms is represented by —OY. As examples of Y, the aryl group including 6 to 50 ring carbon atoms mentioned above can be given.

The unsubstituted arylthio group including 6 to 50 (preferably 6 to 30, more preferably 6 to 18) ring carbon atoms is represented by —SY. As examples of Y, the aryl group including 6 to 50 ring carbon atoms mentioned above can be given.

The unsubstituted aralkyl group including 7 to 50 (preferably 7 to 30, more preferably 7 to 18) carbon atoms includes, for example, a benzyl group, a 1-phenylethyl group, a 2-phenylethyl group, a 1-phenylisopropyl group, a 2-phenylisopropyl group, a phenyl-t-butyl group, an α-naphthylmethyl group, a 1-α-naphthylethyl group, a 2-α-naphthylethyl group, a 1-α-naphthylisopropyl group, a 2-α-naphthylisopropyl group, a β-naphthylmethyl group, a 1-β-naphthylethyl group, a 2-β-naphthylethyl group, a 1-β-naphthylisopropyl group, a 2-β-naphthylisopropyl group, and the like.

The substituted aralkyl group including 7 to 50 (preferably 7 to 30, more preferably 7 to 18) carbon atoms includes, for example, a p-methylbenzyl group, a m-methylbenzyl group, an o-methylbenzyl group, a p-chlorobenzyl group, a m-chlorobenzyl group, an o-chlorobenzyl group, a p-bromobenzyl group, a m-bromobenzyl group, an o-bromobenzyl group, a p-iodobenzyl group, a m-iodobenzyl group, an o-iodobenzyl group, a p-hydroxybenzyl group, a m-hydroxybenzyl group, an o-hydroxybenzyl group, a p-nitrobenzyl group, a m-nitrobenzyl group, an o-nitrobenzyl group, a p-cyanobenzyl group, a m-cyanobenzyl group, an o-cyanobenzyl group, and the like.

The unsubstituted monovalent heterocyclic group including 5 to 50 (preferably 5 to 30, more preferably 5 to 18) ring atoms includes, for example:

heterocyclic groups containing a nitrogen atom such as a pyrrolyl group, an imidazolyl group, a pyrazolyl group, a triazolyl group, a tetrazolyl group, an oxazolyl group, an isoxazolyl group, an oxadiazolyl group, a thiazolyl group, an isothiazolyl group, a thiadiazolyl group, a pyridyl group, a pyridazinyl group, a pyrimidinyl group, a pyrazinyl group, a triazinyl group, an indolyl group, an isoindolyl group, an indolizinyl group, a quinolizinyl group, a quinolyl group, an isoquinolyl group, a cinnolyl group, a phthalazinyl group, a quinazolinyl group, a quinoxalinyl group, a benzimidazolyl group, an indazolyl group, a phenanthrolinyl group, a phenanthridinyl group, an acridinyl group, a phenazinyl group, a carbazolyl group, a benzocarbazolyl group, a morpholino group, a phenoxazinyl group, a phenothiazinyl group, an azacarbazolyl group, a diazacarbazolyl group, and the like;

unsubstituted heterocyclic groups containing an oxygen atom such as a furyl group, an oxazolyl group, an isoxazolyl group, an oxadiazolyl group, a xanthenyl group, a benzofuranyl group, an isobenzofuranyl group, a dibenzofuranyl group, a naphthobenzofuranyl group, a benzoxazolyl group, a benzisoxazolyl group, a phenoxazinyl group, a morpholino group, a dinaphthofuranyl group, an azadibenzofuranyl group, a diazadibenzofuranyl group, an azanaphthobenzofuranyl group, a diazanaphthobenzofuranyl group, and the like;

unsubstituted heterocyclic groups containing a sulfur atom such as a thienyl group, a thiazolyl group, an isothiazolyl group, a thiadiazolyl group, a benzothiophenyl group, an isobenzothiophenyl group, a dibenzothiophenyl group, a naphthobenzothiophenyl group, a benzothiazolyl group, a benzisothiazolyl group, a phenothiazinyl group, a dinaphthothiophenyl group, an azadibenzothiophenyl group, a diazadibenzothiophenyl group, an azanaphthobenzothiophenyl group, a diazanaphthobenzothiophenyl group, and the like.

Examples of the heteroatoms constituting a heterocyclic group include heteroatoms such as S, O, and N, and heteroatoms such as Si, Ge, and Se.

The "heterocyclic group" described in the present specification may be a monocyclic group or a fused ring group. The "heterocyclic group" described in the present specification may be an aromatic heterocyclic group or an aliphatic heterocyclic group.

The substituted monovalent heterocyclic group including 5 to 50 (preferably 5 to 30, more preferably 5 to 18) ring atoms includes, for example:

substituted heterocyclic groups containing a nitrogen atom such as a (9-phenyl)carbazolyl group, a (9-biphenylyl)carbazolyl group, a (9-phenyl)phenylcarbazolyl group, a (9-naphthyl)carbazolyl group, a diphenylcarbazol-9-yl group, a phenylcarbazol-9-yl group, a methylbenzimidazolyl group, an ethylbenzimidazolyl group, a phenyltriazinyl group, a biphenylyltriazinyl group, a diphenyltriazinyl group, a phenylquinazolinyl group, a biphenylylquinazolinyl group, and the like;

unsubstituted heterocyclic groups containing an oxygen atom such as a phenyldibenzofuranyl group, a methyldibenzofuranyl group, a t-butyldibenzofuranyl group, a monovalent group formed of spiro[9H-xanthene-9,9'-[9H]fluorene], and the like;

unsubstituted heterocyclic groups containing a sulfur atom such as a phenyldibenzothiophenyl group; a methyldibenzothiophenyl group, a t-butyldibenzothiophenyl group, a monovalent group derived from spiro[9H-thioxanthene-9,9'-[9H]fluorene], and the like.

As the substituted or unsubstituted divalent heterocyclic group including 5 to 30 (preferably 5 to 20, more preferably 5 to 18) ring atoms, a divalent group derived from a heterocyclic ring constituting the unsubstituted monovalent heterocyclic group including 5 to 50 ring atoms and the substituted monovalent heterocyclic group including 5 to 50 ring atoms exemplified above can be given.

As the substituted or unsubstituted monovalent heterocyclic group including 5 to 50 ring atoms, the following groups are included. As the divalent heterocyclic group including 5 to 30 ring atoms, groups obtained by making the following groups into divalent groups are also included:

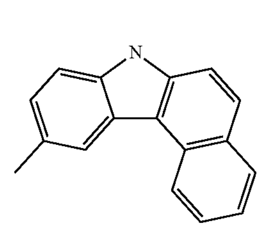

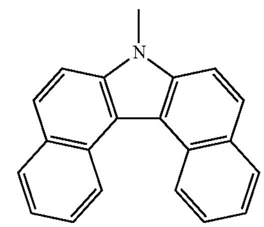

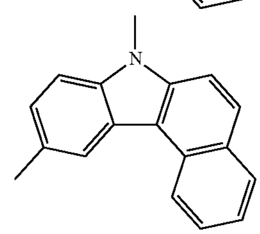

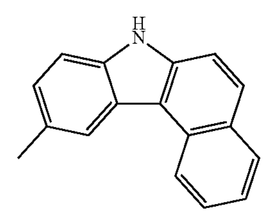

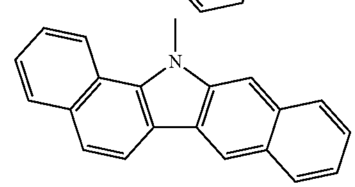

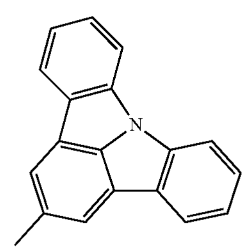

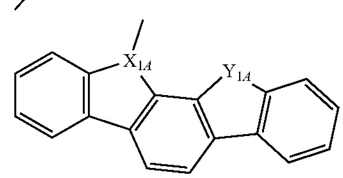

-continued
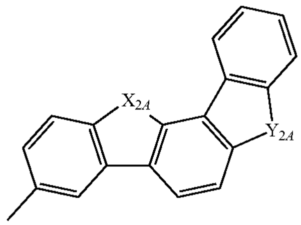
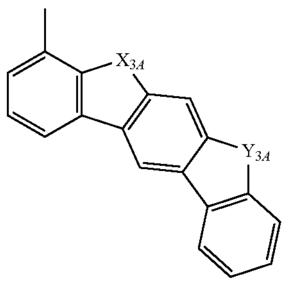
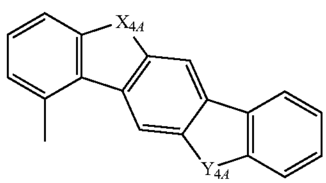
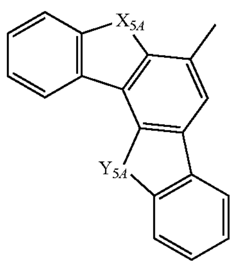
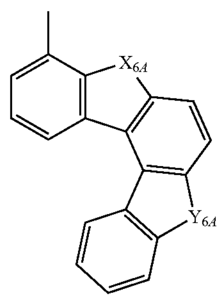
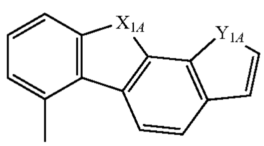
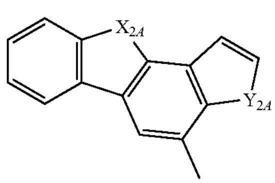
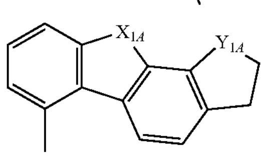
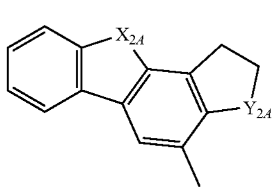
-continued
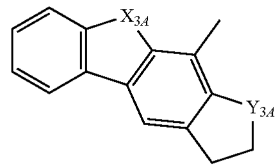
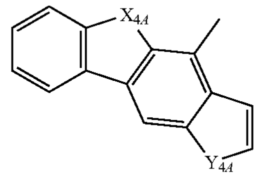
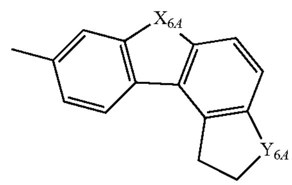
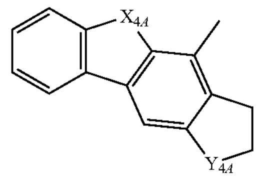
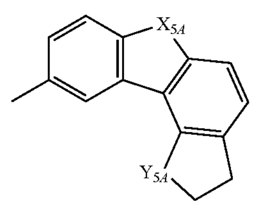
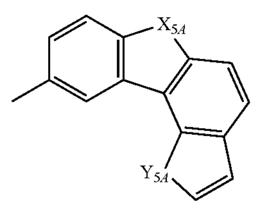
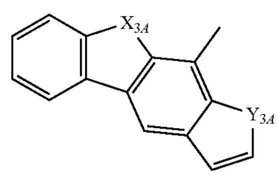
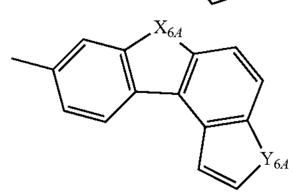
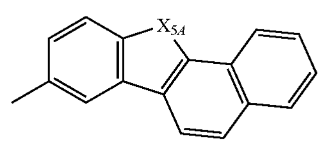
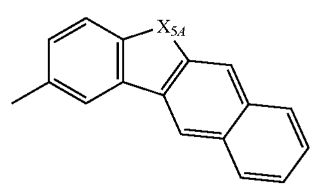

-continued

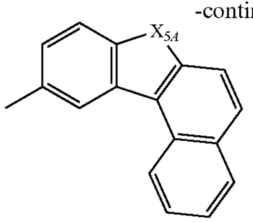

wherein in the formulas, $X_{1A}$ to $X_{6A}$, and $Y_{1A}$ to $Y_{6A}$ are independently an oxygen atom, a sulfur atom, a —NZ— group, or a —NH— group;

Z is a substituted or unsubstituted aryl group including 6 to 50 ring carbon atoms, a substituted or unsubstituted monovalent heterocyclic group including 5 to 50 ring atoms, or a substituted or unsubstituted alkyl group including 1 to 50 carbon atoms; and when two or more Z's are present, the two or more Z's may be the same or different As the halogen atom, a fluorine atom, a chlorine atom, a bromine atom, an iodine atom or the like can be given.

<Compound>

The novel compound according to an aspect of the invention is represented by the following formula (1):

(1)

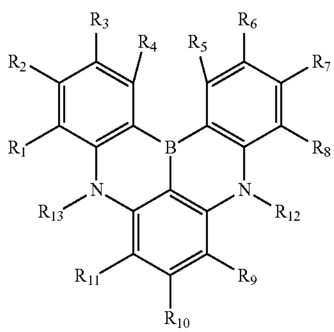

wherein in the formula (1), one or more pairs of adjacent two or more among $R_1$ to $R_{11}$ form a substituted or unsubstituted, saturated or unsaturated ring, or do not form a substituted or unsubstituted, saturated or unsaturated ring;

$R_1$ to $R_{11}$ which do not form the substituted or unsubstituted, saturated or unsaturated ring, and $R_{12}$ and $R_{13}$ are independently a hydrogen atom, a substituted or unsubstituted alkyl group including 1 to 50 carbon atoms, a substituted or unsubstituted haloalkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted alkoxy group including 1 to 50 carbon atoms, a substituted or unsubstituted alkylthio group including 1 to 50 carbon atoms, a substituted or unsubstituted aryloxy group including 6 to 50 ring carbon atoms, a substituted or unsubstituted arylthio group including 6 to 50 ring carbon atoms, a substituted or unsubstituted aralkyl group including 7 to 50 carbon atoms, $—Si(R_{31})(R_{32})(R_{33})$, $—C(=O)R_{34}$, $—COOR_3—$, $—N(R_{36})(R_{37})$, a halogen atom, a cyano group, a nitro group, a substituted or unsubstituted aryl group including 6 to 50 ring carbon atoms, a substituted or unsubstituted monovalent heterocyclic group including 5 to 50 ring atoms, or a group represented by the following formula (2) (for example, $R_1$ and $R_8$ represent a hydrogen atom, a substituted or unsubstituted alkyl group including 1 to 50 carbon atoms, a substituted or unsubstituted haloalkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted alkoxy group including 1 to 50 carbon atoms, a substituted or unsubstituted alkylthio group including 1 to 50 carbon atoms, a substituted or unsubstituted aryloxy group including 6 to 50 ring carbon atoms, a substituted or unsubstituted arylthio group including 6 to 50 ring carbon atoms, a substituted or unsubstituted aralkyl group including 7 to 50 carbon atoms, $-Si(R_{31})(R_{32})(R_{33})$, $—C(=O)R_{34}$, $—COOR_{35}$, $—N(R_{36})(R_{37})$, a halogen atom, a cyano group, a nitro group, a substituted or unsubstituted aryl group including 6 to 50 ring carbon atoms, a substituted or unsubstituted monovalent heterocyclic group including 5 to 50 ring atoms, or a group represented by the following formula (2);

$R_2$ and $R_7$ represent a hydrogen atom, a substituted or unsubstituted alkyl group including 1 to 50 carbon atoms, a substituted or unsubstituted haloalkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted alkoxy group including 1 to 50 carbon atoms, a substituted or unsubstituted alkylthio group including 1 to 50 carbon atoms, a substituted or unsubstituted aryloxy group including 6 to 50 ring carbon atoms, a substituted or unsubstituted arylthio group including 6 to 50 ring carbon atoms, a substituted or unsubstituted aralkyl group including 7 to 50 carbon atoms, $—Si(R_{31})(R_{32})(R_{33})$, $—C(=O)R_{34}$, $—COOR_{35}$, $—N(R_{36})(R_{37})$, a halogen atom, a cyano group, a nitro group, a substituted or unsubstituted aryl group including 6 to 50 ring carbon atoms, a substituted or unsubstituted monovalent heterocyclic group including 5 to 50 ring atoms, or a group represented by the following formula (2);

$R_3$ and $R_6$ represent a hydrogen atom, a substituted or unsubstituted alkyl group including 1 to 50 carbon atoms, a substituted or unsubstituted haloalkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted alkoxy group including 1 to 50 carbon atoms, a substituted or unsubstituted alkylthio group including 1 to 50 carbon atoms, a substituted or unsubstituted aryloxy group including 6 to 50 ring carbon atoms, a substituted or unsubstituted arylthio group including 6 to 50 ring carbon atoms, a substituted or unsubstituted aralkyl group including 7 to 50 carbon atoms, $—Si(R_{31})(R_{32})(R_{33})$, $—C(=O)R_{34}$, $—COOR_{35}$, $—N(R_{36})(R_{37})$, a halogen atom, a cyano group, a nitro group, a substituted or unsubstituted aryl group including 6 to 50 ring carbon atoms, a substituted or unsubstituted monovalent heterocyclic group including 5 to 50 ring atoms, or a group represented by the following formula (2);

$R_4$ and $R_5$ represent a hydrogen atom, a substituted or unsubstituted alkyl group including 1 to 50 carbon atoms, a substituted or unsubstituted haloalkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted alkoxy group including 1 to 50 carbon atoms, a substituted or unsubstituted alkylthio group including 1 to 50 carbon atoms, a substituted or unsubstituted aryloxy group including 6 to 50 ring carbon atoms, a substituted or unsubstituted arylthio group including 6 to 50 ring carbon atoms, a substituted or unsubstituted aralkyl group including 7 to 50 carbon atoms, —Si($R_{31}$)($R_{32}$)($R_{33}$), —C(═O)$R_{34}$, —COO$R_{35}$, —N($R_{36}$)($R_{37}$), a halogen atom, a cyano group, a nitro group, a substituted or unsubstituted aryl group including 6 to 50 ring carbon atoms, a substituted or unsubstituted monovalent heterocyclic group including 5 to 50 ring atoms, or a group represented by the following formula (2);

$R_{12}$ and $R_{13}$ represent a hydrogen atom, a substituted or unsubstituted alkyl group including 1 to 50 carbon atoms, a substituted or unsubstituted haloalkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted alkoxy group including 1 to 50 carbon atoms, a substituted or unsubstituted alkylthio group including 1 to 50 carbon atoms, a substituted or unsubstituted aryloxy group including 6 to 50 ring carbon atoms, a substituted or unsubstituted arylthio group including 6 to 50 ring carbon atoms, a substituted or unsubstituted aralkyl group including 7 to 50 carbon atoms, —Si($R_{31}$)($R_{32}$)($R_{33}$), —C(═O)$R_{34}$, —COO$R_{35}$, —N($R_{36}$)($R_{37}$), a halogen atom, a cyano group, a nitro group, a substituted or unsubstituted aryl group including 6 to 50 ring carbon atoms, a substituted or unsubstituted monovalent heterocyclic group including 5 to 50 ring atoms, or a group represented by the following formula (2);

$R_9$ and $R_{11}$ represent a hydrogen atom, a substituted or unsubstituted alkyl group including 1 to 50 carbon atoms, a substituted or unsubstituted haloalkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted alkoxy group including 1 to 50 carbon atoms, a substituted or unsubstituted alkylthio group including 1 to 50 carbon atoms, a substituted or unsubstituted aryloxy group including 6 to 50 ring carbon atoms, a substituted or unsubstituted arylthio group including 6 to 50 ring carbon atoms, a substituted or unsubstituted aralkyl group including 7 to 50 carbon atoms, —Si($R_{31}$)($R_{32}$)($R_{33}$), —C(═O)$R_{34}$, —COO$R_{35}$, —N($R_{36}$)($R_{37}$), a halogen atom, a cyano group, a nitro group, a substituted or unsubstituted aryl group including 6 to 50 ring carbon atoms, a substituted or unsubstituted monovalent heterocyclic group including 5 to 50 ring atoms, or a group represented by the following formula (2);

$R_{10}$ represents a hydrogen atom, a substituted or unsubstituted alkyl group including 1 to 50 carbon atoms, a substituted or unsubstituted haloalkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted alkoxy group including 1 to 50 carbon atoms, a substituted or unsubstituted alkylthio group including 1 to 50 carbon atoms, a substituted or unsubstituted aryloxy group including 6 to 50 ring carbon atoms, a substituted or unsubstituted arylthio group including 6 to 50 ring carbon atoms, a substituted or unsubstituted aralkyl group including 7 to 50 carbon atoms, —Si($R_{31}$)($R_{32}$)($R_{33}$), —C(═O)$R_{34}$, —COO$R_{35}$, —N($R_{36}$)($R_{37}$), a halogen atom, a cyano group, a nitro group, a substituted or unsubstituted aryl group including 6 to 50 ring carbon atoms, a substituted or unsubstituted monovalent heterocyclic group including 5 to 50 ring atoms, or a group represented by the following formula (2));

$R_{31}$ to $R_{37}$ are independently a hydrogen atom, a substituted or unsubstituted alkyl group including 1 to 50 carbon atoms, a substituted or unsubstituted aryl group including 6 to 50 ring carbon atoms, or a substituted or unsubstituted monovalent heterocyclic group including 5 to 50 ring atoms;

when two or more of each of $R_{31}$ to $R_{37}$ are present, the two or more of each of $R_{31}$ to $R_{37}$ may be the same or different;

provided that at least one of $R_1$ to $R_8$ is a group represented by the following formula (2);

when two or more groups represented by the following formula (2) are present, the two or more groups represented by the following formula (2) may be the same or different:

$$-L_1\text{-HAr} \qquad (2)$$

wherein in the formula (2), $L_1$ is a single bond, a substituted or unsubstituted arylene group including 6 to 30 ring carbon atoms, or a substituted or unsubstituted divalent heterocyclic group including 5 to 30 ring atoms; and HAr is a substituted or unsubstituted monovalent heterocyclic group including 5 to 50 ring atoms.

As a result, a material for an organic electroluminescence device, that makes the device to have high luminous efficiency can be provided.

The term "at least one of $R_1$ to $R_8$ is a group represented by the following formula (2)" means that at least one of $R_1$ to $R_8$ does not form a substituted or unsubstituted, saturated or unsaturated ring, and the at least one is a group represented by the formula (2).

Hereinafter, "one or more pairs of adjacent two or more among $R_1$ to $R_{11}$ form a substituted or unsubstituted, saturated or unsaturated ring" will be described.

The "one pair of adjacent two or more among $R_1$ to $R_{11}$" represents, for example, a combination of $R_1$ and $R_2$, $R_2$ and $R_3$, $R_3$ and $R_4$, $R_5$ and $R_6$, $R_6$ and $R_7$, $R_1$, $R_2$ and $R_3$, and the like.

The substituent in the case of "substituted" of "substituted or unsubstituted" for the saturated or unsaturated ring is the same as the arbitrary substituent described above.

The "saturated or unsaturated ring" means, for example, when the ring is formed by $R_1$ and $R_2$, a ring formed by a carbon atom with which $R_1$ is bonded, a carbon atom with which $R_2$ is bonded, and one or more arbitrary elements. Specifically, if the ring is formed by $R_1$ and $R_2$, when an unsaturated ring is formed by a carbon atom with which $R_1$ is bonded, a carbon atom with which $R_2$ is bonded, and four carbon atoms, the ring formed by $R_1$ and $R_2$ is a benzene ring.

The "arbitrary element" is preferably a C element, a N element, an O element, and a S element. In the arbitrary elements (a C element or a N element, for example), chemical bonding sites that are not involved in the ring formation a ring may be terminated by a hydrogen atom, or the like.

The number of the "one or more arbitrary element" is preferably 2 or more and 15 or less, more preferably 3 or more and 12 or less, and still more preferably 3 or more and 5 or less arbitrary elements. In the present specification, the expression "one or more pairs of adjacent two or more among X to Y form a substituted or unsubstituted, saturated or unsaturated ring, or do not form a substituted or unsubstituted, saturated or unsaturated ring" has the same meanings as when X is replaced with $R_1$ and Y is replaced with $R_{11}$.

In one embodiment, the compound represented by the formula (1) is represented by the following formula (3).

(3)

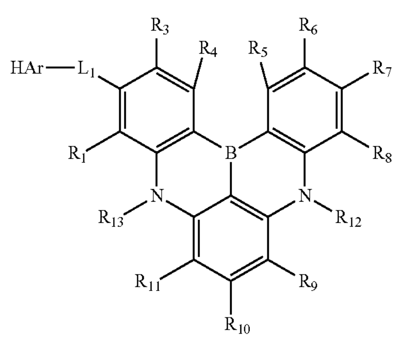

wherein in the formula (3), $R_1$, $R_3$ to $R_{13}$, $L_1$ and HAr are as defined in the formula (1).

In one embodiment, the compound represented by the formula (1) is represented by the following formula (4).

(4)

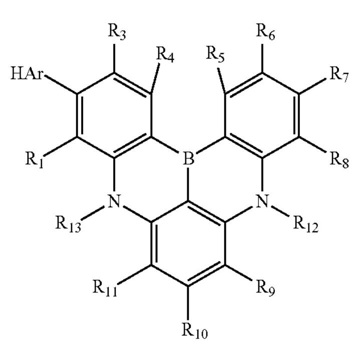

wherein in the formula (4), $R_1$, $R_3$ to $R_{13}$ and HAr are as defined in the formula (1).

In one embodiment, in the compound represented by the formula (1), $R_1$, $R_3$ to $R_{11}$ which do not form the substituted or unsubstituted, saturated or unsaturated ring, $R_1$ and $R_{13}$ are independently a hydrogen atom, a substituted or unsubstituted alkyl group including 1 to 50 carbon atoms, a substituted or unsubstituted aryl group including 6 to 50 ring carbon atoms, a substituted or unsubstituted monovalent heterocyclic group including 5 to 50 ring atoms, or a group represented by the formula (2).

In one embodiment, the compound represented by the formula (1) is represented by the following formula (5).

(5)

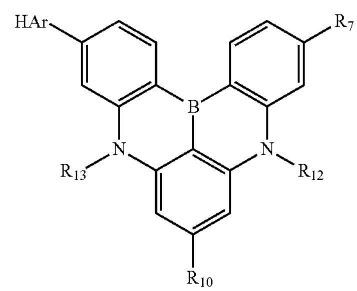

wherein in the formula (5), $R_7$, $R_{10}$, $R_{12}$, $R_{13}$ and HAr are as defined in the formula (1).

In one embodiment, $R_7$, $R_{10}$, $R_{12}$ and $R_{13}$ are independently a hydrogen atom, a substituted or unsubstituted alkyl group including 1 to 50 carbon atoms, a substituted or unsubstituted aryl group including 6 to 50 ring carbon atoms, and a substituted or unsubstituted monovalent heterocyclic group including 5 to 50 ring atoms, or a group represented by the formula (2).

In one embodiment, the compound represented by the formula (1) is represented by the following formula (6).

(6)

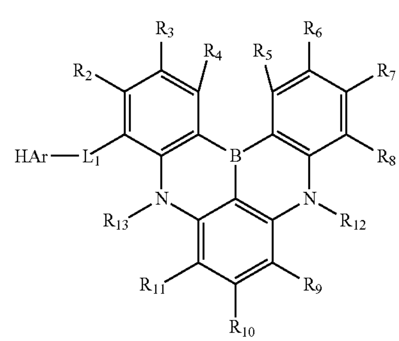

wherein in the formula (6), $R_2$ to $R_{13}$, $L_1$ and HAr are as defined in the formula (1).

In one embodiment, the compound represented by the formula (1) is represented by the following formula (7).

(7)

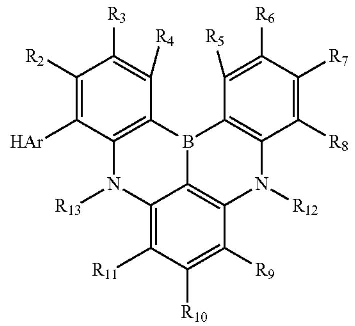

wherein in the formula (7), $R_2$ to $R_{13}$ and HAr are as defined in the formula (1).

In one embodiment, HAr is a substituted or unsubstituted monovalent heterocyclic group including 5 to 18 ring atoms.

In one embodiment, the substituent in the case of "substituted or unsubstituted" in the compound represented by the formula (1) is selected from the group consisting of an alkyl group including 1 to 50 carbon atoms, a haloalkyl group including 1 to 50 carbon atoms, an alkenyl group including 2 to 50 carbon atoms, an alkynyl group including 2 to 50 carbon atoms, a cycloalkyl group including 3 to 50 ring carbon atoms, an alkoxy group including 1 to 50 carbon atoms, an alkylthio group including 1 to 50 carbon atoms, an aryloxy group including 6 to 50 ring carbon atoms, an arylthio group including 6 to 50 ring carbon atoms, an aralkyl group including 7 to 50 carbon atoms, $—Si(R_{41})(R_{42})(R_{43})$, $—C(=O)R_{44}$, $—COOR_{45}$, $—S(=O)_2R_{46}$, $—P(=O)(R_{47})(R_{48})$, $—Ge(R_{49})(R_{50})(R_{51})$, $—N(R_{52})(R_{53})$, a hydroxy group, a halogen atom, a cyano group, a nitro group, an aryl group including 6 to 50 ring carbon atoms, and a monovalent heterocyclic group including 5 to 50 ring atoms;

$R_{41}$ to $R_{53}$ are independently a hydrogen atom, an alkyl group including 1 to 50 carbon atoms, an aryl group including 6 to 50 ring carbon atoms, or a monovalent heterocyclic group including 5 to 50 ring atoms; and when two or more of each of $R_{41}$ to $R_{53}$ are present, the two or more of each of $R_{41}$ to $R_{53}$ may be the same or different.

In one embodiment, the substituent in the case of "substituted or unsubstituted" in the compound represented by the formula (1) is selected from the group consisting of an alkyl group including 1 to 50 carbon atoms, an aryl group including 6 to 50 ring carbon atoms, and a monovalent heterocyclic group including 5 to 50 ring atoms.

Specific examples of the groups of the compound represented by the formula (1), the arbitrary substituent and the halogen atoms are the same as those described above.

In one embodiment, HAr is a substituted or unsubstituted carbazolyl group.

Specific examples of the compound represented by the formula (1) include, for example, the following compounds.

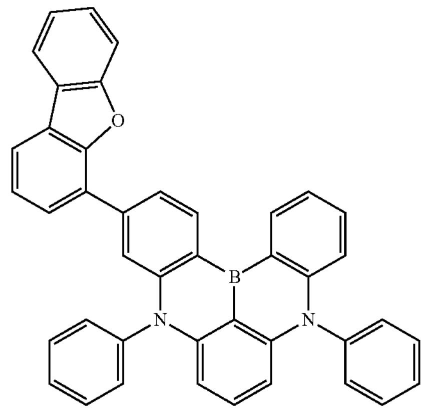

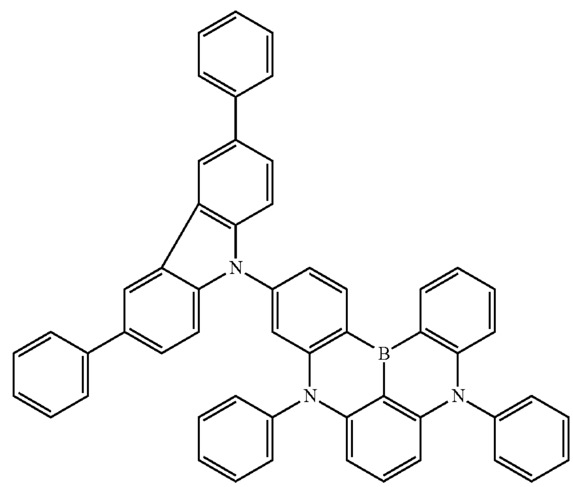

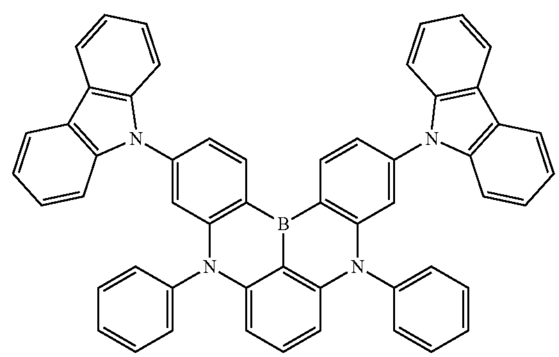

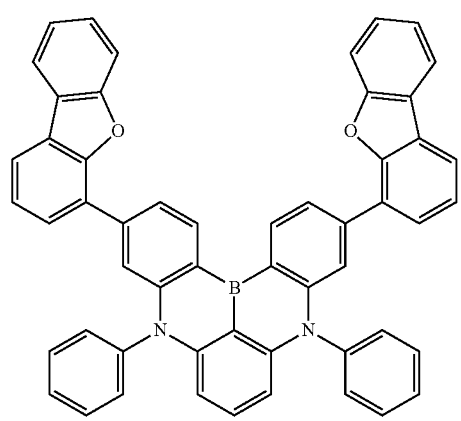

-continued
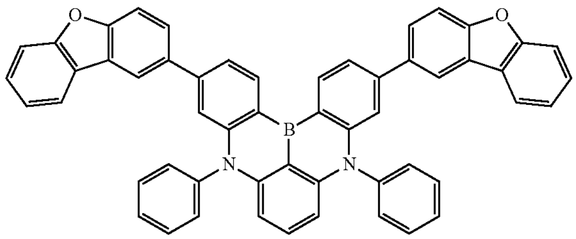
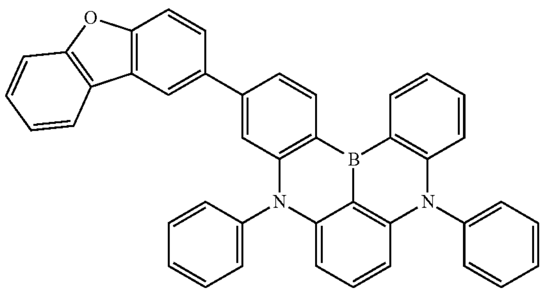
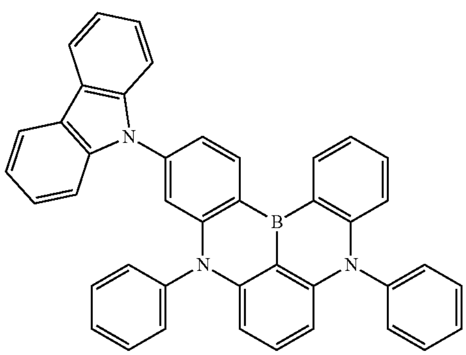
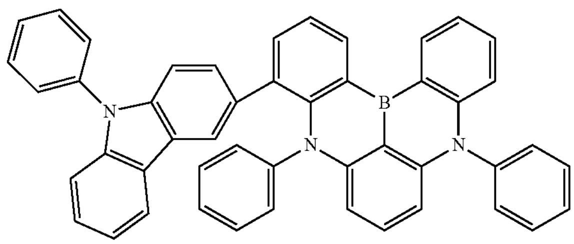
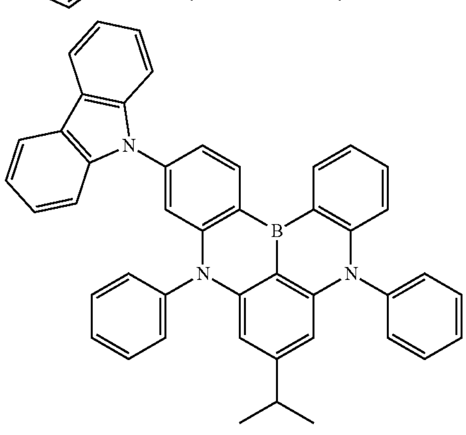
-continued
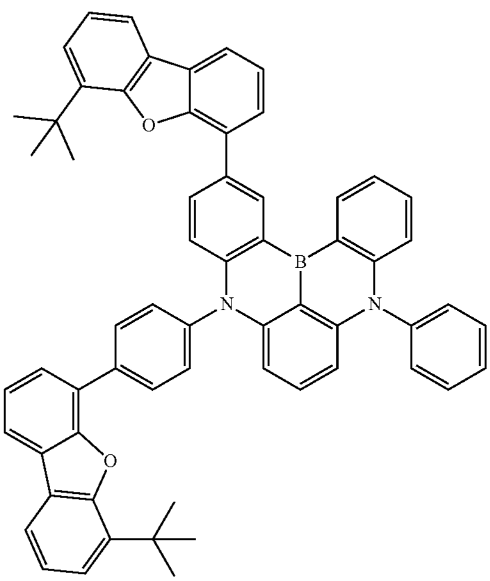
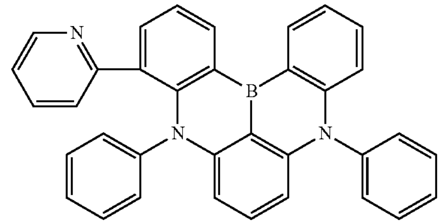
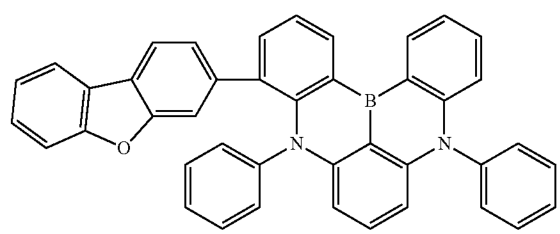
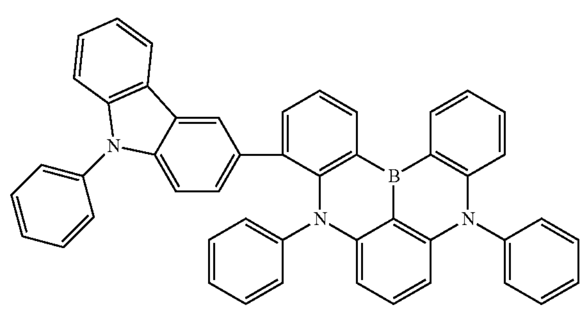
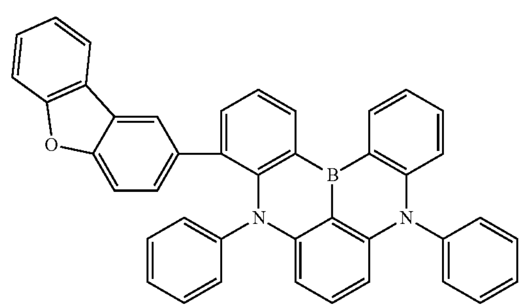

-continued
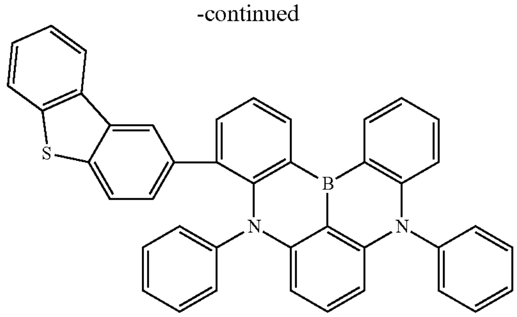
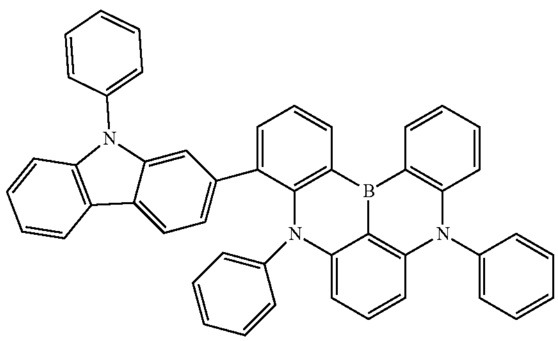
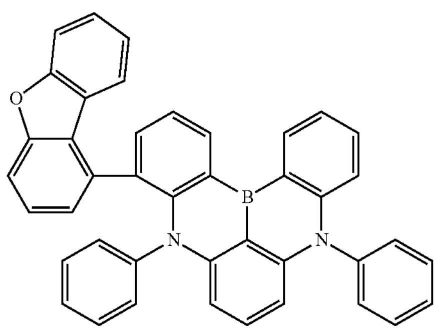
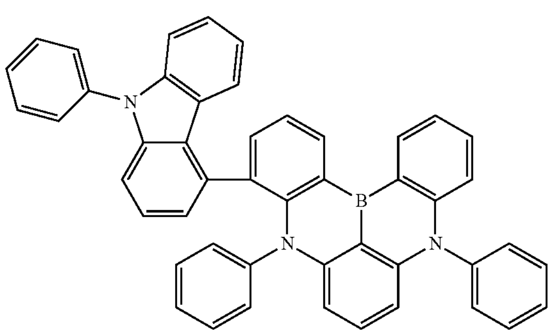
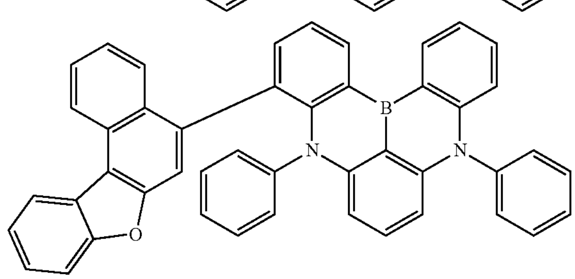
-continued
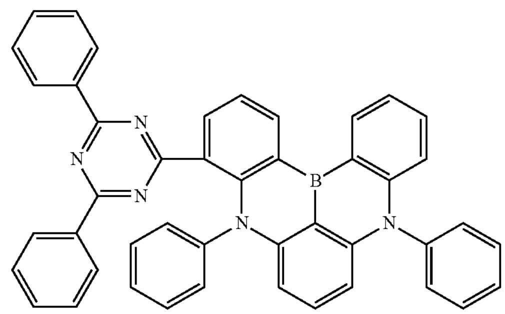
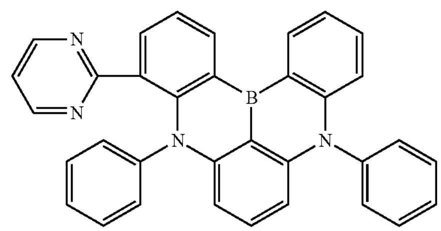
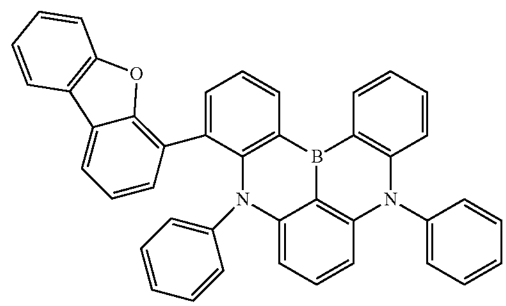
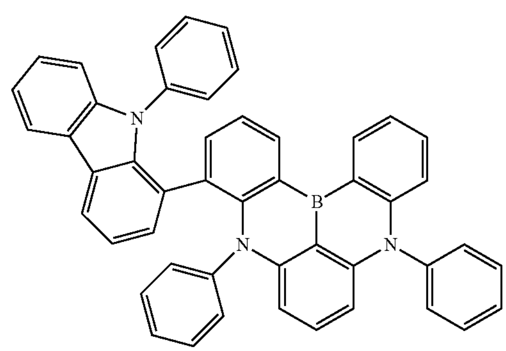
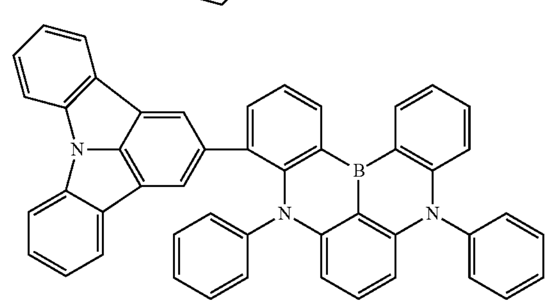

-continued
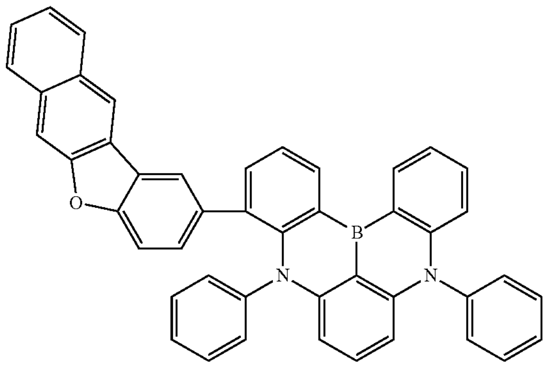
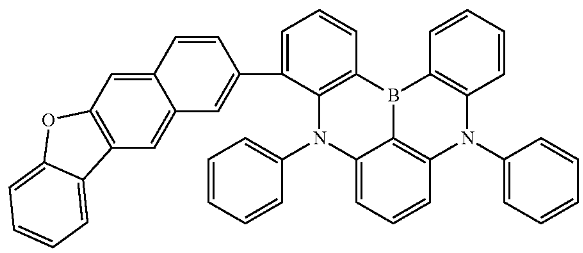
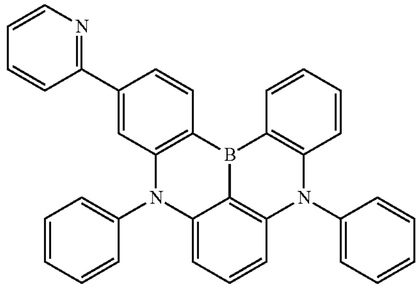
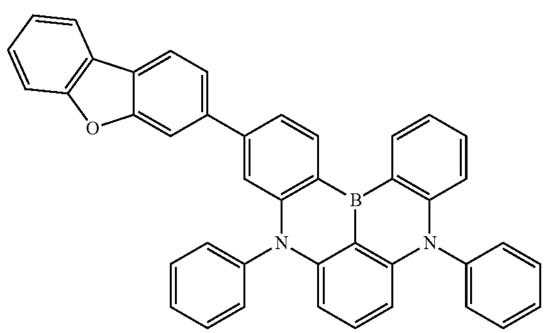
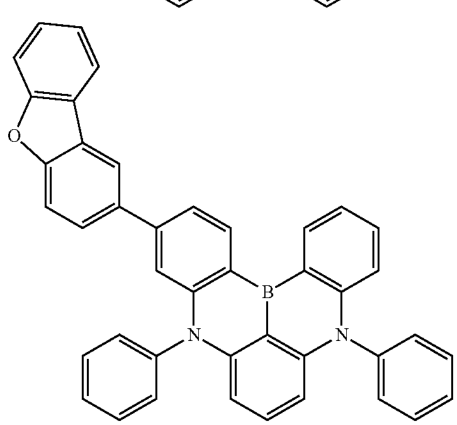
-continued
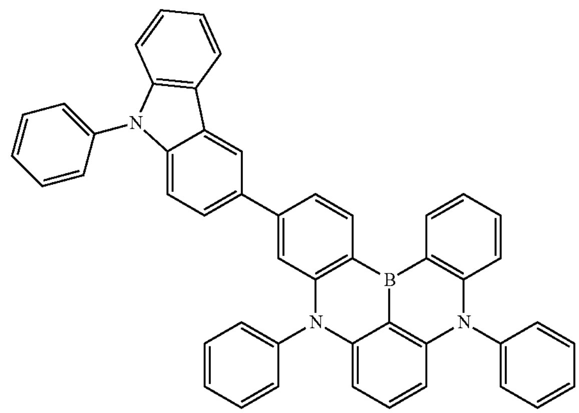
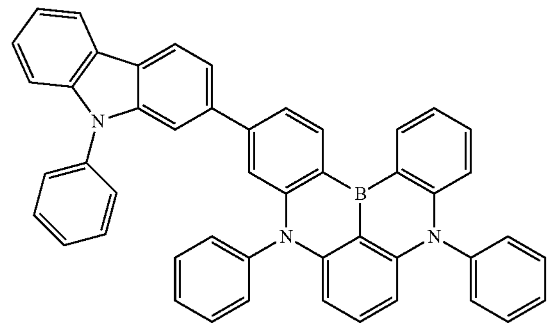
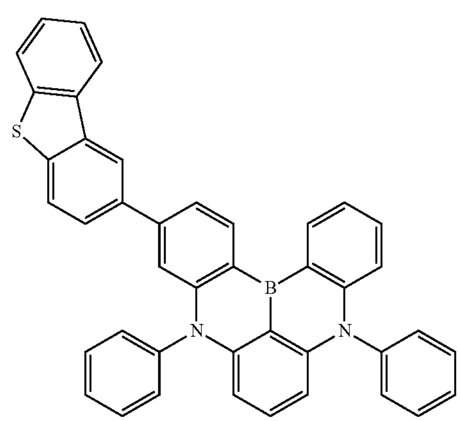
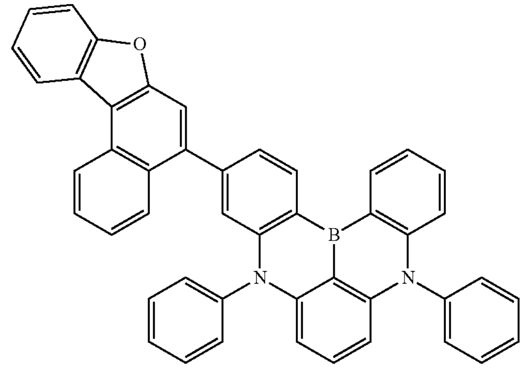

-continued
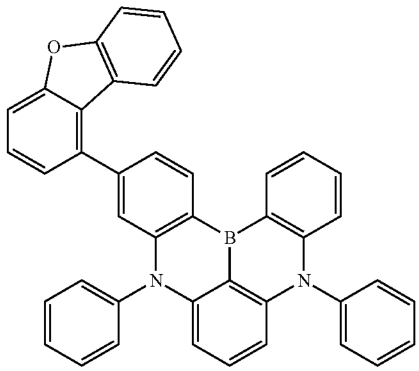
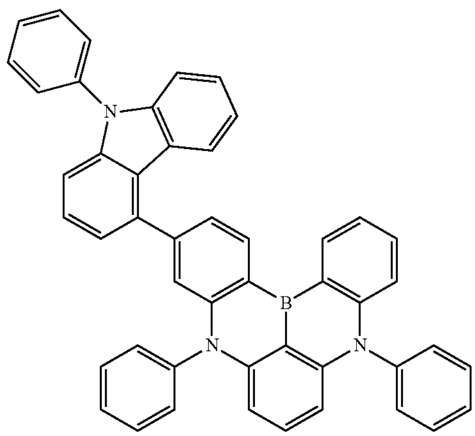
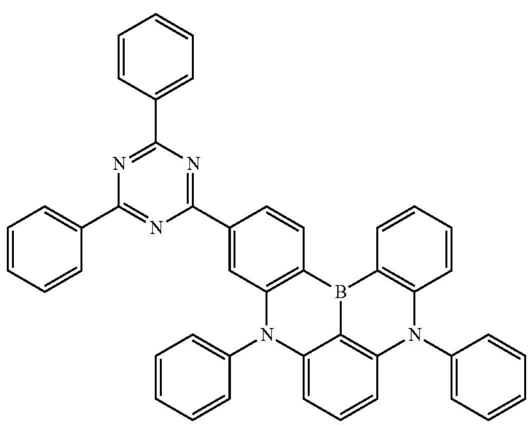
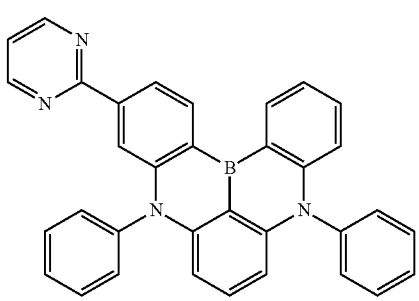
-continued
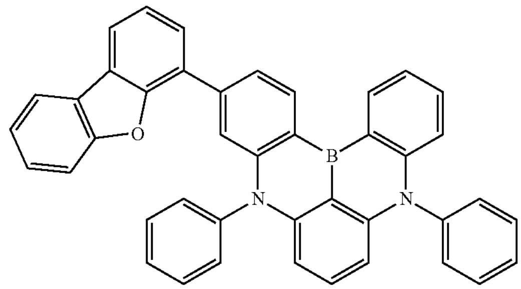
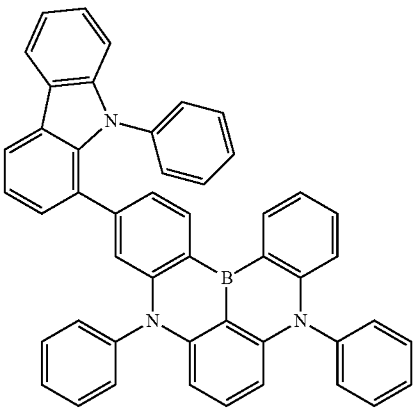
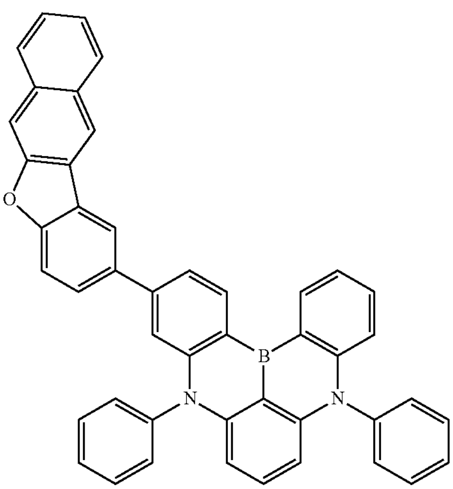
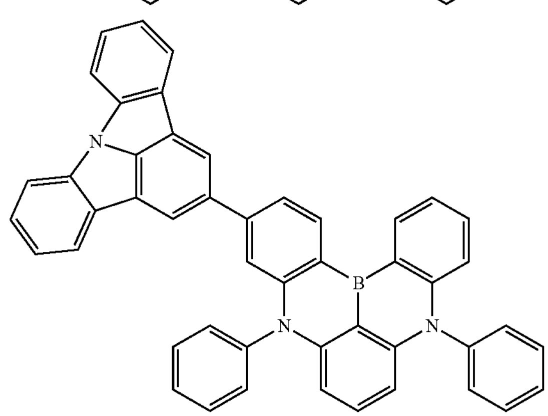

-continued
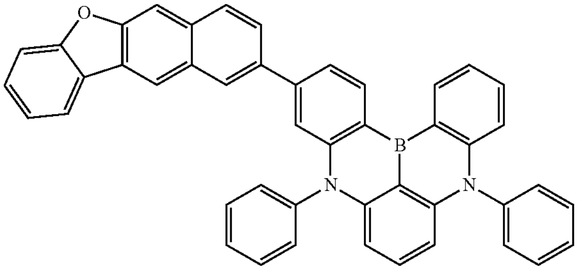
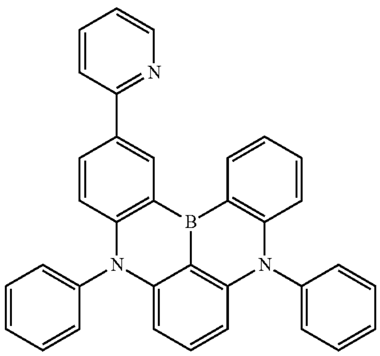
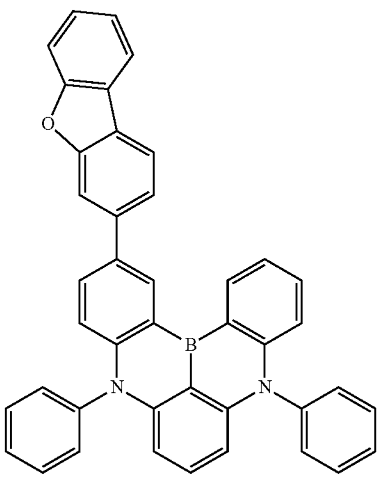
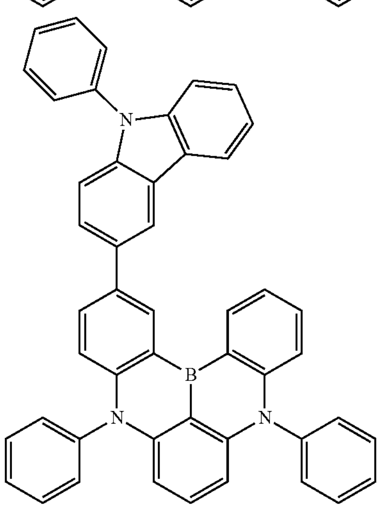
-continued
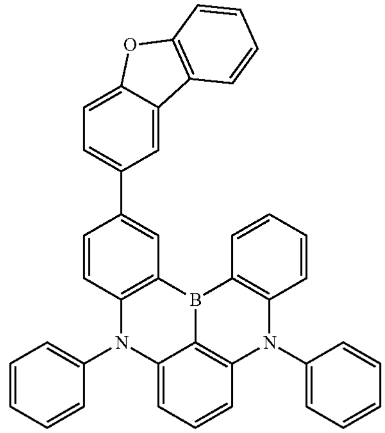
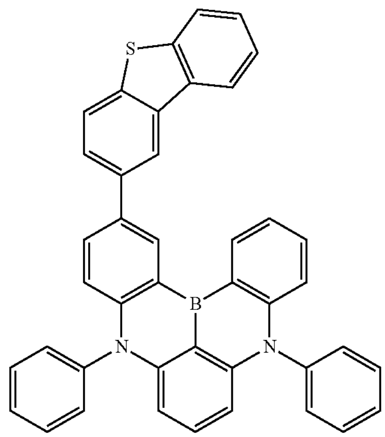
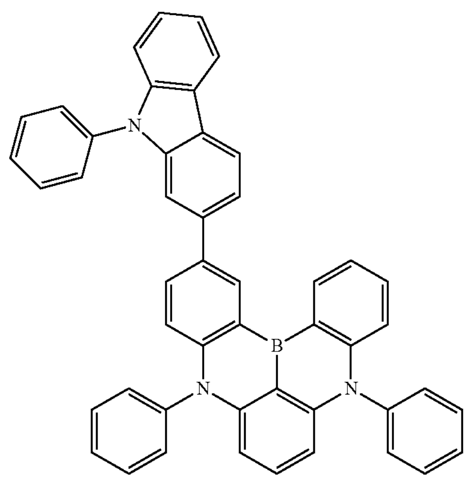
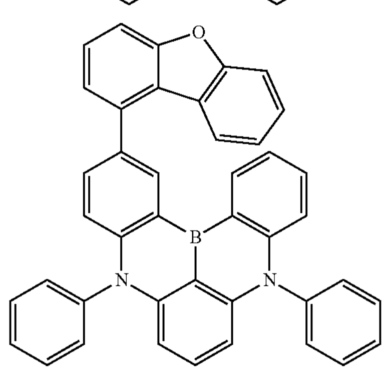

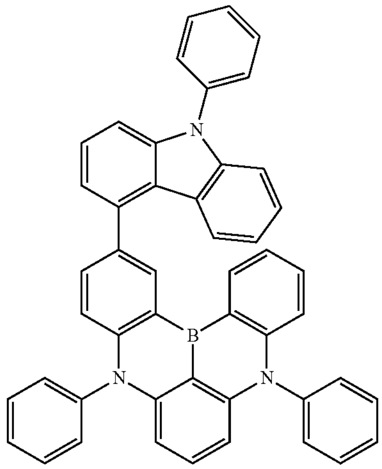
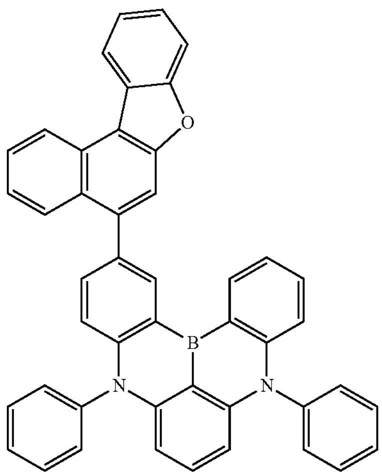
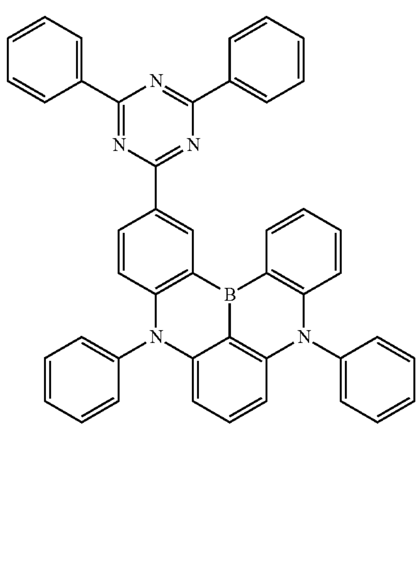
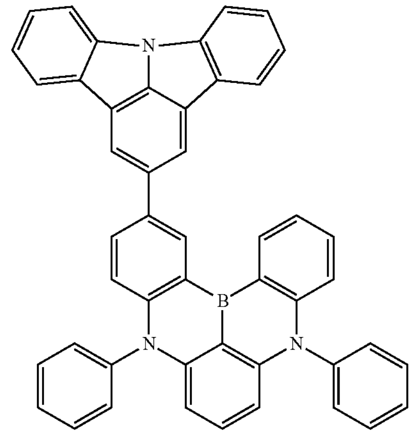
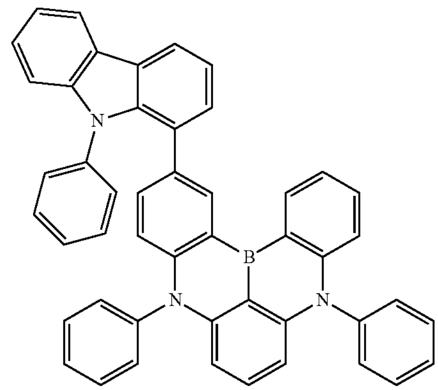
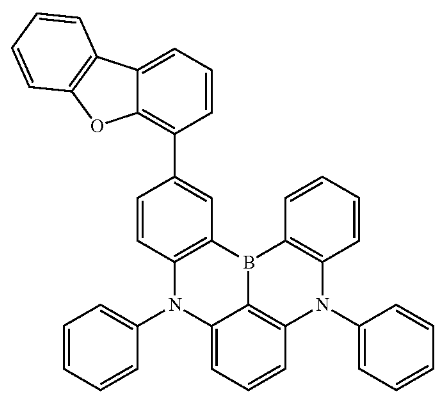
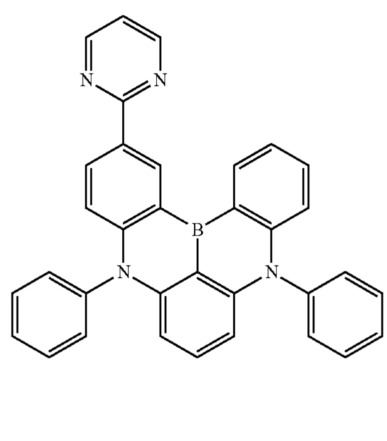

-continued
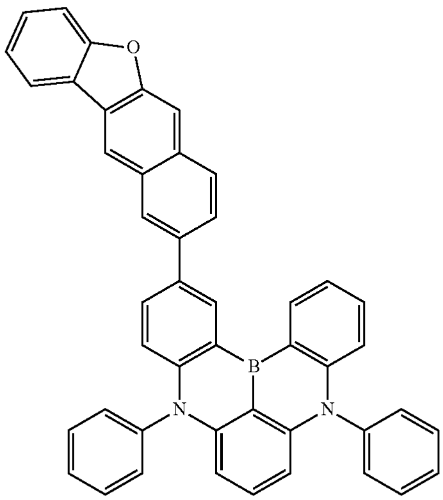
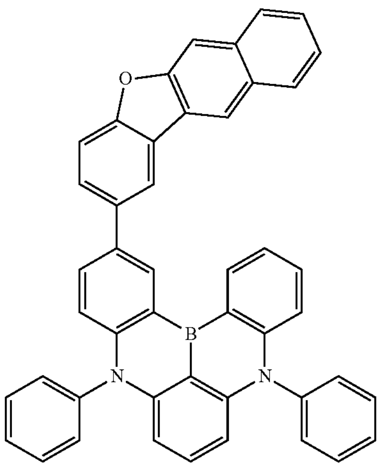
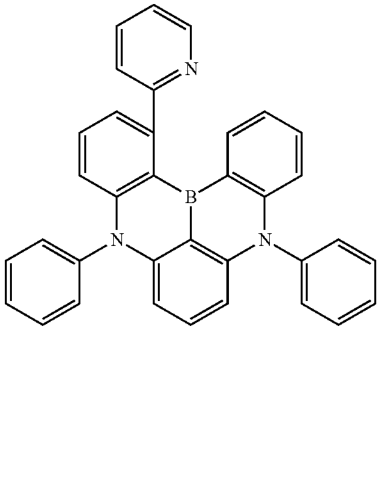
-continued
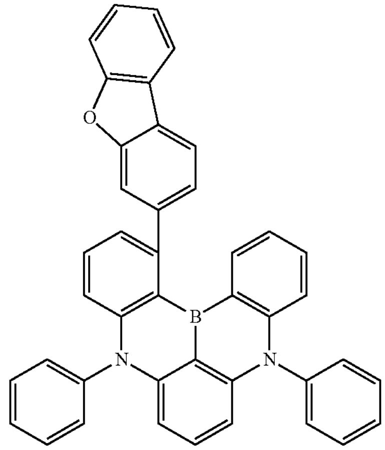
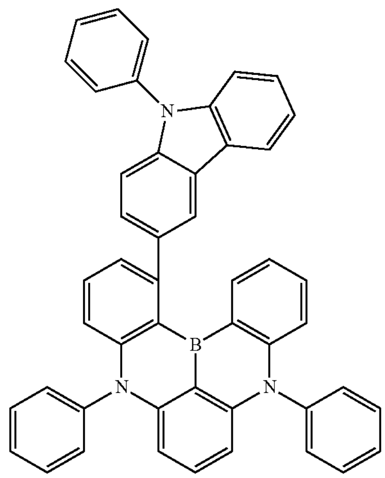
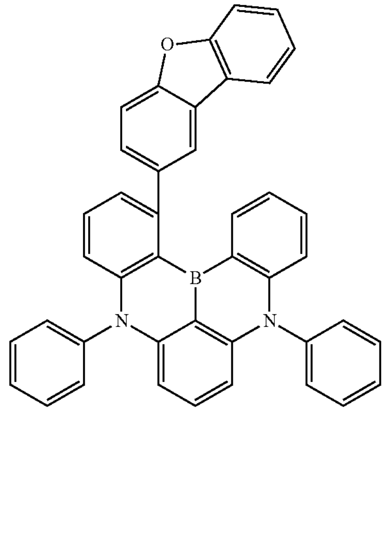

-continued
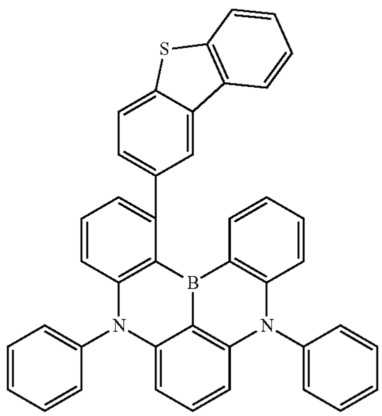
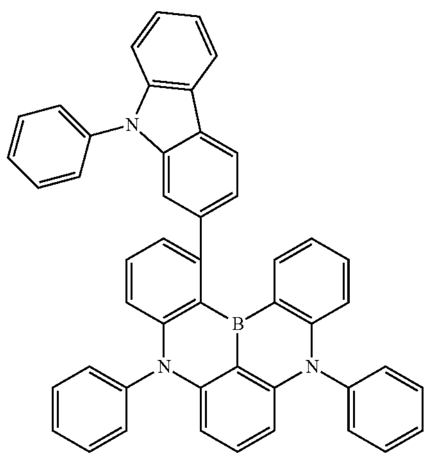
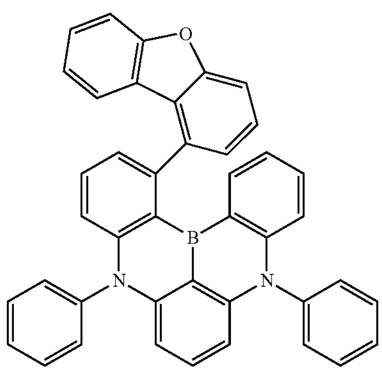
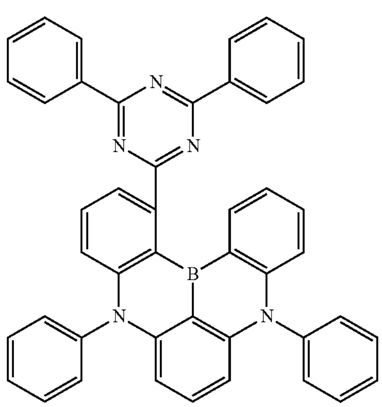
-continued
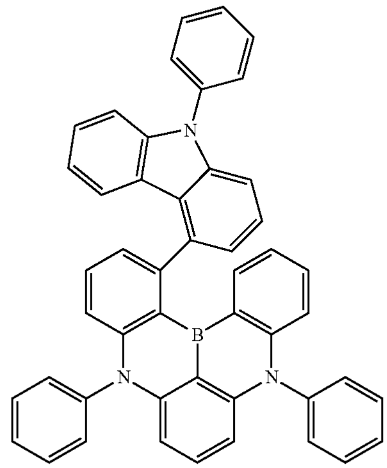
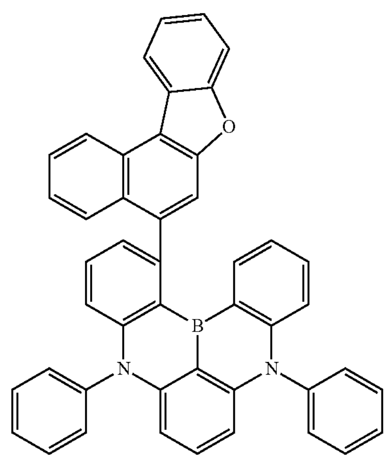
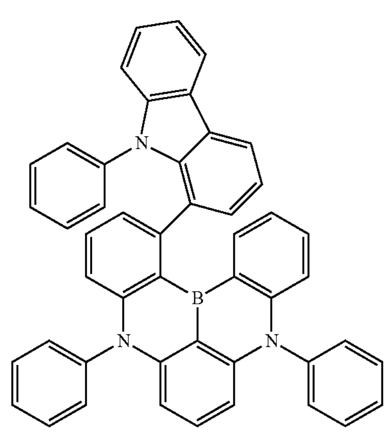

-continued
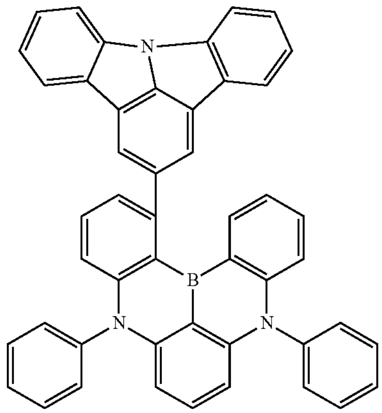
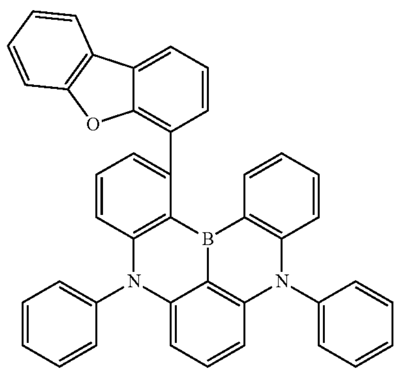
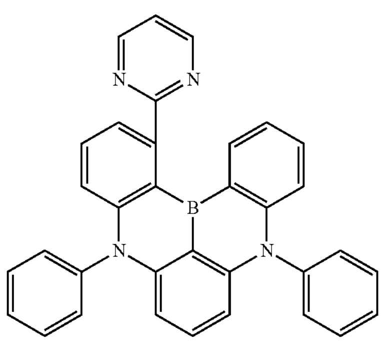
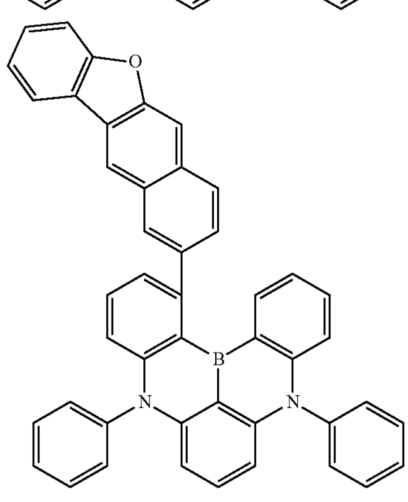
-continued
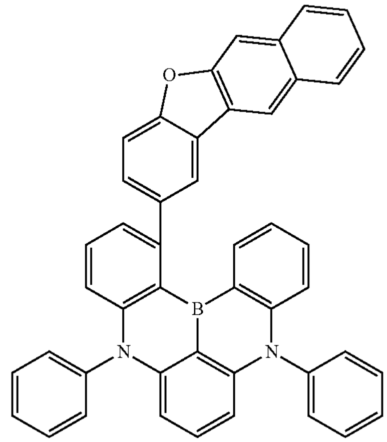
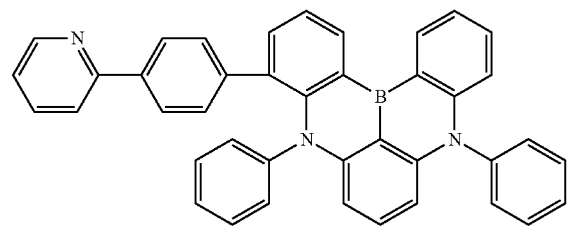
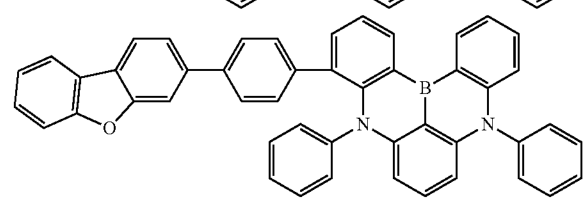
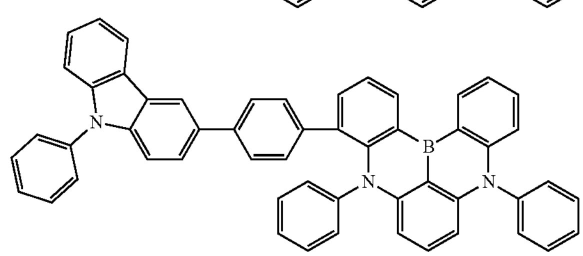
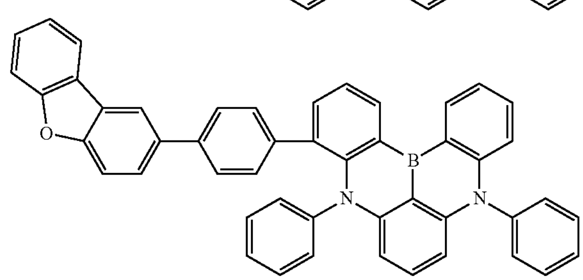
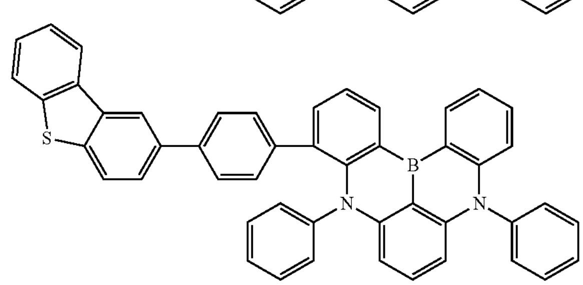

-continued
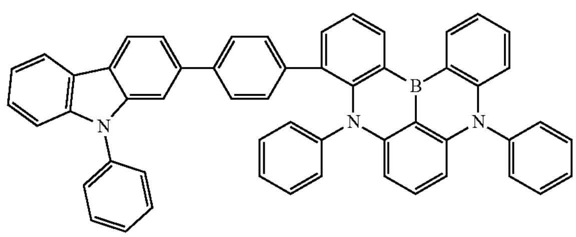
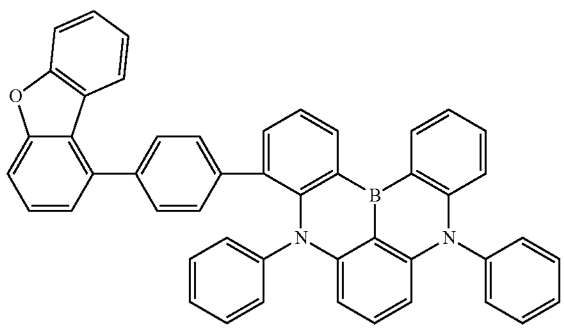
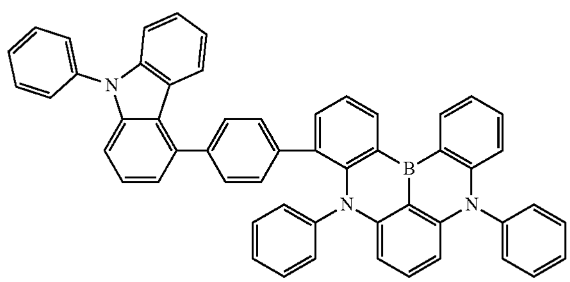
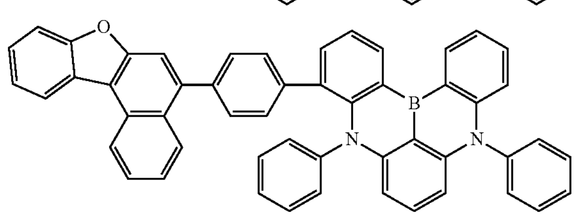
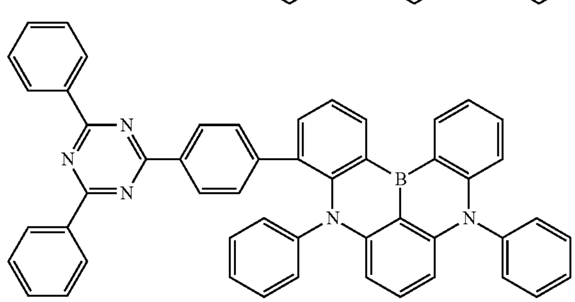
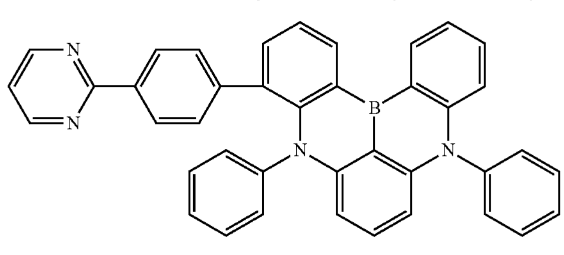
-continued
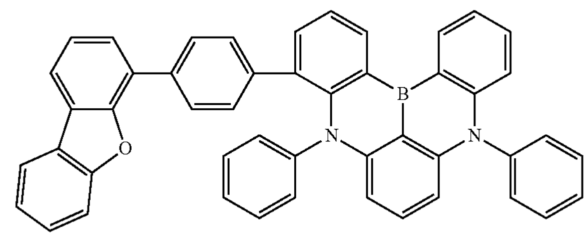
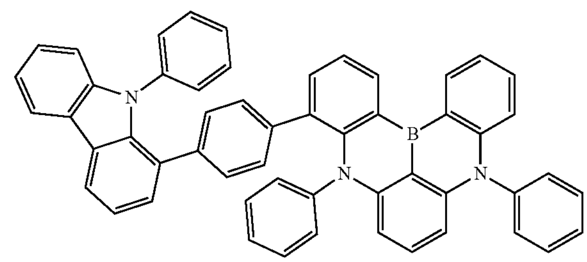
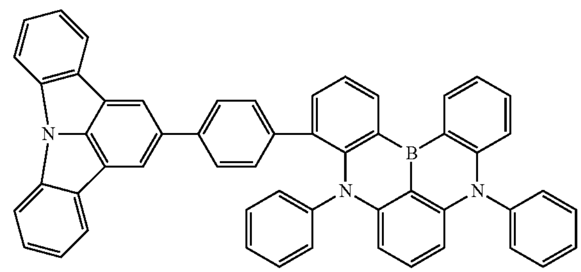
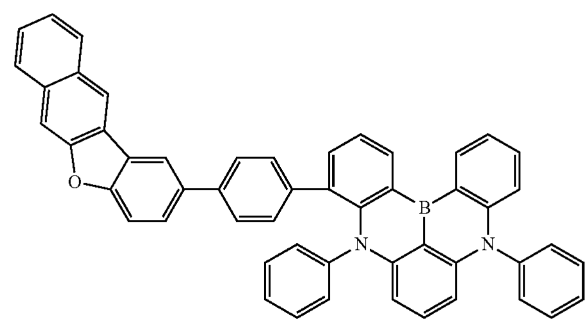
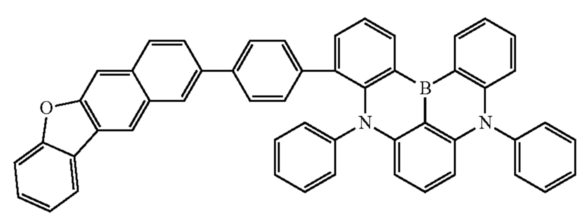
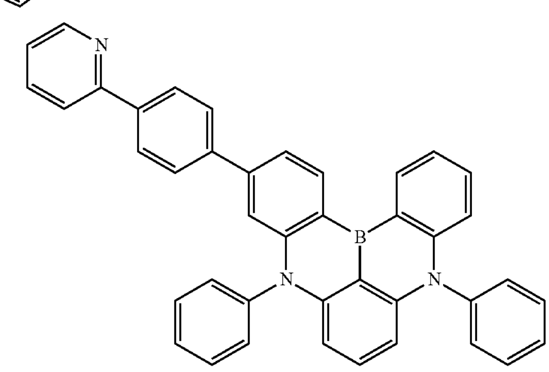

-continued
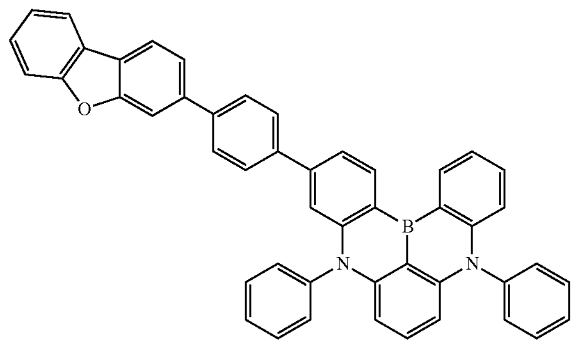
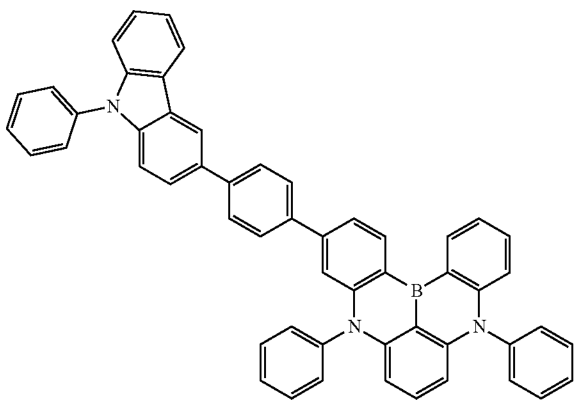
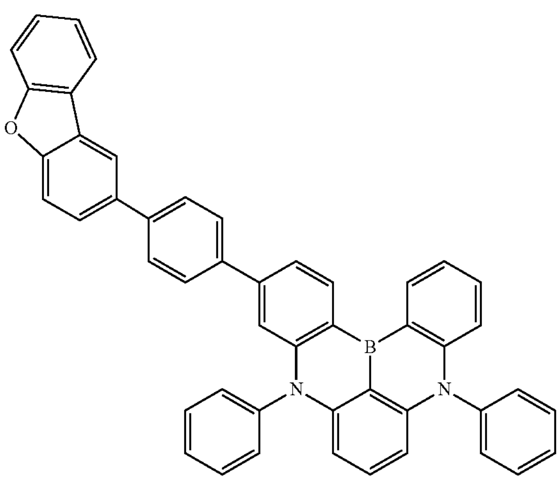
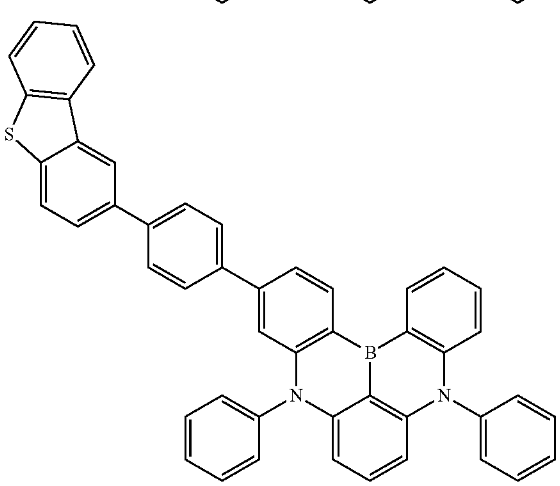
-continued
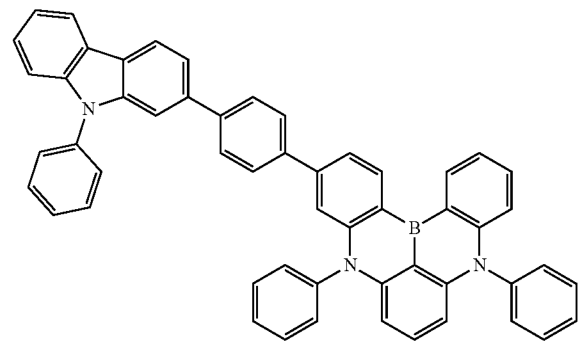
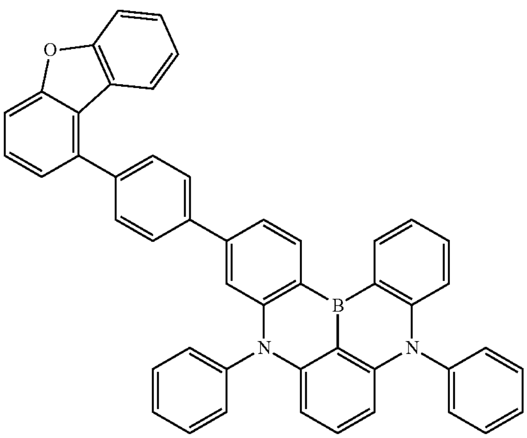
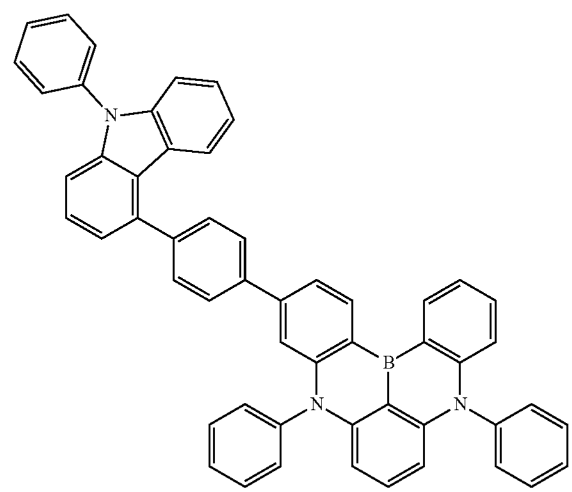
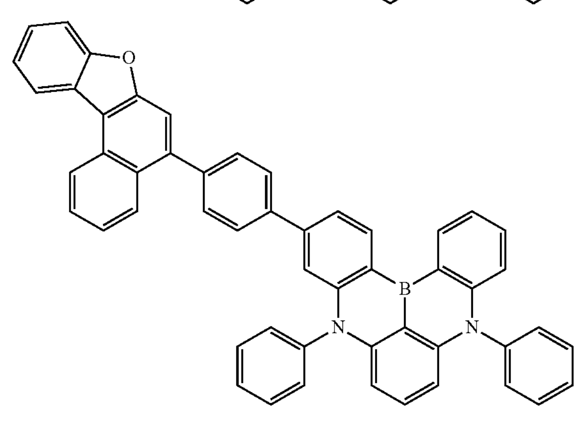

-continued
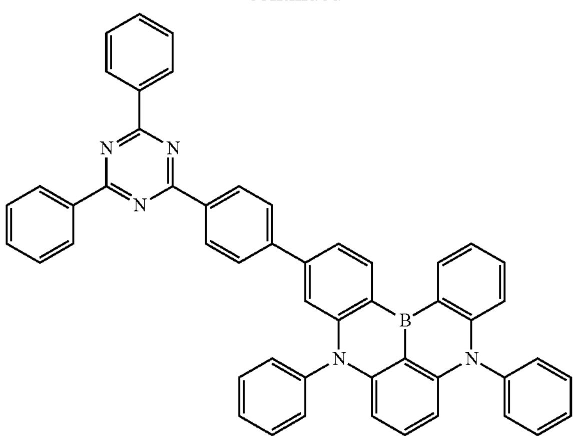
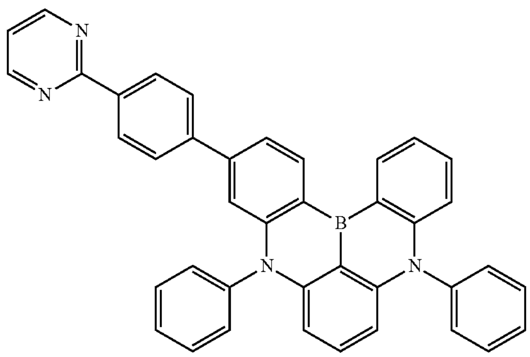
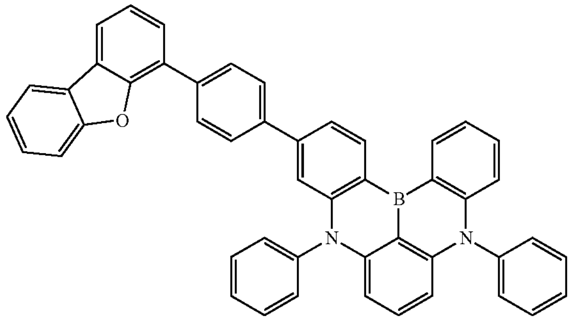
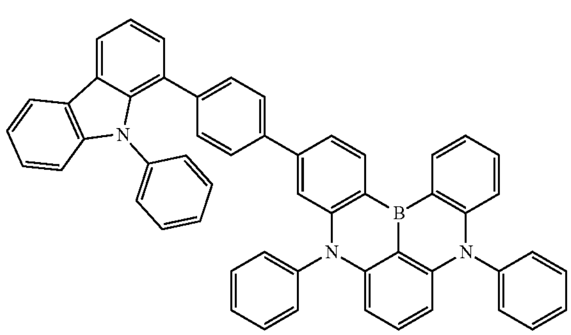
-continued
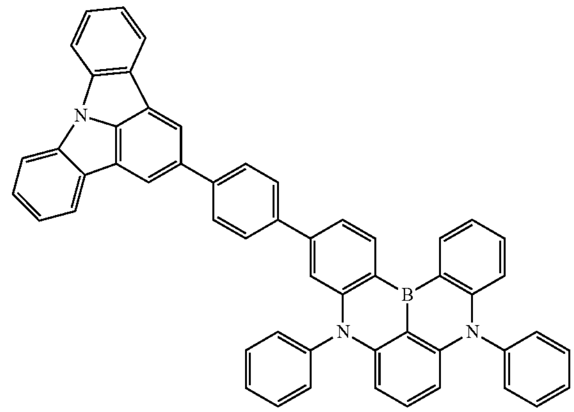
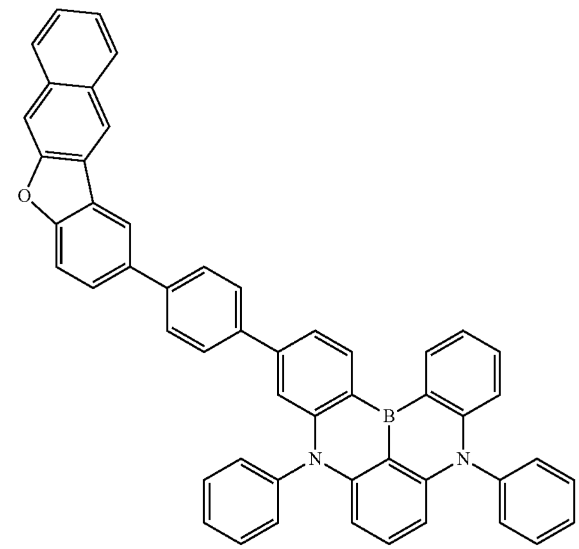
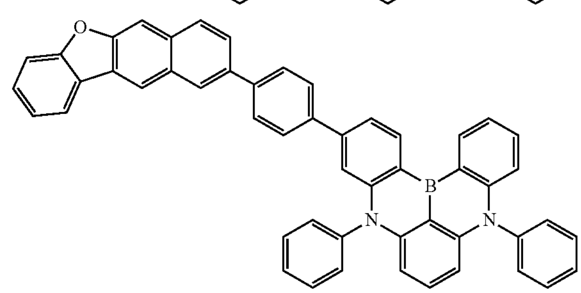
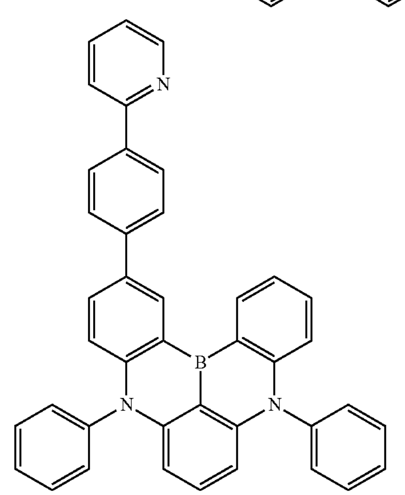

-continued
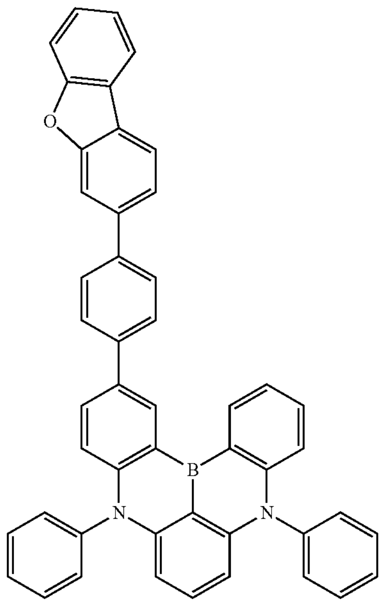
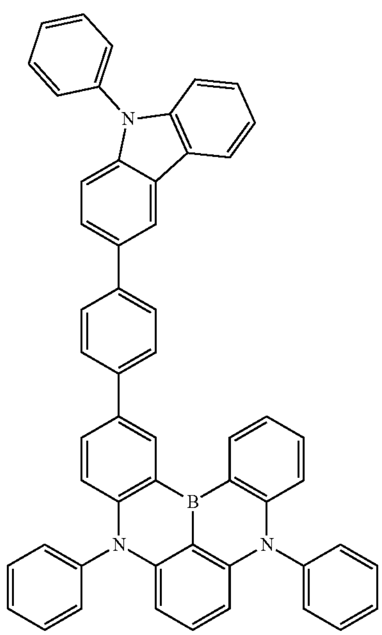
-continued
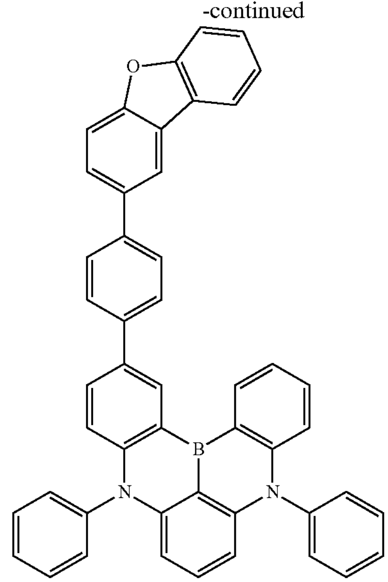
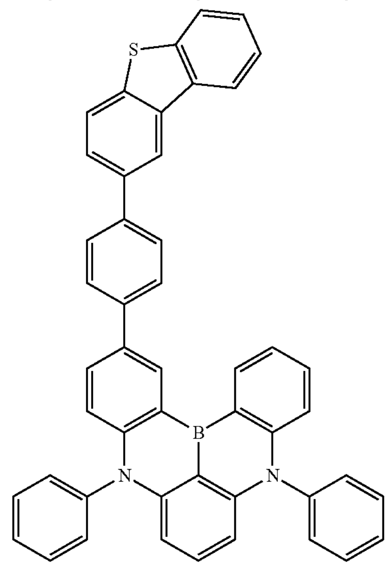
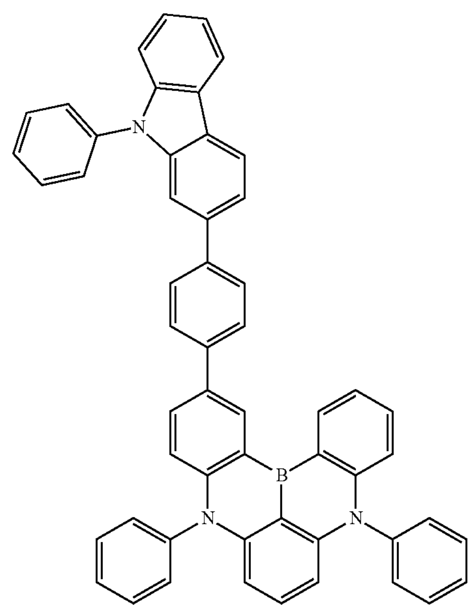

-continued
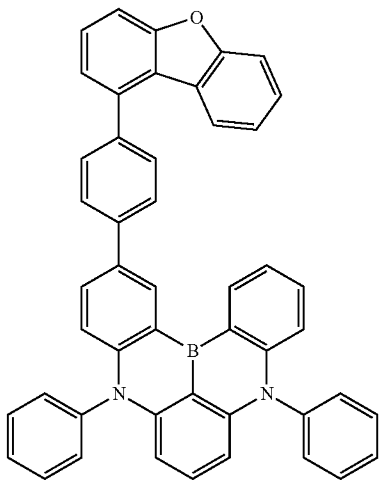
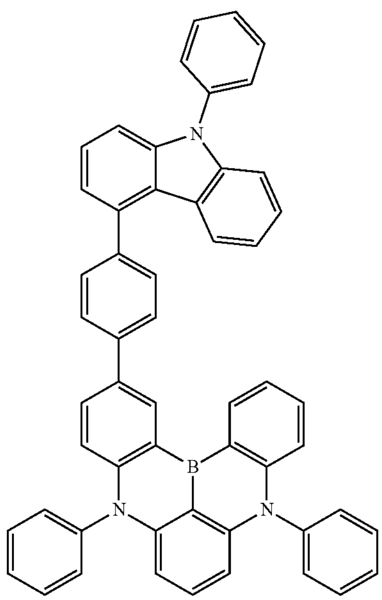
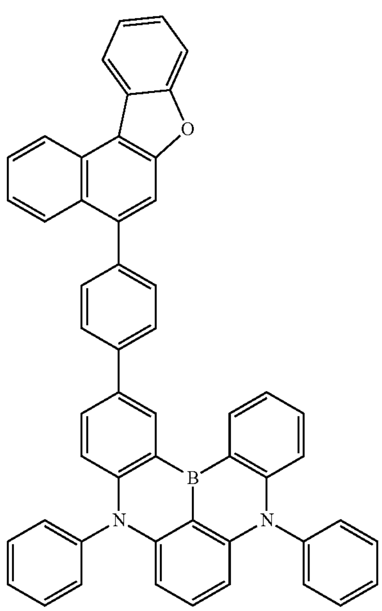
-continued
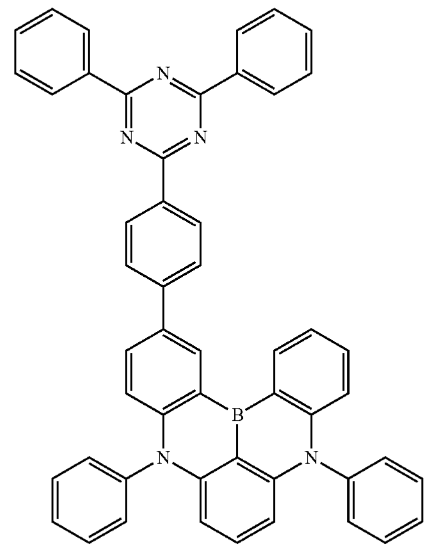
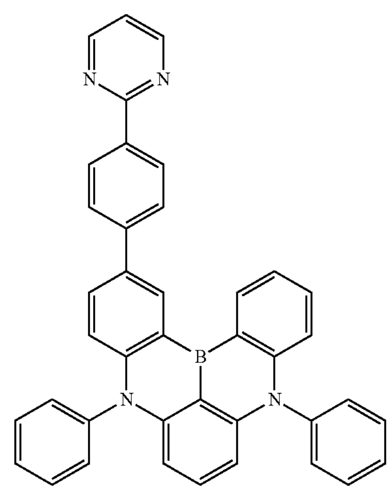
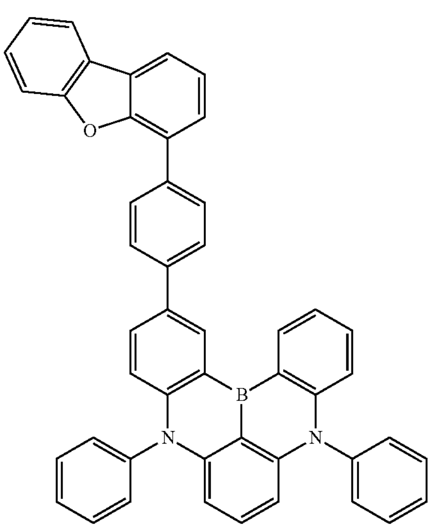

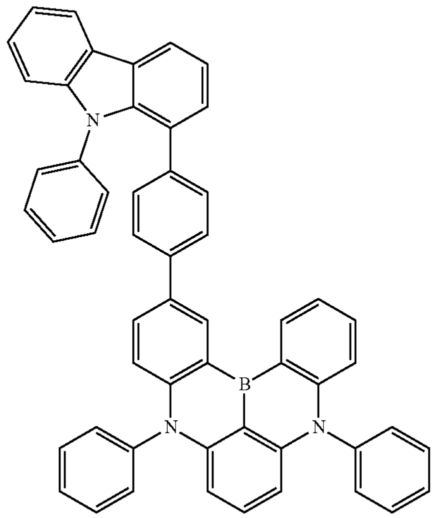
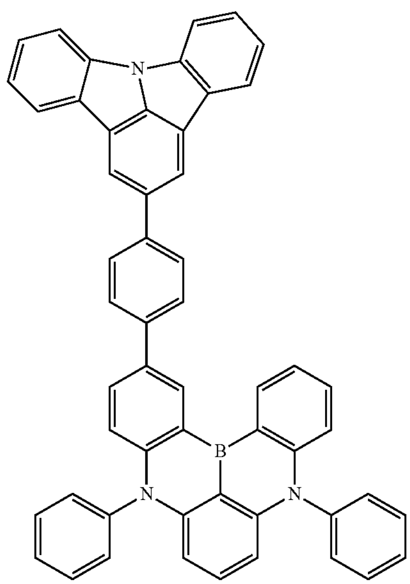
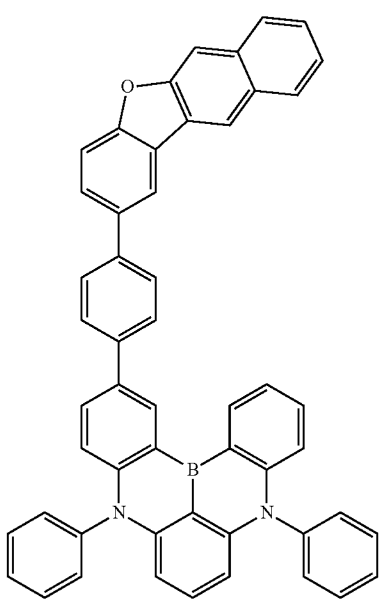
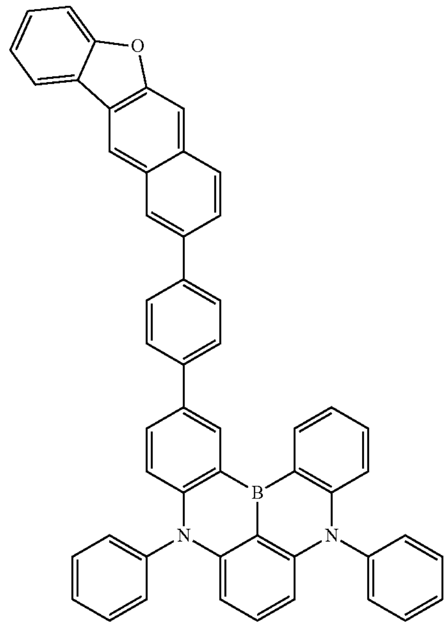
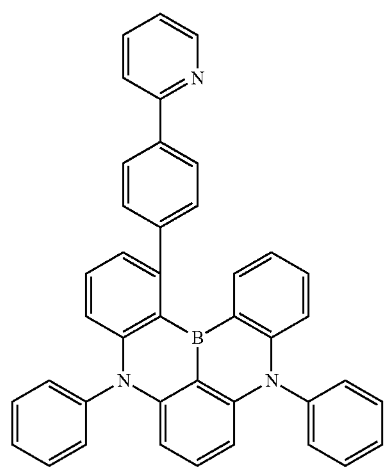
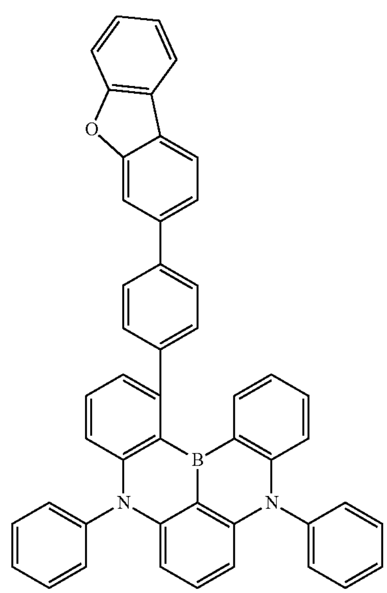

-continued
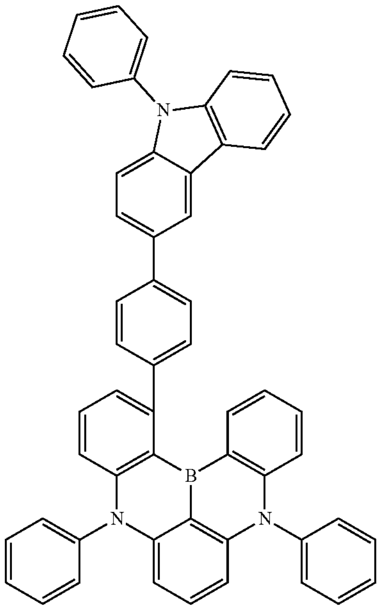
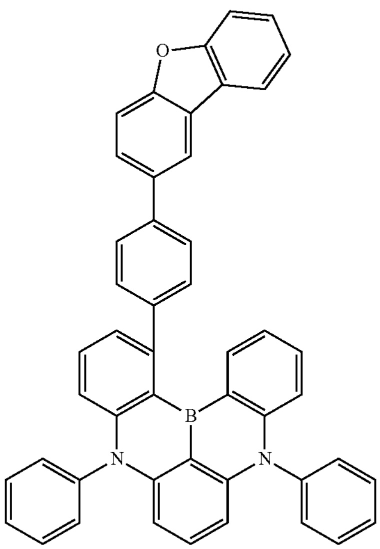
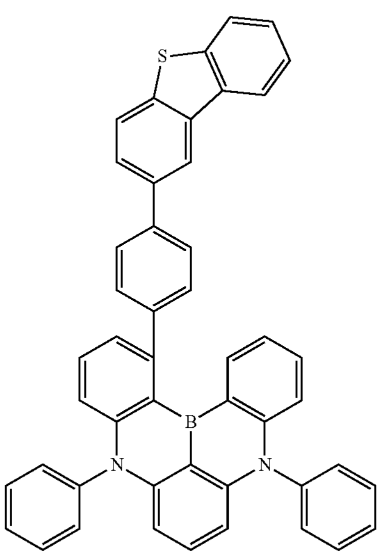
-continued
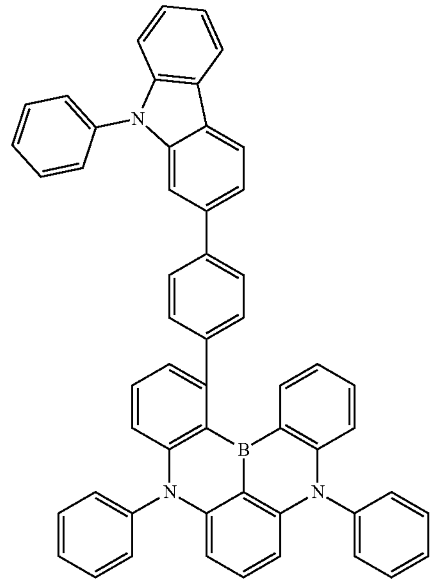
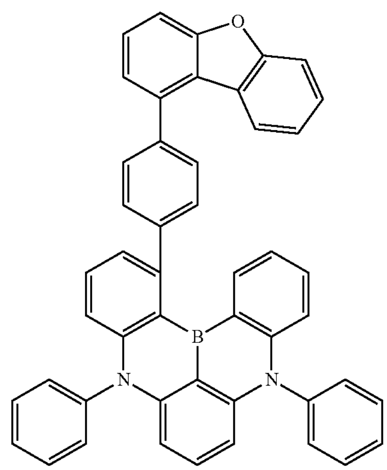
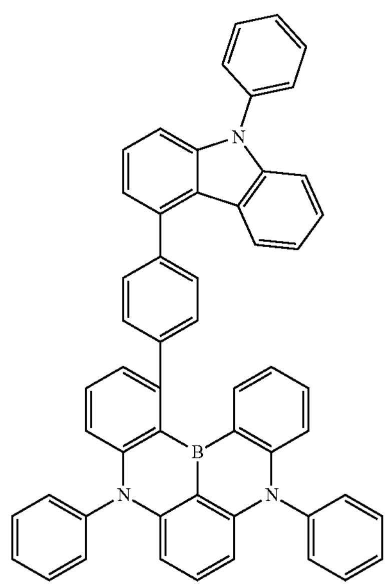

-continued
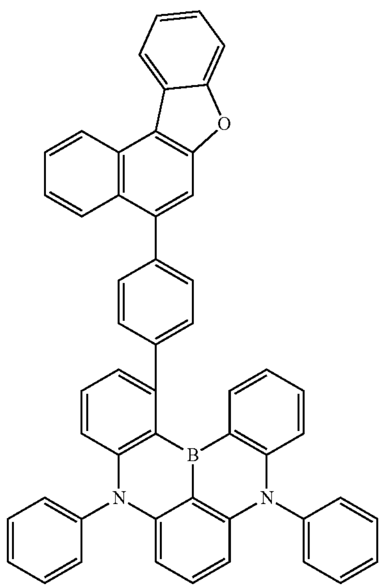
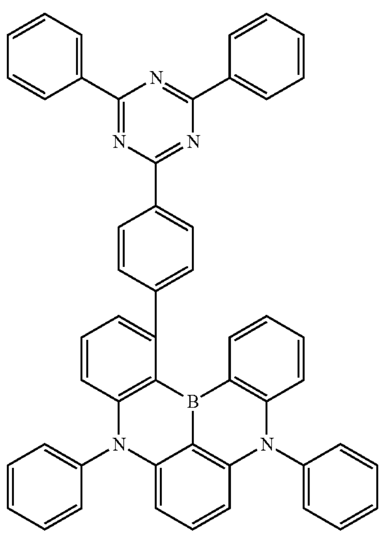
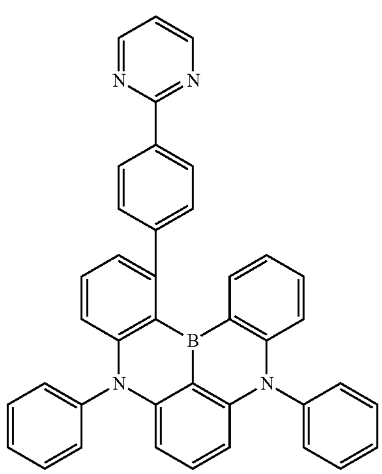
-continued
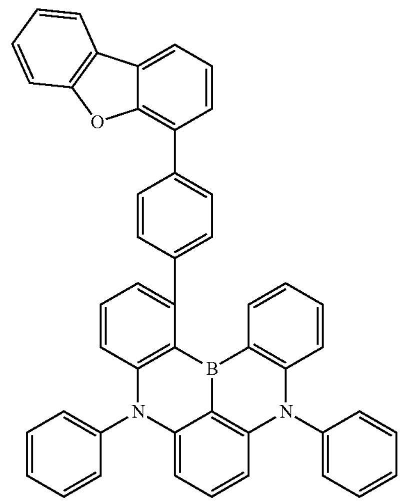
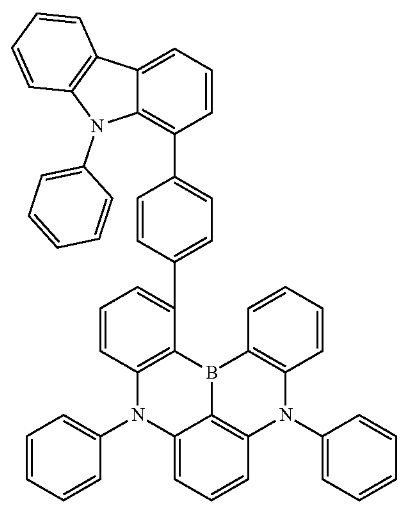
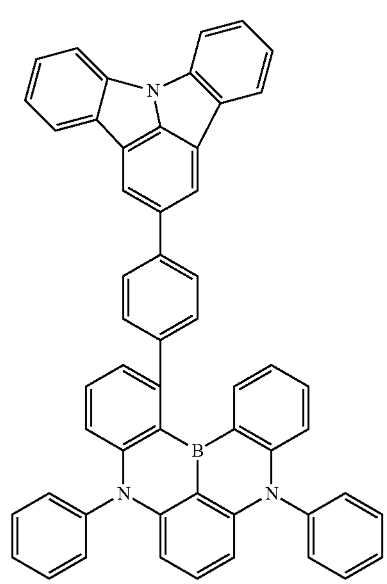

-continued
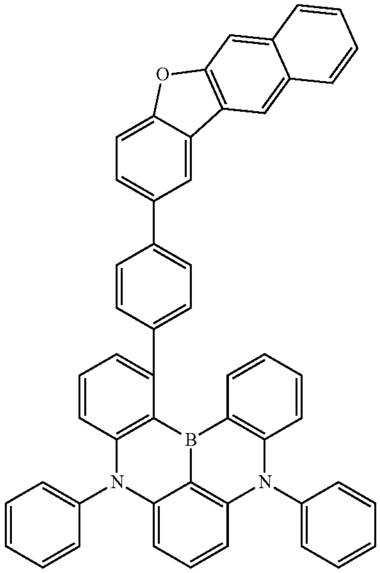
-continued
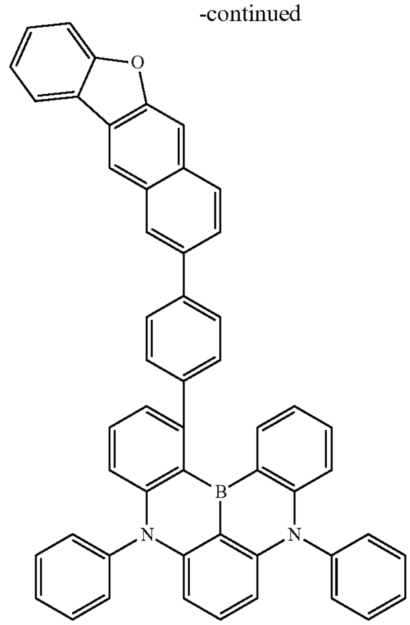
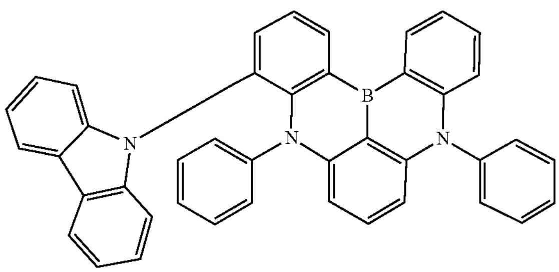
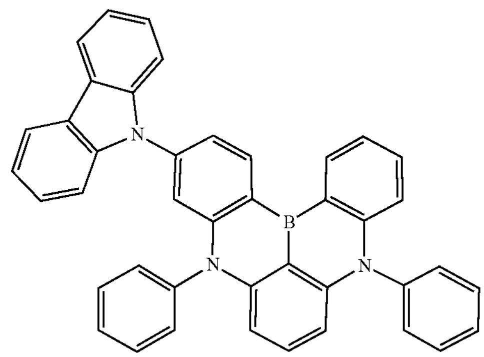
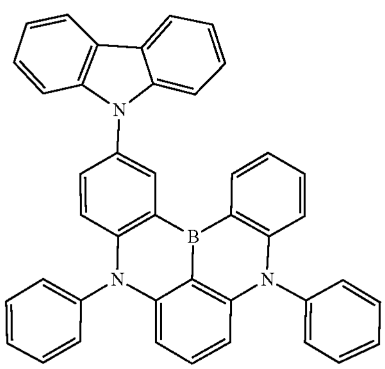
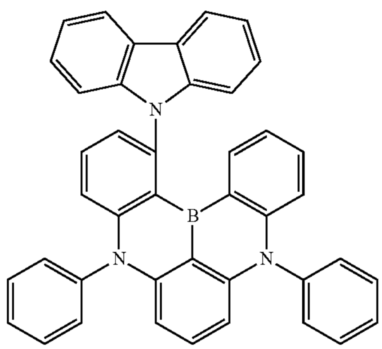
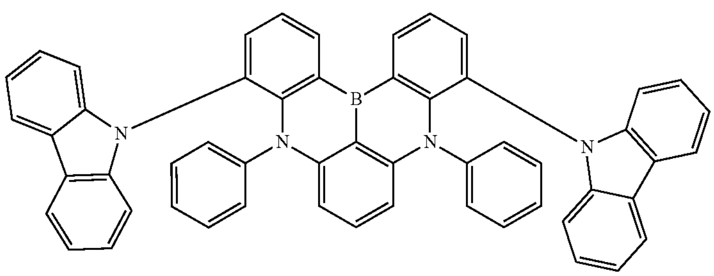

-continued
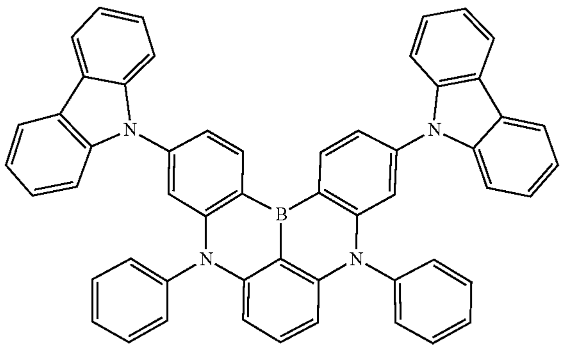
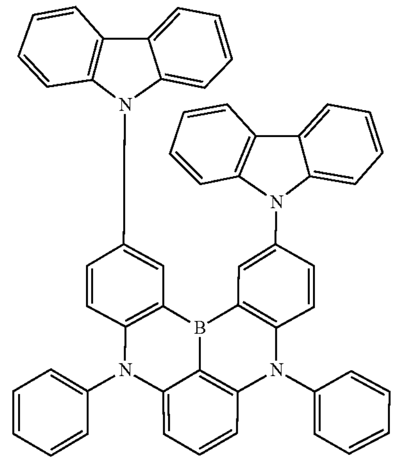
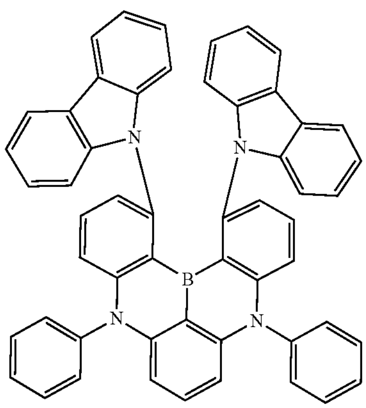
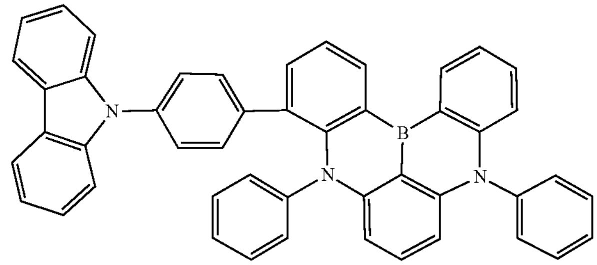
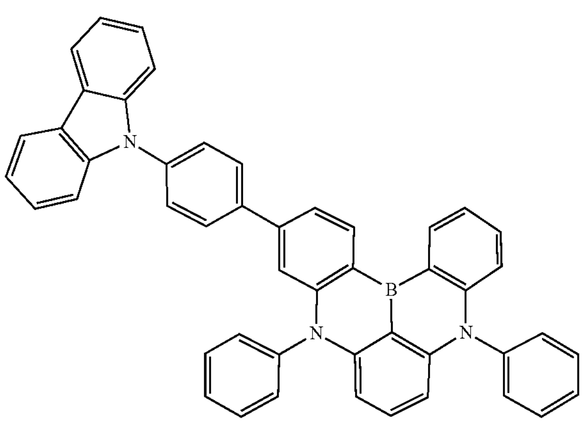
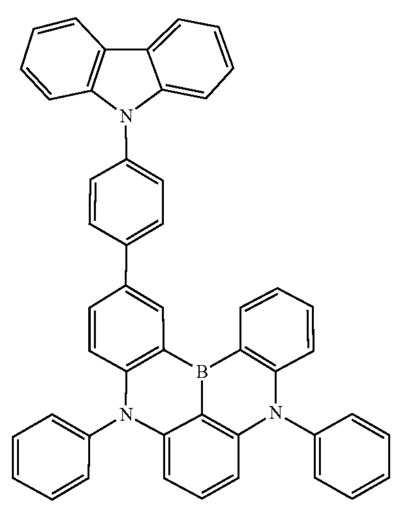

-continued
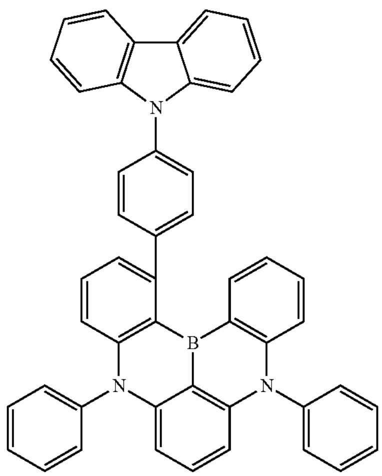
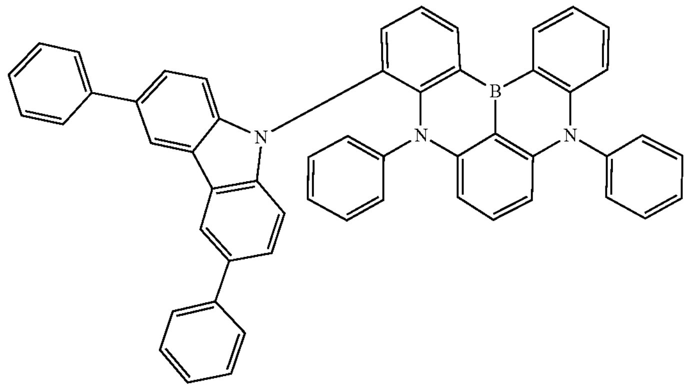
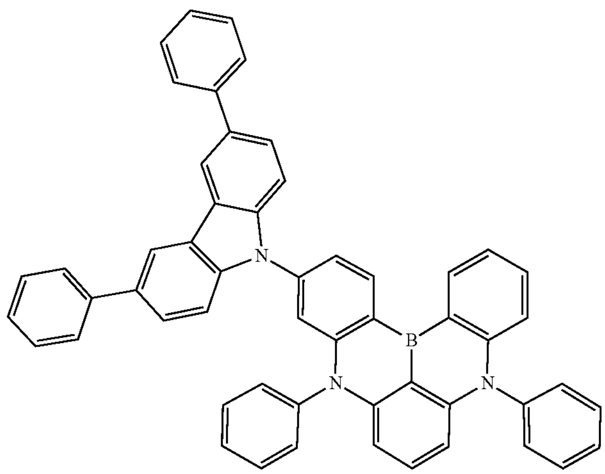
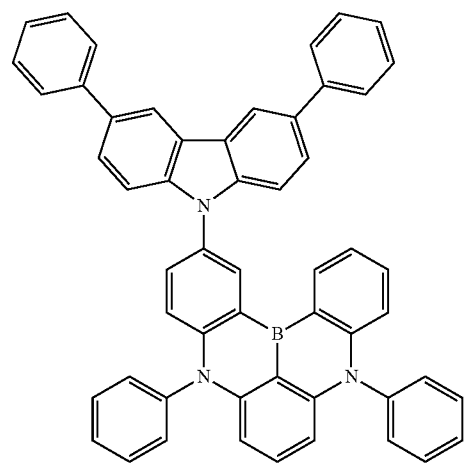
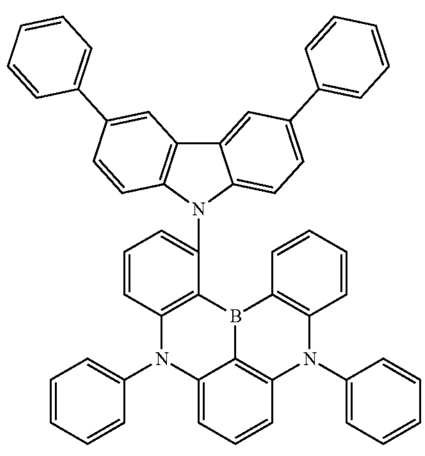

-continued
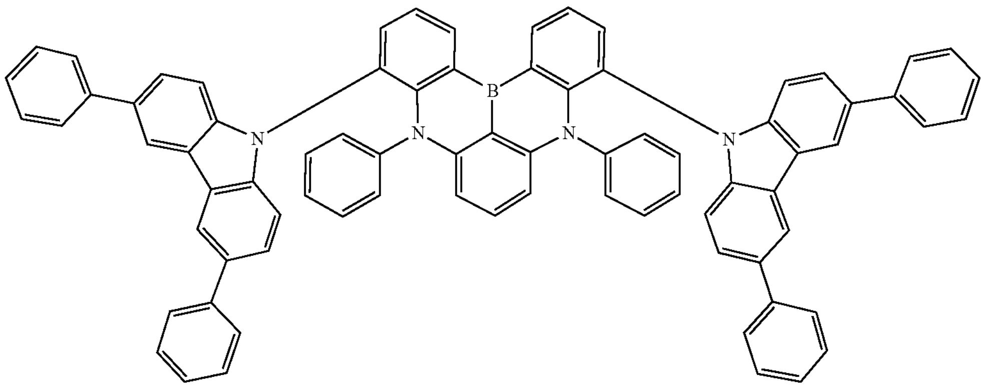
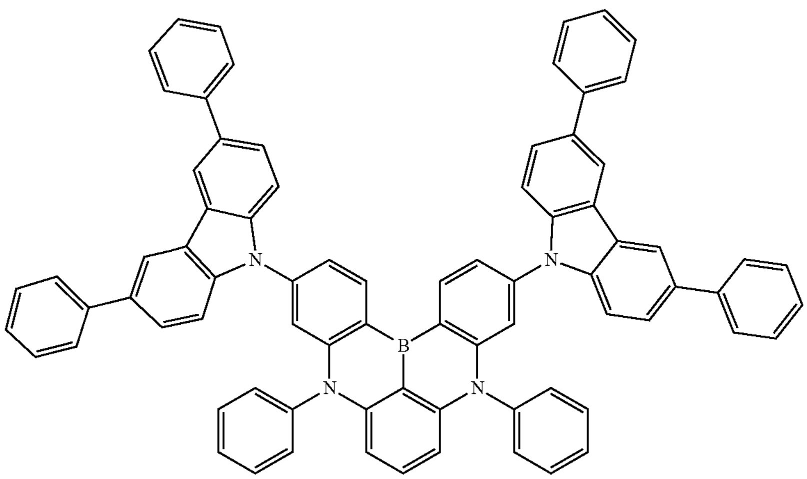
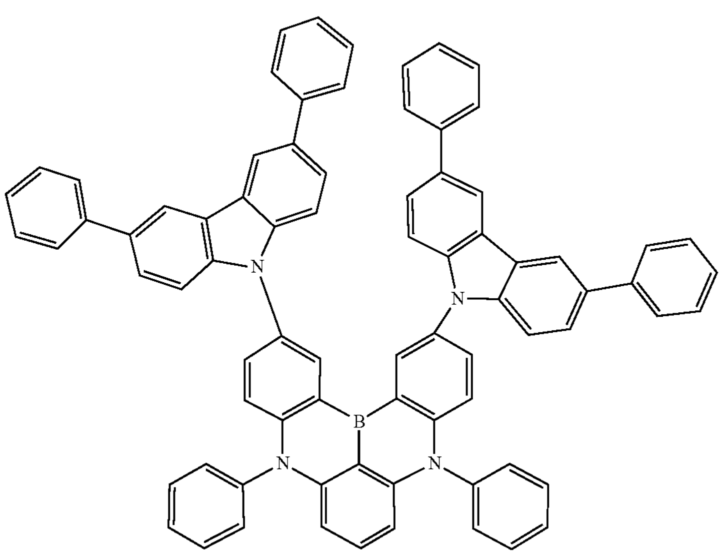

-continued
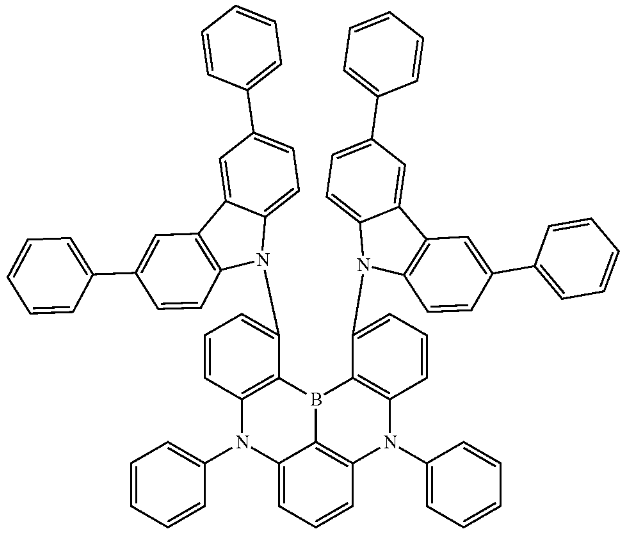
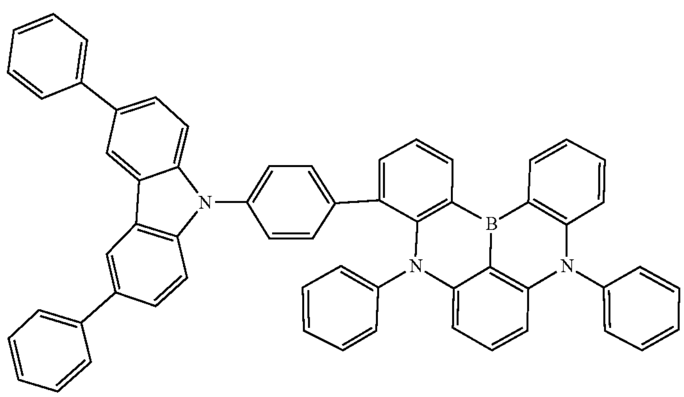
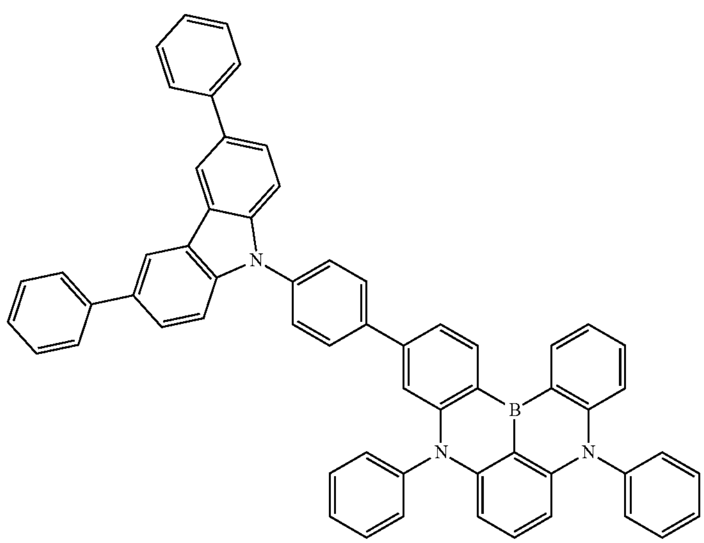

-continued
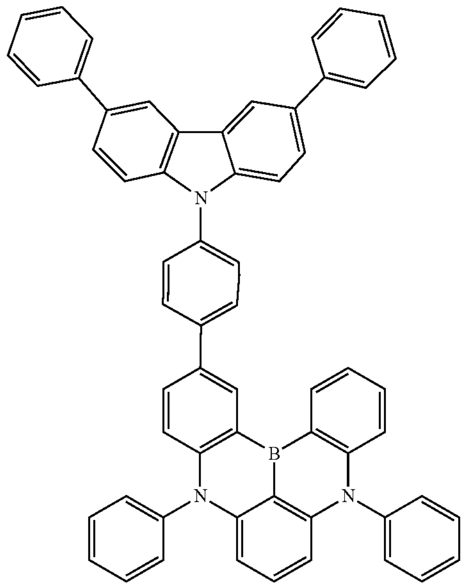
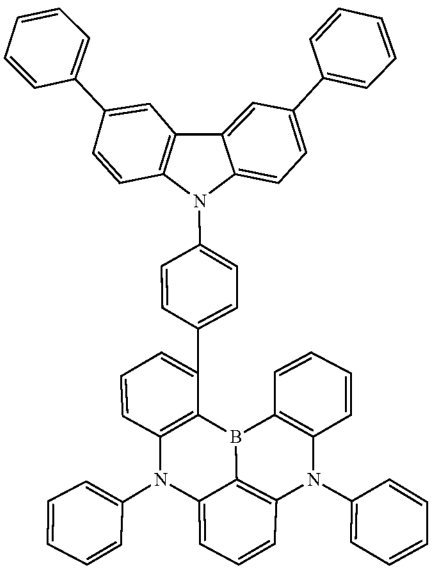
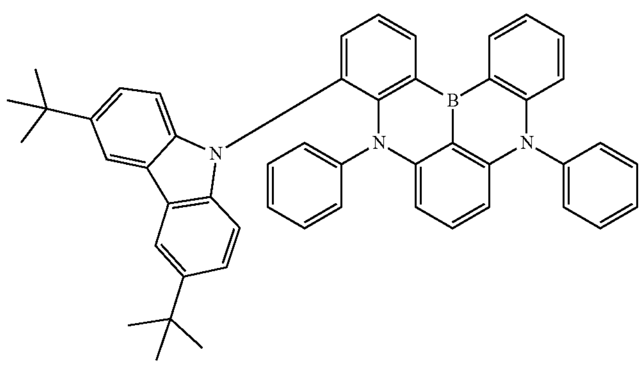
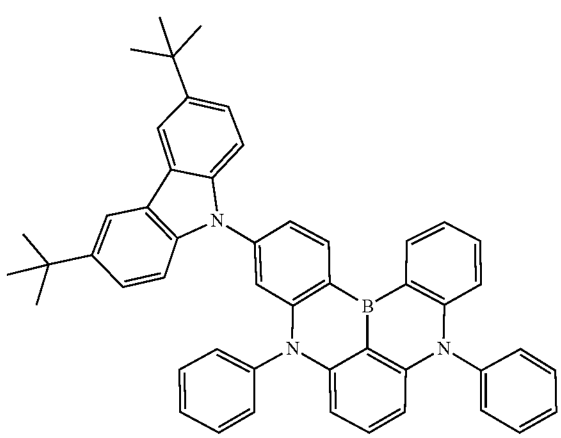
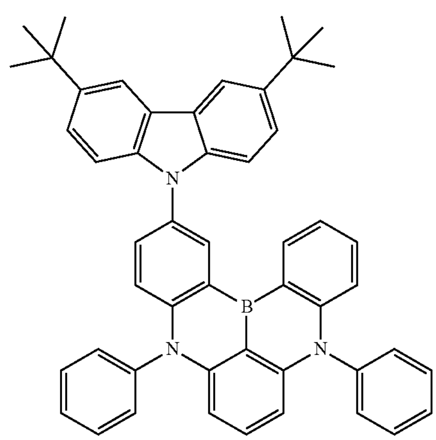

-continued
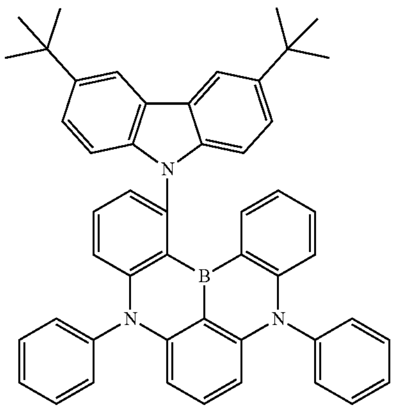
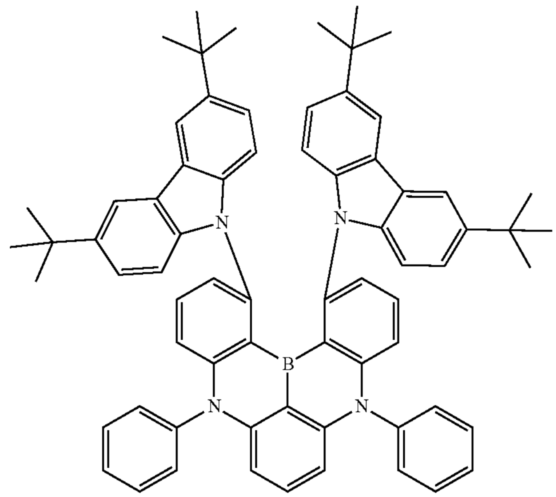
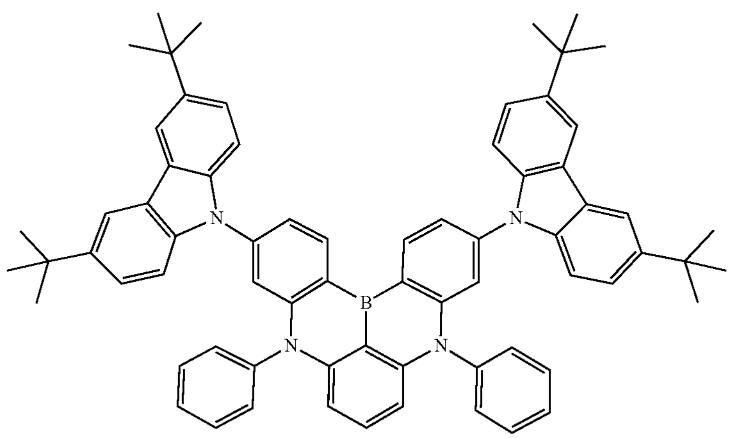
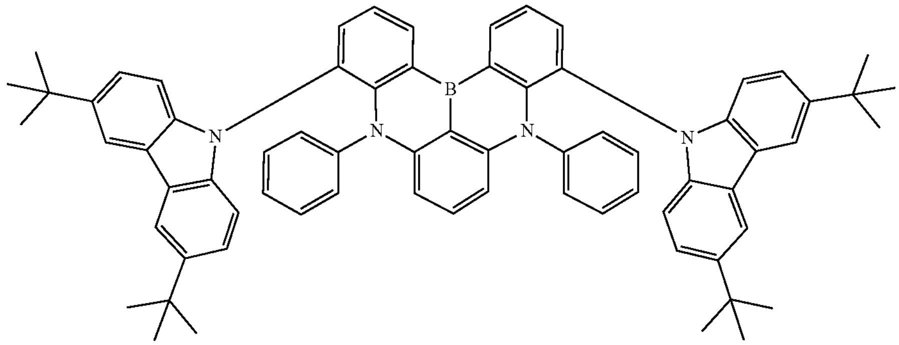

-continued
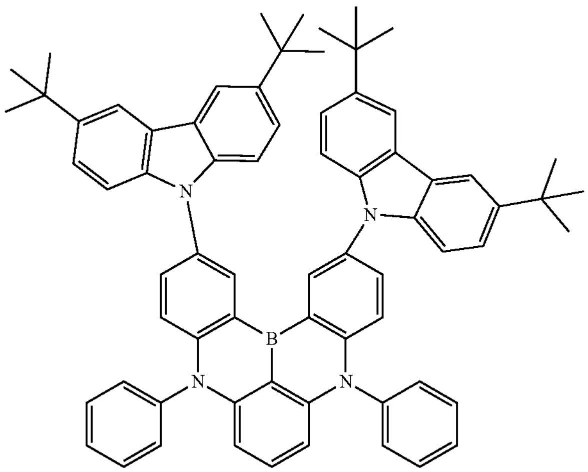
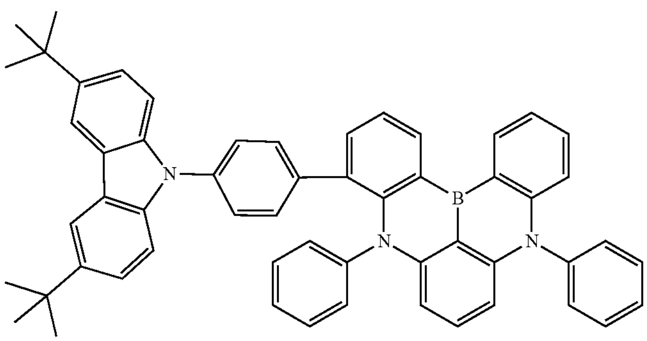
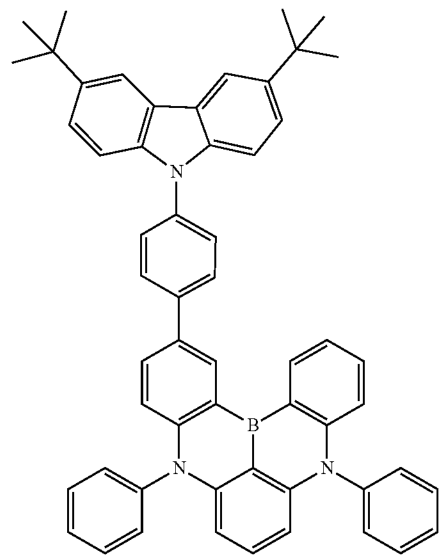
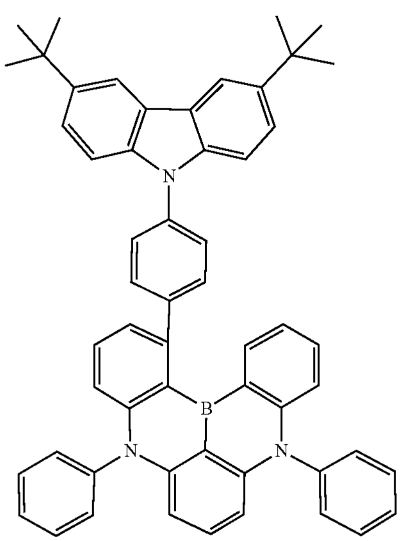
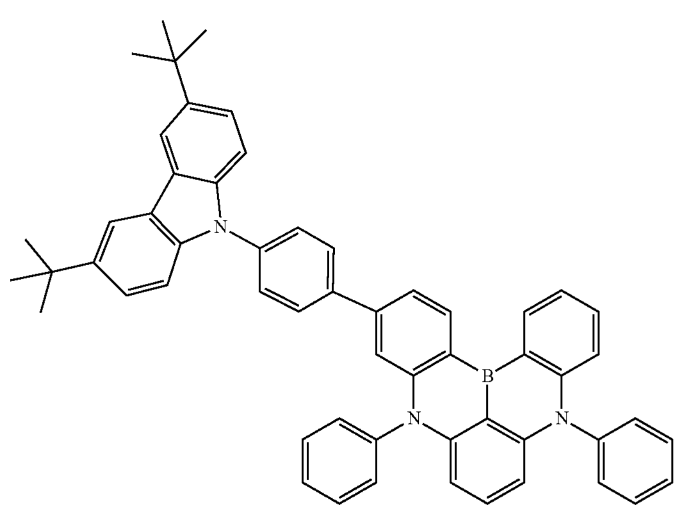

-continued
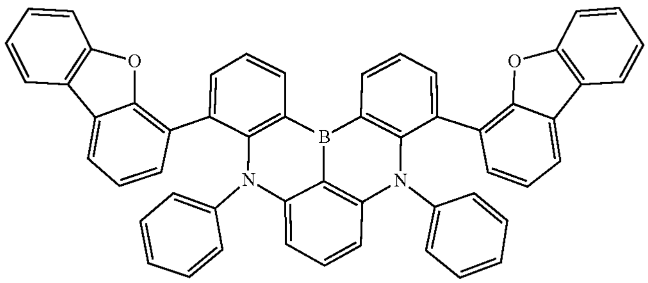
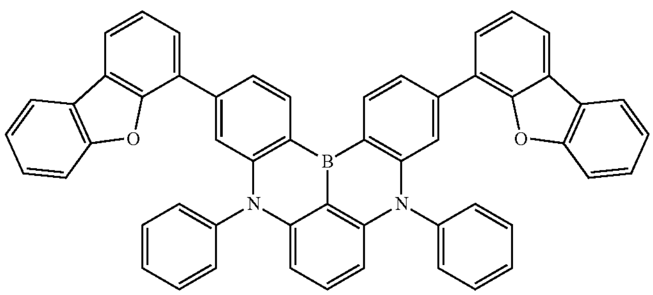
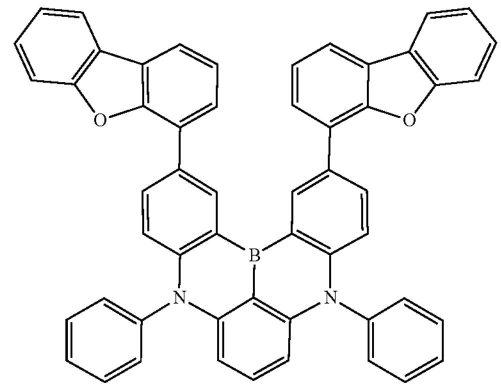
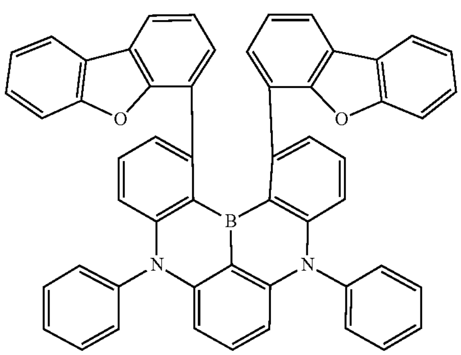
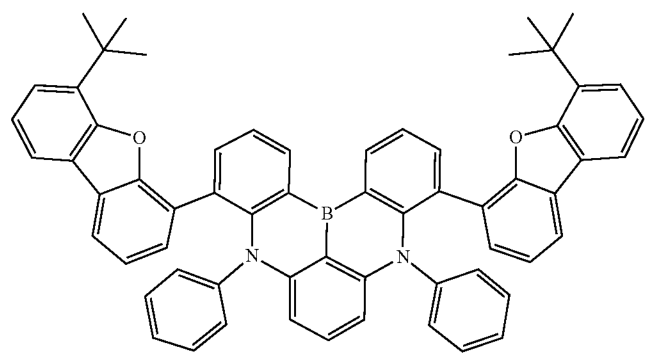
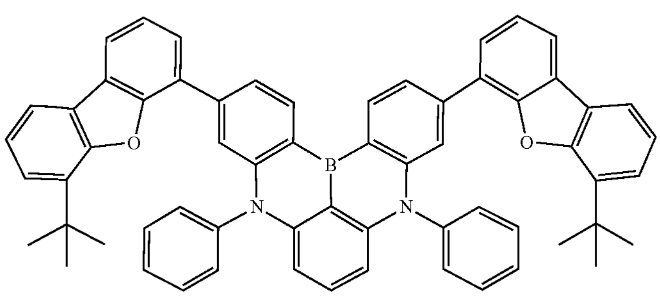
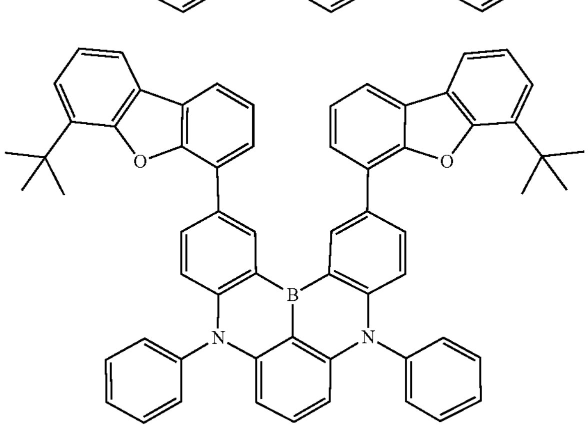
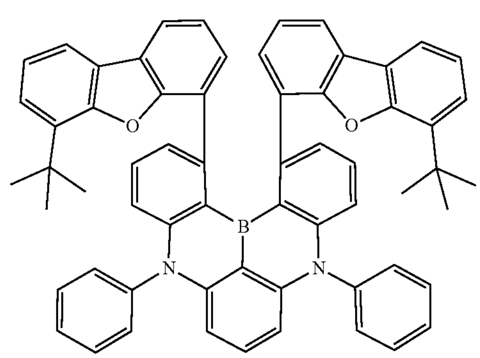

-continued
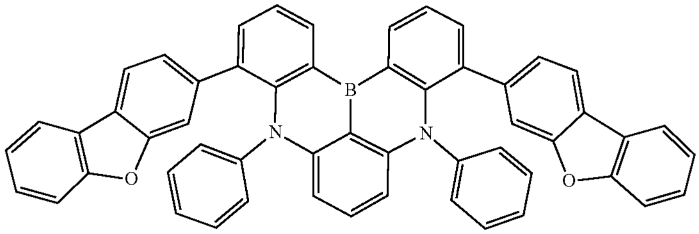
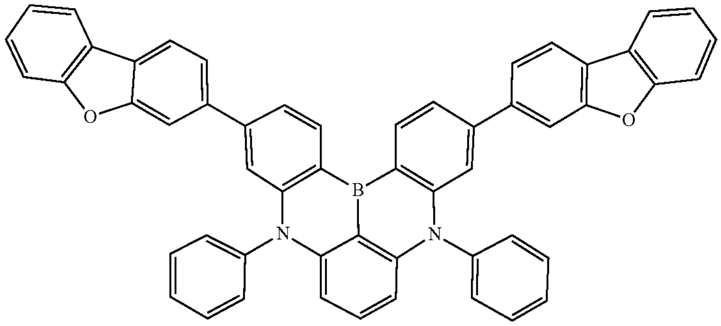
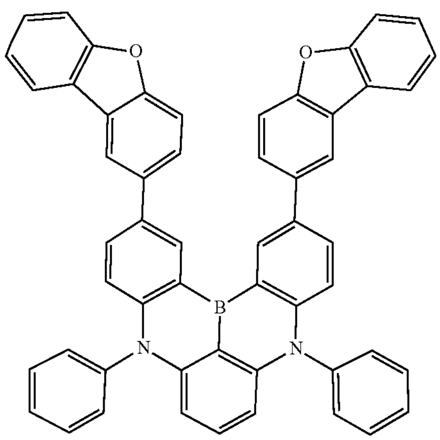
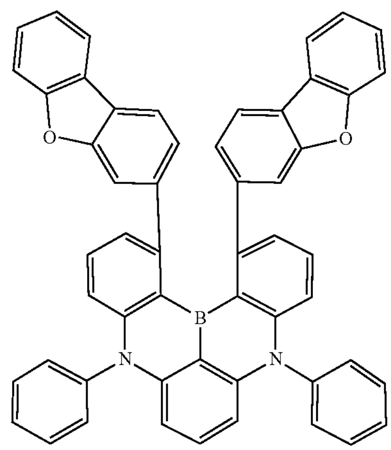
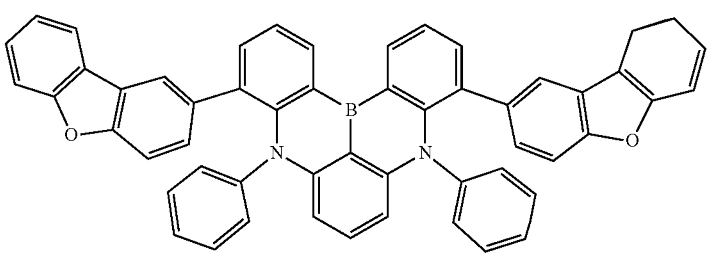
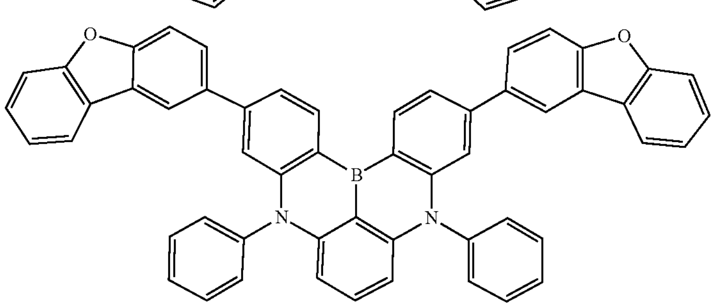

-continued
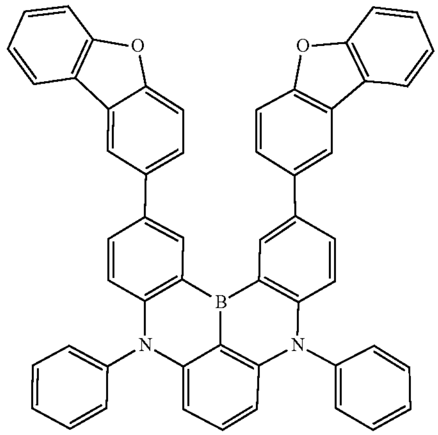
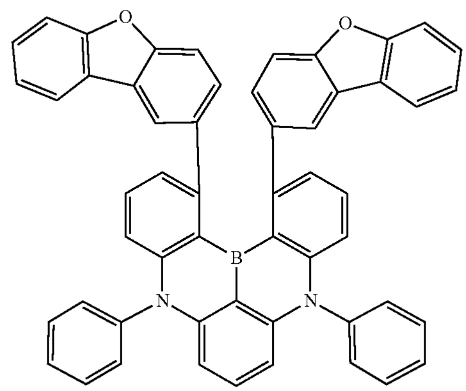
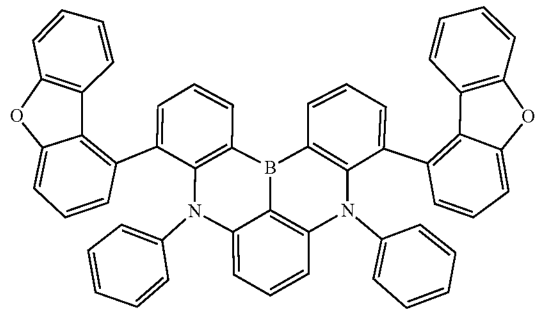
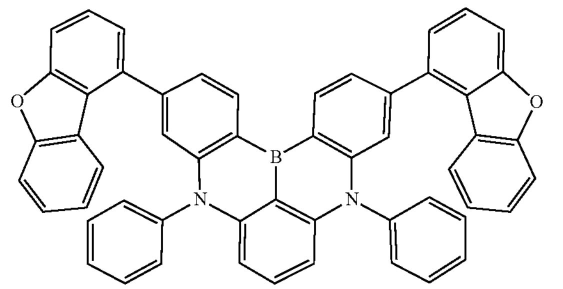
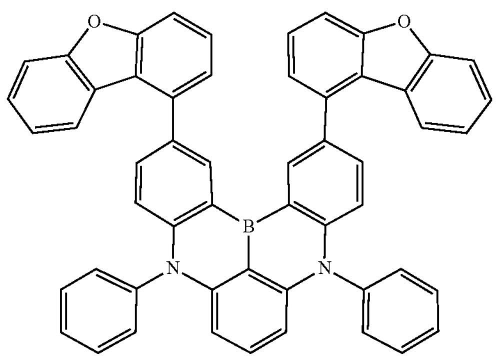
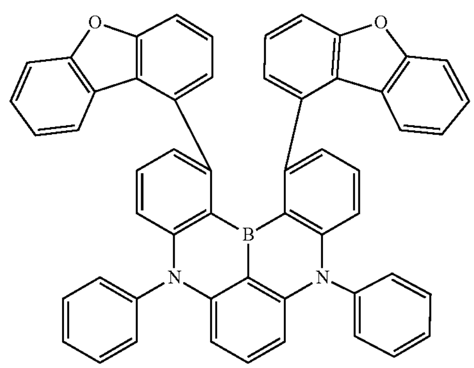
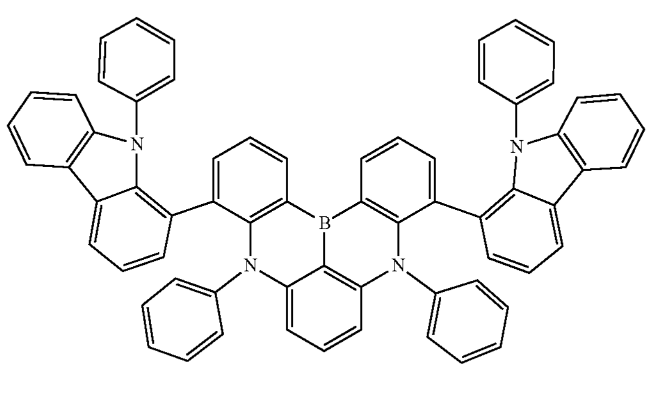
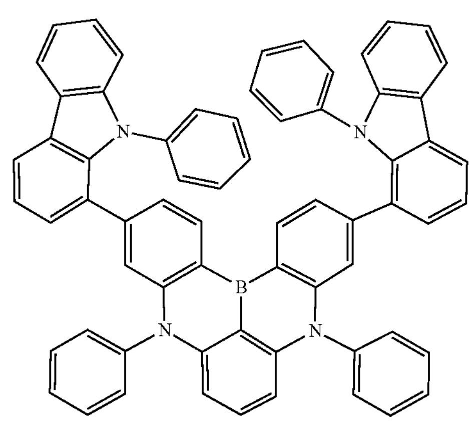

-continued
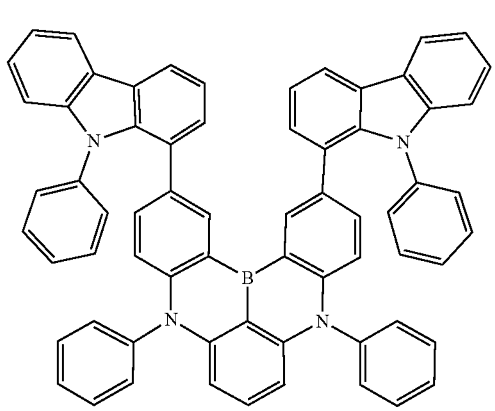
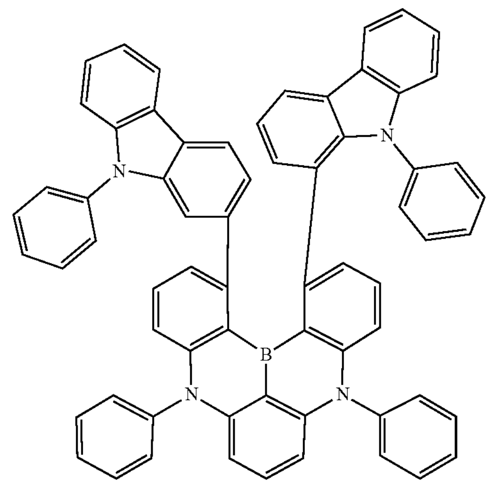
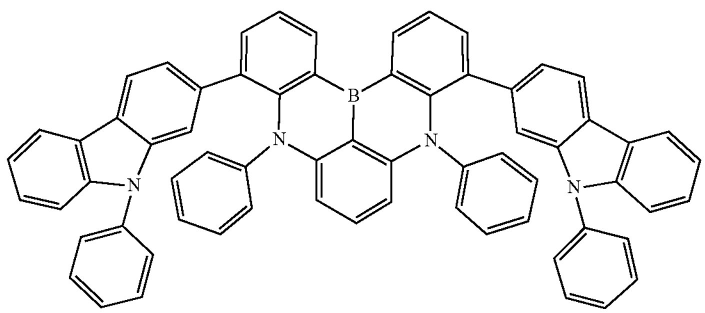
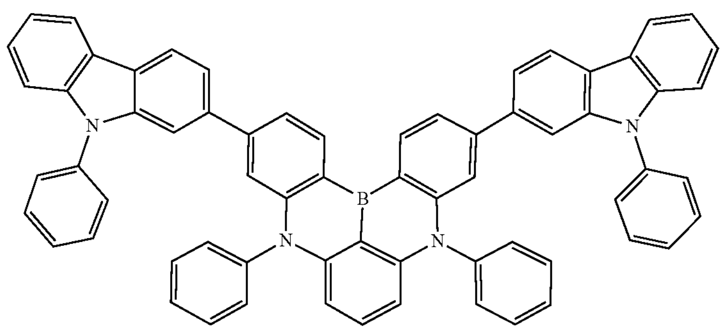
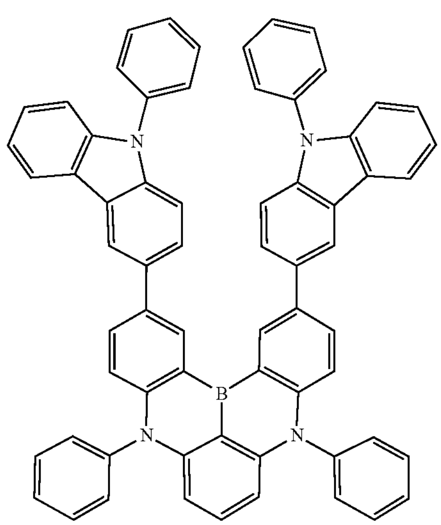
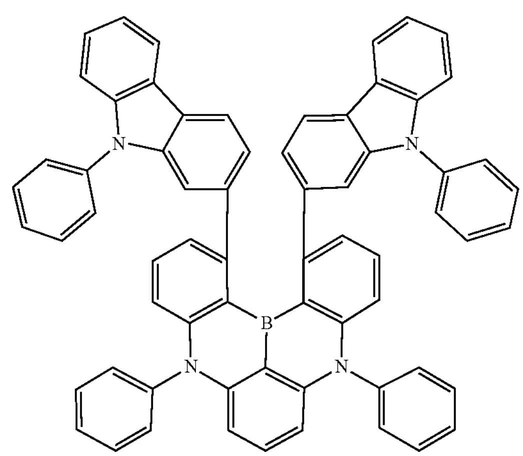

-continued
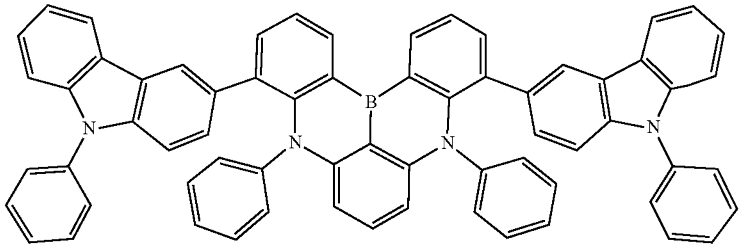
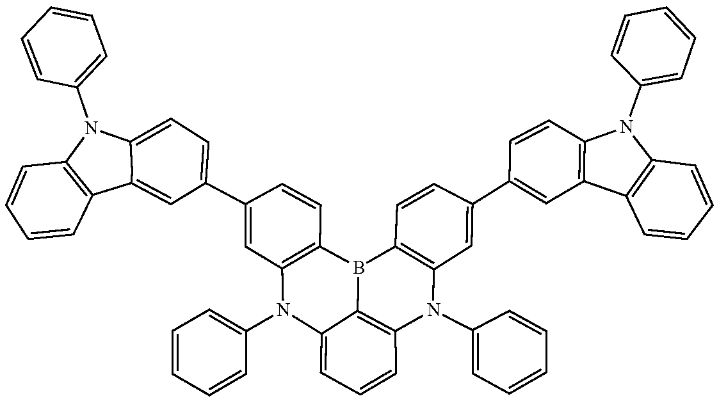
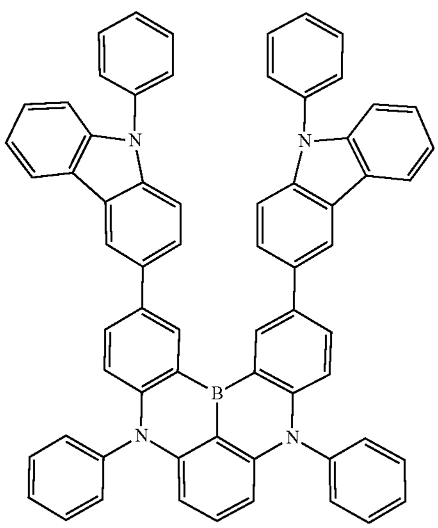
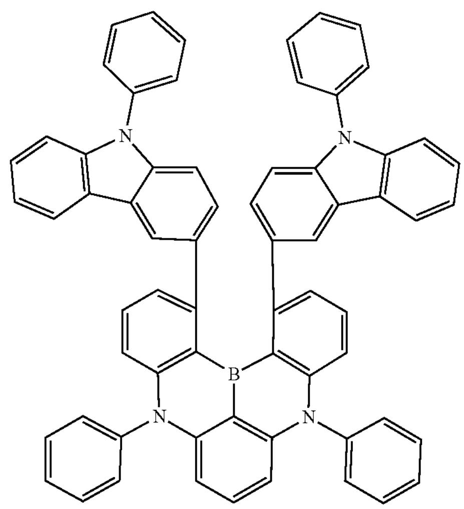
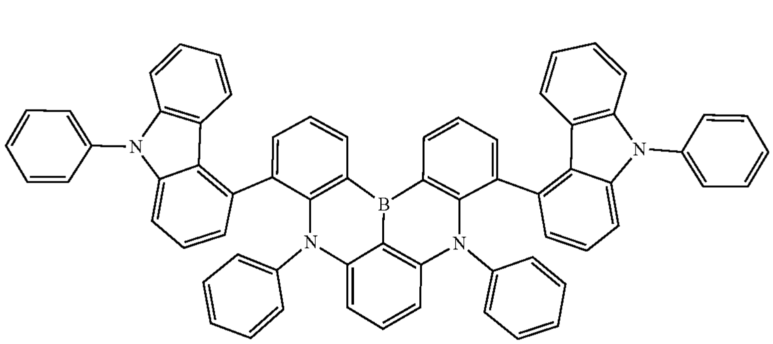

-continued
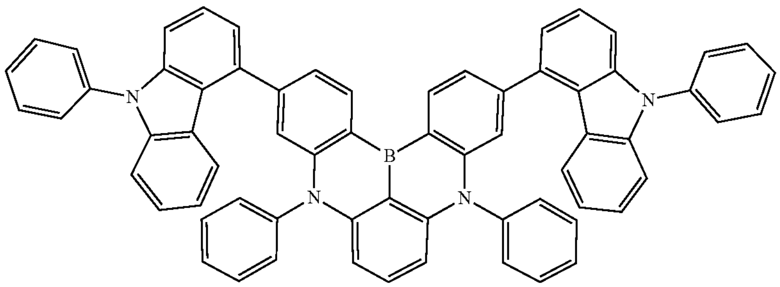
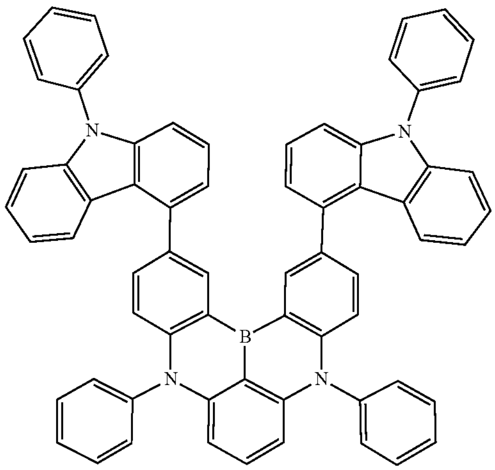
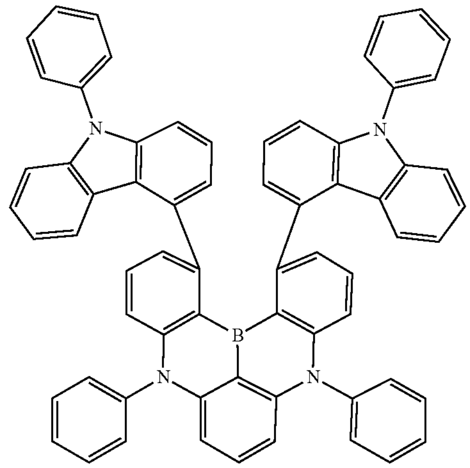
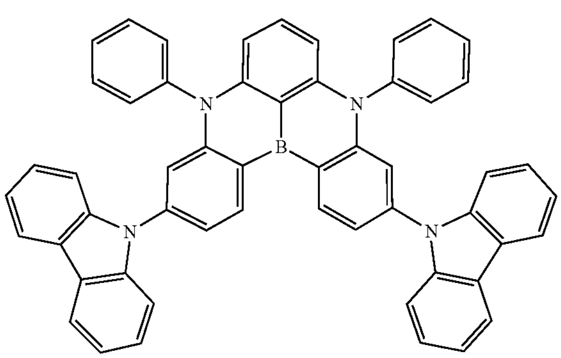
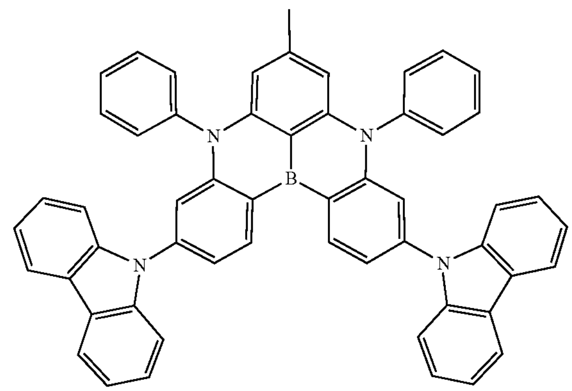
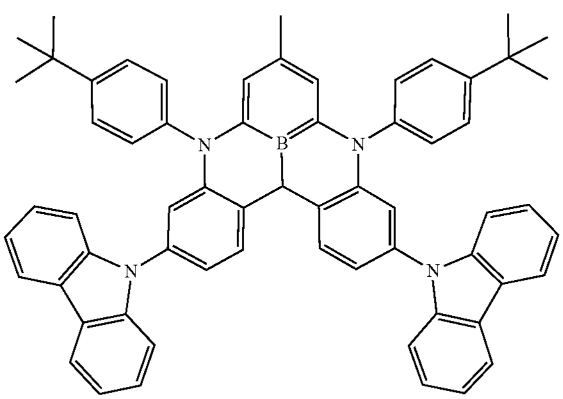
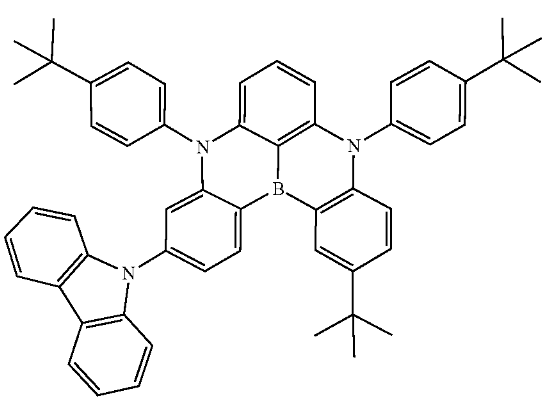

-continued

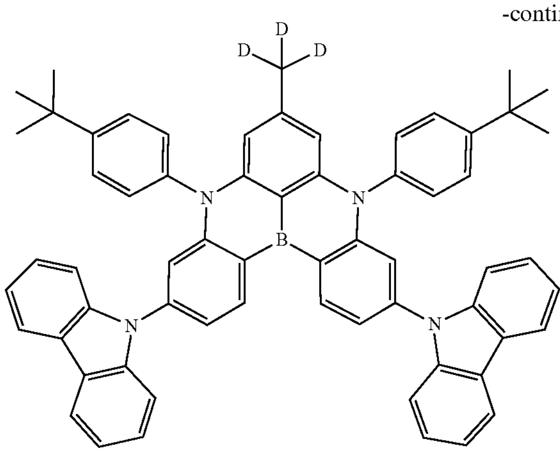

The compound represented by the formula (1) is useful as a material for an organic EL device.

A luminous efficiency of the organic EL device can be improved by using the compound represented by the formula (1) as a material for an emitting layer of the organic EL device.

The material for the organic EL devices according to one aspect of the invention include compound represented by the formula (1).

<Organic Electroluminescence Device>

An organic EL device according to an aspect of the invention comprises: a cathode; an anode; and at least one organic layer disposed between the cathode and the anode, wherein at least one layer of the at least one organic layer comprises the compound represented by the formula (1).

A luminous efficiency of the organic EL device can be improved by using the compound represented by the formula (1) for a predetermined organic layer, for example, for an emitting layer.

In one embodiment, at least one layer of the at least one organic layer is an emitting layer.

An organic EL device according to an aspect of the invention comprises: a cathode; an anode; and at least one organic layer disposed between the cathode and the anode, wherein at least one layer of the at least one organic layer comprises a dopant material, and wherein the dopant material comprises the compound represented by the formula (1).

In the present specification, "at least one organic layer disposed between the cathode and the anode" means that, when one organic layer is present between the cathode and the anode, it refers the one layer; and when two or more organic layers are present between the cathode and the anode, it refers to at least one layer among the plural organic layers.

Also, "at least one layer of the at least one organic layer is an emitting layer" means that, when one organic layer is present between the cathode and the anode, the layer is an emitting layer, and when two or more organic layers are present, at least one of the layers is an emitting layer.

In one embodiment, the organic EL device contains a hole-transporting layer between the anode and the emitting layer.

In one embodiment, the organic EL device contains an electron-transporting layer between the cathode and the emitting layer.

In the present specification, "at least one layer between the emitting layer and the anode" means that, when one organic layer is present between the emitting layer and the anode, it refers to the one layer and when two or more organic layers are present, it refers to at least one layer of the organic layer. For example, if there is two or more organic layers between the emitting layer and the anode, an organic layer closer to the emitting layer is called as a "hole-transporting layer" and an organic layer closer to the anode is called as a "hole-injecting layer." A "hole-transporting layer" and a "hole-injecting layer" may be one layer, respectively; may be two or more layers, respectively; or one may be one layer and the other may be two or more layers.

Similarly, "at least one layer between the emitting layer and the cathode" means that, when one organic layer is present between the emitting layer and the cathode, it refers to the one layer, and when two or more organic layers are present, it refers to at least one layer of the organic layer. For example, if there are two or more organic layers between the emitting layer and cathode, the organic layer closer to the emitting layer is called as an "electron-transporting layer" and an organic layer closer to the cathode is called as an "electron-injecting layer". An "electron-transporting layer" and an "electron-injecting layer" may be one layer, respectively; may be two or more layers, respectively; or one may be a layer and the other may be two or more layers.

In one embodiment, the emitting layer further comprises a compound represented by the following formula (10) (hereinafter may be referred to as the compound (10)):

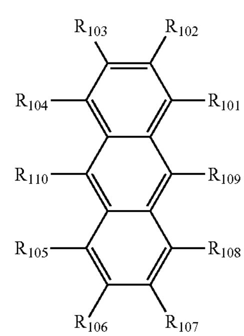

(10)

wherein in the formula (10), one or more pairs of adjacent two or more among $R_{101}$ to $R_{110}$ form a substituted or unsubstituted, saturated or unsaturated ring, or do not form the substituted or unsubstituted, saturated or unsaturated ring;

$R_{101}$ to $R_{110}$ which do not form the substituted or unsubstituted, saturated or unsaturated ring are independently a hydrogen atom, a substituted or unsubstituted alkyl group including 1 to 50 carbon atoms, a substituted or unsubstituted haloalkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted alkoxy group including 1 to 50 carbon atoms, a substituted or unsubstituted alkylthio group including 1 to 50 carbon atoms, a substituted or unsubstituted aryloxy group including 6 to 50 ring carbon atoms, a substituted or unsubstituted arylthio group including 6 to 50 ring carbon atoms, a substituted or unsubstituted aralkyl group including 7 to 50 carbon atoms, —Si$(R_{121})(R_{122})(R_{123})$, —C(═O)$R_{124}$, —COO$R_{125}$, —N$(R_{126})(R_{127})$, a halogen atom, a cyano group, a nitro group, a substituted or unsubstituted aryl group including 0.6 to 50 ring carbon atoms, a substituted or unsubstituted monovalent heterocyclic group including 5 to 50 ring atoms, or a group represented by the following formula (31);

$R_{121}$ to $R_{127}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

when two or more of each of $R_{121}$ to $R_{127}$ are present, the two or more of each of $R_{121}$ to $R_{127}$ may be the same or different;

provided that at least one of $R_{101}$ to $R_{110}$ which do not form the substituted or unsubstituted, saturated or unsaturated ring is a group represented by the following formula (31);

when two or more of groups represented by the following formula (31) are present, the two or more groups represented by the following formula (31) may be the same or different:

$$-L_{101}-Ar_{101} \quad (31)$$

wherein in the formula (31), $L_{101}$ is a single bond, a substituted or unsubstituted arylene group including 6 to 30 ring carbon atoms, or a substituted or unsubstituted divalent heterocyclic group including 5 to 30 ring atoms; and $Ar_{101}$ is a substituted or unsubstituted aryl group including 6 to 50 ring carbon atoms, or a substituted or unsubstituted monovalent heterocyclic group including 5 to 50 ring atoms.

Specific examples of the groups in the compound (10), arbitrary substituents and halogen atoms are the same as those described above.

Hereinafter, "one or more pairs of adjacent two or more among $R_{101}$ to $R_{110}$ form a substituted or unsubstituted, saturated or unsaturated ring" will be described.

The "one pair of adjacent two or more among $R_{101}$ to $R_{110}$" are, for example, a combination of $R_{101}$ and $R_{102}$, $R_{102}$ and $R_{103}$, $R_{103}$ and $R_{104}$, $R_{105}$ and $R_{106}$, $R_{106}$ and $R_{107}$, $R_{107}$ and $R_{108}$, $R_{108}$ and $R_{109}$, $R_{101}$, $R_{102}$ and $R_{103}$, and the like.

The substituent in "substituted" of "substituted or unsubstituted" for the saturated or unsaturated ring is the same as the arbitrary substituent in the formula (10).

The "saturated or unsaturated ring" means, for example, when the ring is formed by $R_{101}$ and $R_{102}$, a ring formed by a carbon atom with which $R_{101}$ is bonded, a carbon atom with which $R_{102}$ is bonded, and one or more arbitrary elements. Specifically, if a ring is formed by $R_{101}$ and $R_{102}$, when an unsaturated ring is formed by a carbon atom with which $R_{101}$ is bonded, a carbon atom with which $R_{102}$ is bonded, and four carbon atoms, the ring formed by $R_{101}$ and $R_{102}$ is a benzene ring.

The "arbitrary element" is preferably a C element, a N element, an O element, and a S element. In the arbitrary elements (a C element or a N element, for example), chemical bonding sites that do not form a ring may be terminated by a hydrogen atom, or the like.

The "one or more arbitrary element" is preferably 2 or more and 15 or less, more preferably 3 or more and 12 or less, and further preferably 3 or more and 5 or less arbitrary elements.

For example, $R_{101}$ and $R_{102}$ may form a ring, and simultaneously, $R_{105}$ and $R_{106}$ may form a ring. In this case, the compound represented by the formula (10) becomes a compound represented by the following formula (10A), for example.

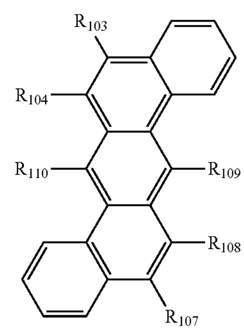

(10A)

In one embodiment, $R_{101}$ to $R_{110}$ are independently a hydrogen atom, a substituted or unsubstituted alkyl group including 1 to 50 carbon atoms, a substituted or unsubstituted aryl group including 6 to 50 ring carbon atoms, a substituted or unsubstituted heterocyclic group including 5 to 50 ring or a group represented by the formula (31).

In one embodiment, $R_{101}$ to $R_{110}$ are independently a hydrogen atom, a substituted or unsubstituted aryl group including 6 to 50 ring carbon atoms, a substituted or unsubstituted heterocyclic group including 5 to 50 ring atoms, or a group represented by the formula (31).

In one embodiment, $R_{101}$ to $R_{110}$ are independently a hydrogen atom, a substituted or unsubstituted aryl group including 6 to 18 ring carbon atoms, a substituted or unsubstituted heterocyclic group including 5 to 18 ring atoms, or a group represented by the formula (31).

In one embodiment, at least one of $R_{109}$ and $R_{110}$ is a group represented by the formula (31).

In one embodiment, $R_{109}$ and $R_{110}$ are independently a group represented by the formula (31).

In one embodiment, the compound (10) is a compound represented by the following formula (10-1).

(10-1)

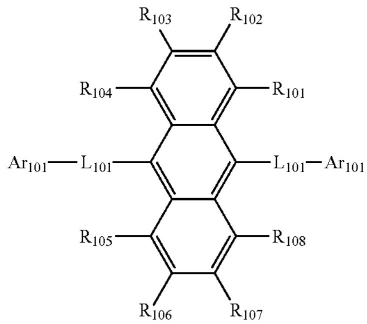

In the formula (10-1), $R_{101}$ to $R_{108}$, $L_{101}$ and $Ar_{101}$ are as defined in the formula (10).

In one embodiment, the compound (10) is a compound represented by the following formula (10-2).

(10-2)

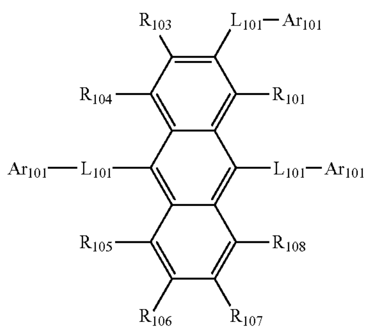

In the formula (10-2), $R_{101}$, $R_{103}$ to $R_{108}$, $L_{101}$ and $Ar_{101}$ are as defined in the formula (10).

In one embodiment, the compound (10) is a compound represented by the following formula (10-3).

(10-3)

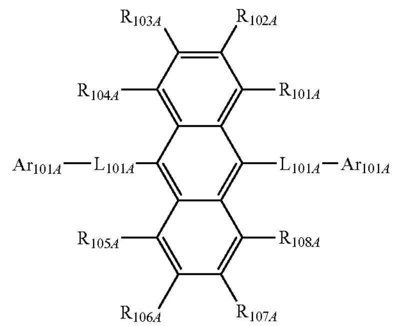

In the formula (10-3), $R_{101A}$ to $R_{108A}$ are independently a hydrogen atom, or a substituted or unsubstituted aryl group including 6 to 50 ring carbon atoms;

$L_{101A}$ is a single bond, or a substituted or unsubstituted arylene group including 6 to 30 ring carbon atoms;

two $L_{101A}$'s may be the same or different;

$Ar_{101A}$ is a substituted or unsubstituted aryl group including 6 to 50 ring carbon atoms; and the two $Ar_{101A}$'s may be the same or different In one embodiment, the compound (10) is a compound represented by the following formula (10-4).

(10-4)

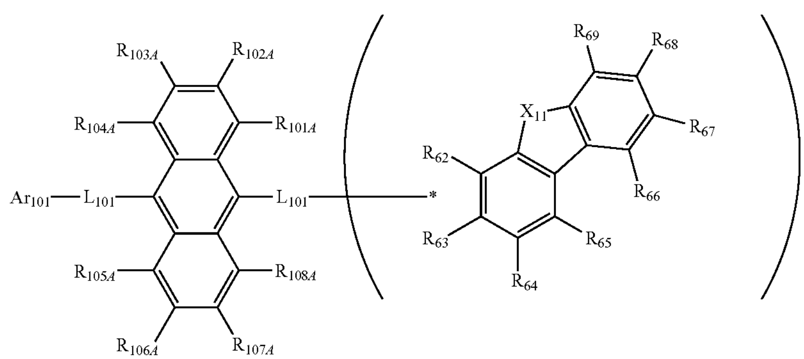

In the formula (10-4), $L_{101}$ and $Ar_{101}$ are as defined in the formula (10);

$R_{101A}$ to $R_{108A}$ are independently a hydrogen atom, or a substituted or unsubstituted aryl group including 6 to 50 ring carbon atoms;

$X_{11}$ is O, S, or $N(R_{61})$;

$R_{61}$ is a hydrogen atom, a substituted or unsubstituted alkyl group including 1 to 50 carbon atoms, or a substituted or unsubstituted aryl group including 6 to 50 ring carbon atoms;

one of $R_{62}$ to $R_{69}$ is bonded with $L_{101}$;

one or more pairs of adjacent among $R_{62}$ to $R_{69}$ which are not bonded with $L_{101}$ form a substituted or unsubstituted, saturated or unsaturated ring, or do not form a substituted or unsubstituted, saturated or unsaturated ring; and $R_{62}$ to $R_{69}$ which are not bonded with $L_{101}$ and do not form the substituted or unsubstituted, saturated or unsaturated ring are independently a hydrogen atom, a substituted or unsubstituted alkyl group including 1 to 50 carbon atoms, or a substituted or unsubstituted aryl group including 6 to 50 ring carbon atoms.

In one embodiment, the compound (10) is a compound represented by the following formula (10-4A).

(10-4A)

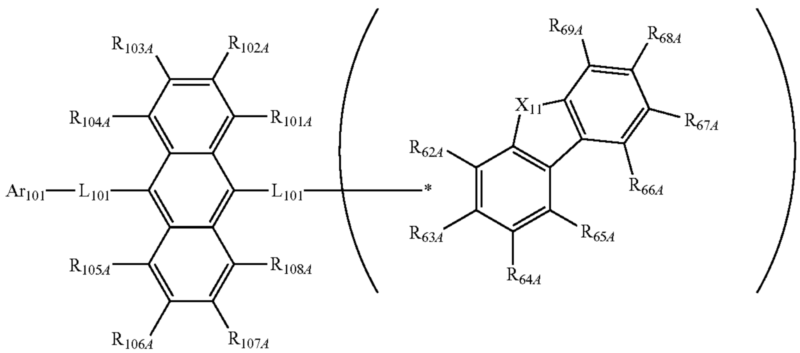

In the formula (10-4A), $L_{101}$ and $Ar_{101}$ are as defined in the formula (10);

$R_{101A}$ to $R_{108A}$ are independently a hydrogen atom or a substituted or unsubstituted aryl group including 6 to 50 ring carbon atoms;

$X_{11}$ is O, S, or $N(R_{61})$;

$R_{61}$ is a hydrogen atom, a substituted or unsubstituted alkyl group including 1 to 50 carbon atoms, or a substituted or unsubstituted aryl group including 6 to 50 ring carbon atoms;

one or more pairs of adjacent two or more among $R_{62}$ to $R_{69A}$ may form a substituted or unsubstituted, saturated or unsaturated ring, and adjacent two among $R_{62A}$ to $R_{69A}$ form a ring represented by the following formula (10-4A-1); and $R_{62A}$ to $R_{69A}$ which do not form a substituted or unsubstituted, saturated or unsaturated ring are independently a hydrogen atom, a substituted or unsubstituted alkyl group including 1 to 50 carbon atoms, or a substituted or unsubstituted aryl group including 6 to 50 ring carbon atoms.

(10-4A-1)

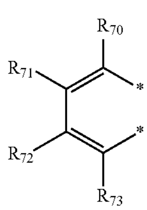

In the formula (10-4A-1), two "*" s are bonded with adjacent two among $R_{62A}$ to $R_{69A}$;

one of $R_{70}$ to $R_{73}$ is bonded with $L_{101}$; and $R_{70}$ to $R_{73}$ which are not bonded with $L_{101}$ are independently a hydrogen atom, a substituted or unsubstituted alkyl group including 1 to 50 carbon atoms, or a substituted or unsubstituted aryl group including 6 to 50 ring carbon atoms.

In one embodiment, the compound (10) is a compound represented by the following formula (10-6).

(10-6)

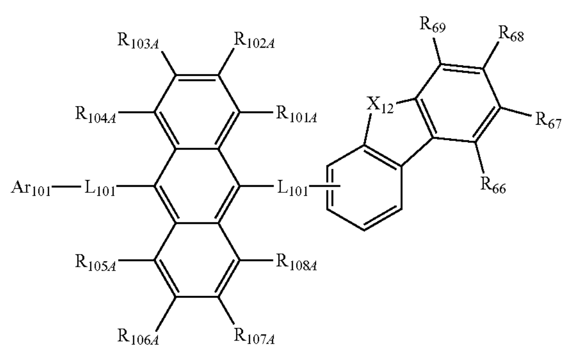

In the formula (10-6), $L_{101}$ and $Ar_{101}$ are as defined in the formula (10);

$R_{101A}$ to $R_{108A}$ are as defined in the formula (10-4);

$R_{66}$ to $R_{69}$ are as defined in the formula (10-4); and $X_{12}$ is O or S.

In one embodiment, the compound represented by the formula (10-6) is selected from compounds represented by the following formula (10-6-1) to the following formula (10-6-4).

(10-6-1)

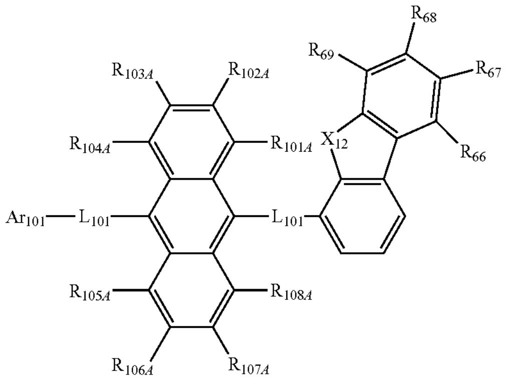

(10-6-2)

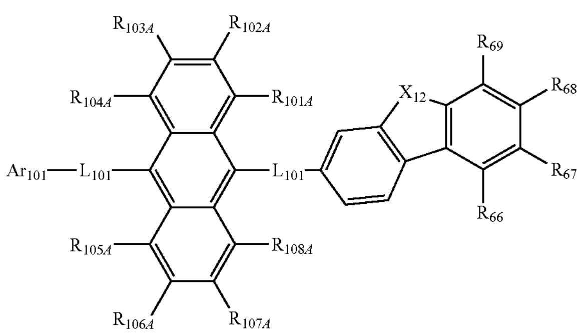

(10-6-3)

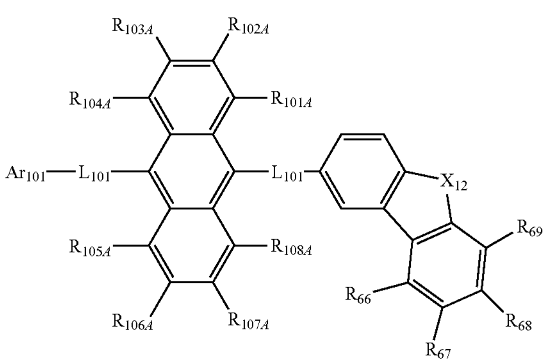

(10-6-4)

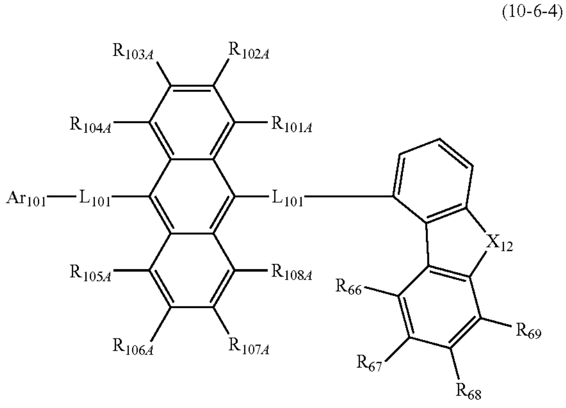

In the formulas (10-6-1) to (10-6-4), $L_{101}$ and $Ar_{101}$ are as defined in the formula (10);

$R_{101A}$ to $R_{108A}$ are as defined in the formula (10-4);

$R_{66}$ to $R_{69}$ are as defined in the formula (10-4); and $X_{12}$ is O or S.

In one embodiment, the compound represented by the formula (10-6) is a compound represented by the following formula (10-6H).

(10-6H)

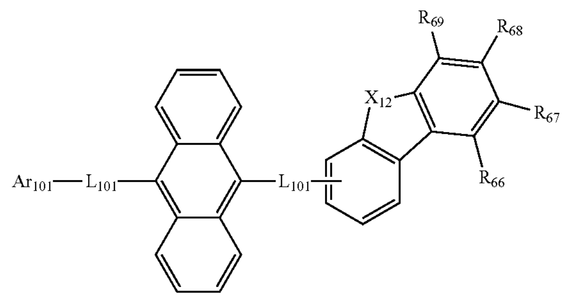

In the formula (10-6H), $L_{101}$ and $Ar_{101}$ are as defined in the formula (10);

$R_{66}$ to $R_{69}$ are as defined in the formula (10-4); and $X_{12}$ is O or S.

In one embodiment, the compound represented by the formula (10-6) or (10-6H) is a compound represented by the following formula (10-6Ha).

(10-6Ha)

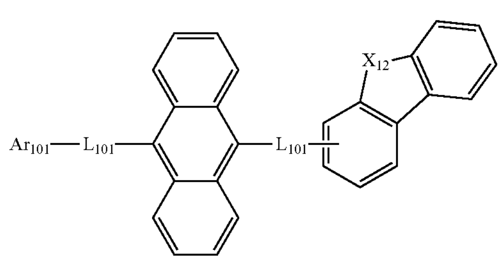

In the formula (10-6Ha), $L_{101}$ and $Ar_{101}$ are as defined in the formula (10); and $X_{12}$ is or S.

In one embodiment, the compound represented by the formula (10-6), (10-6H) or (10H-6a) is a compound represented by the following formula (10-6Ha-1) or (10-6Ha-2).

(10-6Ha-1)

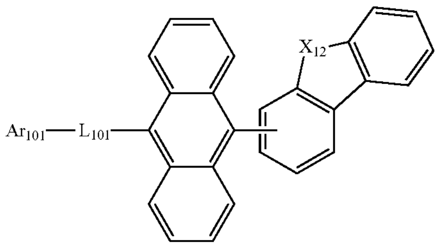

-continued (10-6Ha-2)

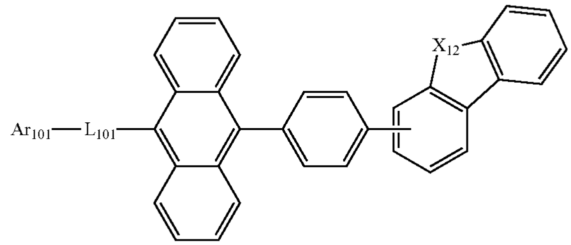

In the formulas (10-6Ha-1) and (10-6Ha-2), $L_{11}$ and $Ar_{101}$ are as defined in the formula (10); and $X_{12}$ is O or S.

In one embodiment, the compound (10) is a compound represented by the following formula (10-7).

(10-7)

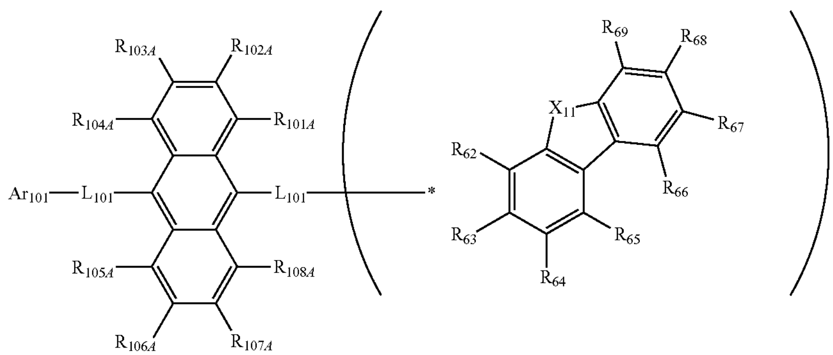

In the formula (10-7), $L_{101}$ and $Ar_{101}$ are as defined in the formula (10);

$R_{101A}$ to $R_{108A}$ are as defined in the formula (10-4);

$X_{11}$ is as defined in the formula (10-4);

$R_{62}$ to $R_{69}$ are as defined in the formula (10-4); and provided that one pair among $R_{66}$ and $R_{67}$, $R_{67}$ and $R_{68}$, and $R_{68}$ and $R_{69}$ is bonded with each other to form a substituted or unsubstituted, saturated or unsaturated ring.

In one embodiment, the compound (10) is a compound represented by the following formula (10-7H).

(10-7H)

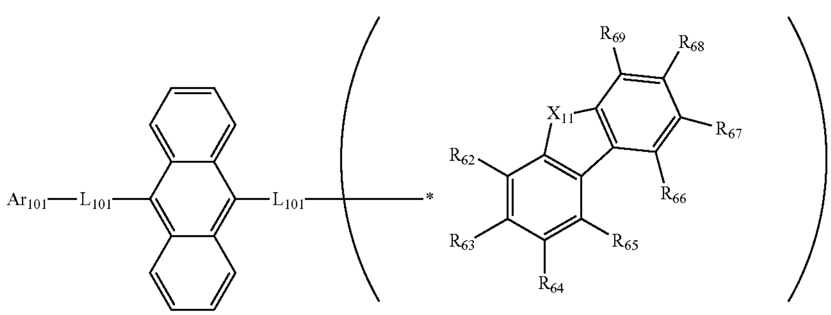

In the formula(10-7H), $L_{101}$ and $Ar_{101}$ are as defined in the formula (10);

$X_{11}$ is as defined in the formula (10-4);

$R_{62}$ to $R_{69}$ are as defined in the formula (10-4); and provided that one pair among $R_{66}$ and $R_{67}$, $R_{67}$ and $R_{68}$, and $R_{68}$ and $R_{69}$ is bonded with each other to form a substituted or unsubstituted, saturated or unsaturated ring.

In one embodiment, the compound (10) is a compound represented by the following formula (10-8).

(10-8)

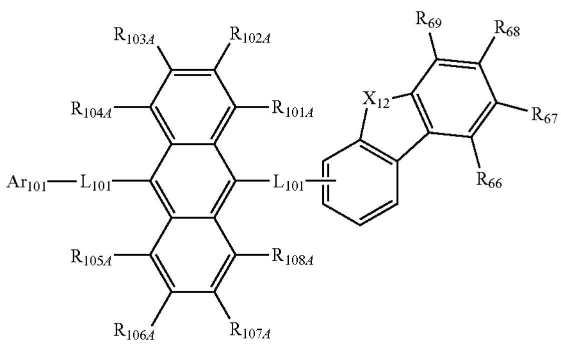

In the formula (10-8), $L_{101}$ and $Ar_{101}$ are as defined in the formula (10);

$R_{101A}$ to $R_{108A}$ are as defined in the formula (10-4);

$X_{12}$ is O or S;

$R_{66}$ to $R_{69}$ are as defined in the formula (10-4); and provided that one pair among $R_{66}$ and $R_{67}$, $R_{67}$ and $R_{68}$, and $R_{68}$ and $R_{69}$ is bonded with each other to form a substituted or unsubstituted, saturated or unsaturated ring.

In one embodiment, the compound represented by the formula (10-8) is a compound represented by the following formula (10-8H).

(10-8H)

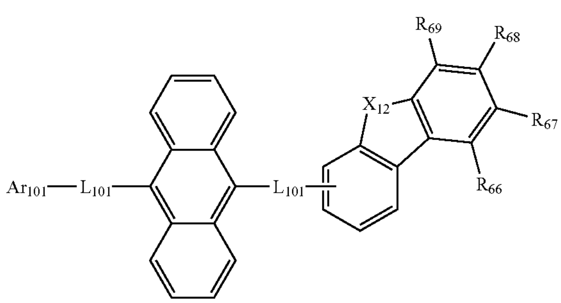

In the formula (10-8H), $L_{101}$ and $Ar_{101}$ are as defined in the formula (10);

$R_{66}$ to $R_{69}$ are as defined in the formula (10-4);

provided that one pair among $R_{66}$ and $R_{67}$, $R_{67}$ and $R_{68}$, and $R_{68}$ and $R_{69}$ is bonded with each other to form a substituted or unsubstituted, saturated or unsaturated ring;

preferably, one pair among $R_{66}$ and $R_{67}$, $R_{67}$ and $R_{68}$, or $R_{68}$ and $R_{69}$ is bonded with each other to form an unsubstituted benzene ring; and $X_{12}$ is O or S.

In one embodiment, in the compound represented by the formula (10-7), (10-7H), (10-8) or (10-8H), one pair among $R_{66}$ and $R_{67}$, $R_{67}$ and $R_{68}$, and $R_{68}$ and $R_{69}$ is bonded with each other to form a ring represented by the following formula (10-8-1) or (10-8-2), and $R_{66}$ to $R_{69}$ which do not form the ring represented by the formula (10-8-1) or (10-8-2) do not form a substituted or unsubstituted, saturated or unsaturated ring:

(10-8-1)

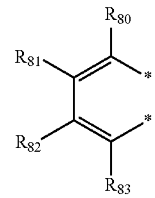

(10-8-2)

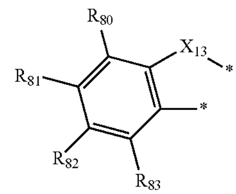

wherein in the formulas (10-8-1) and (10-8-2), two "*" s are respectively bonded with one pair of $R_{66}$ and $R_{67}$, $R_{67}$ and $R_{68}$, and $R_{68}$ and $R_{69}$;

$R_{80}$ to $R_{83}$ are independently a hydrogen atom, a substituted or unsubstituted alkyl group including 1 to 50 carbon atoms, or a substituted or unsubstituted aryl group including 6 to 50 ring carbon atoms; and $X_{13}$ is O or S.

In one embodiment, the compound (10) is a compound represented by the following formula (10-9).

(10-9)

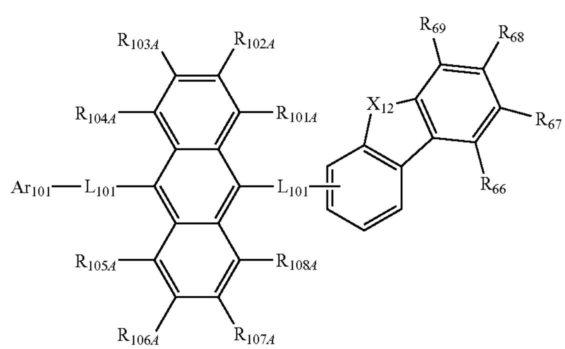

In the formula (10-9), $L_{101}$ and $Ar_{101}$ are as defined in the formula (10);

$R_{101A}$ to $R_{108A}$ are as defined in the formula (10-4);

$R_{66}$ to $R_{69}$ are as defined in the formula (10-4);

provided that $R_{66}$ and $R_{67}$, $R_{67}$ and $R_{68}$, and $R_{69}$ and $R_{67}$ are not bonded with each other to form a substituted or unsubstituted, saturated or unsaturated ring; and $X_2$ is O or S.

In one embodiment, the compound (10) is selected from the group consisting of compounds represented by the following formulas (10-10-1) to (10-10-4).

(10-10-1)
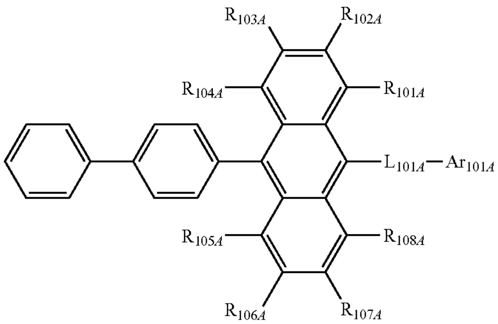
(10-10-2)
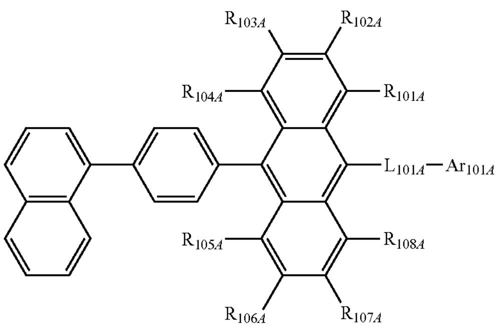
(10-10-3)
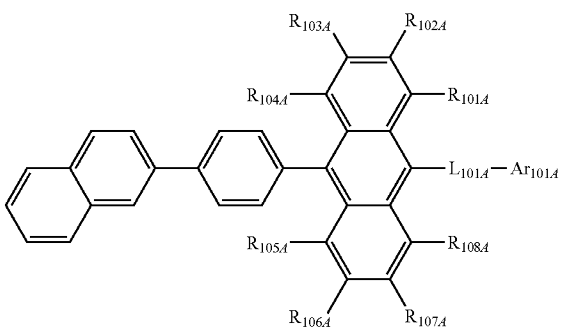
(10-10-4)
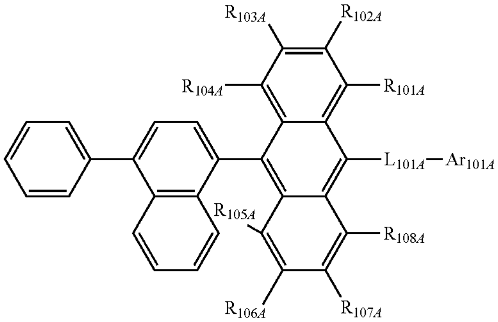
(10-10-1H)
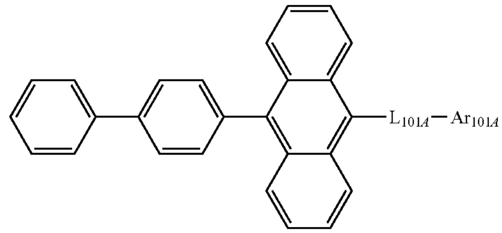
(10-10-2H)
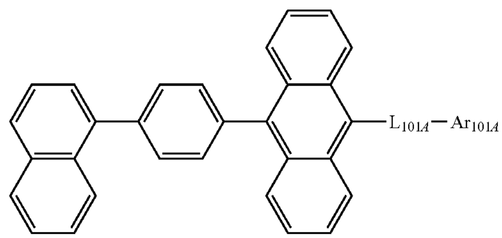
(10-10-3H)
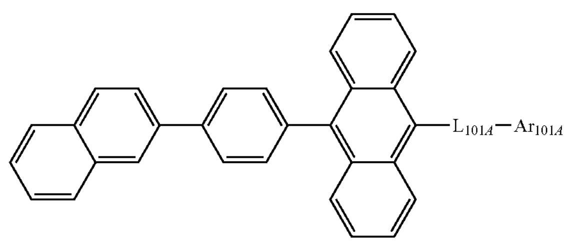
(10-10-4H)
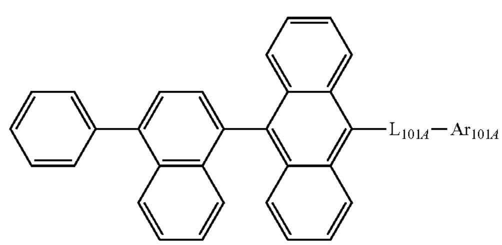
In the formulas (10-10-1H) to (10-10-4H), $L_{101A}$ and $Ar_{101A}$ areas defined in the formula (10-3).
Specific examples of the compound represented by the formula (10) include compounds shown below.

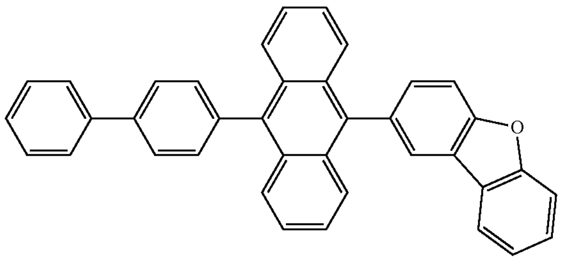
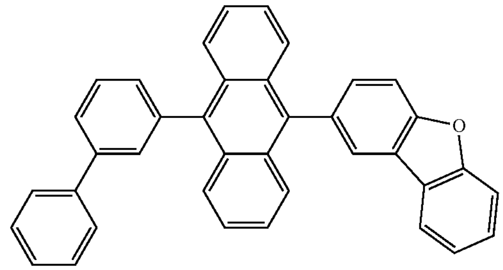
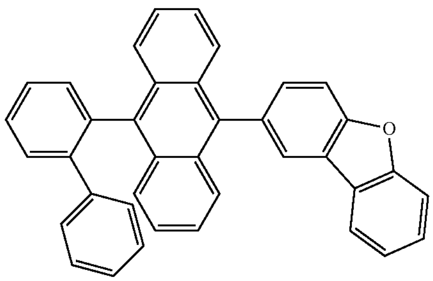
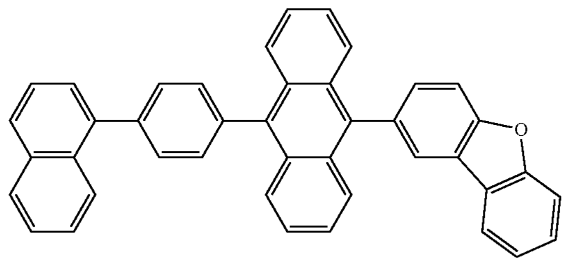
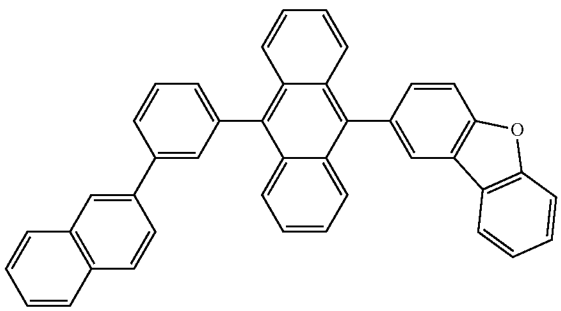
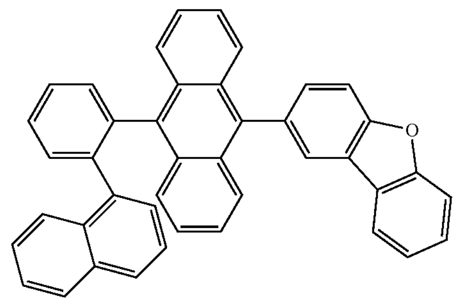
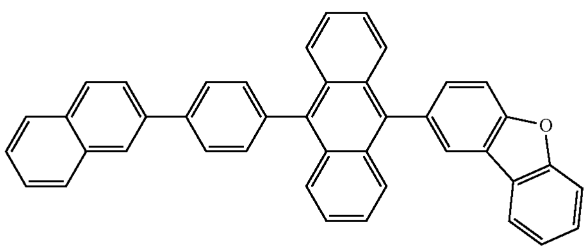
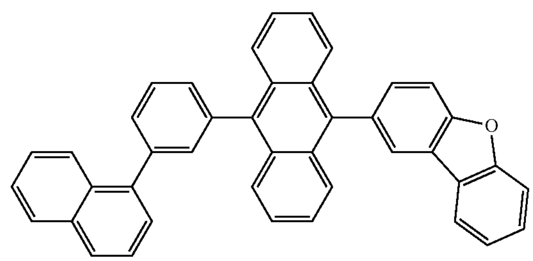
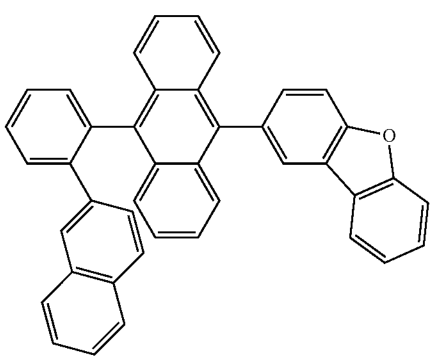
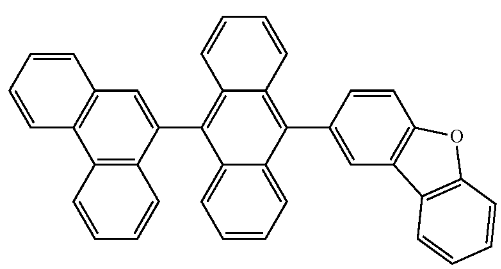
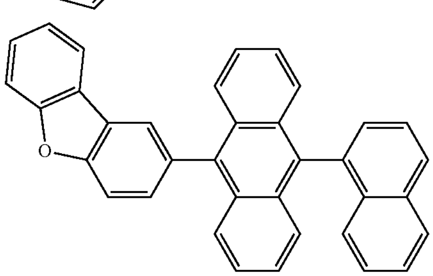
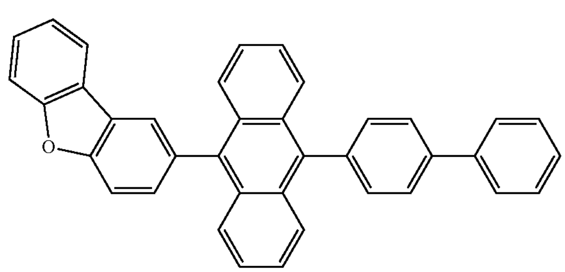

-continued
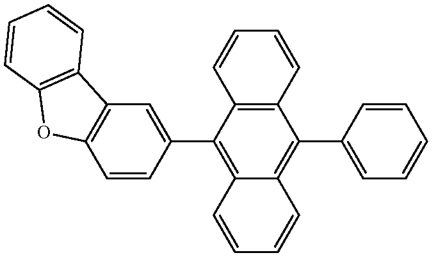
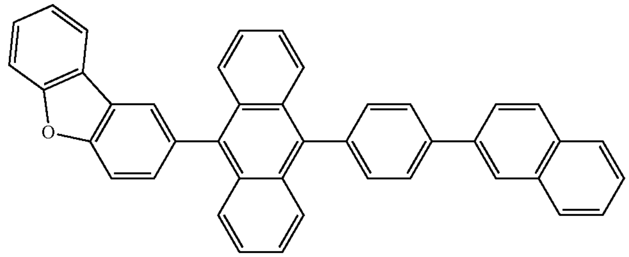
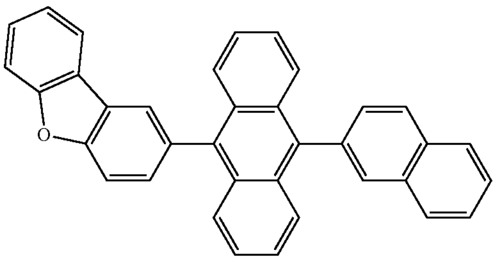
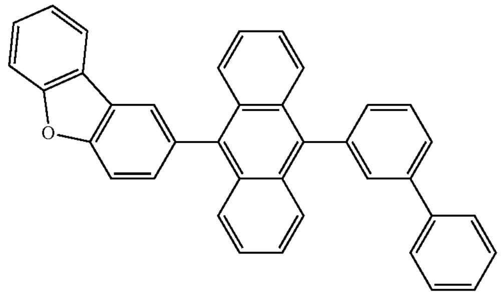
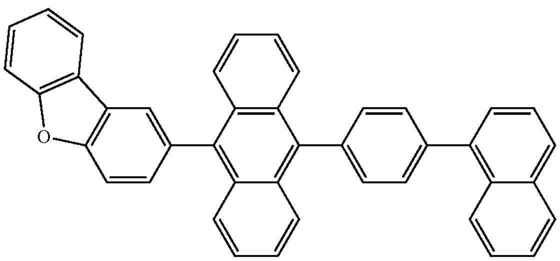
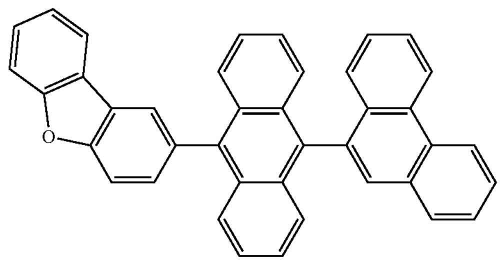
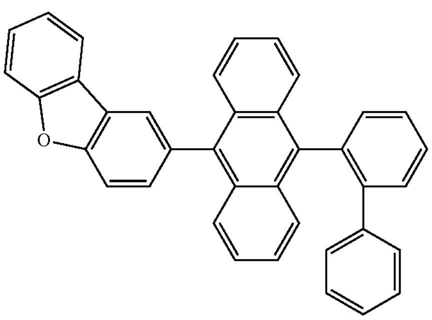
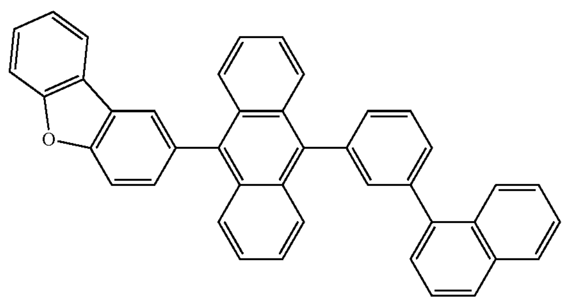
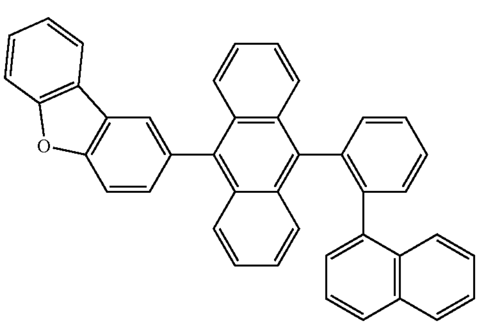
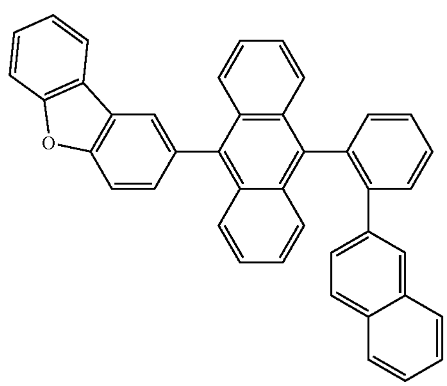

-continued
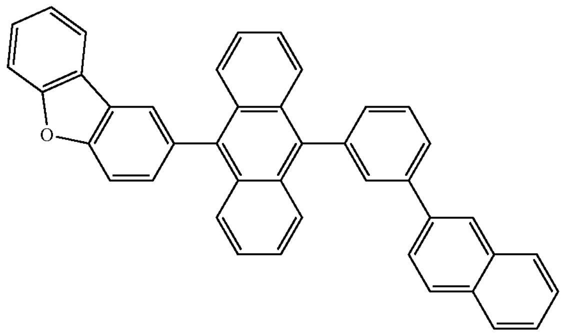
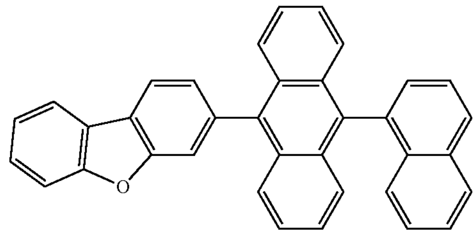
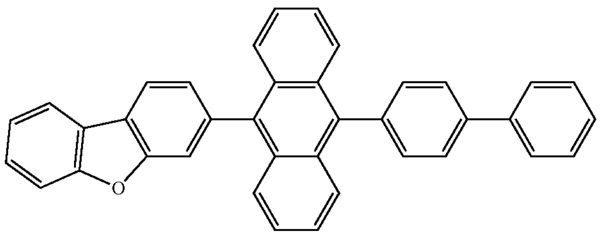
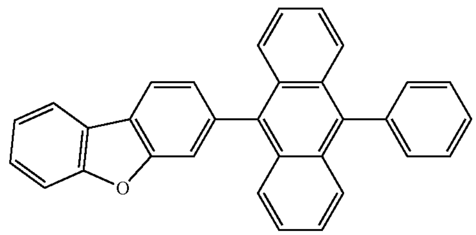
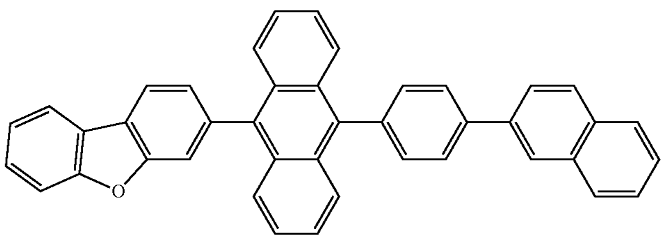
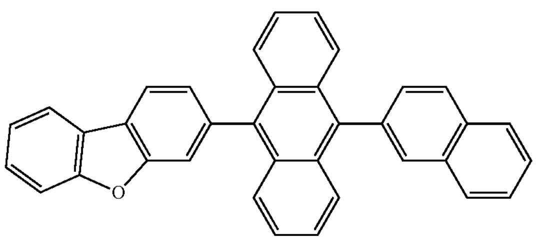
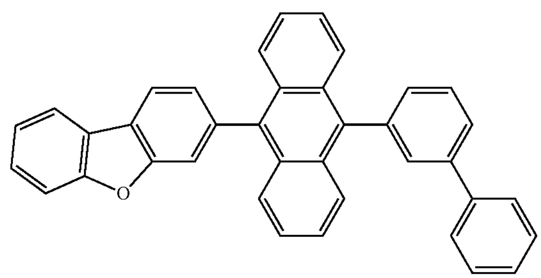
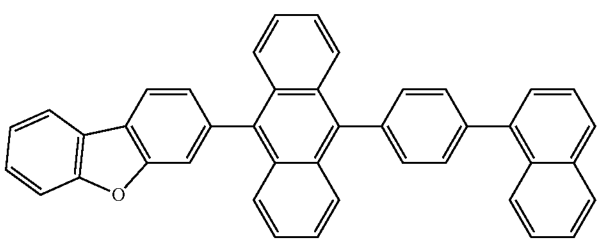
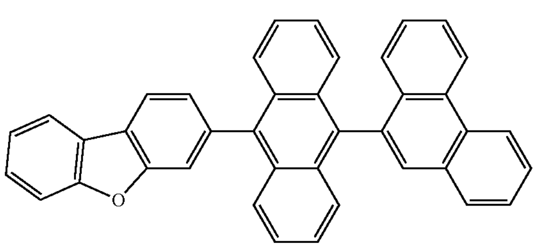
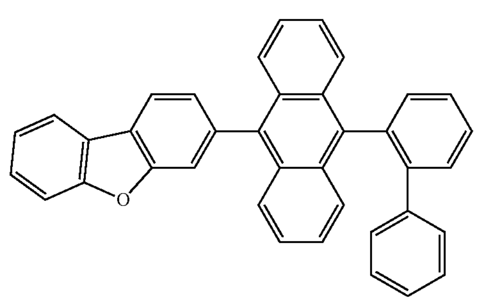

-continued
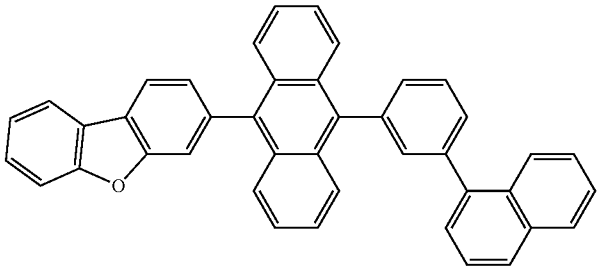
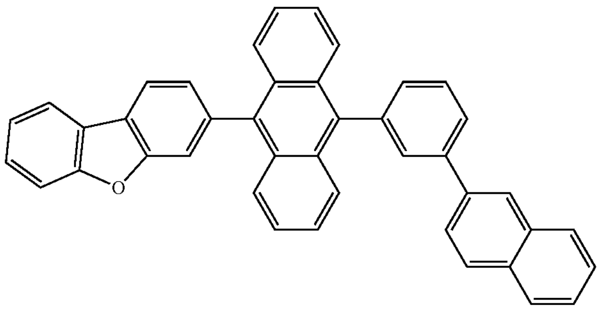
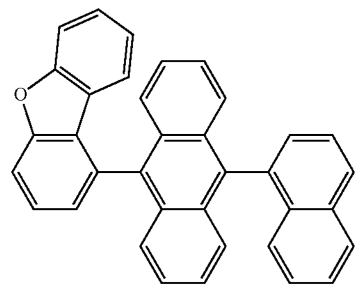
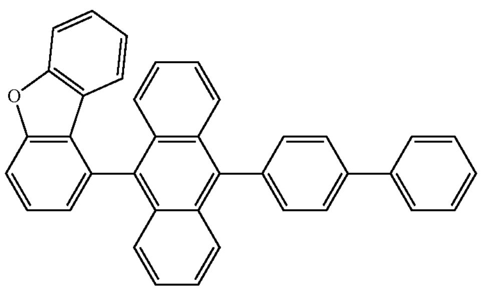
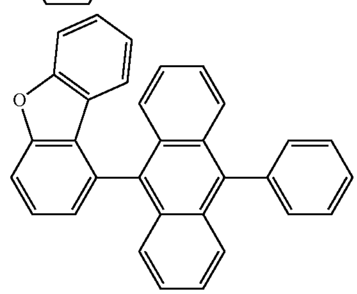
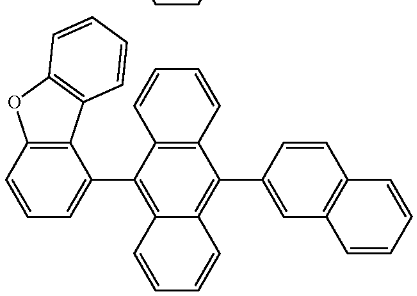
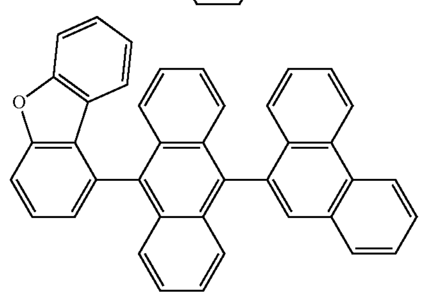
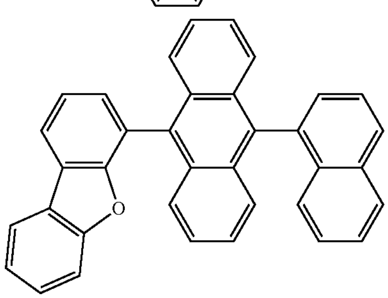
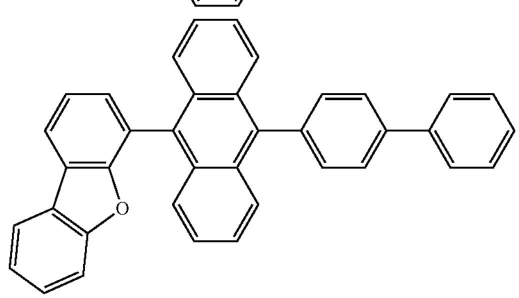
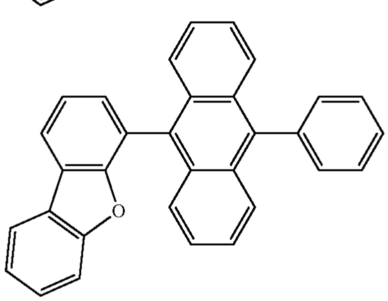
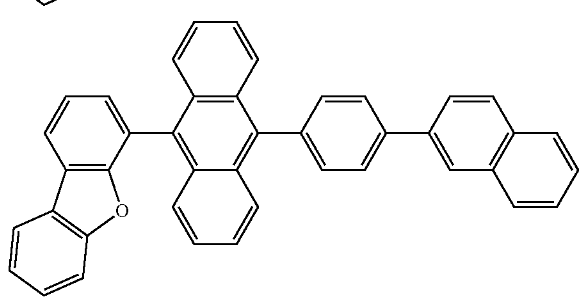

-continued
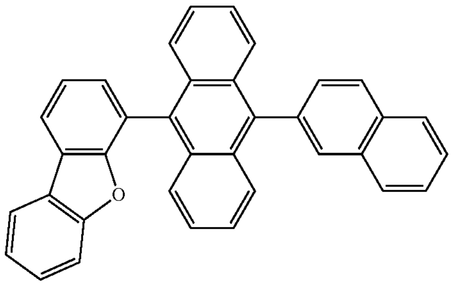
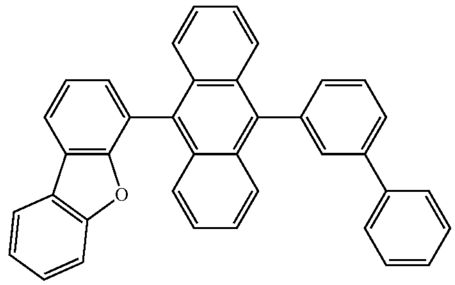
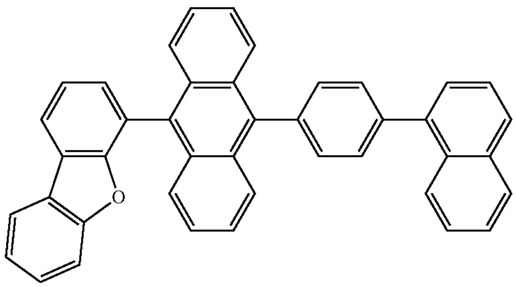
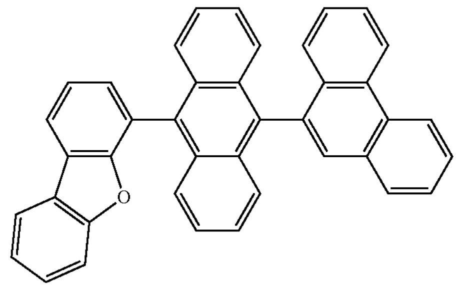
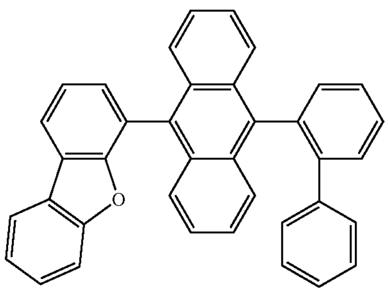
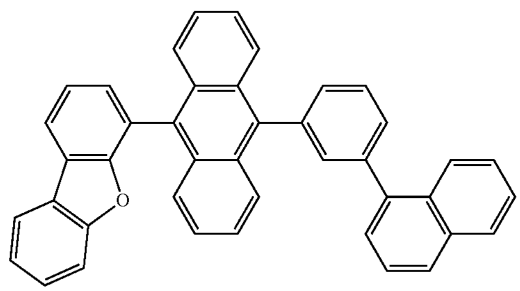
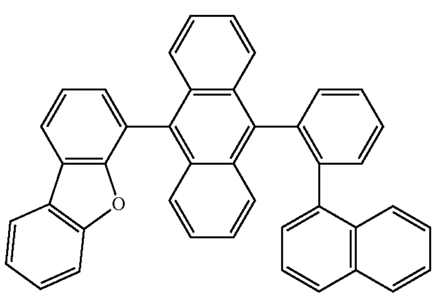
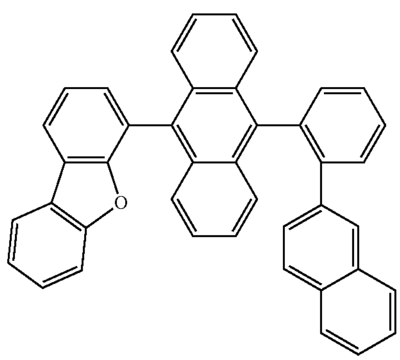
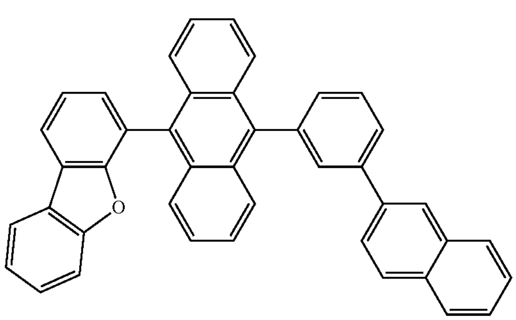
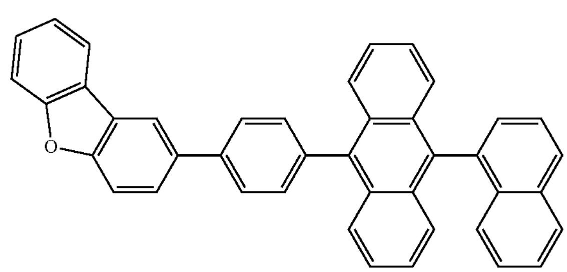

-continued
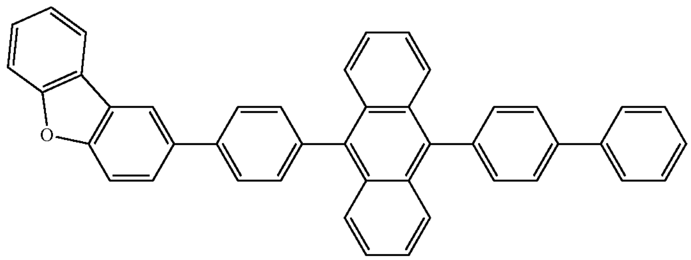
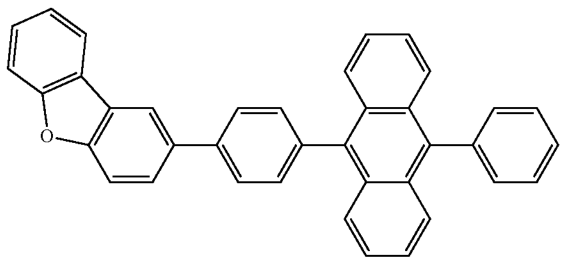
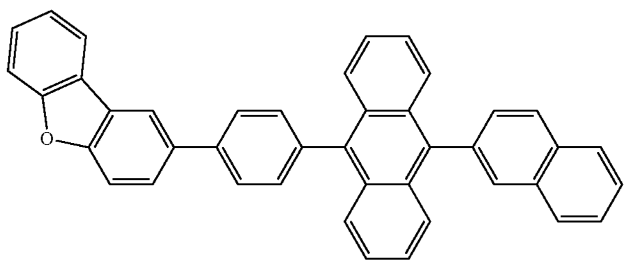
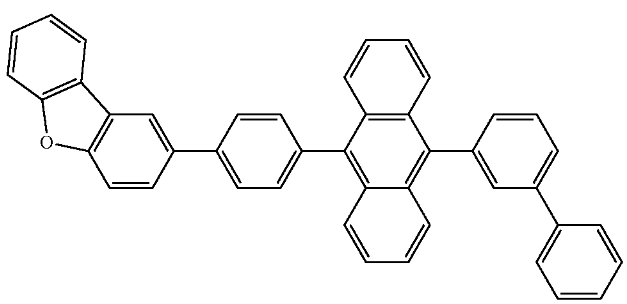
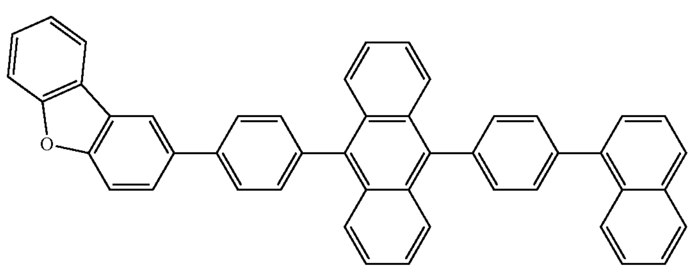
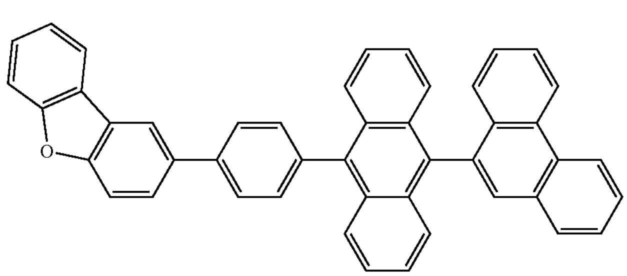

-continued
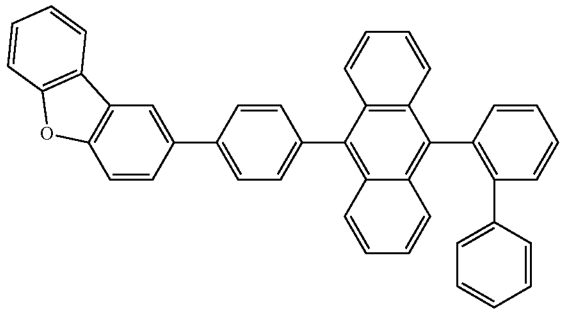
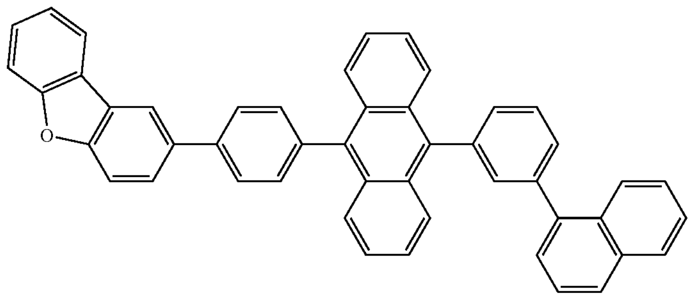
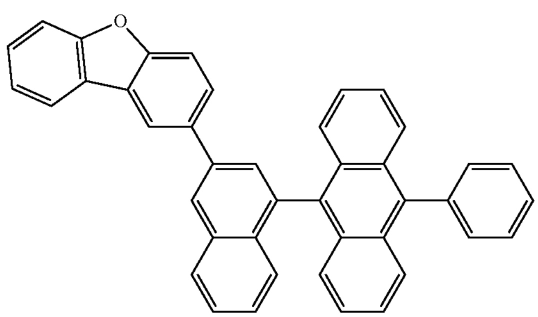
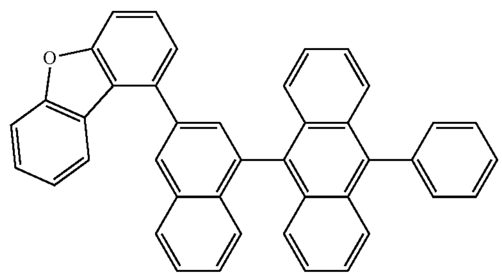
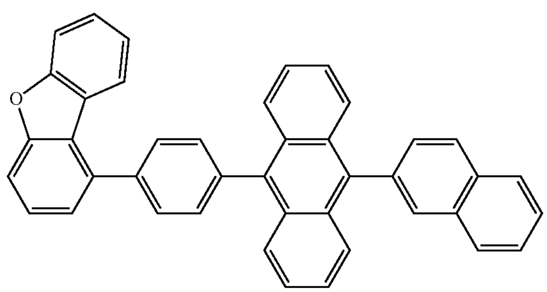
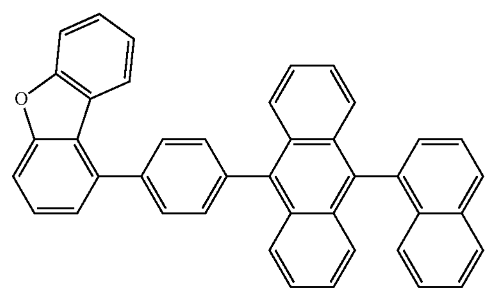
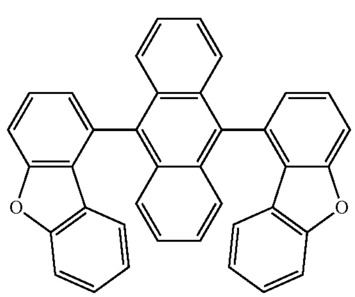
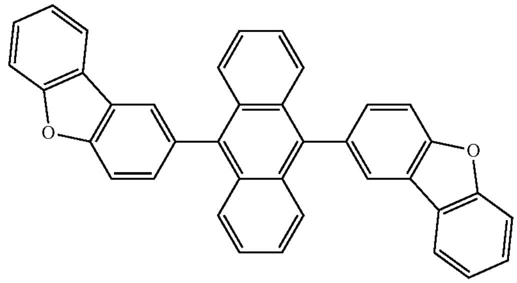

-continued
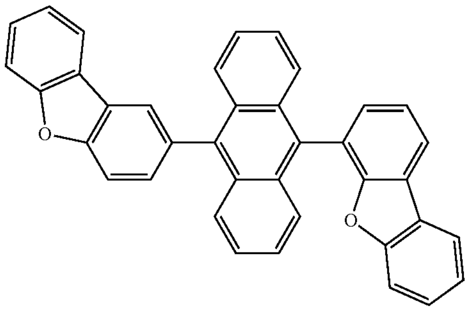
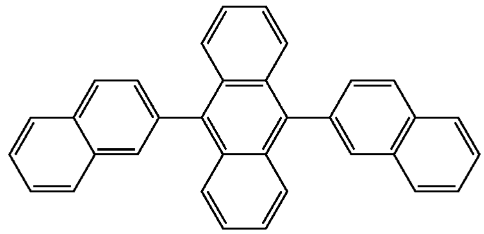
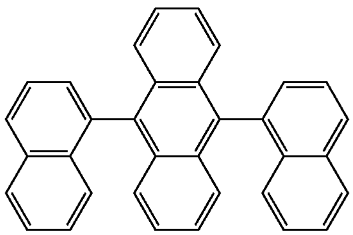
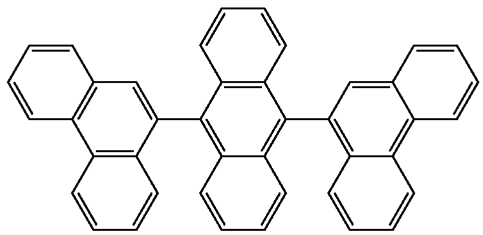
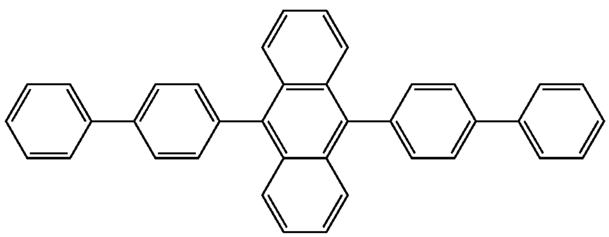
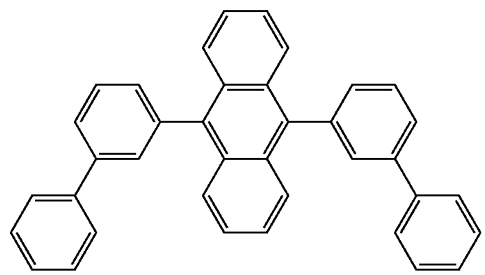
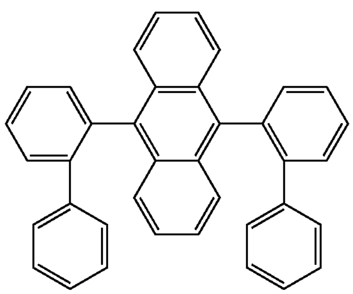
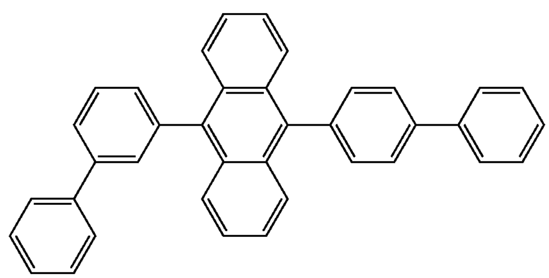
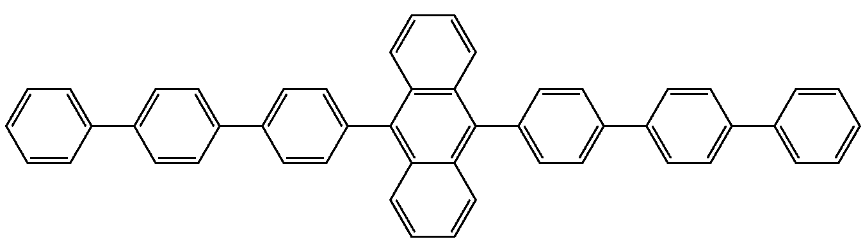
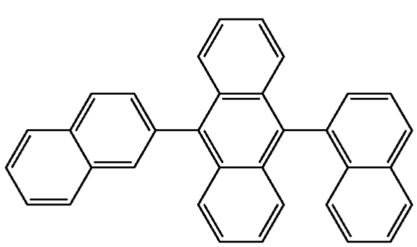
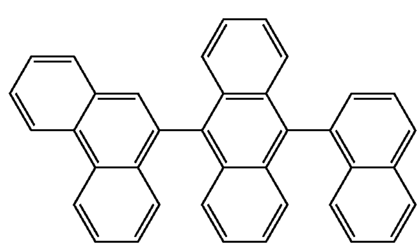

-continued
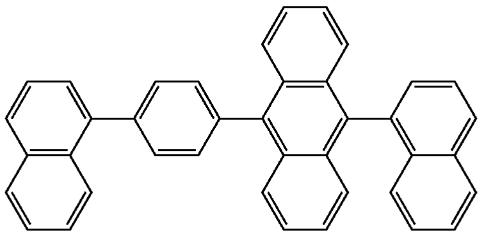
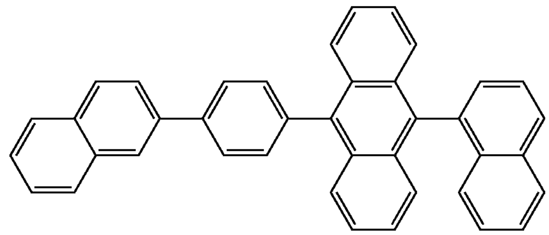
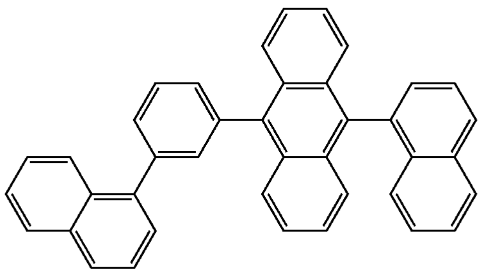
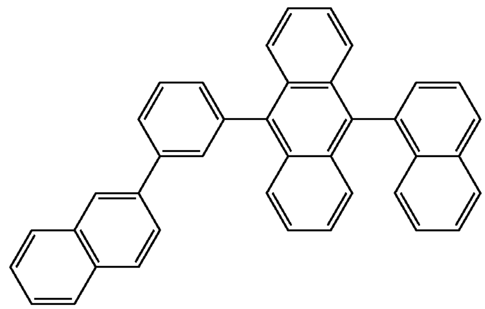
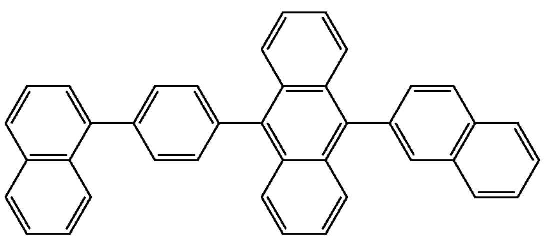
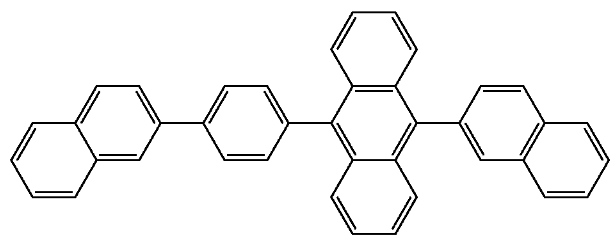
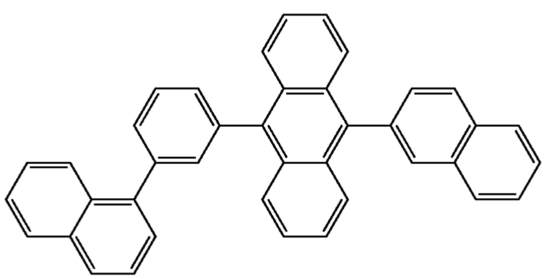
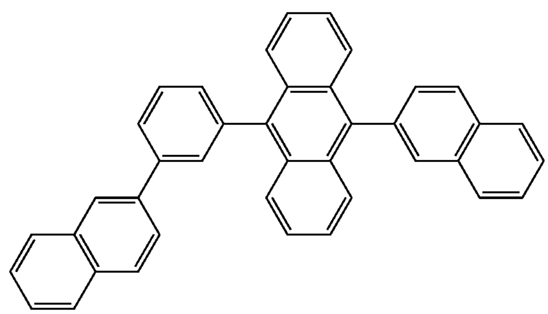
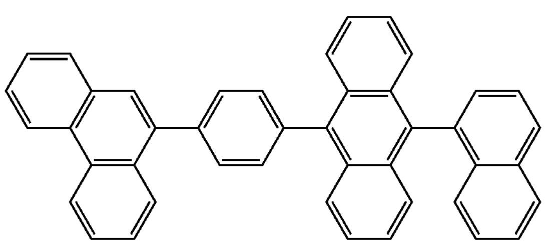
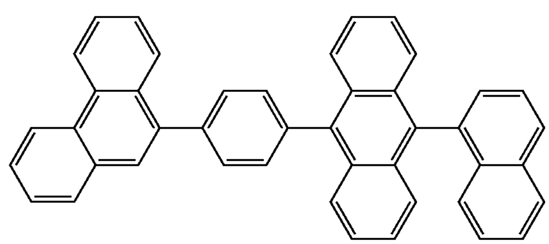
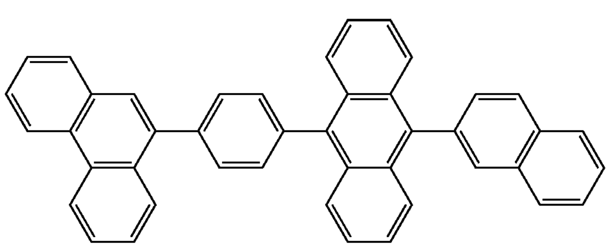

-continued
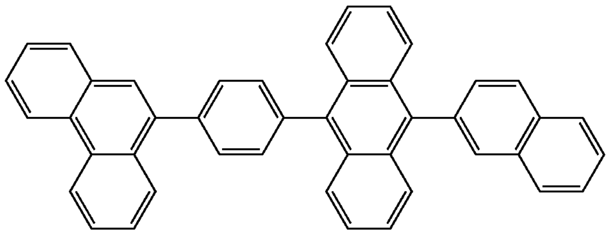
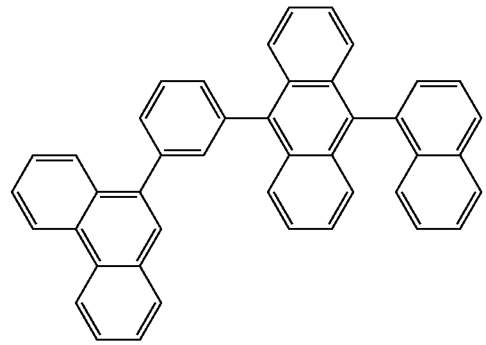
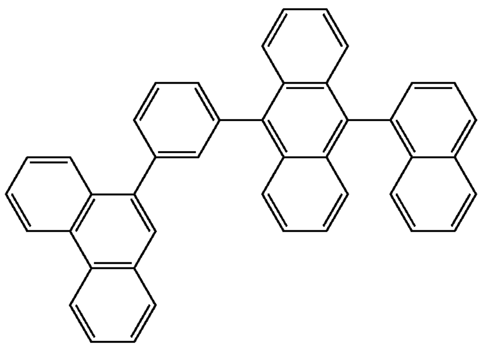
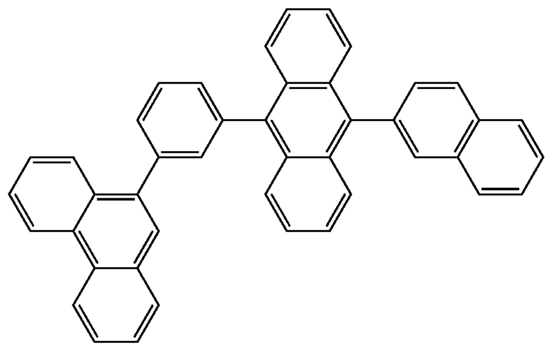
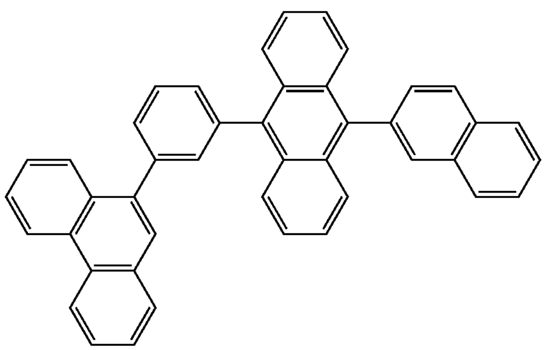
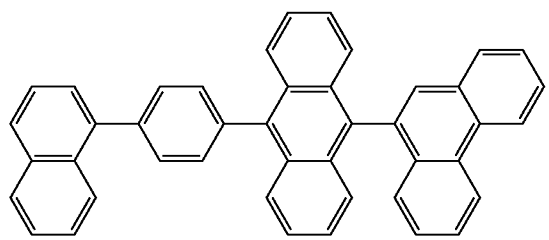
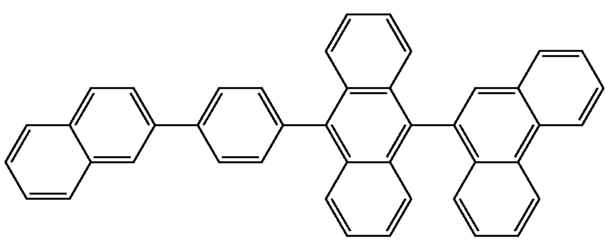
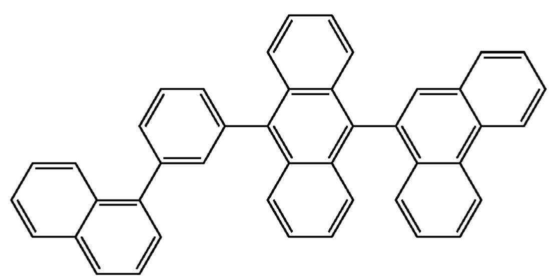
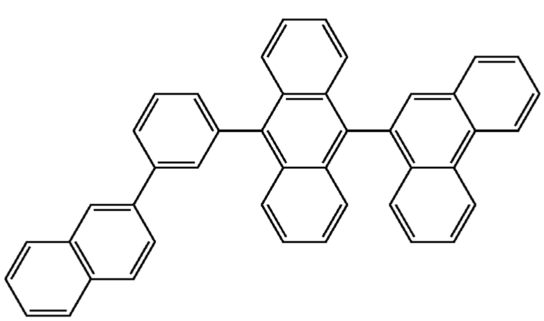
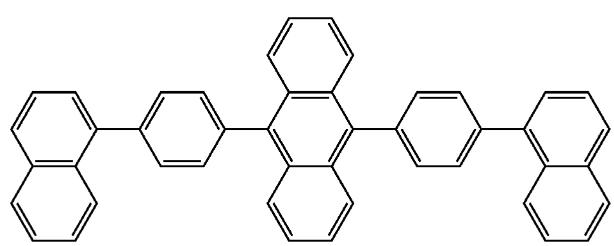

-continued
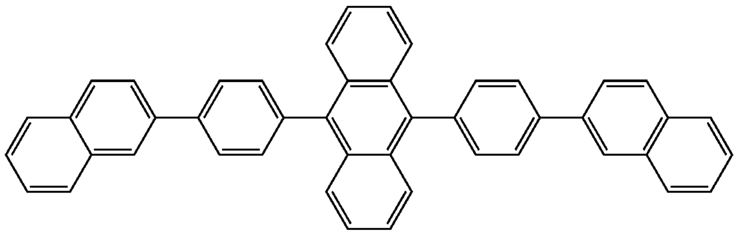
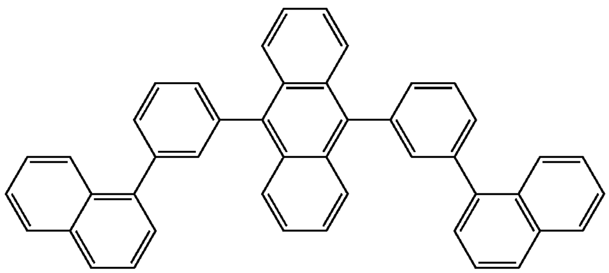
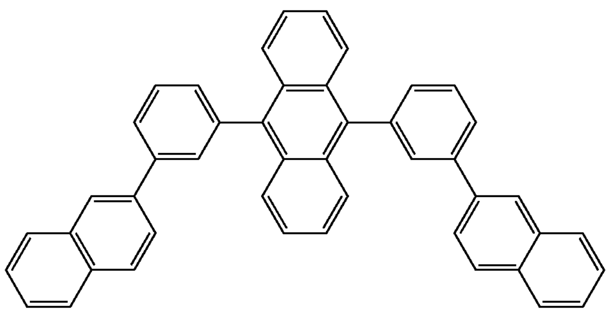
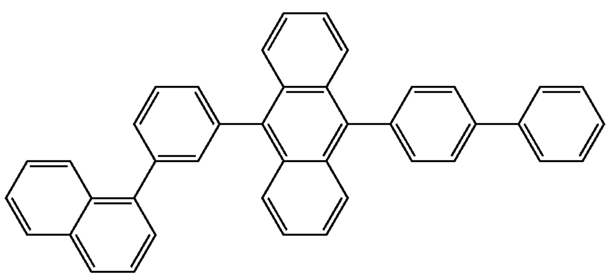
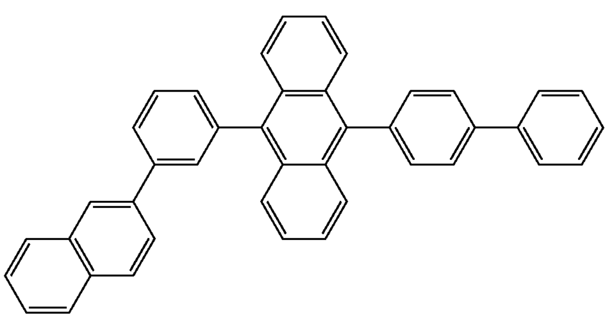
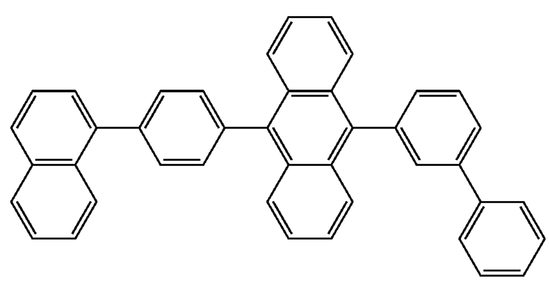
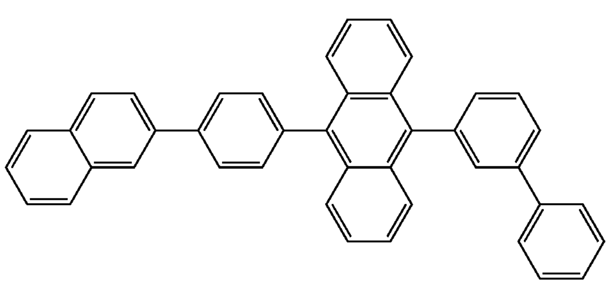
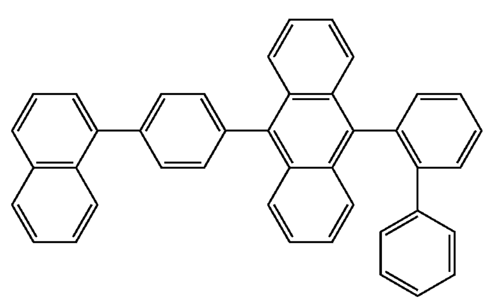

-continued
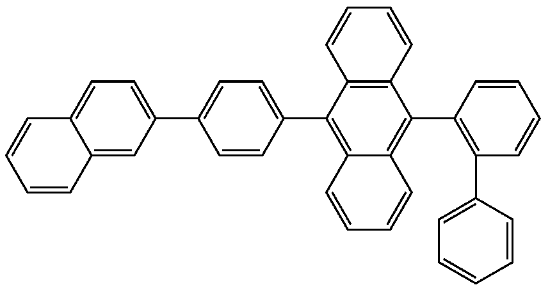
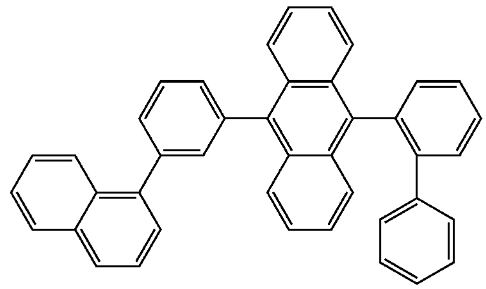
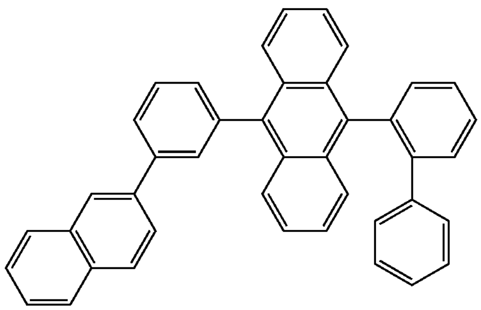
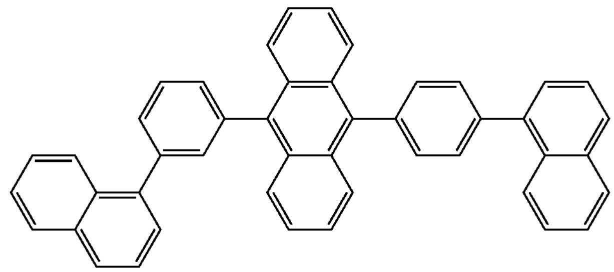
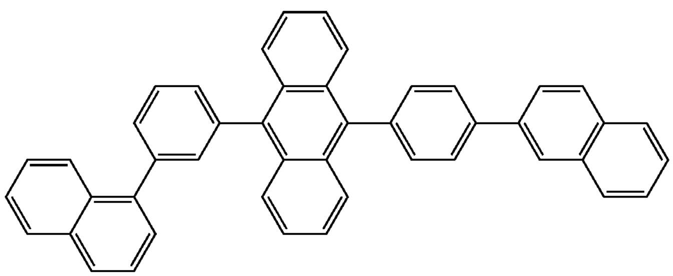
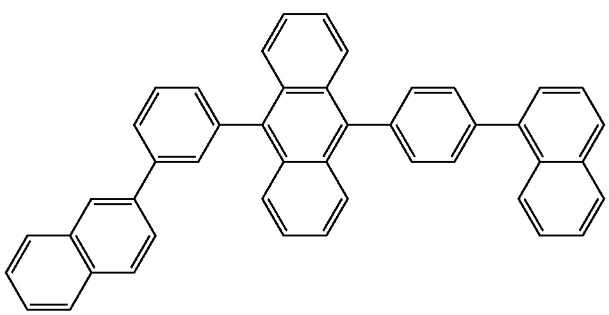
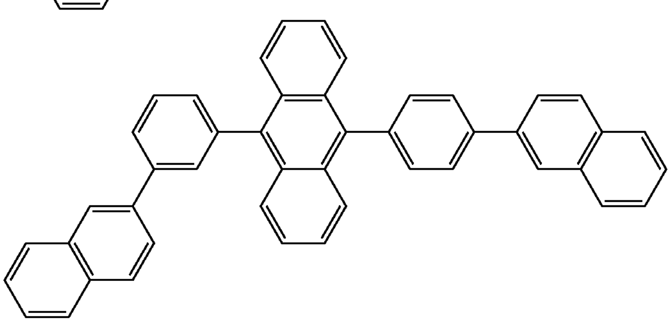
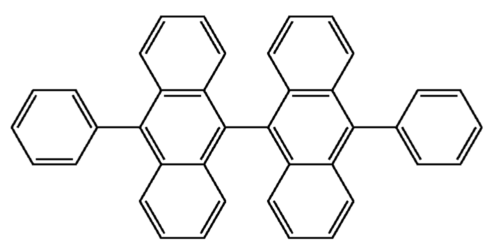
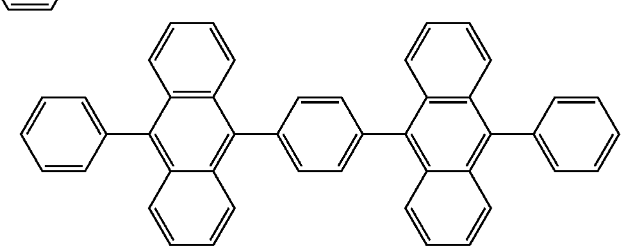
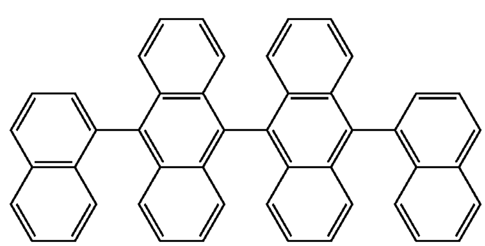

-continued
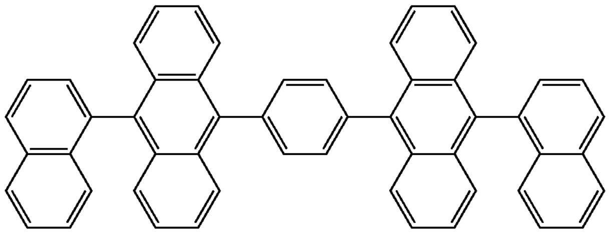
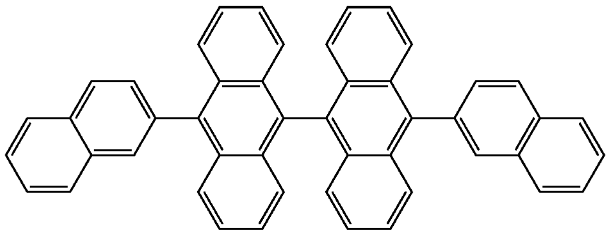
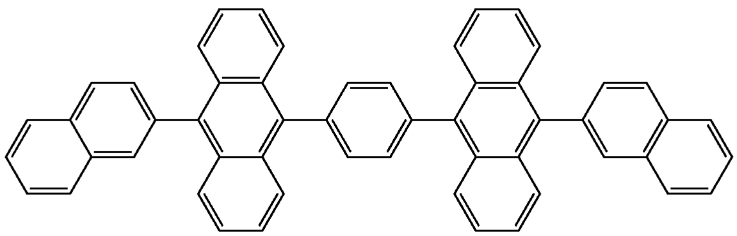
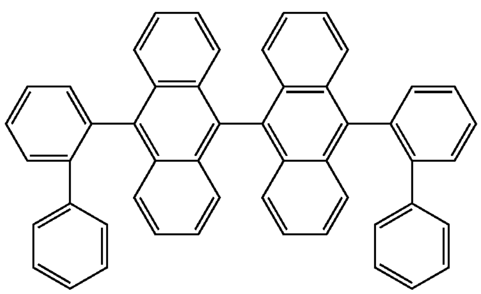
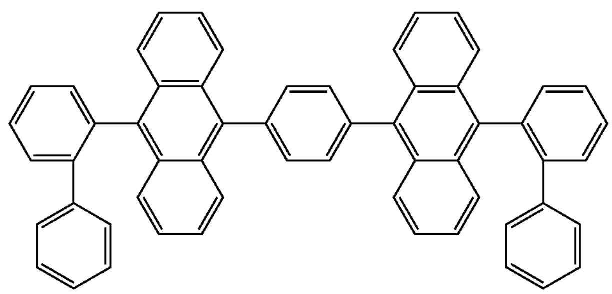
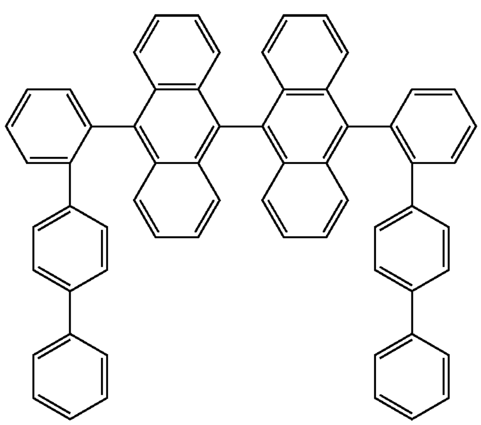
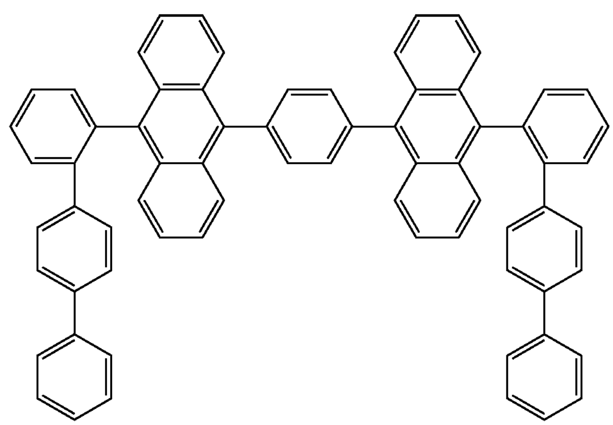
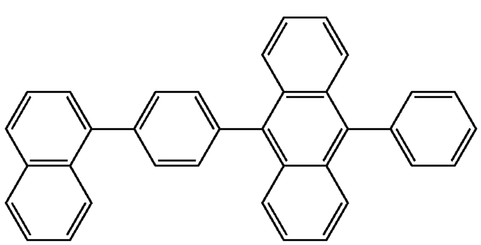
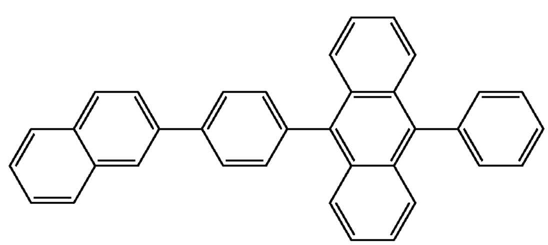

-continued
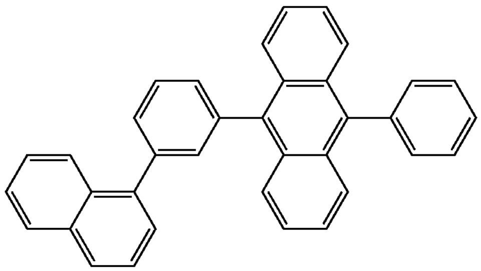
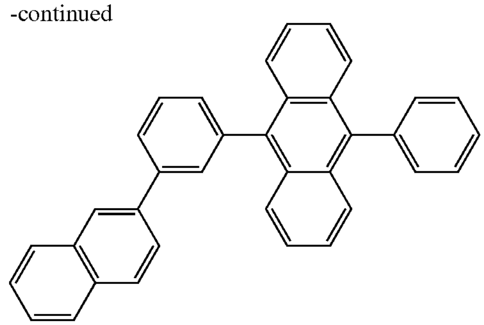
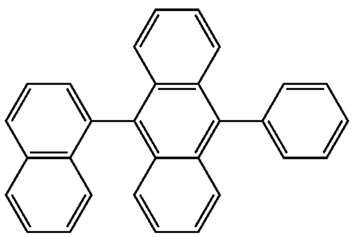
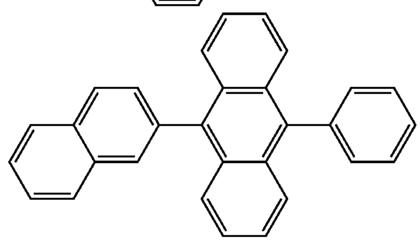
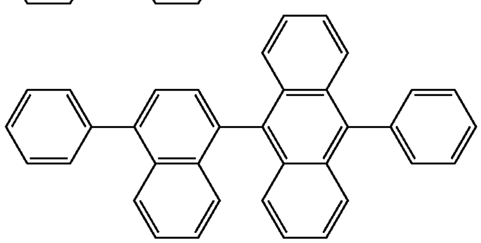
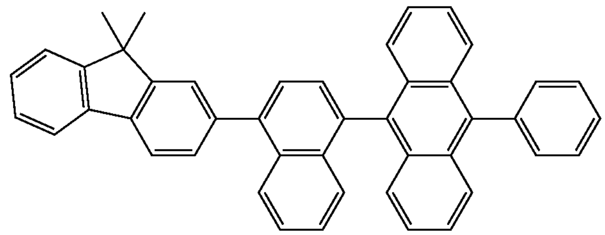
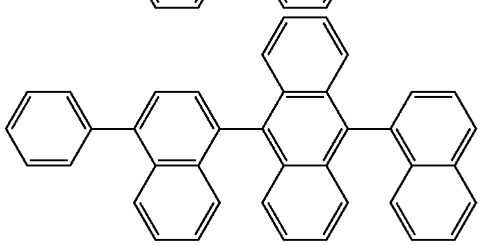
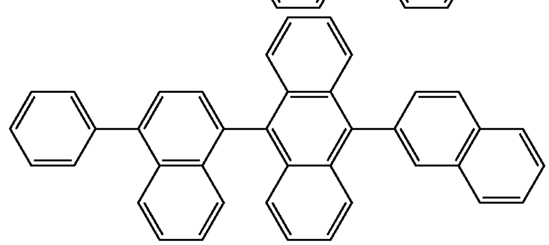
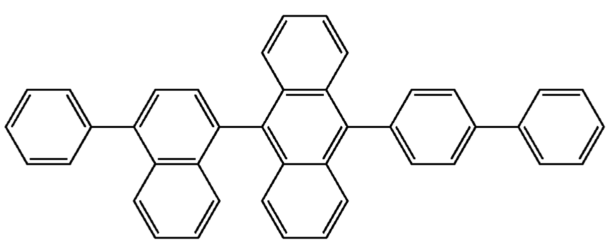
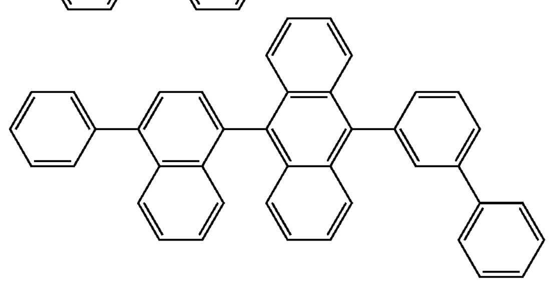
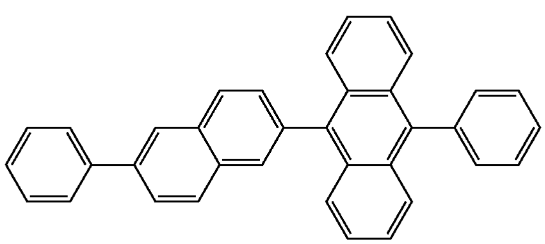
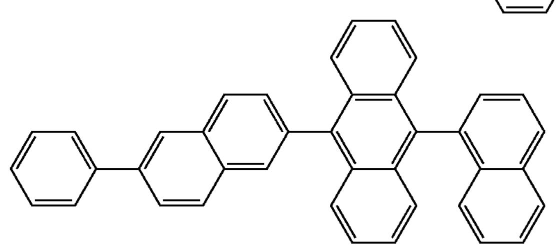
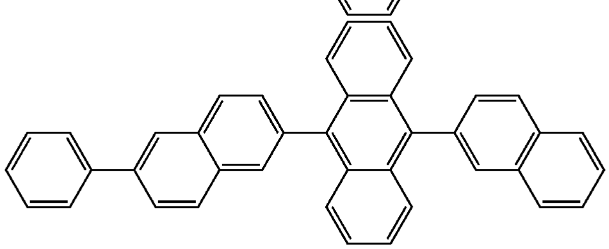
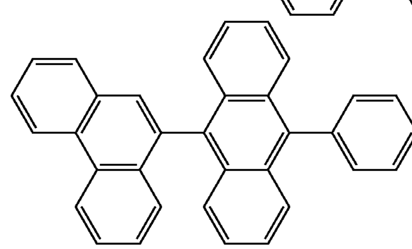

-continued
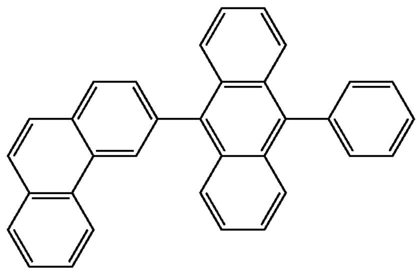
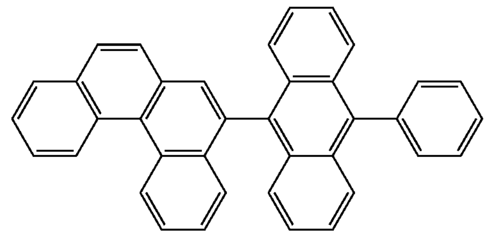
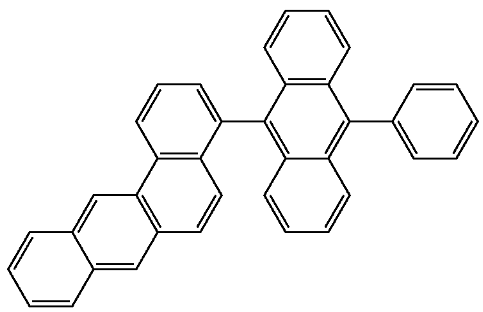
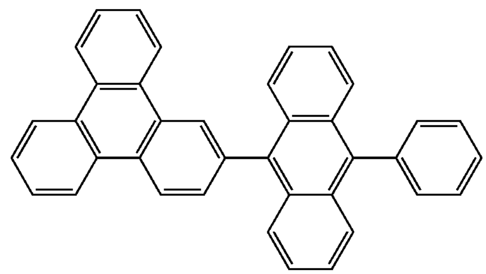
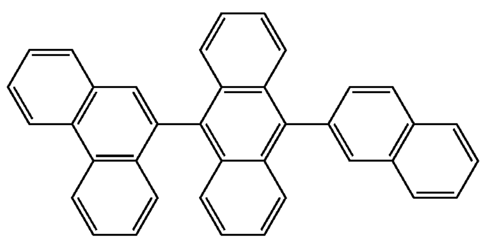
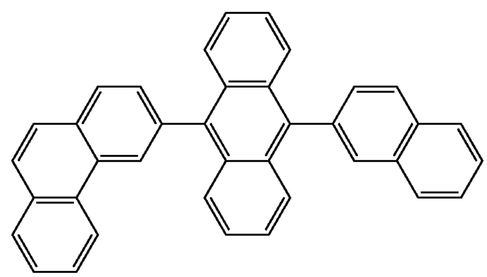
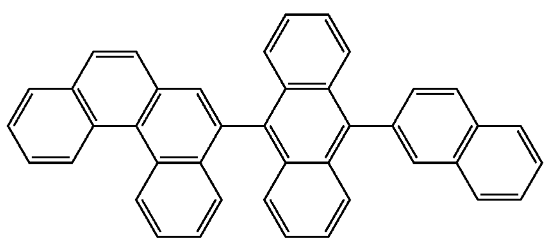
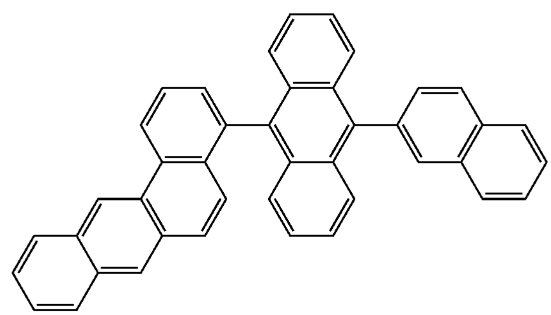
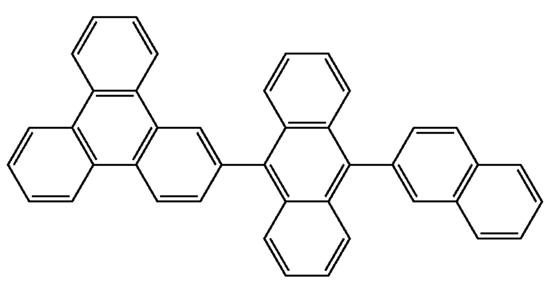
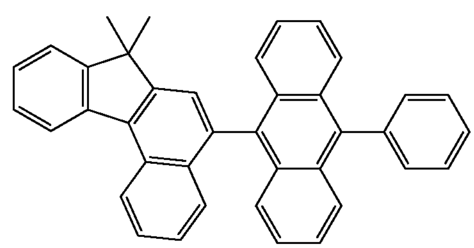
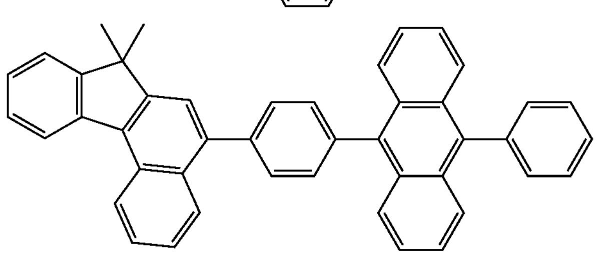
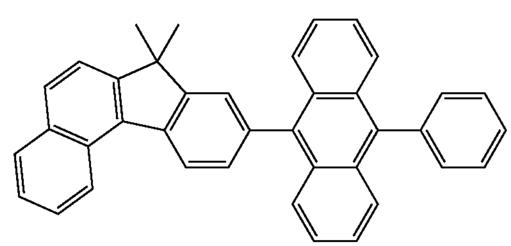

-continued
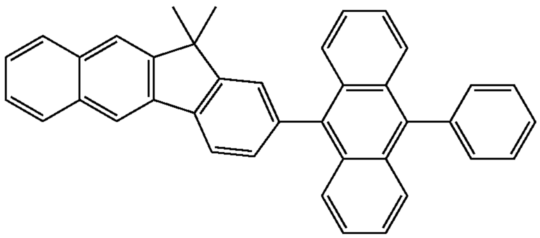
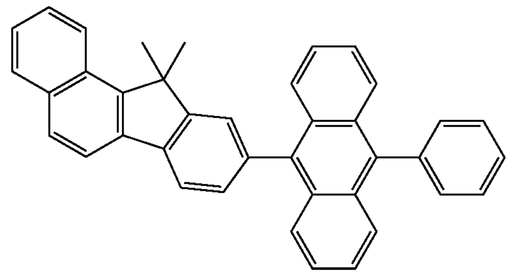
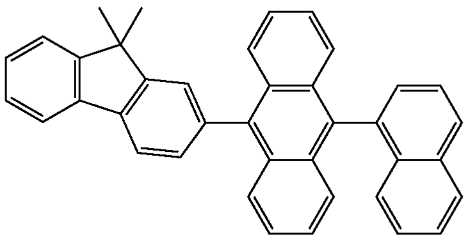
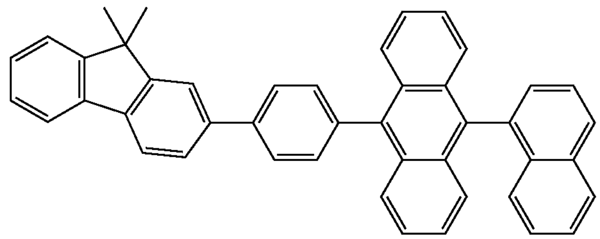
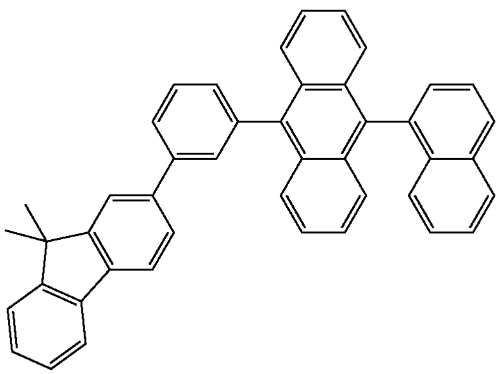
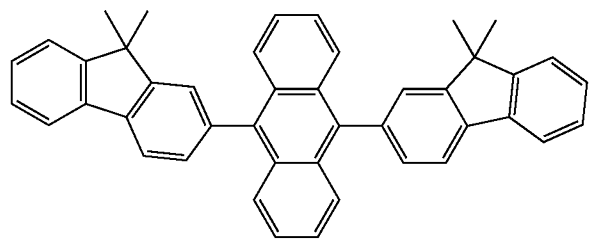
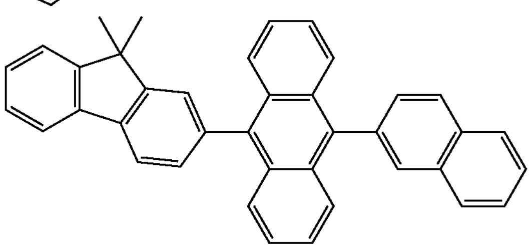
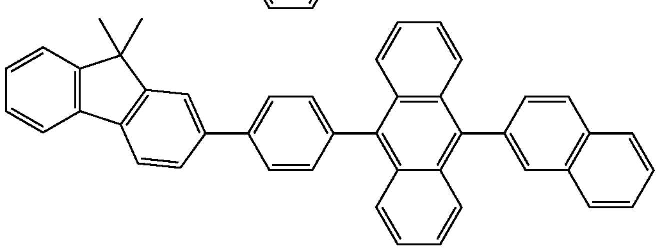
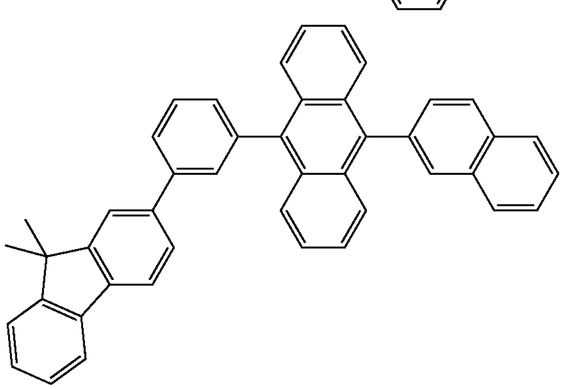
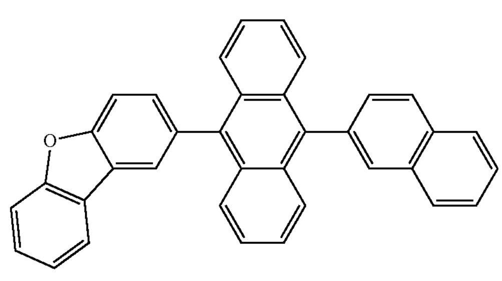

-continued
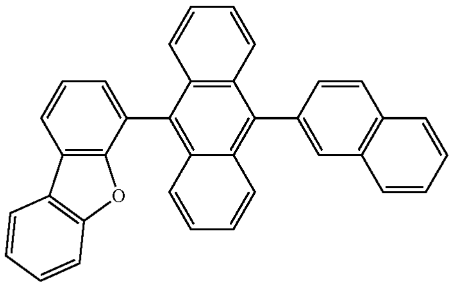
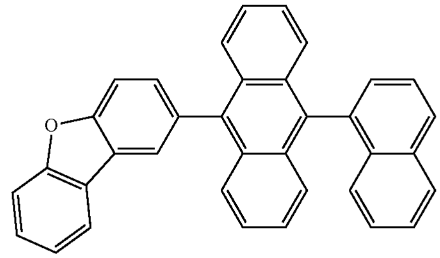
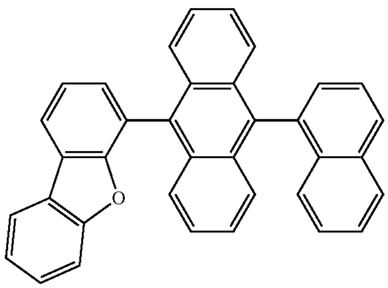
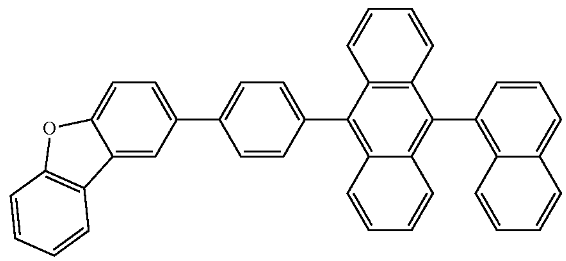
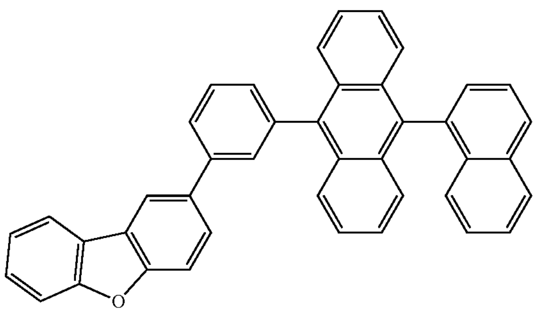
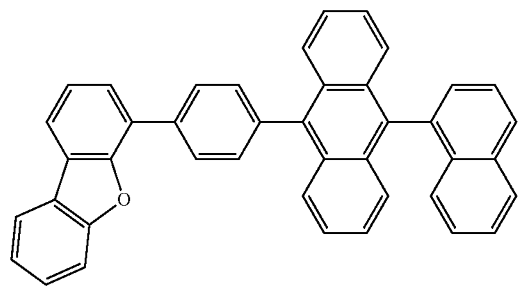
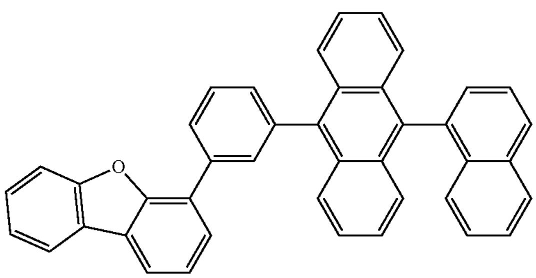
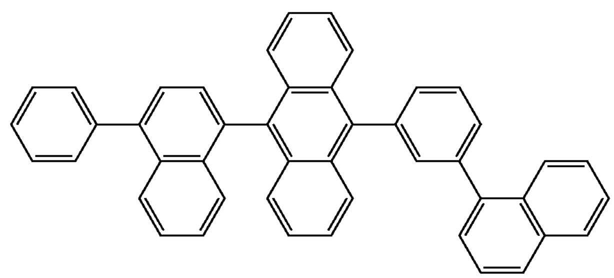
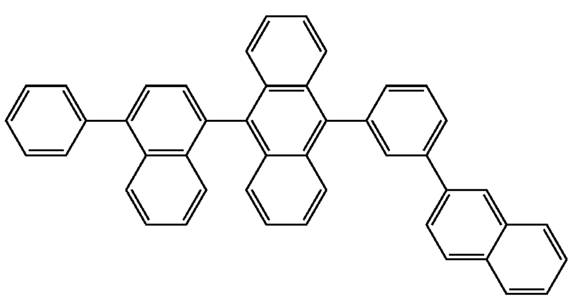
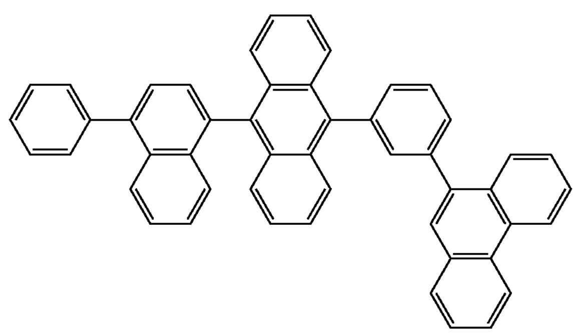
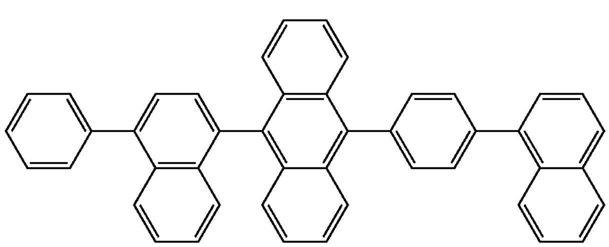

-continued
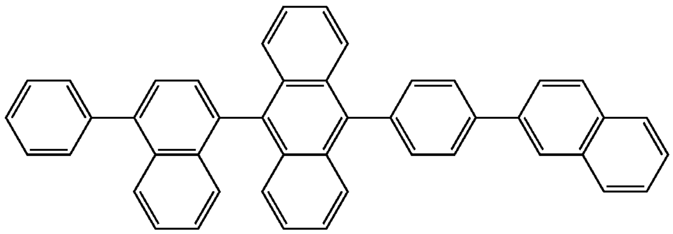
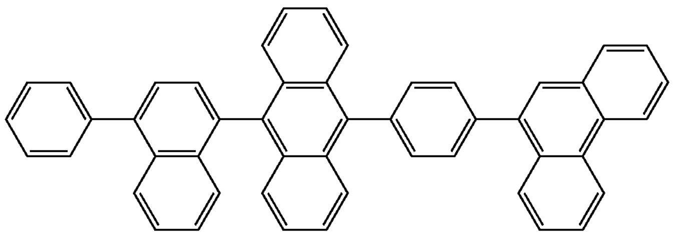
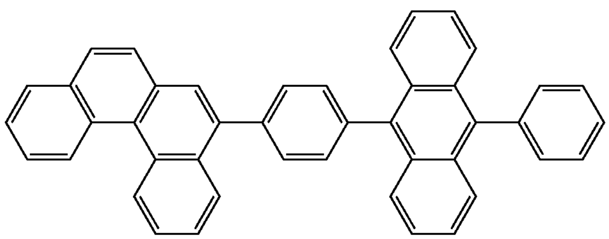
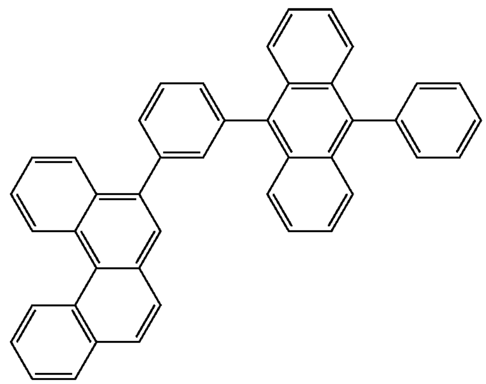
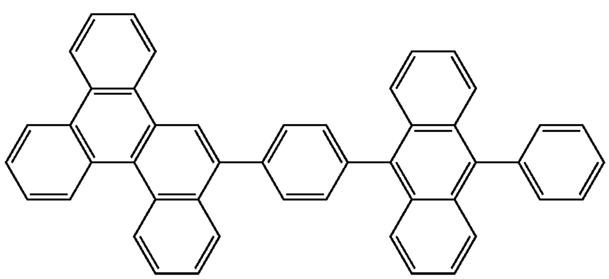
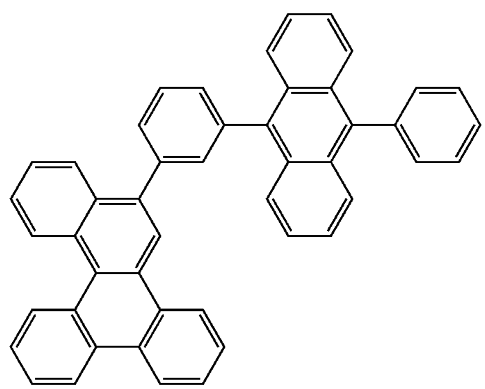
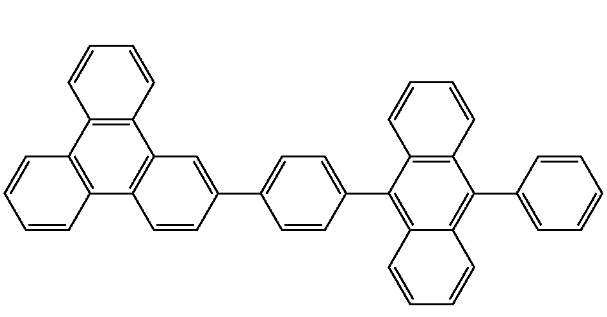
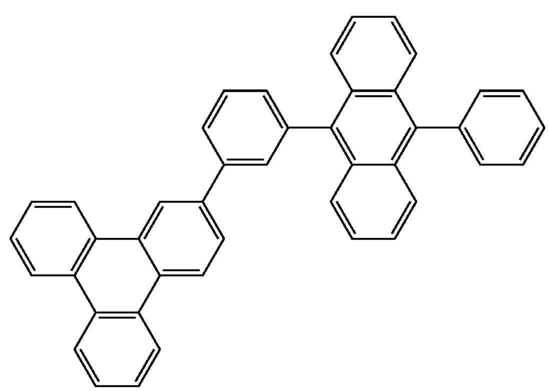

-continued
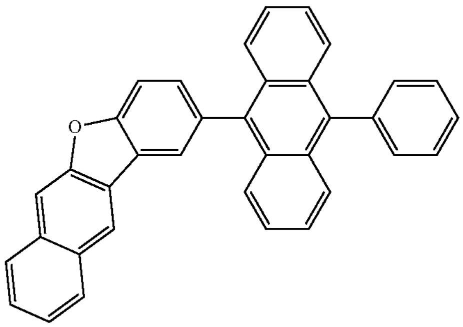
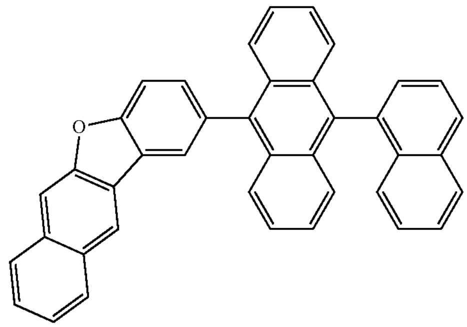
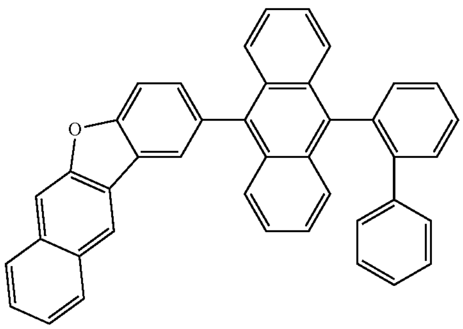
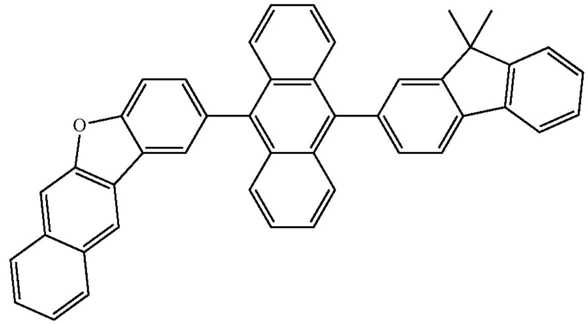
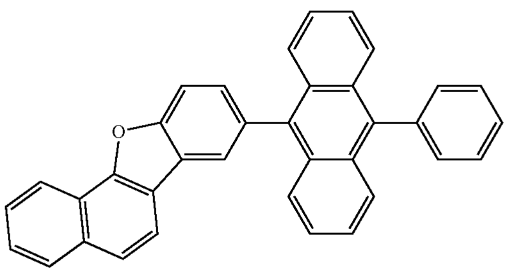
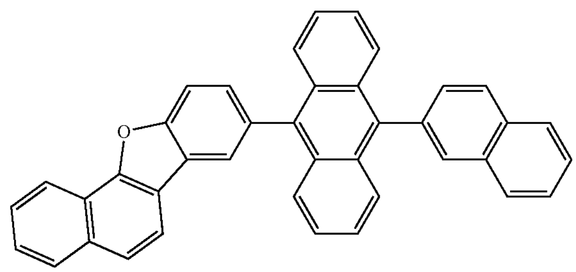
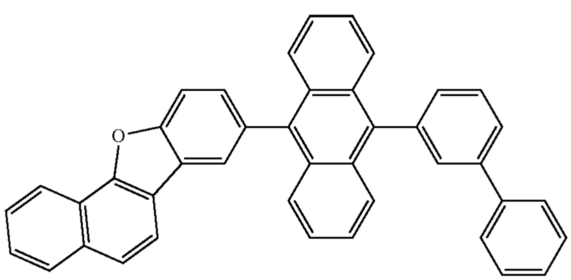
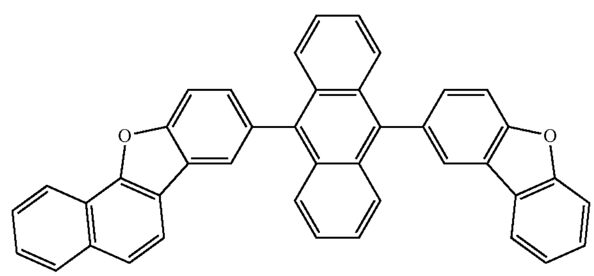
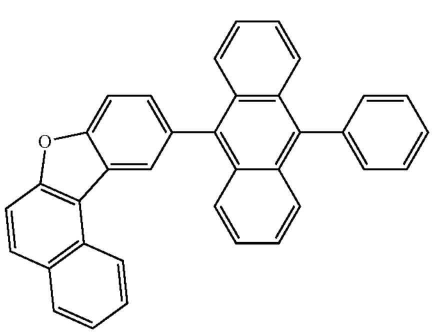
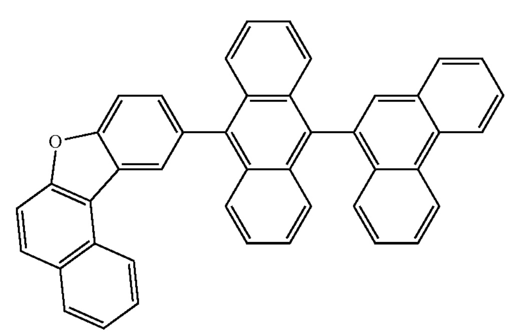

-continued
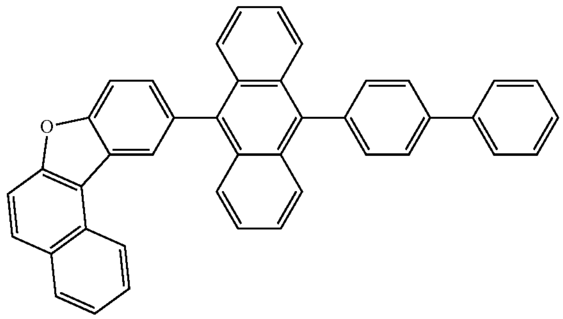
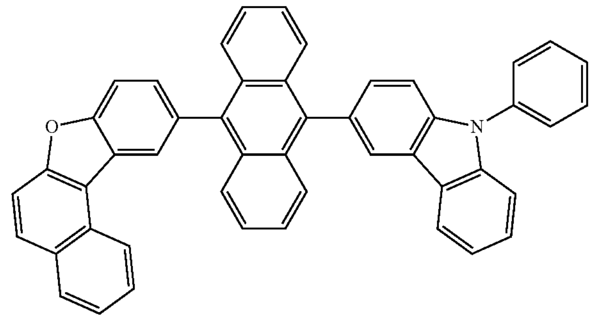
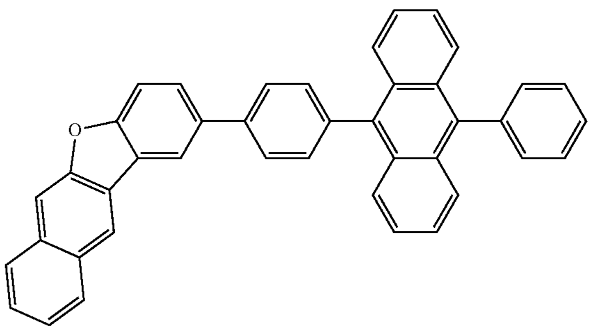
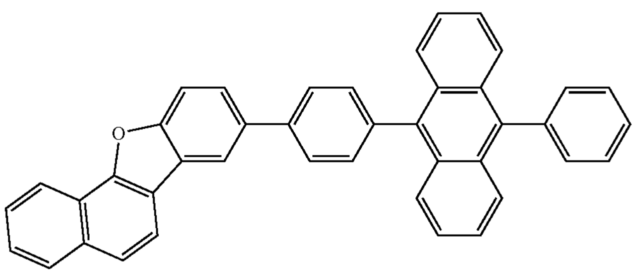
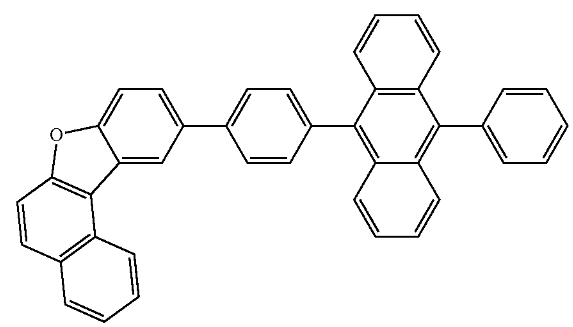
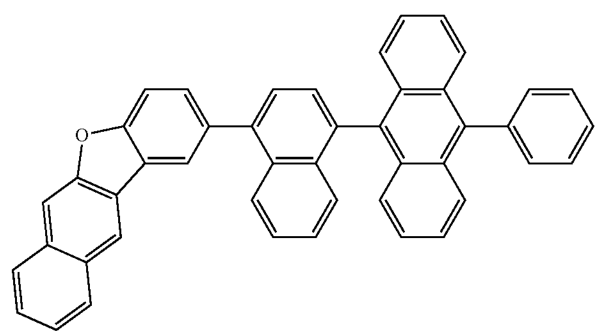
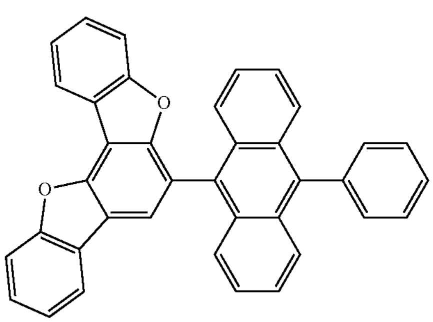
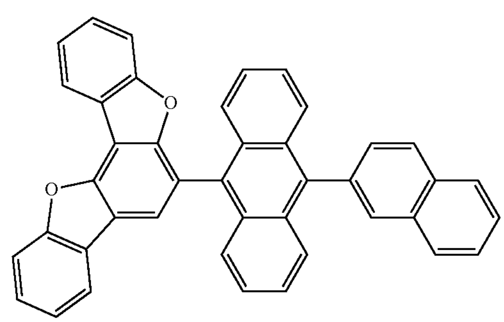

-continued
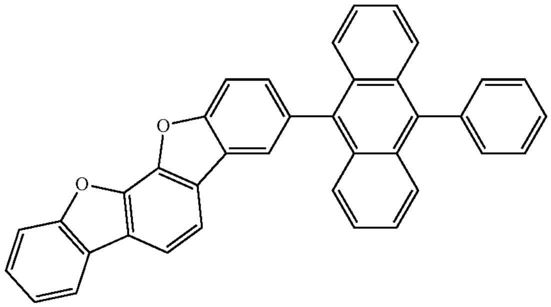
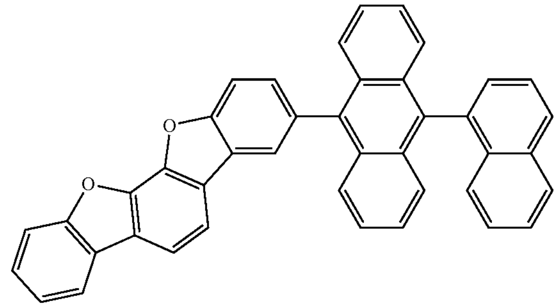
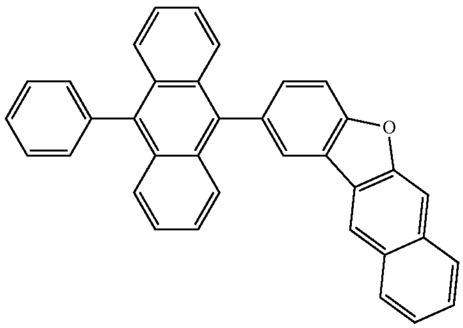
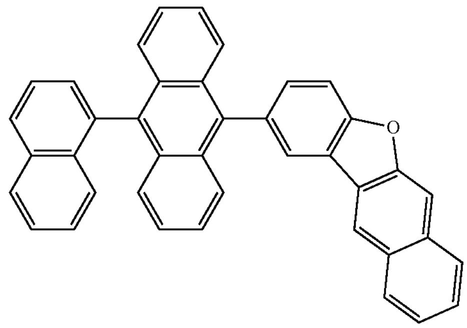
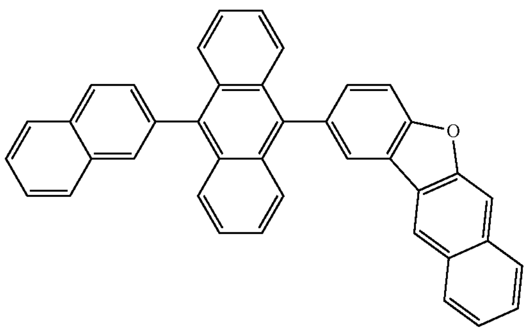
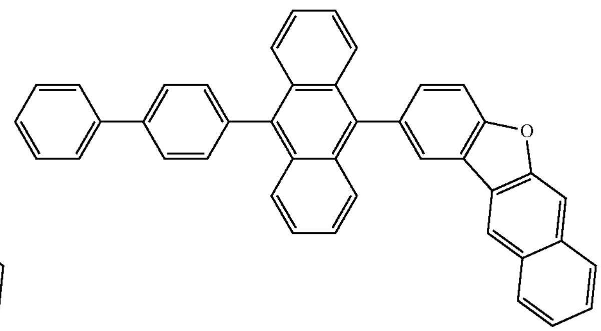
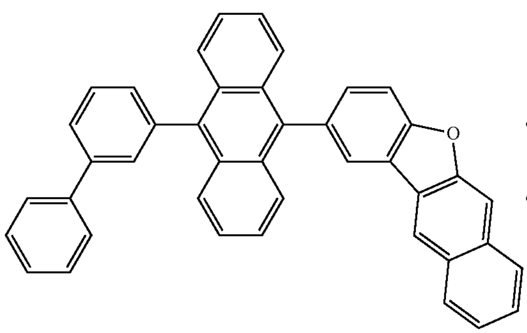
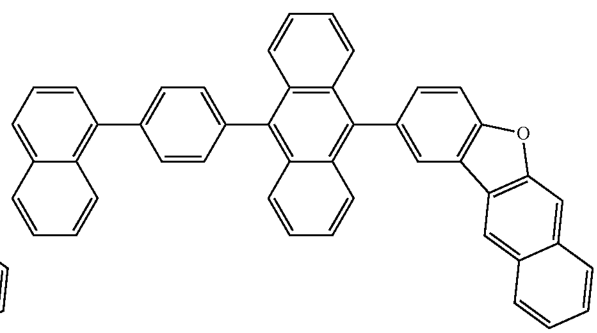
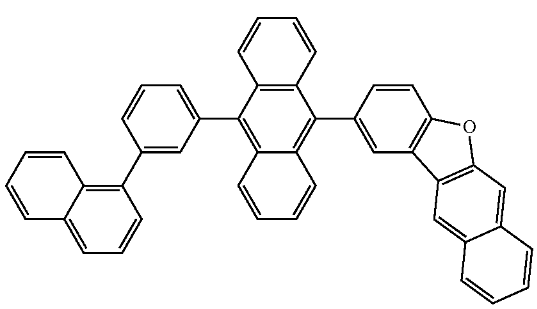
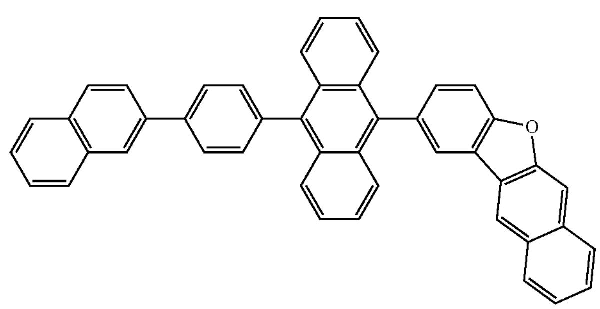

-continued
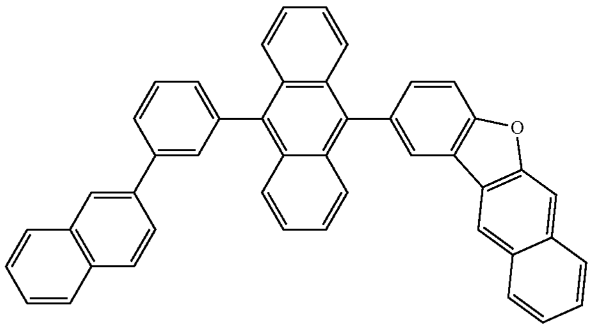
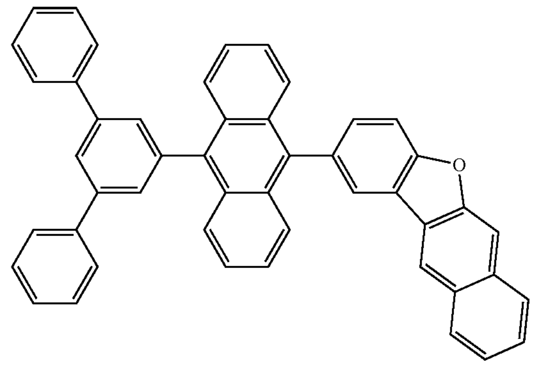
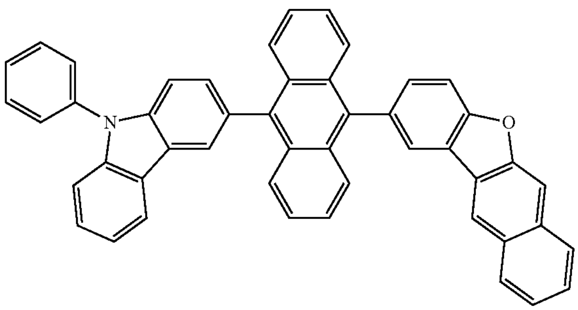
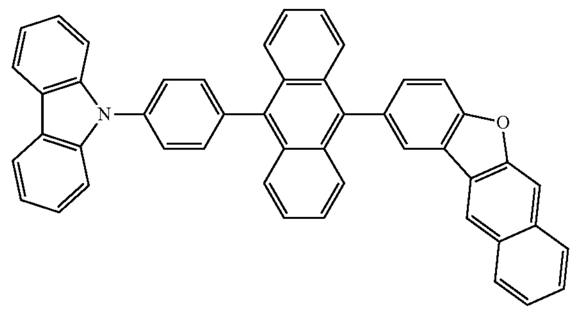
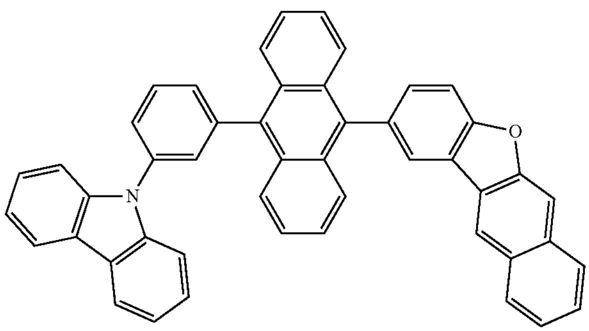
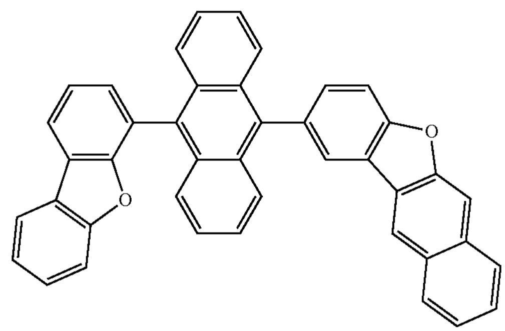
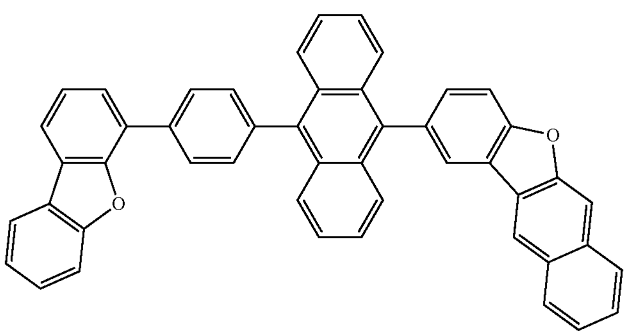
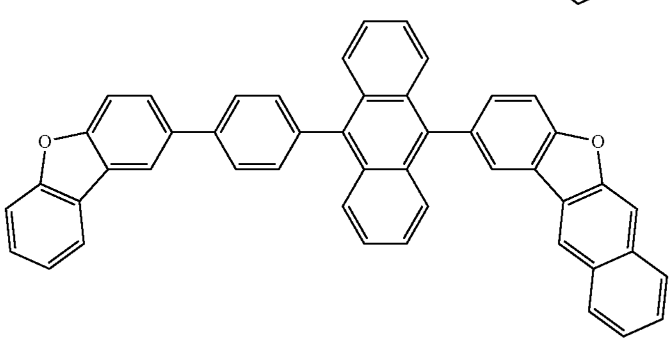

-continued
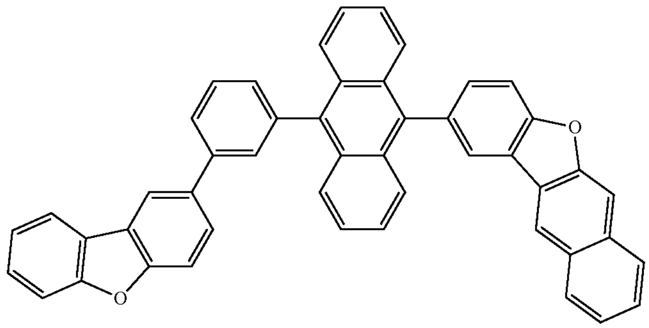
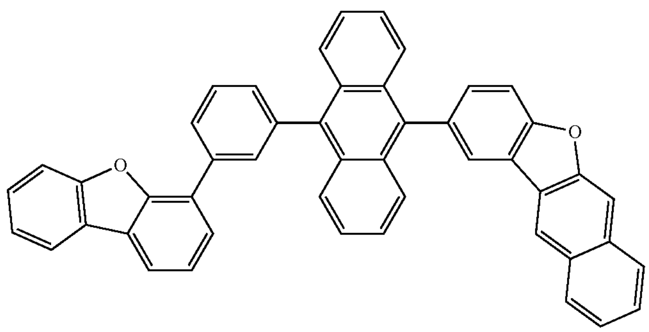
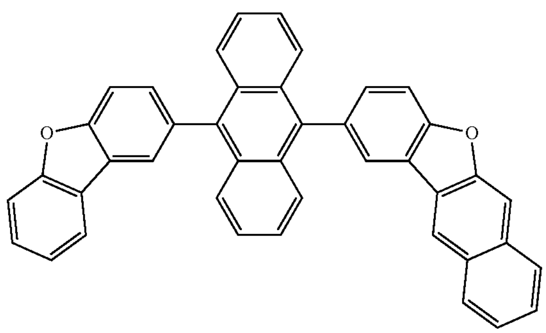
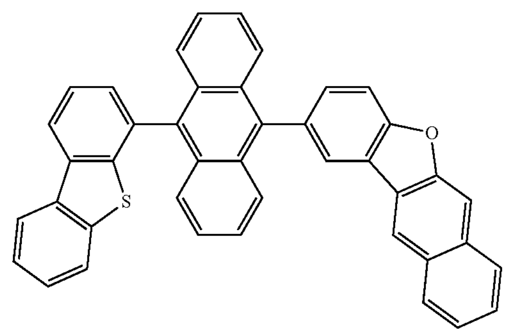
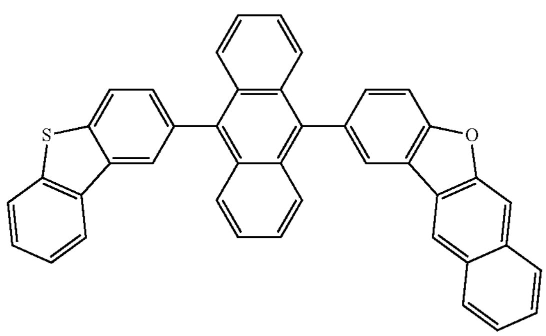
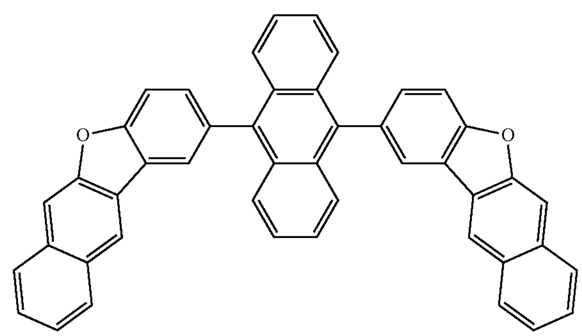
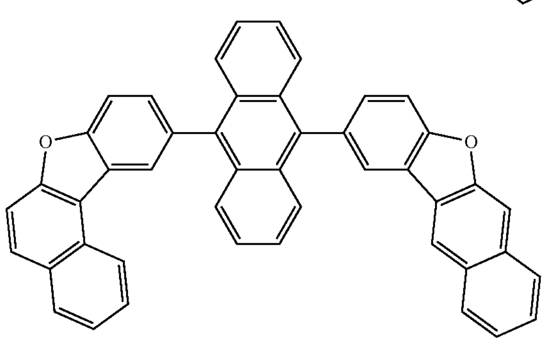
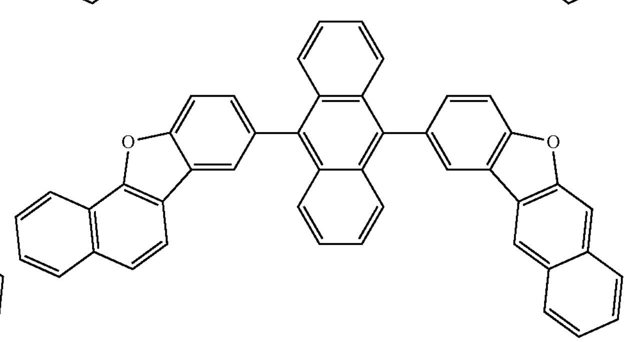

-continued
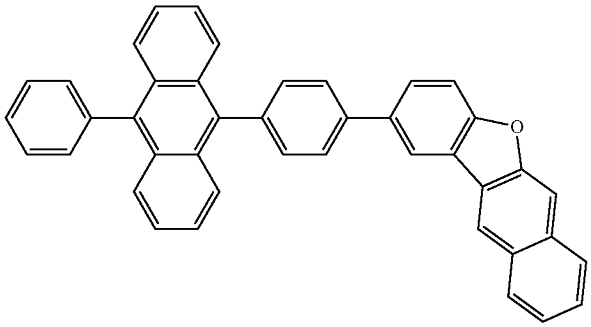
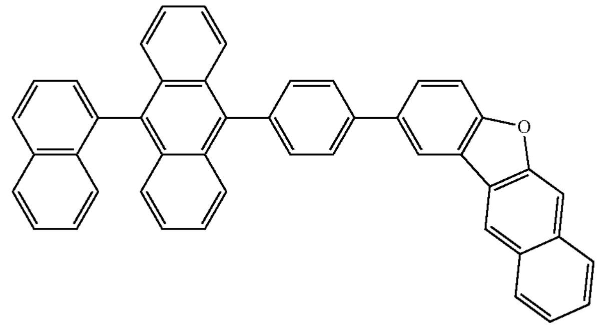
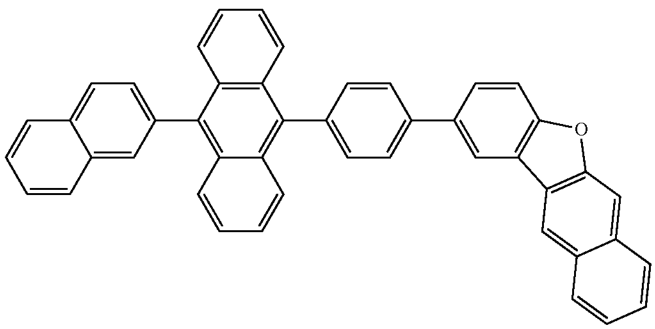
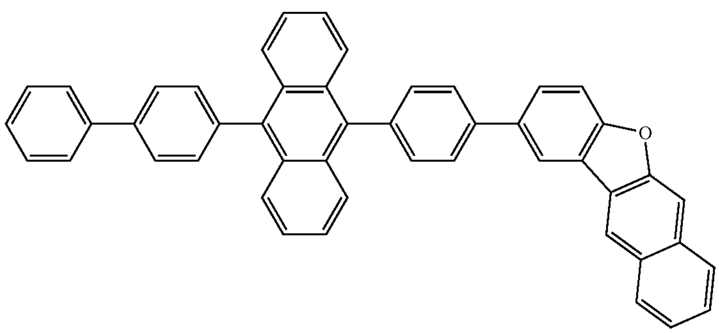
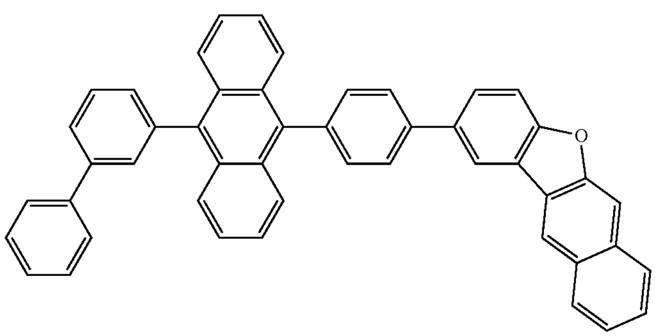
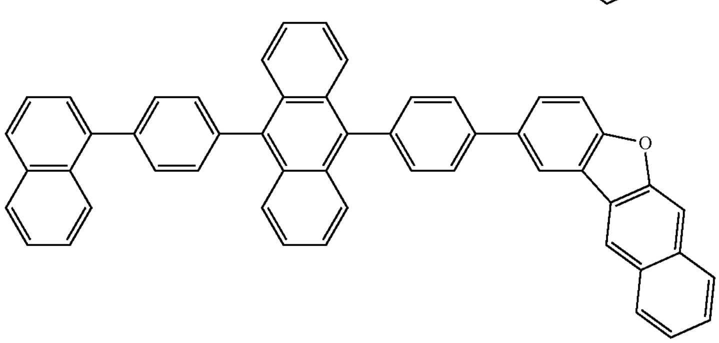

-continued
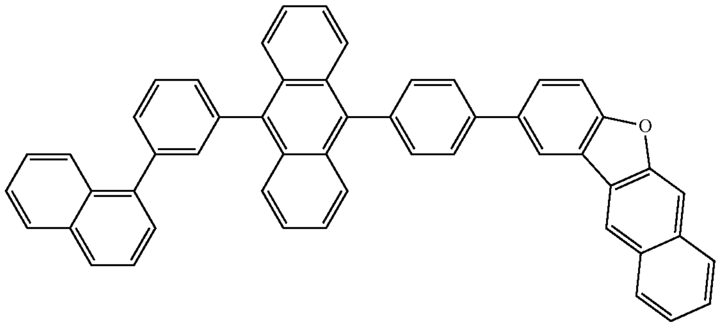
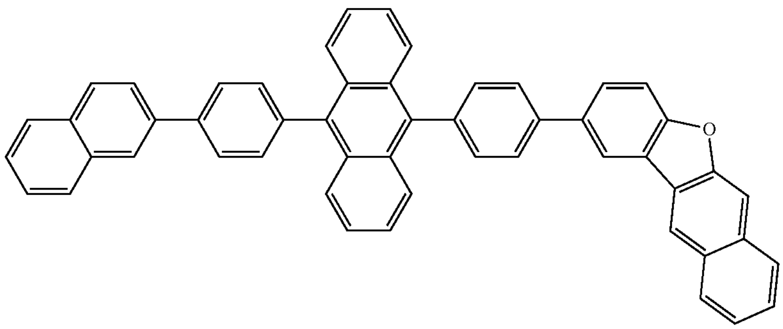
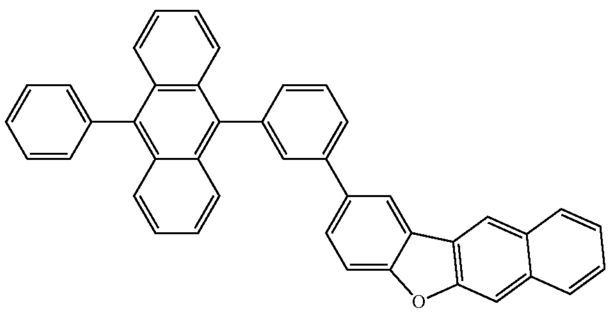
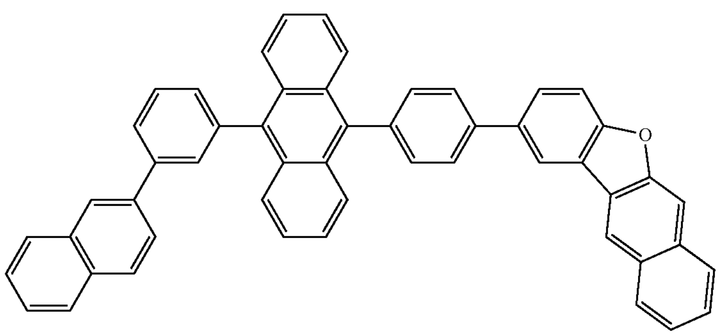
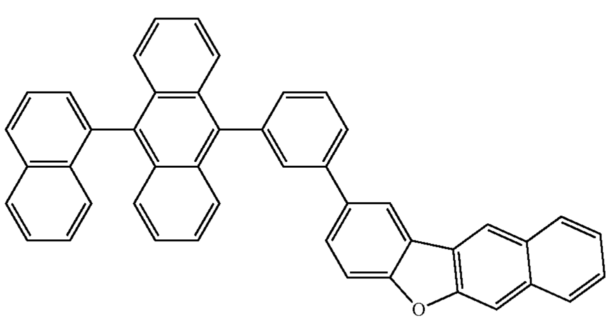

-continued
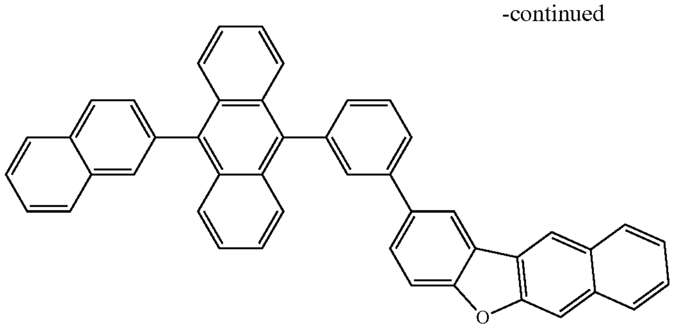
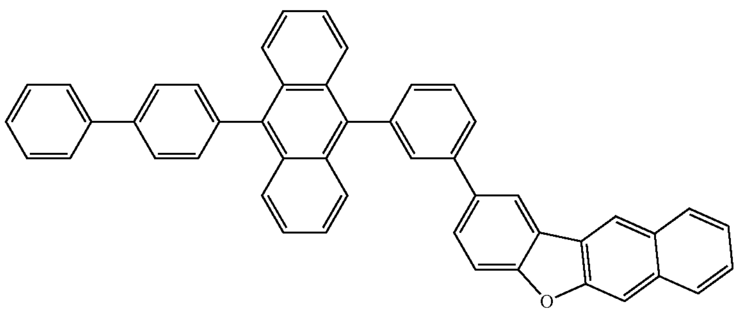
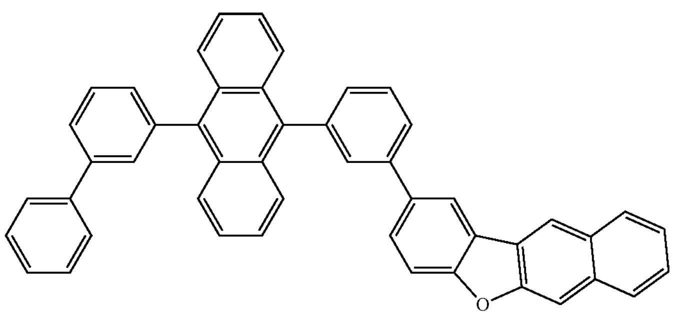
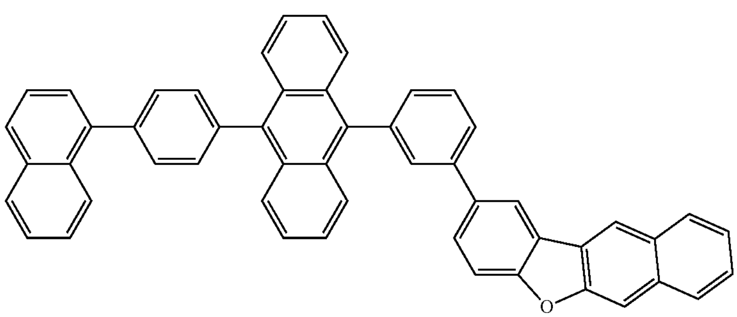
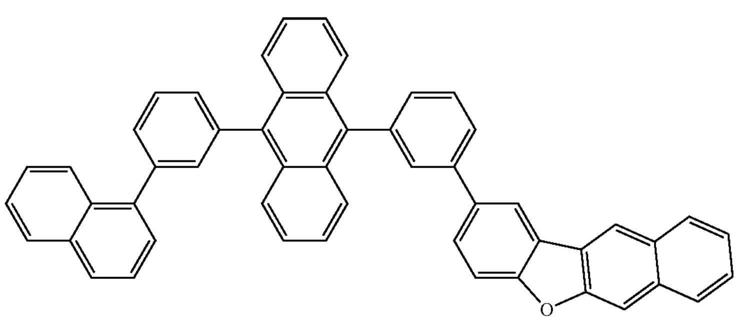

-continued
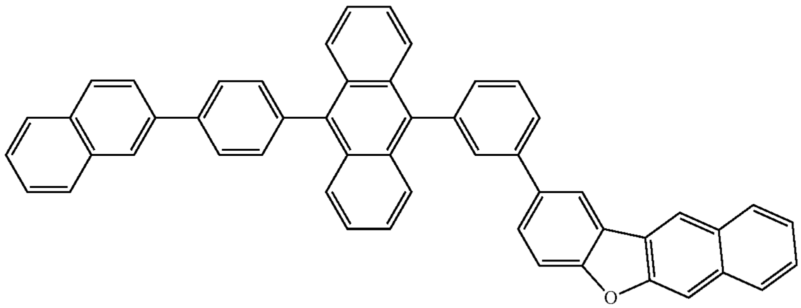
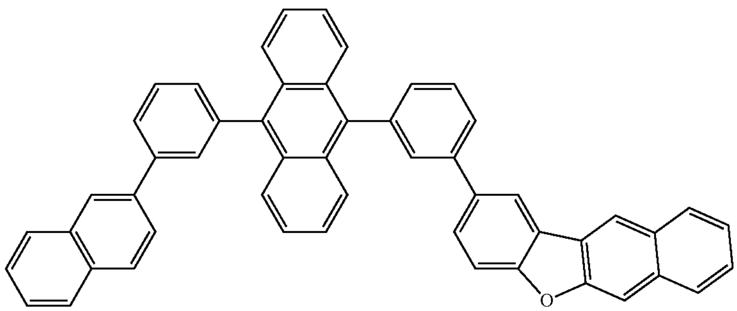
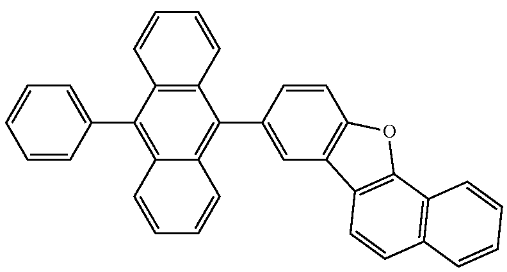
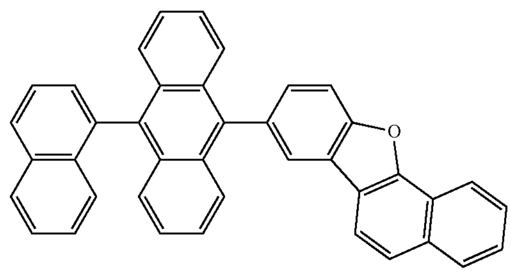
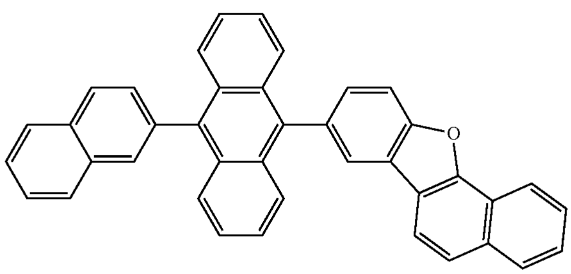
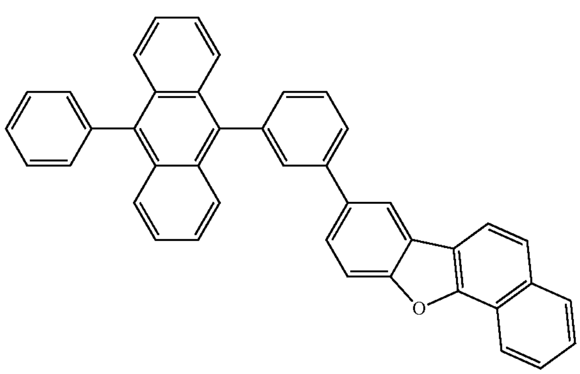

-continued
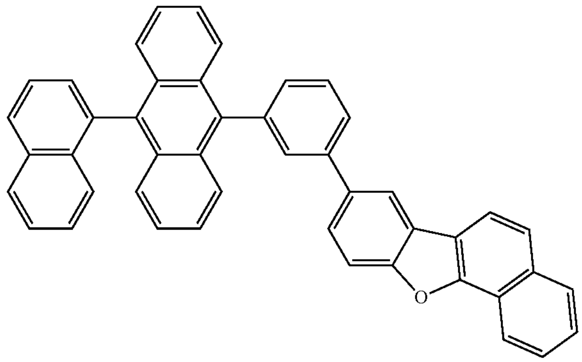
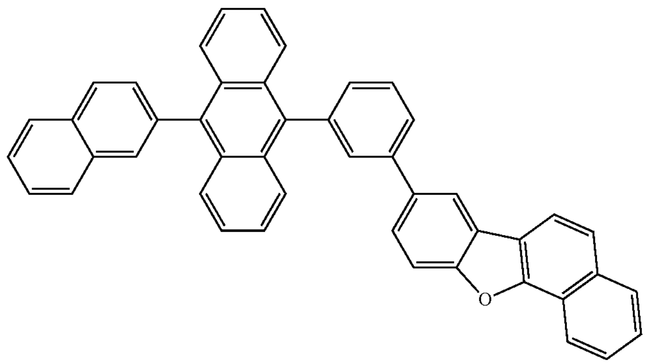
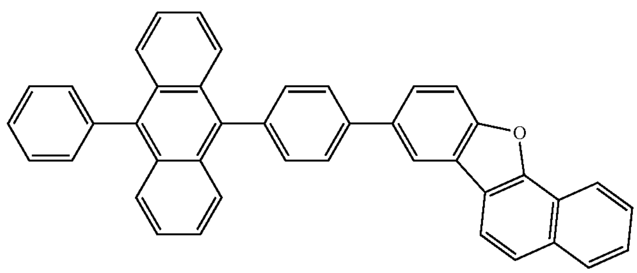
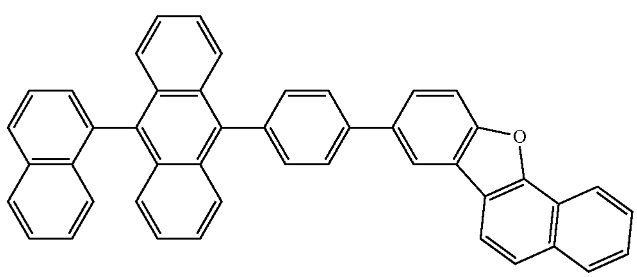
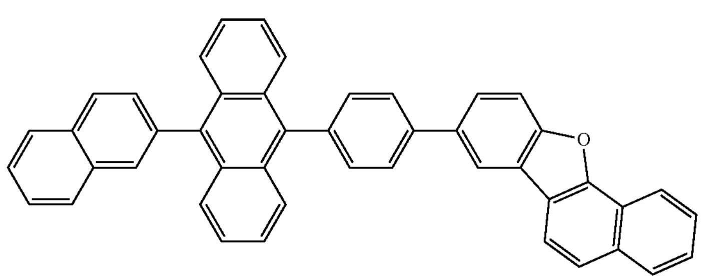

-continued
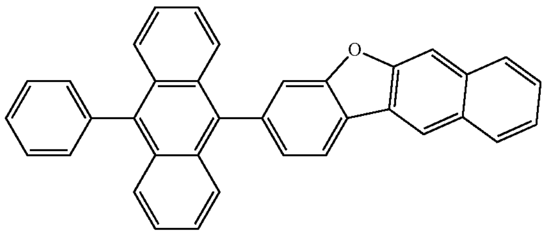
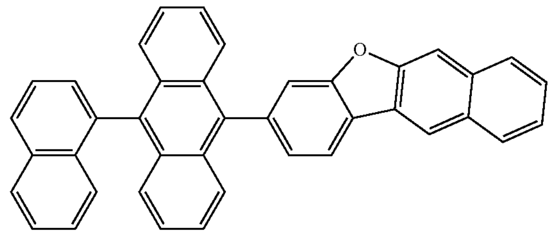
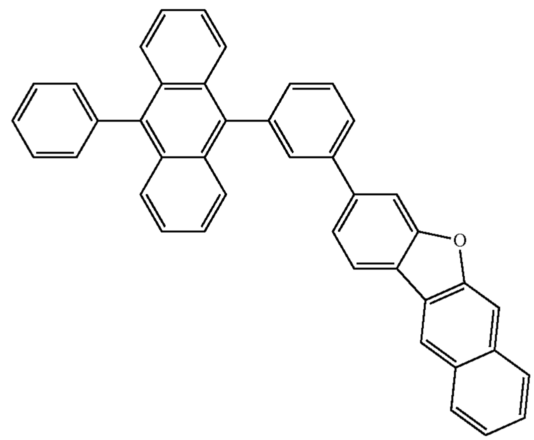
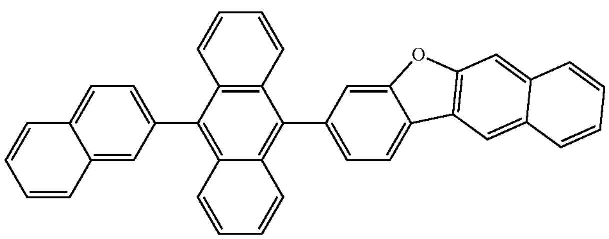
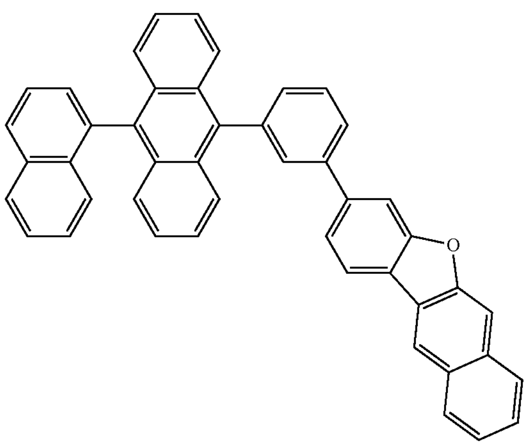
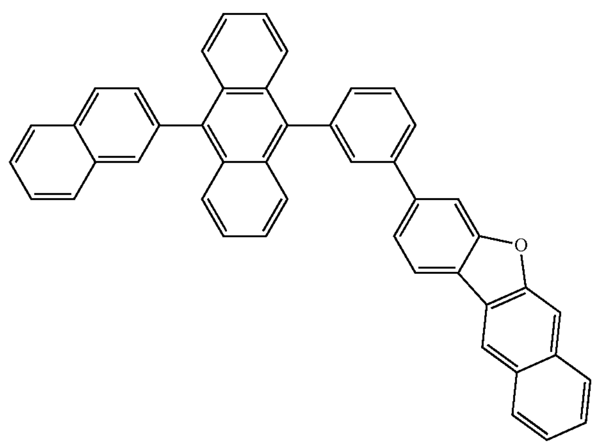
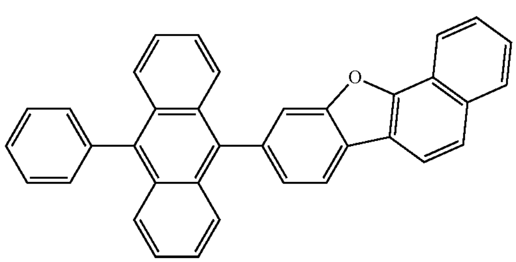
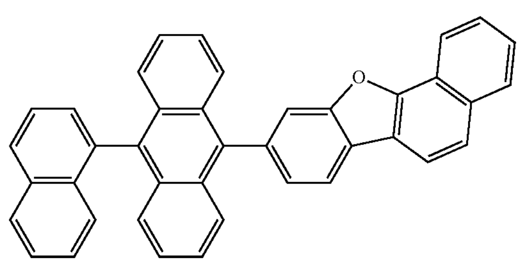
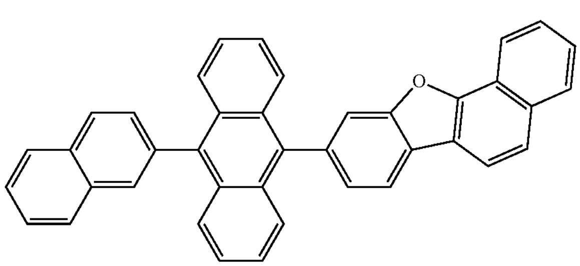

-continued
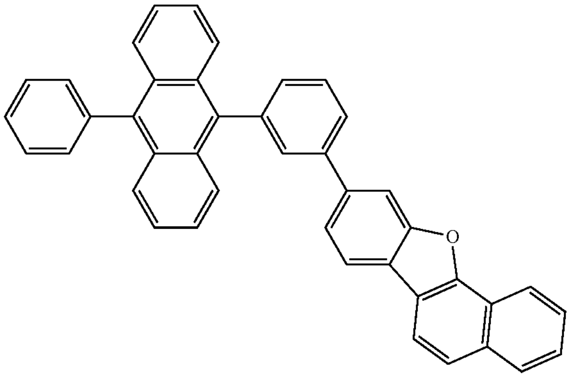
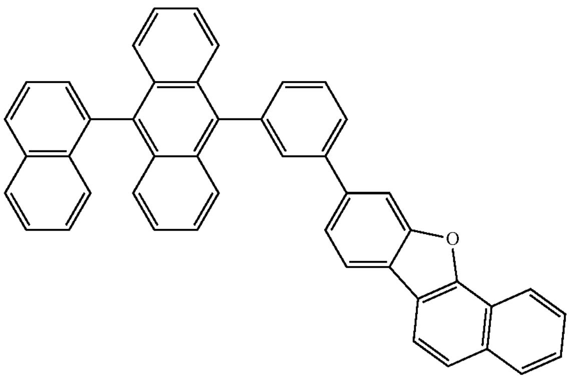
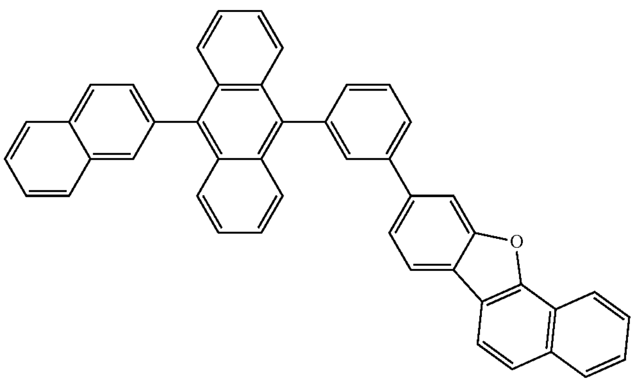
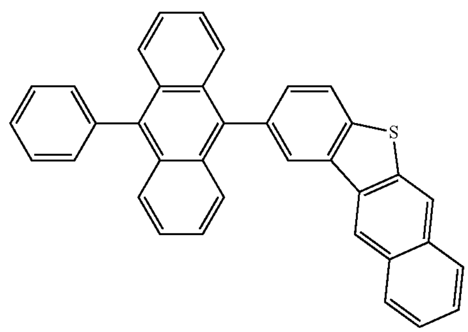
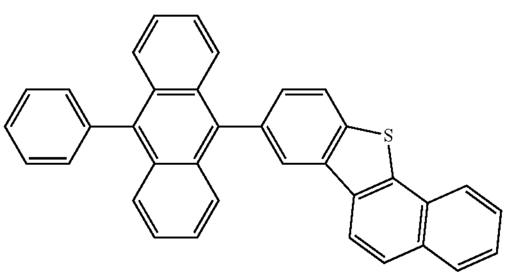
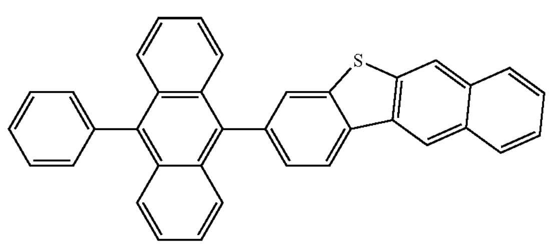
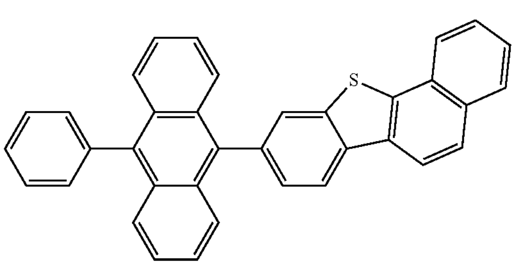
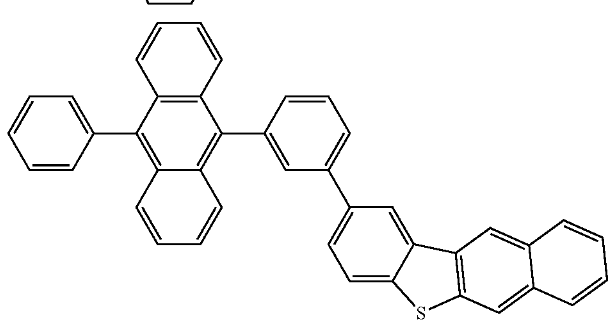

-continued
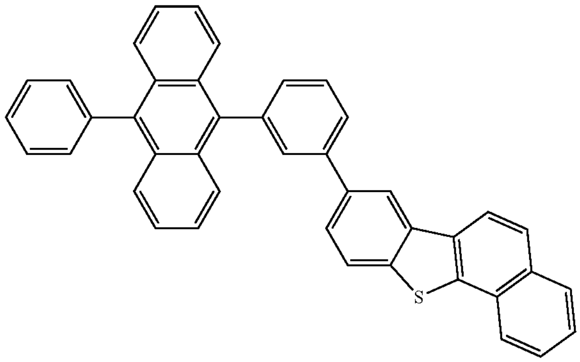
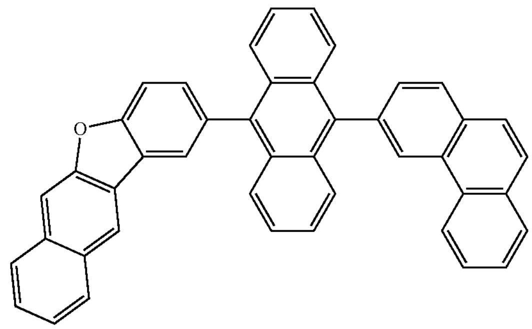
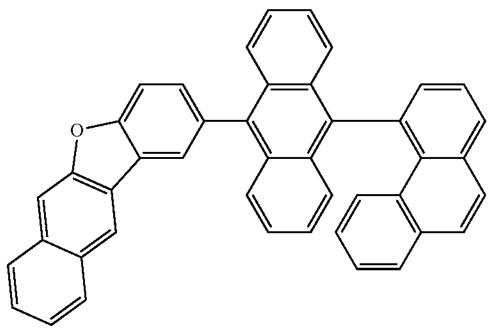
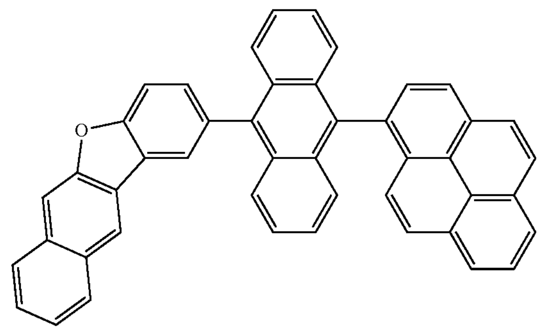
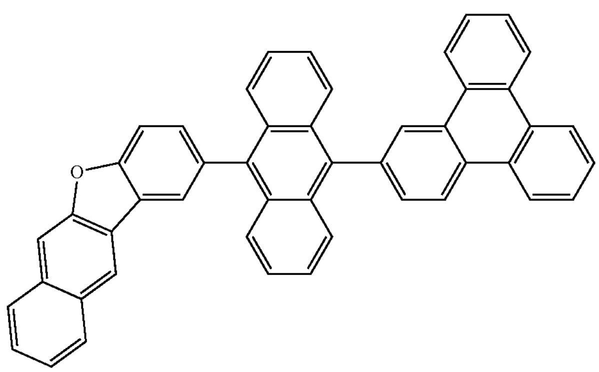
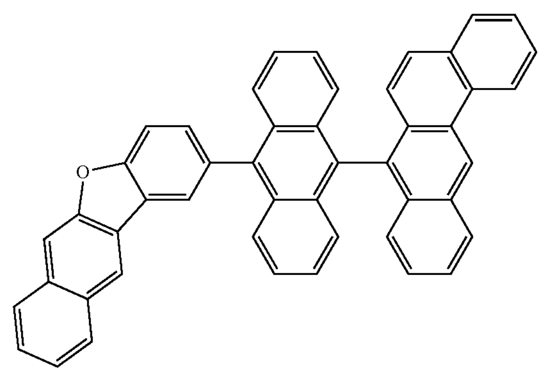
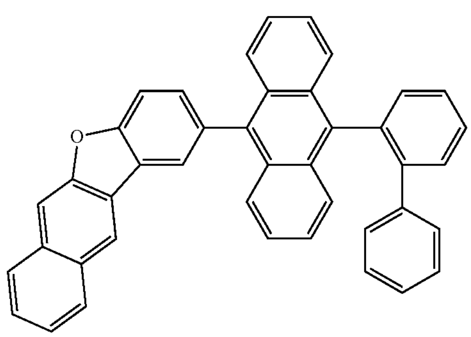
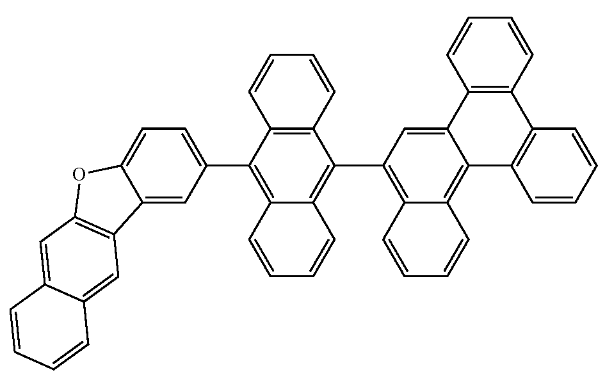

-continued
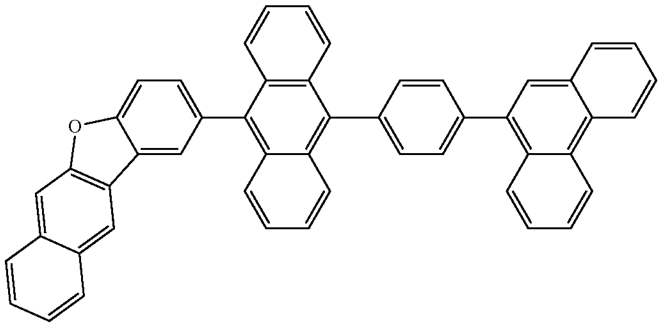
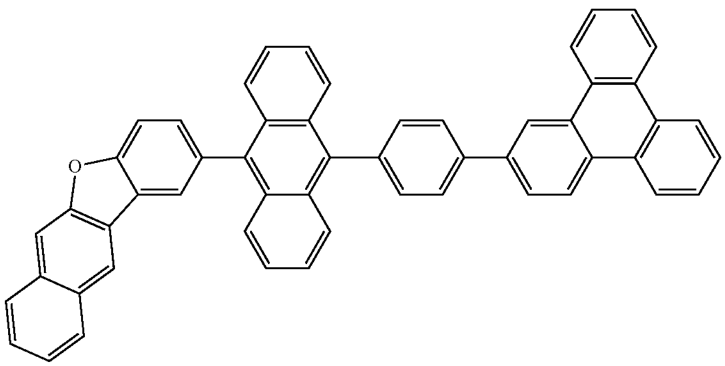
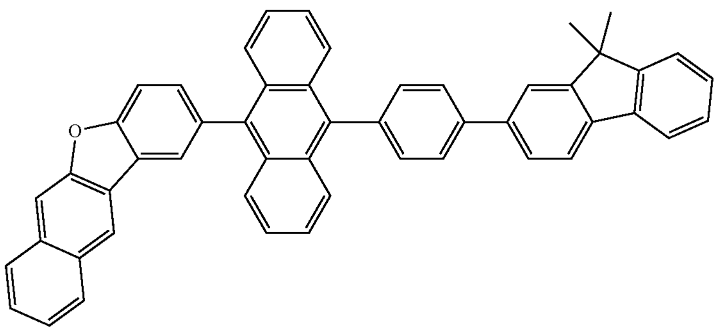
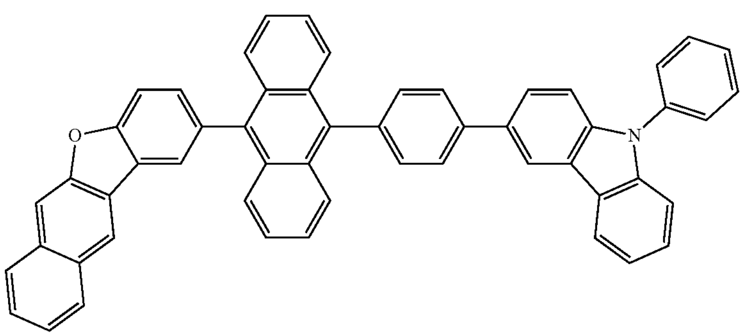
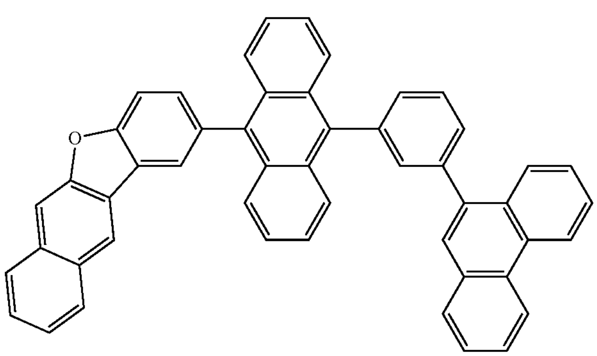 [SMILES: c1cc(-c2c3ccccc3c(-c3ccc4oc5cc6ccccc6cc5c4c3)c3ccccc23)cc(-c2cc3ccccc3c3ccccc23)c1]

-continued
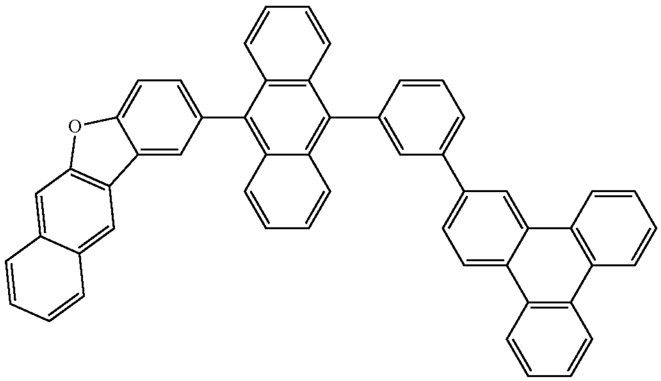
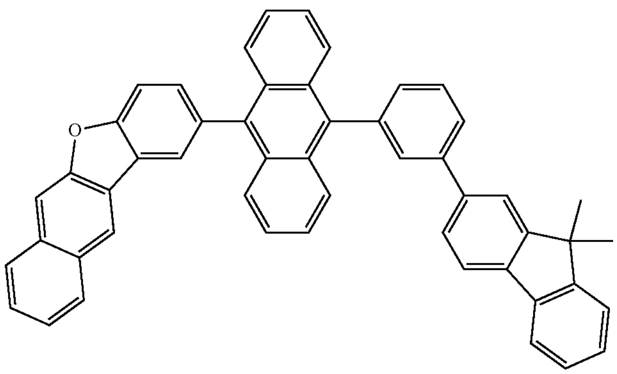
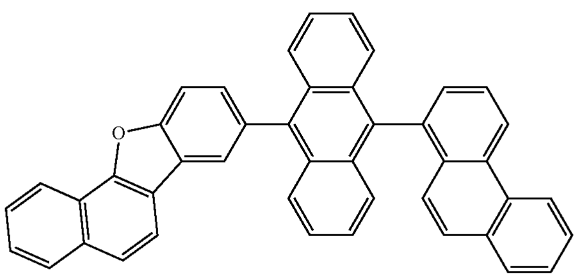
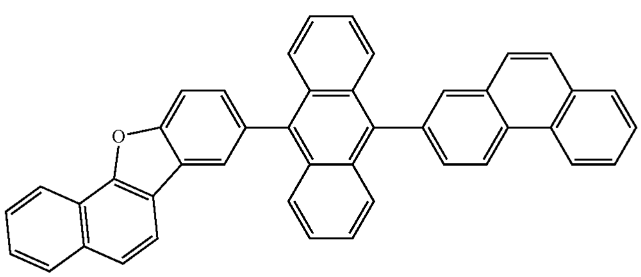
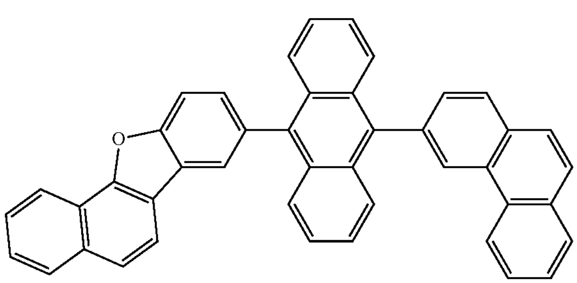
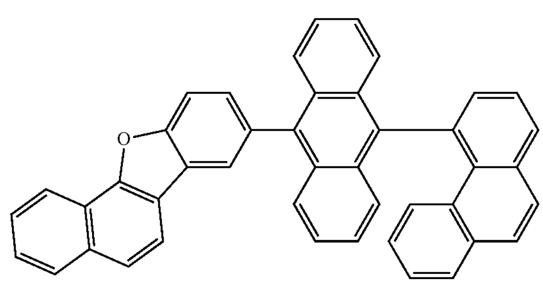

-continued
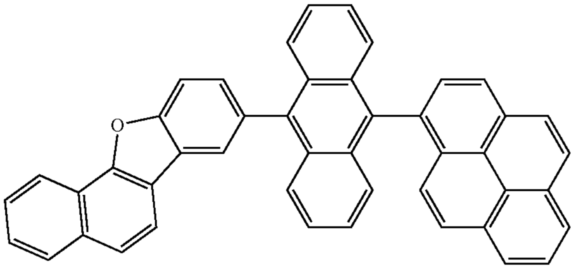
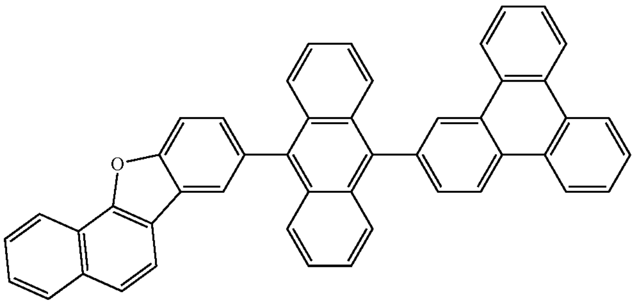
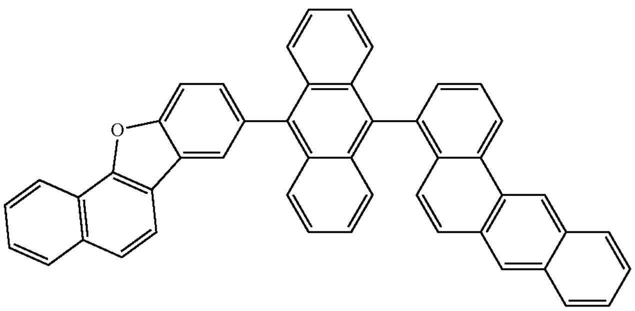
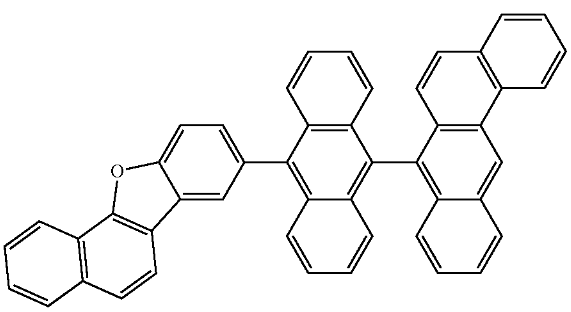
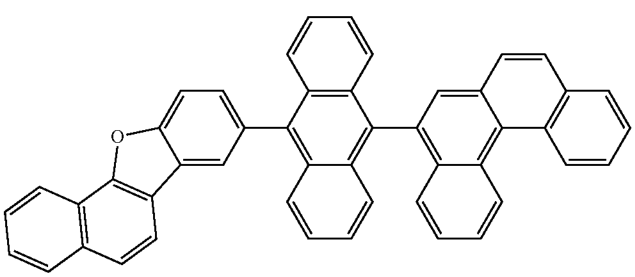

-continued
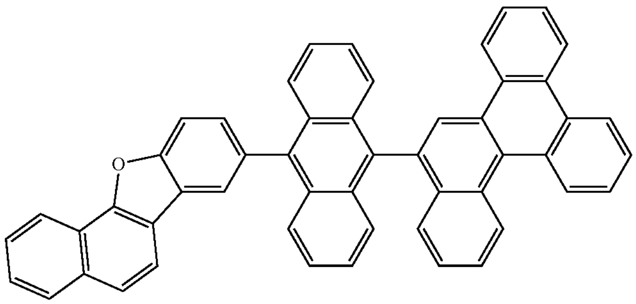
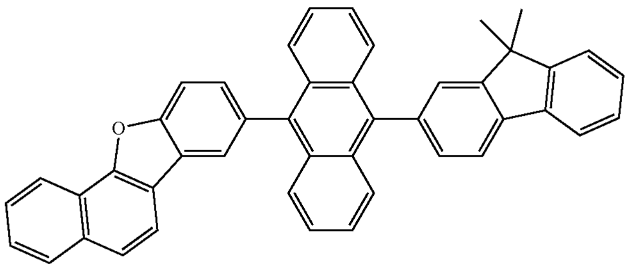
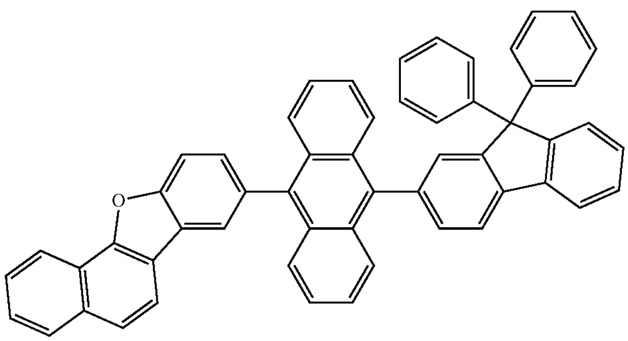
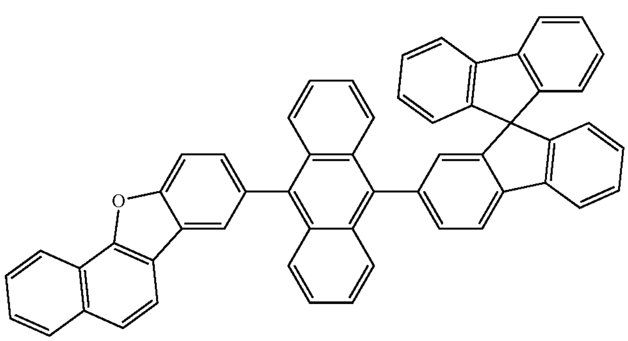
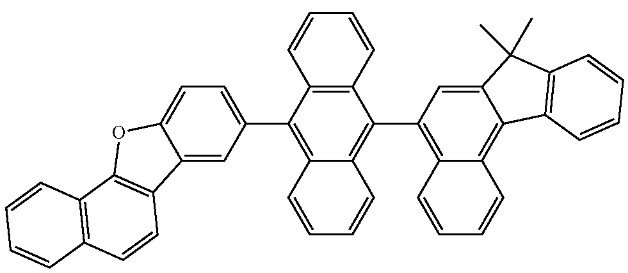

-continued
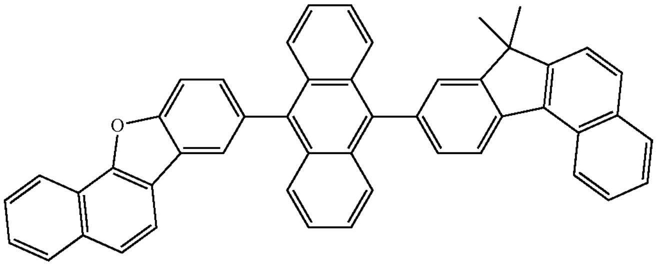
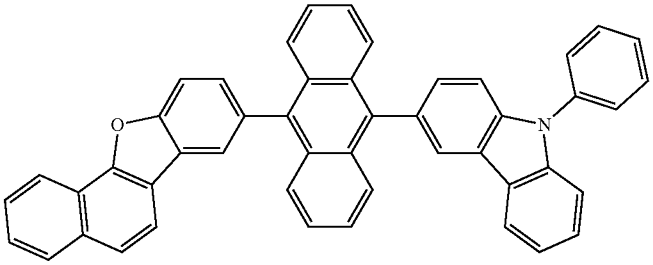
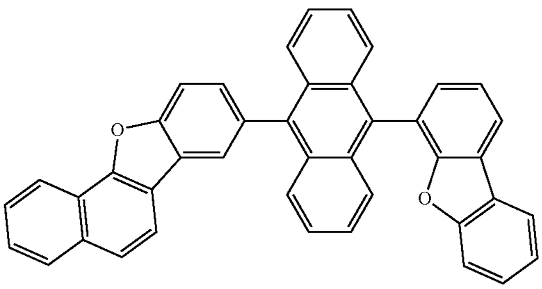
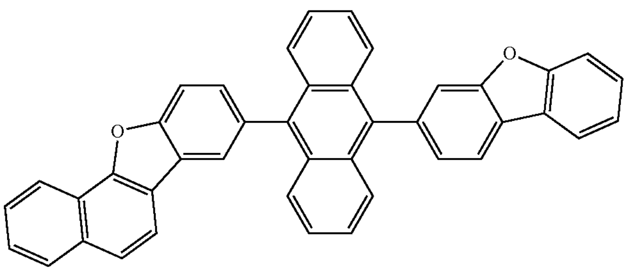
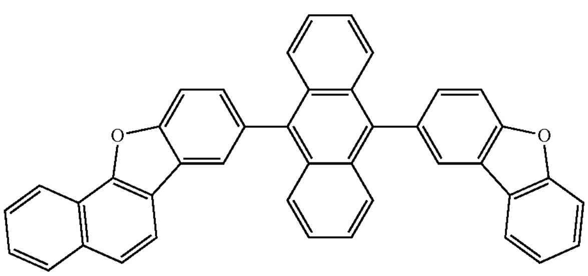
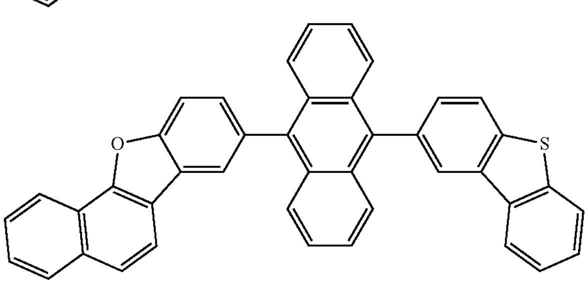

-continued
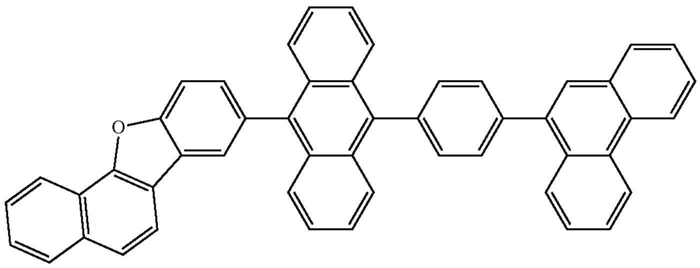
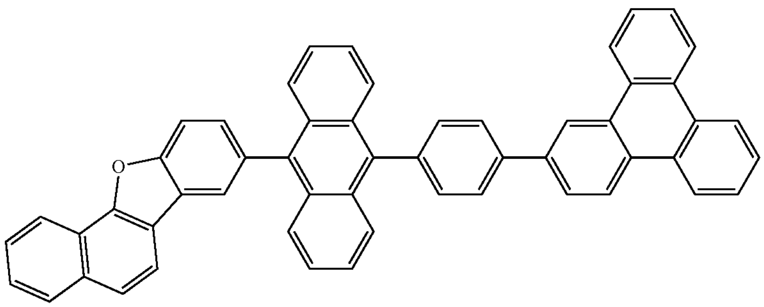
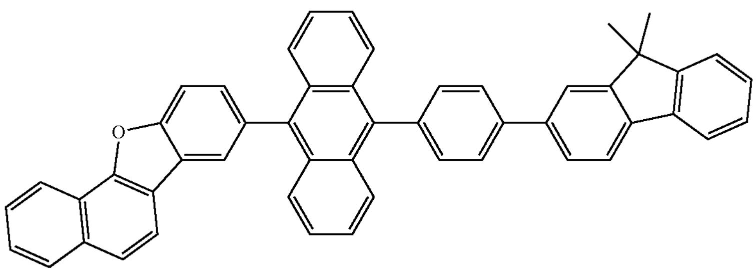
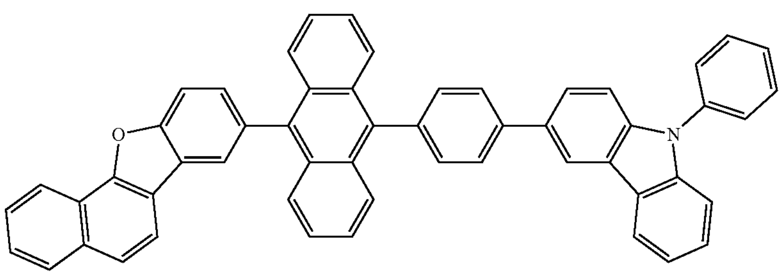
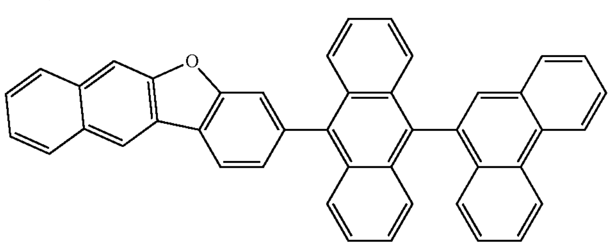
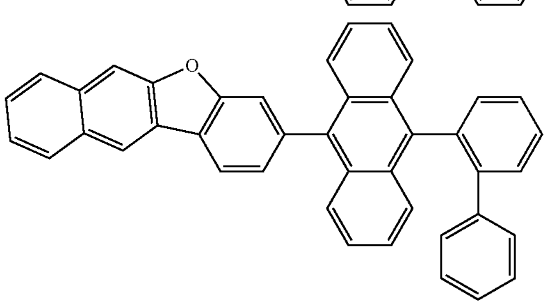

-continued
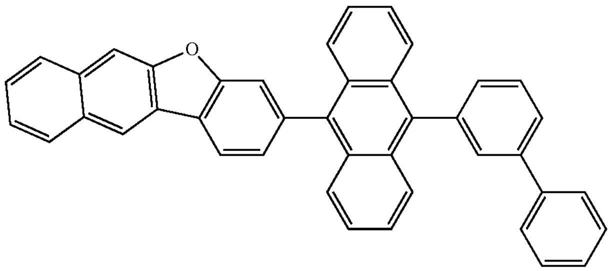
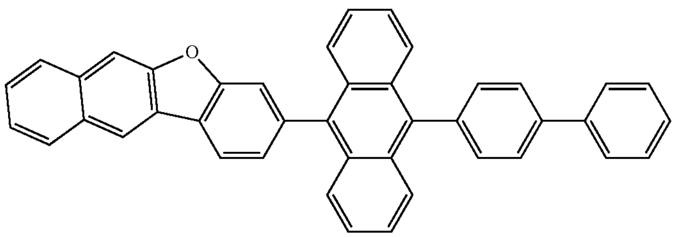
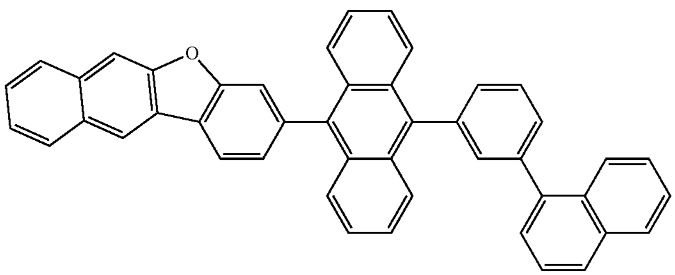
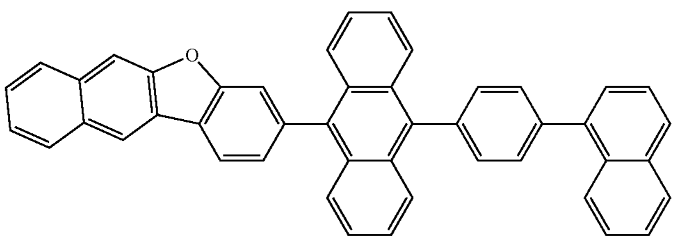
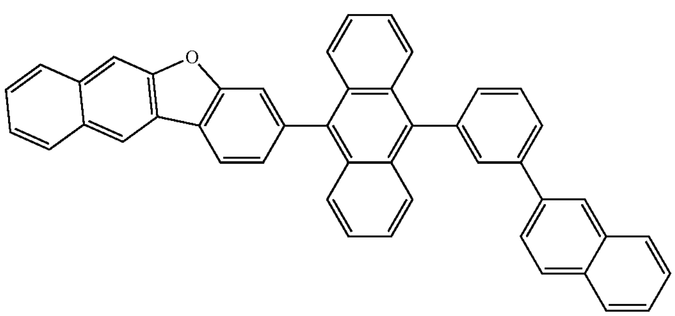
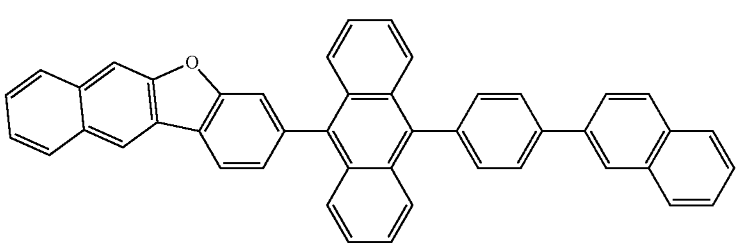

-continued
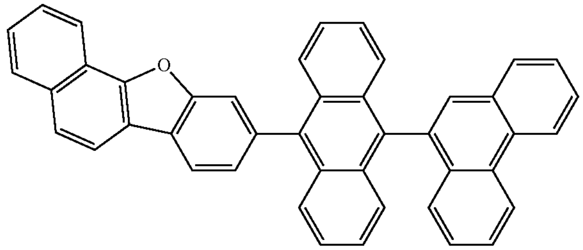
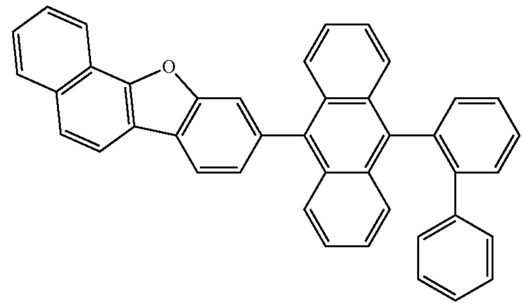
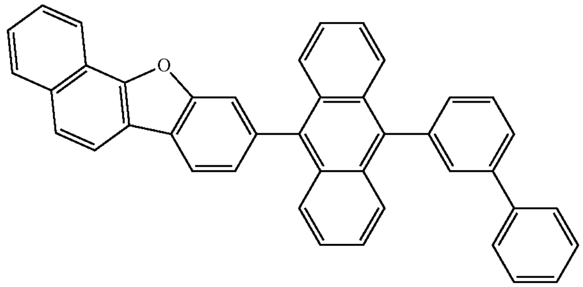
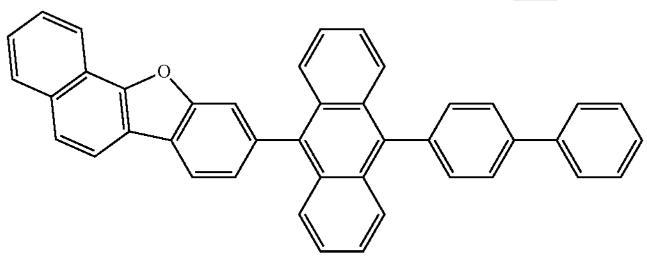
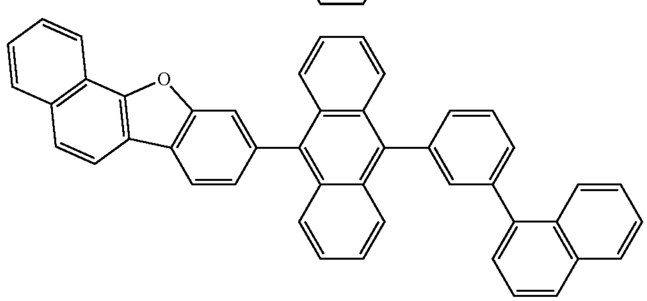
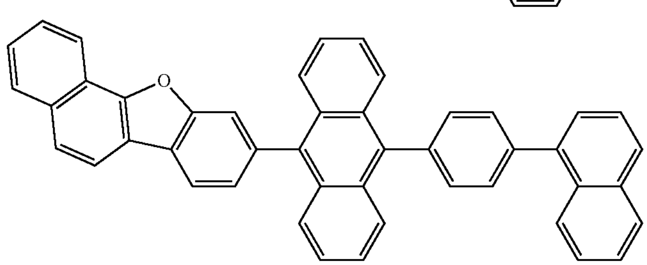
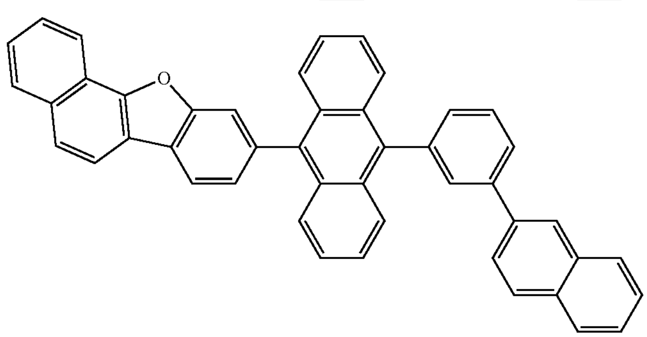

-continued
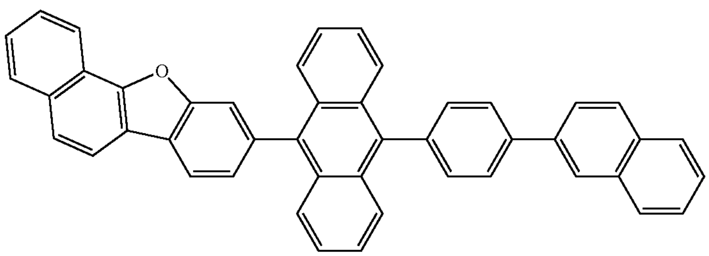
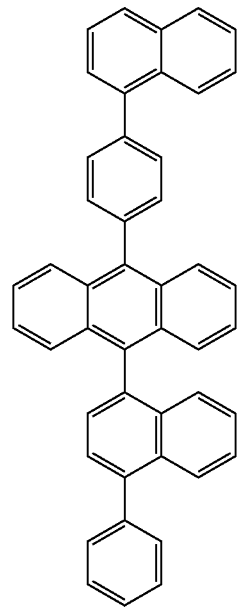
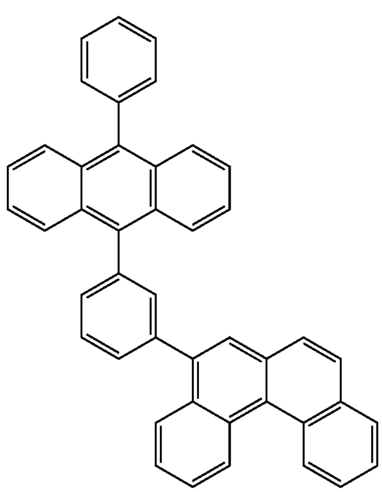
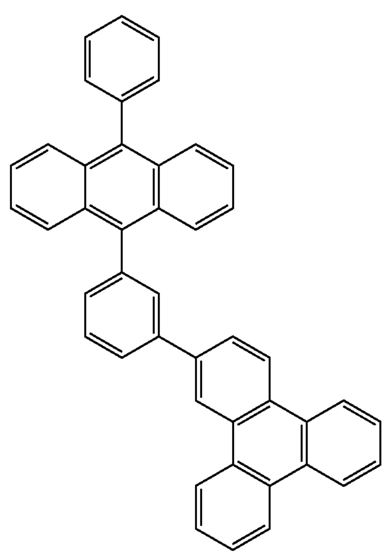
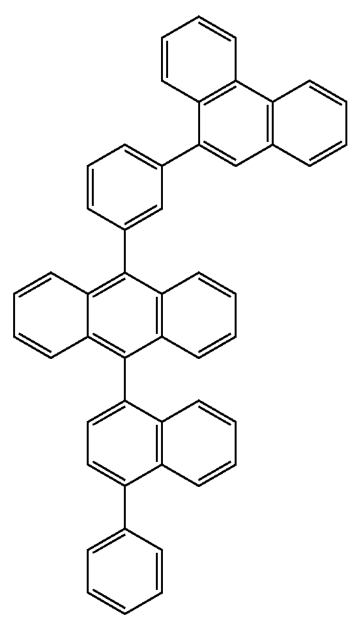

-continued
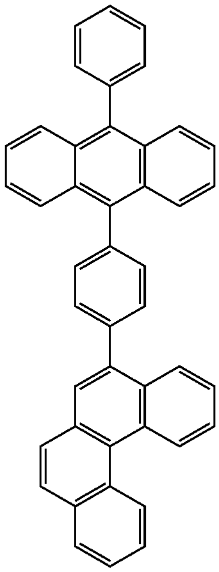
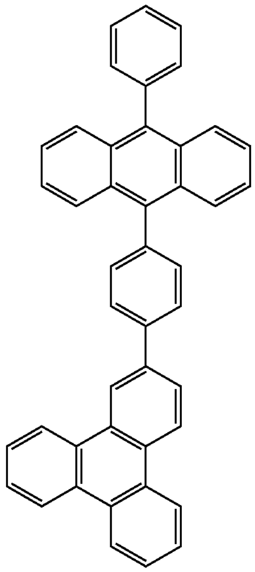
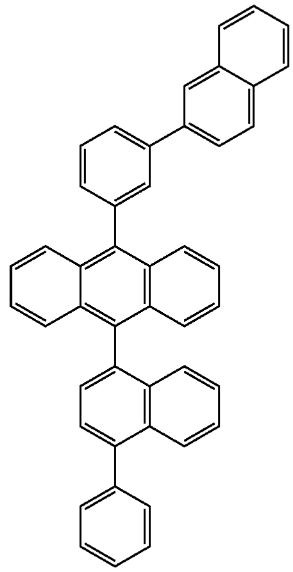
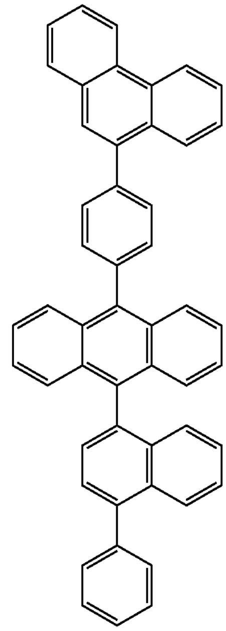
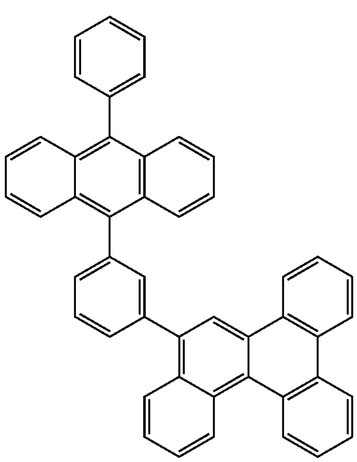
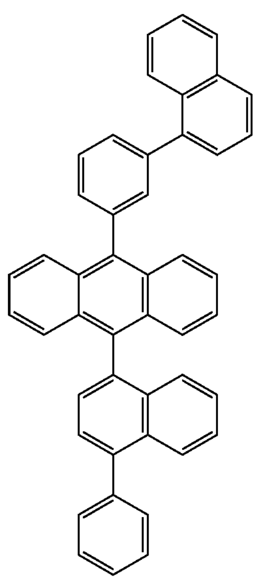
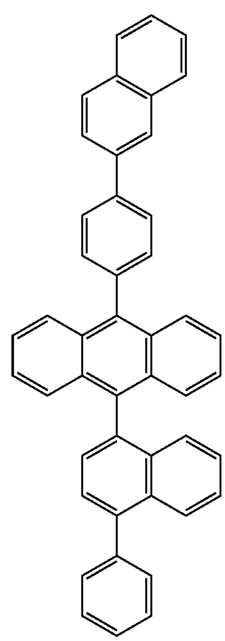
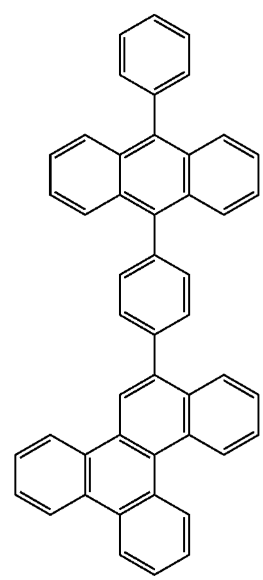

-continued
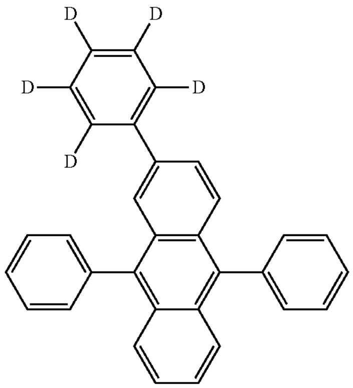
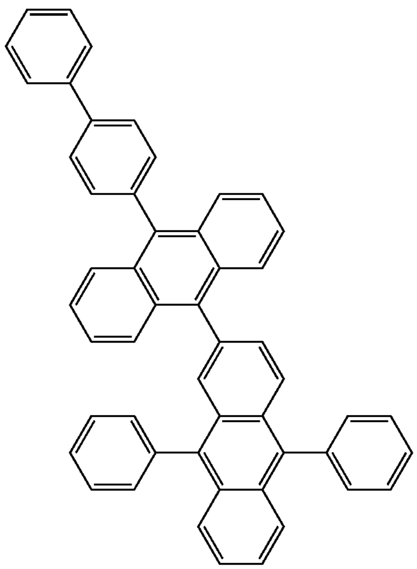
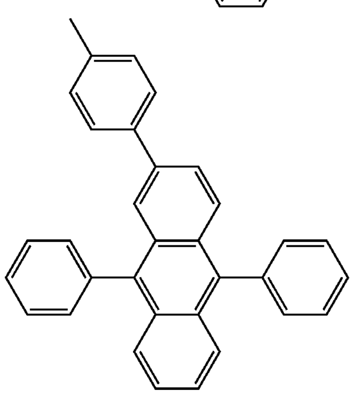
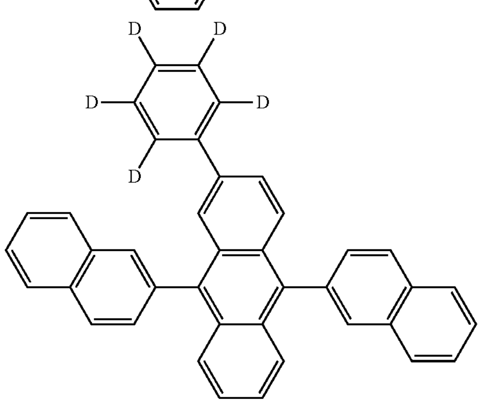
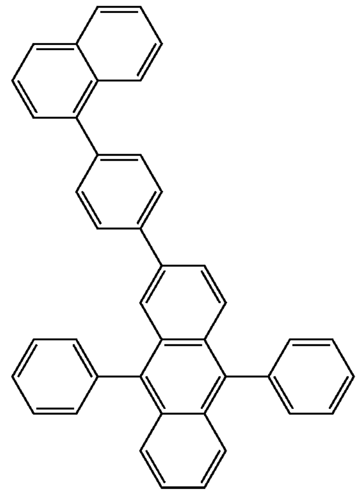
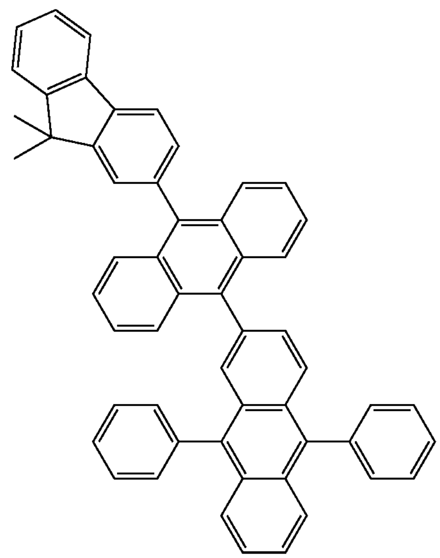
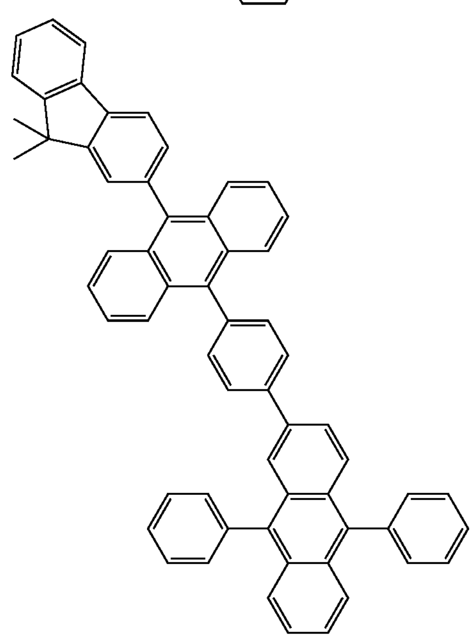

-continued
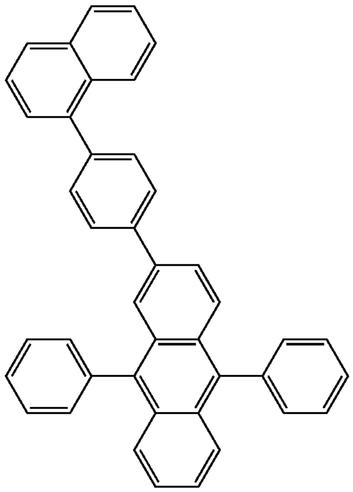
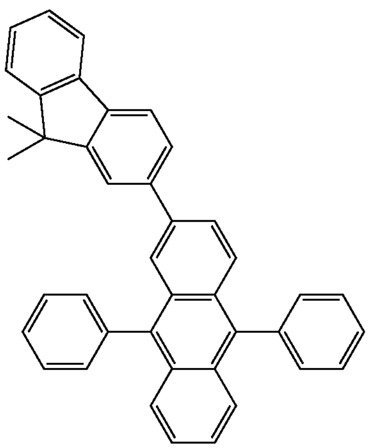
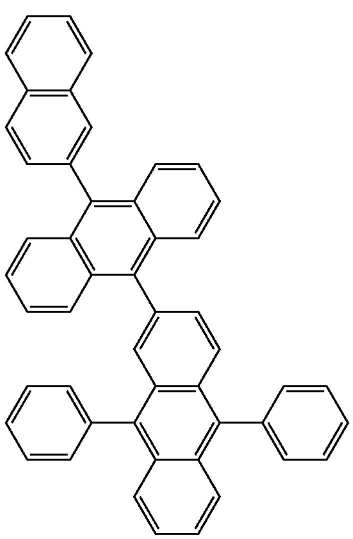
-continued
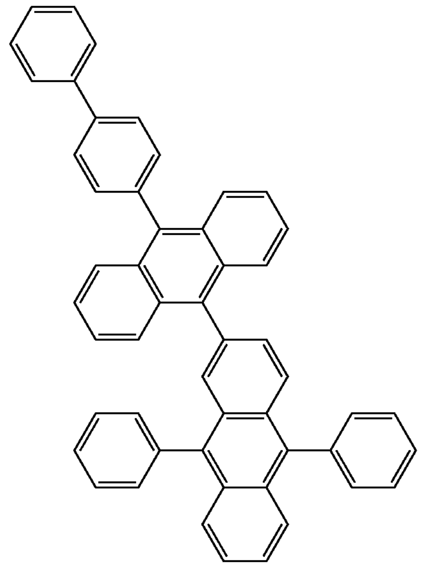
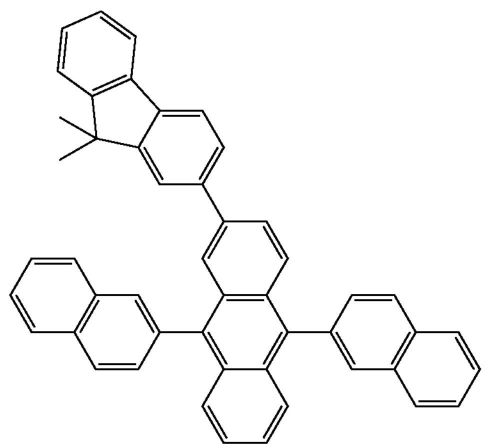
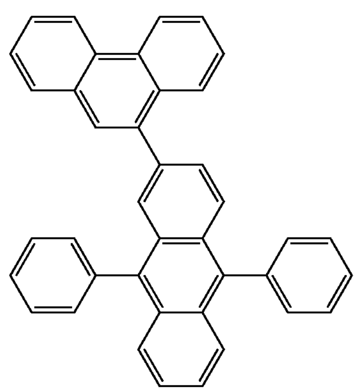

-continued
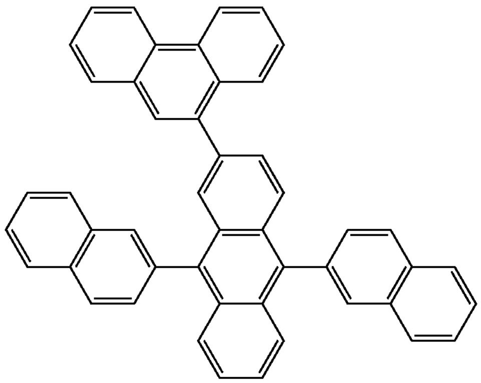
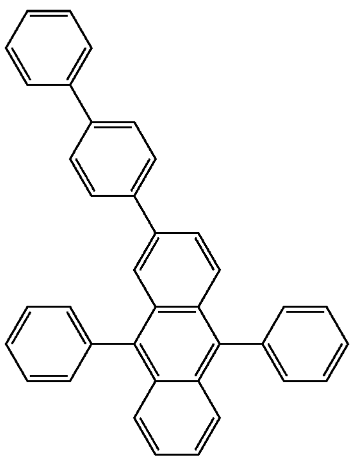
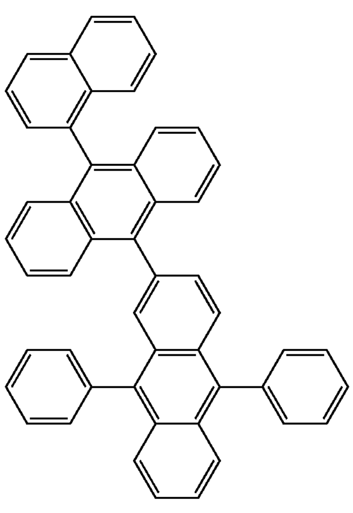
-continued
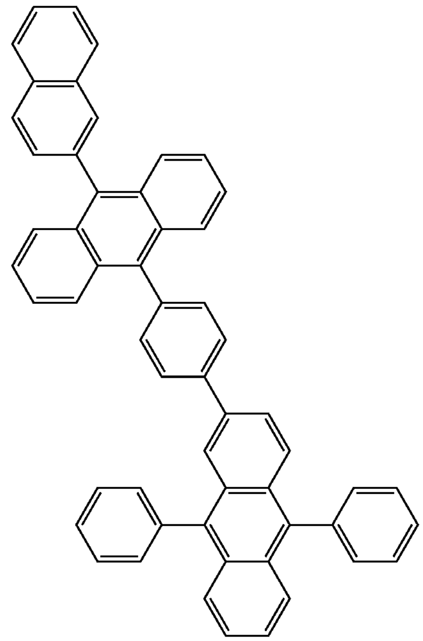
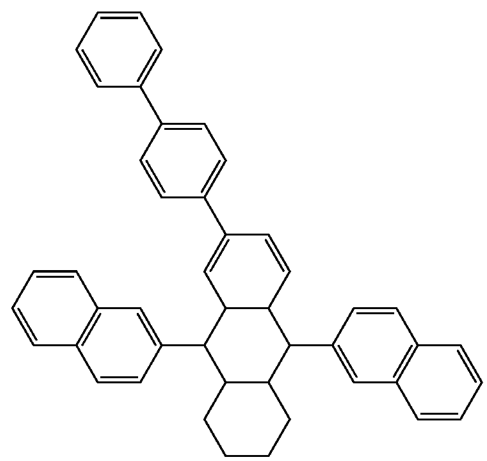
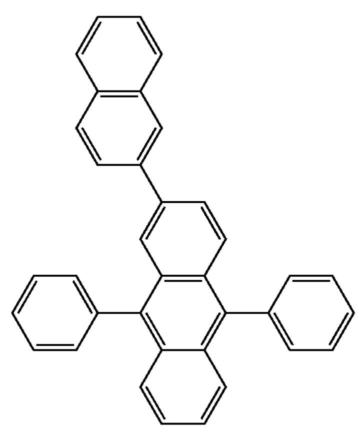

-continued
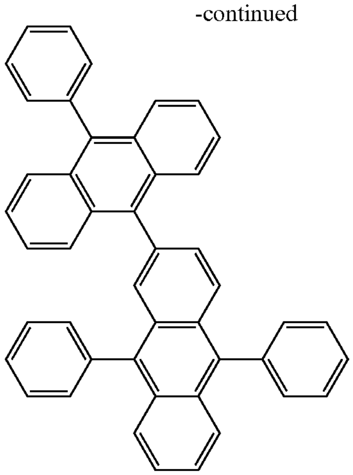
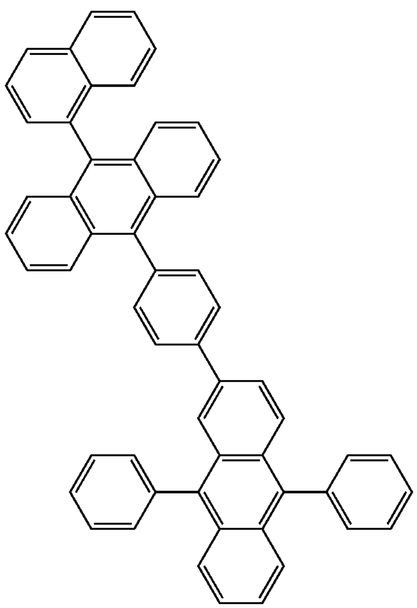
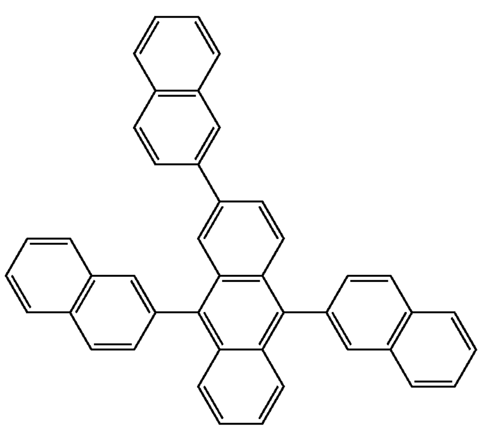
-continued
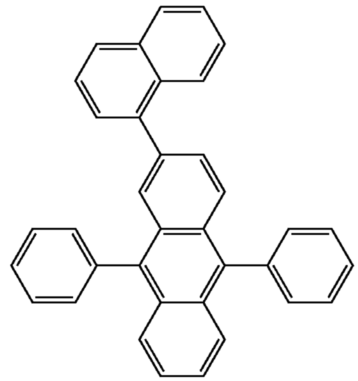
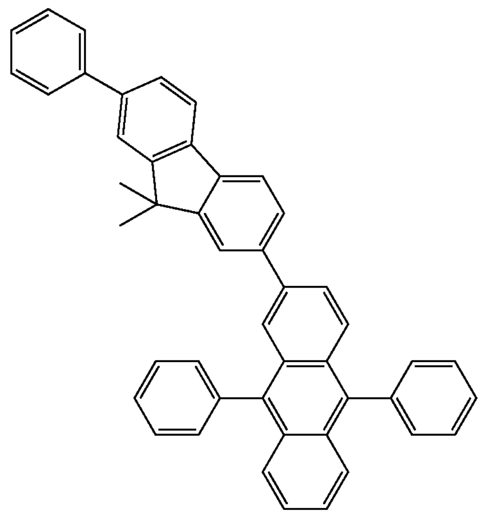
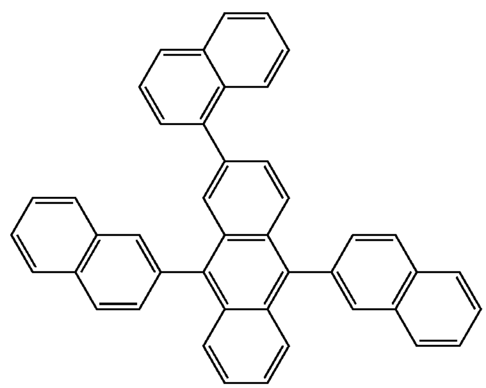
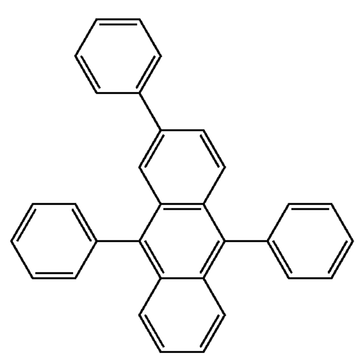

-continued
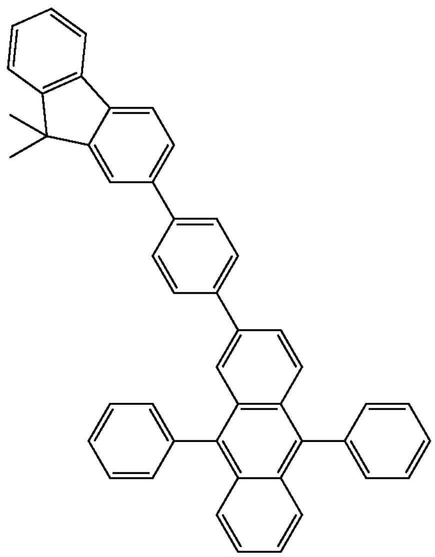
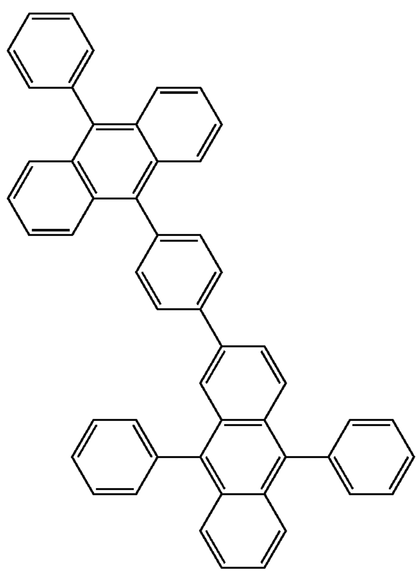
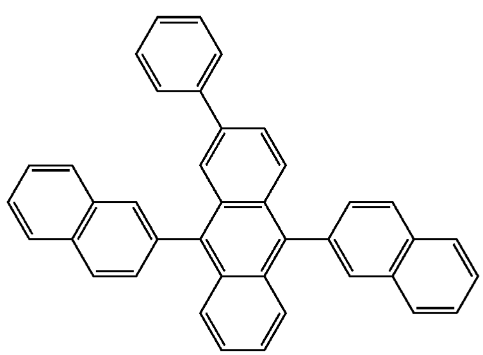
-continued
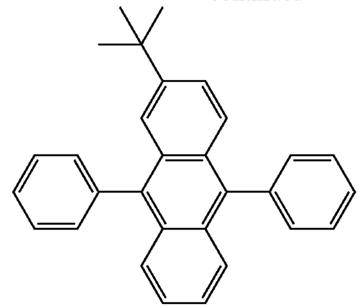
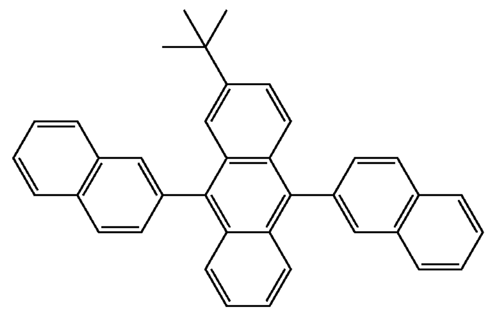
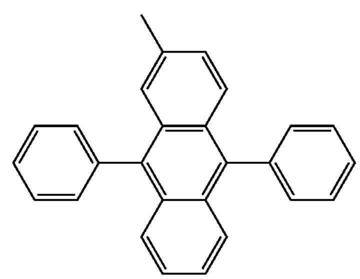
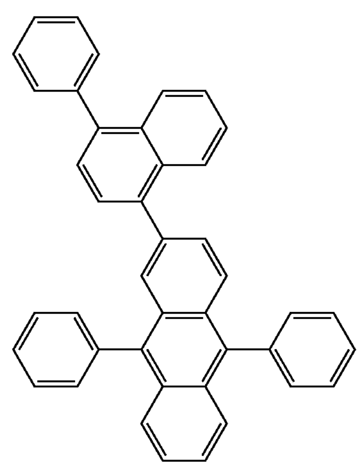

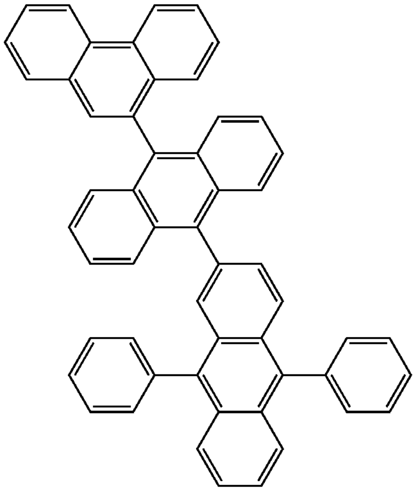
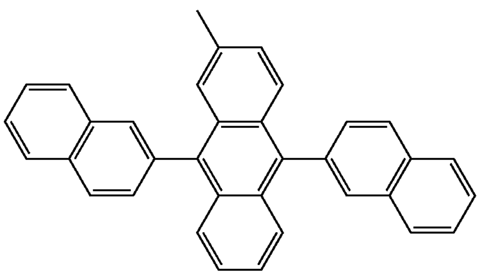
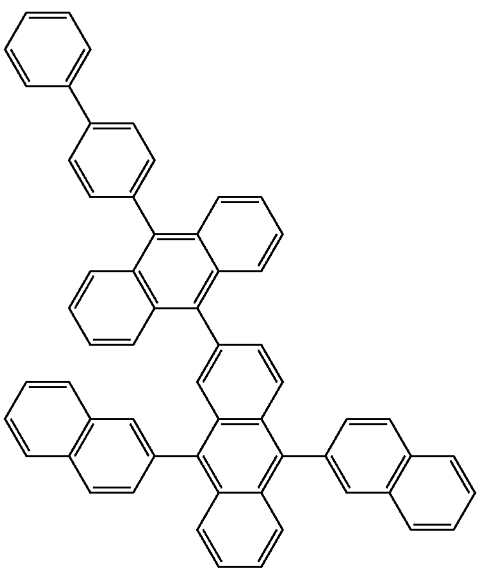
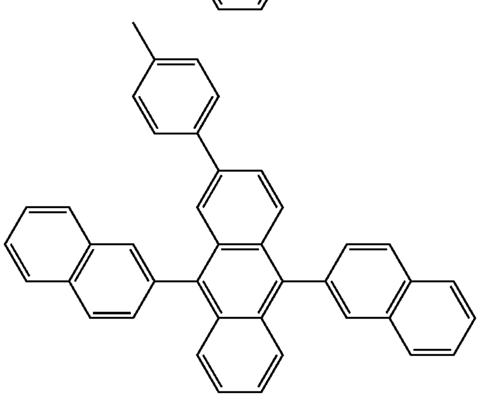
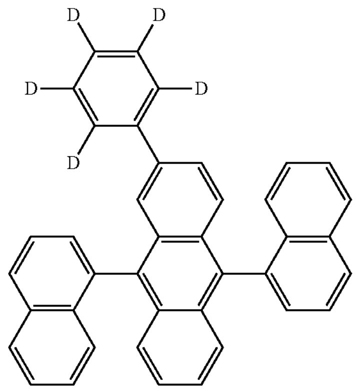
D
D
D
D
D
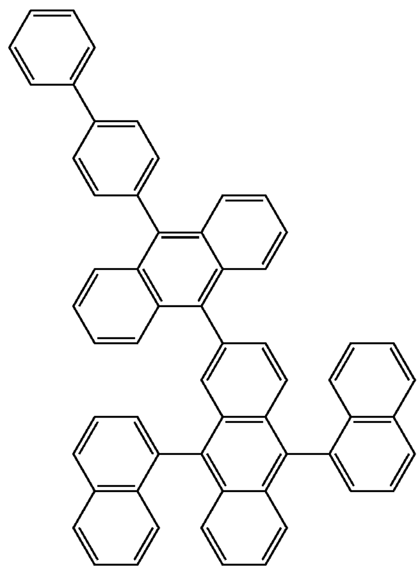
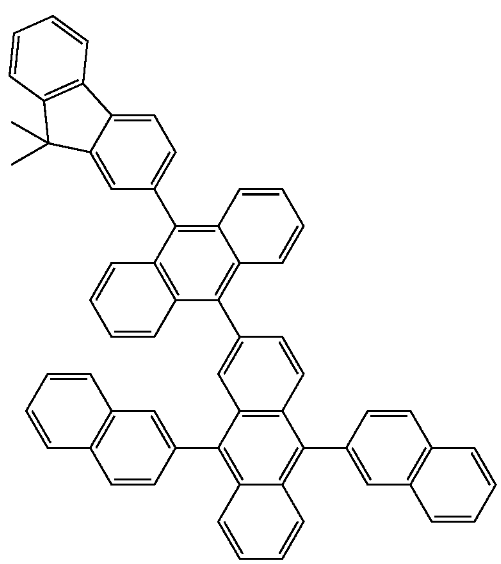

-continued
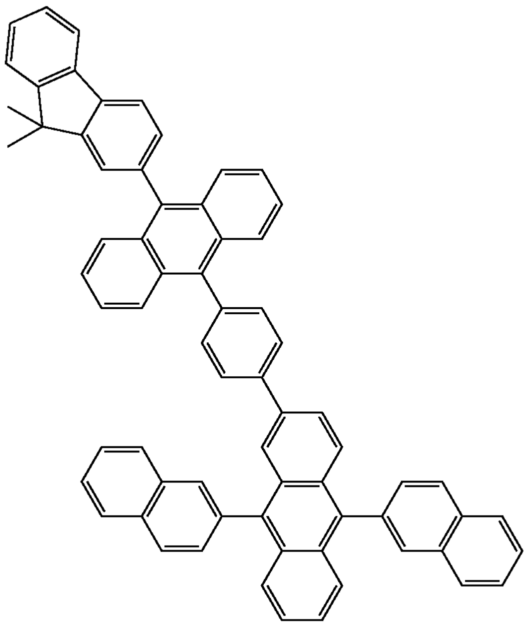
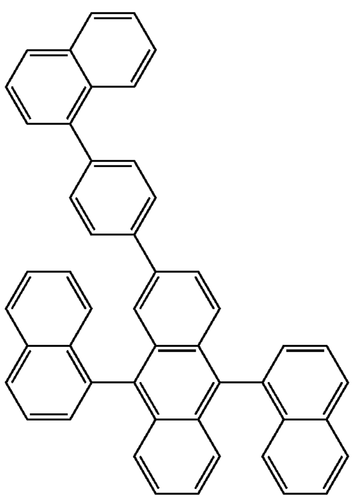
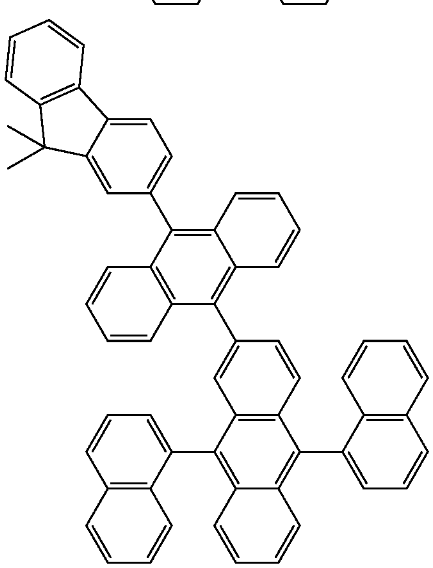
-continued
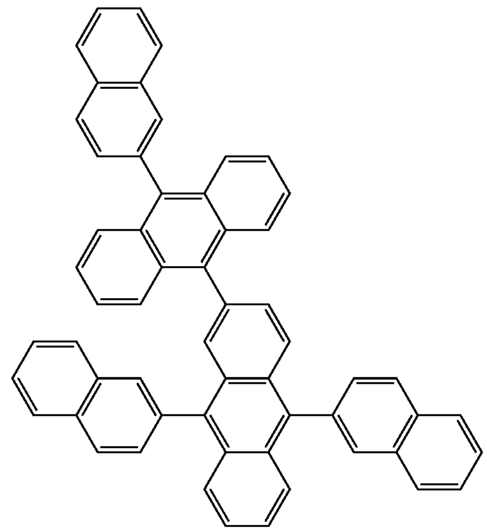
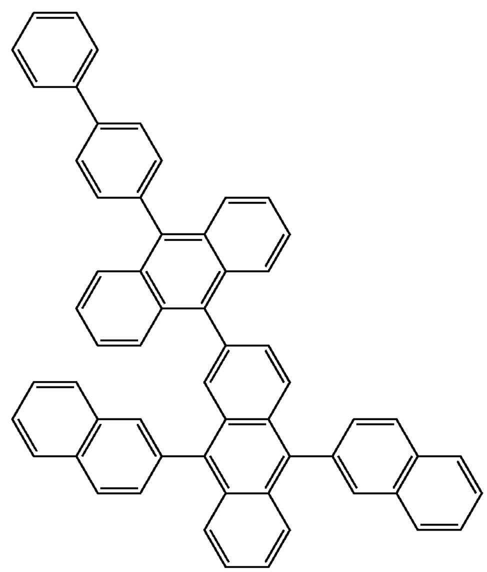
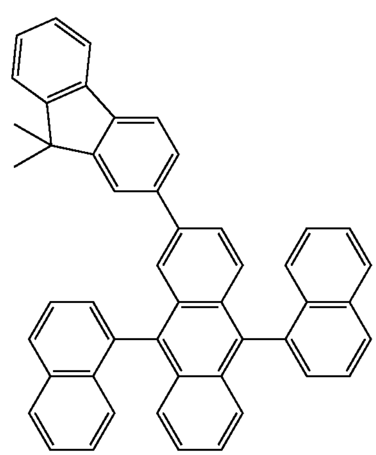

-continued
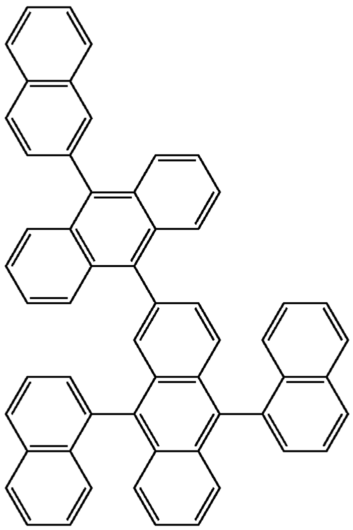
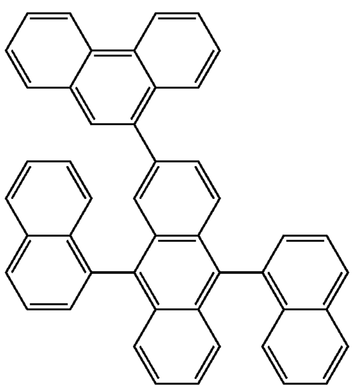
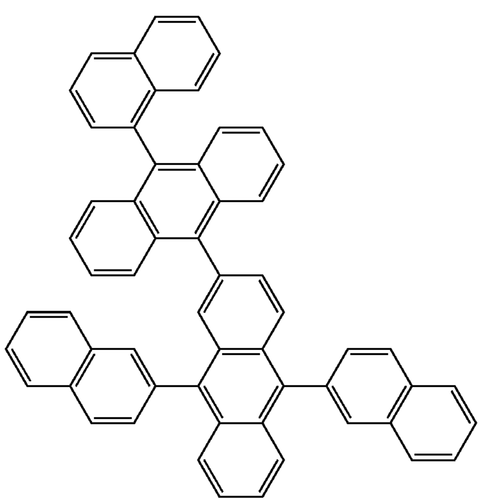
-continued
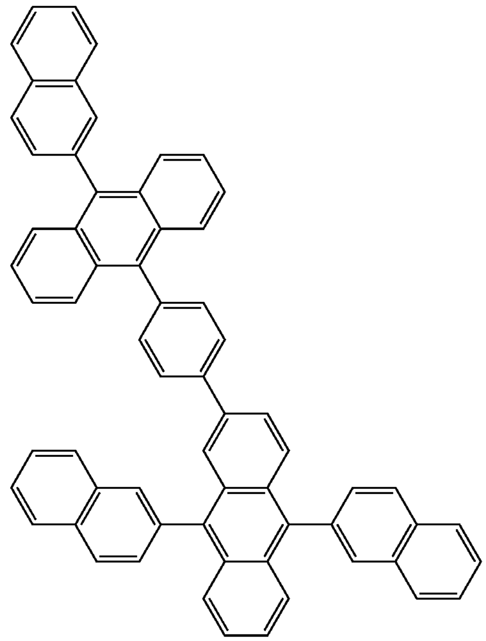
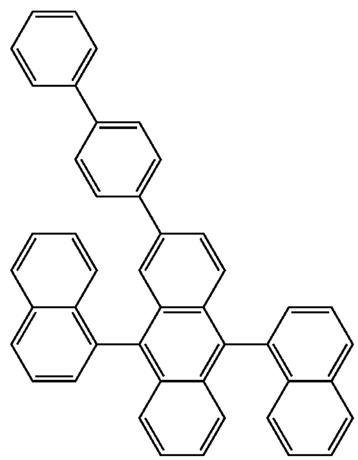
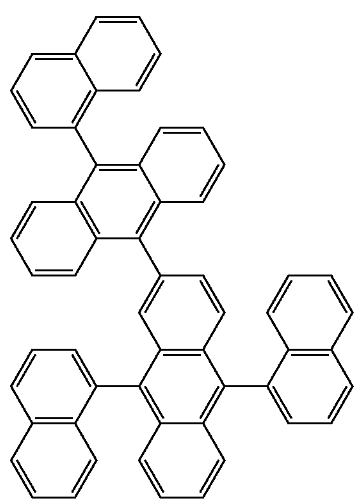

-continued
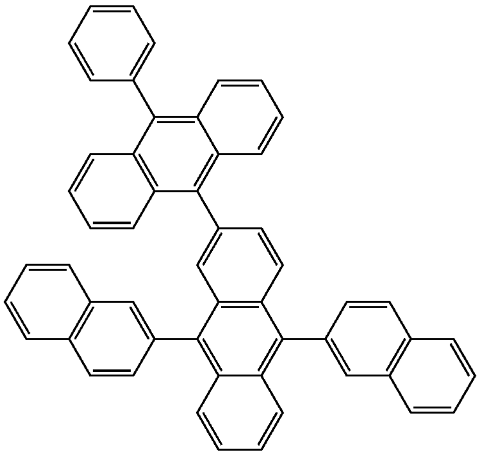
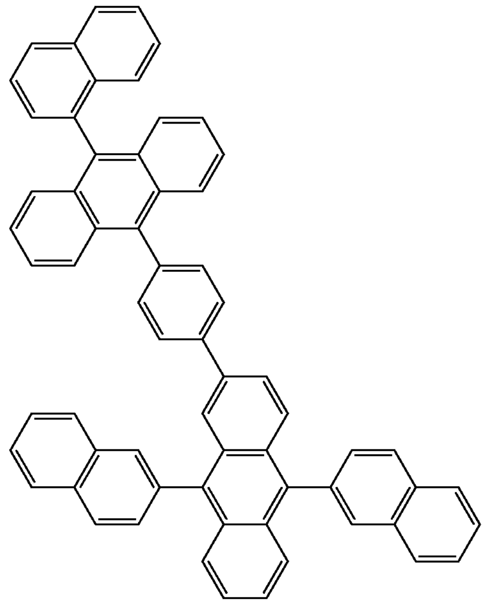
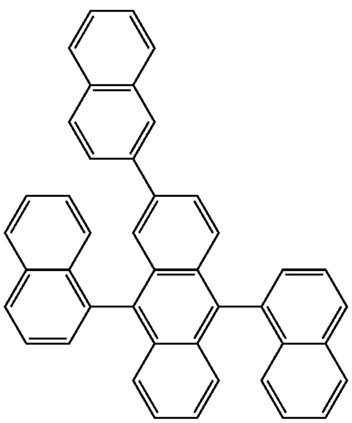
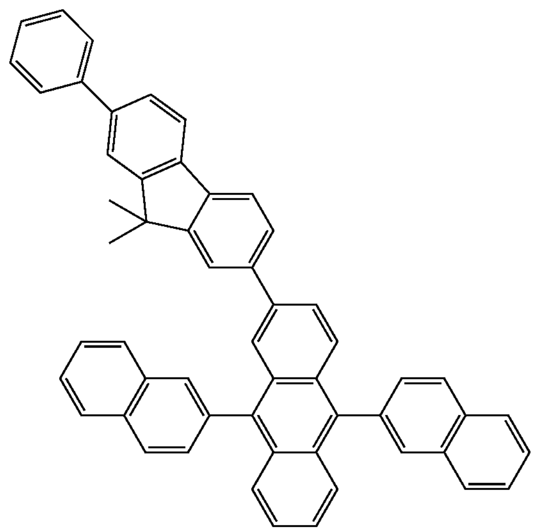
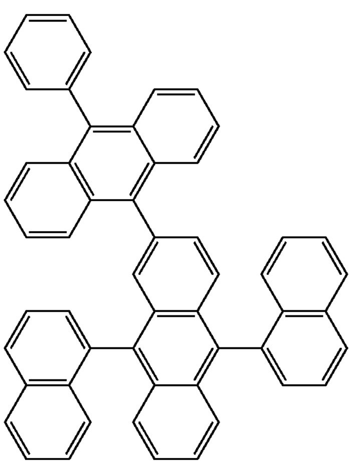
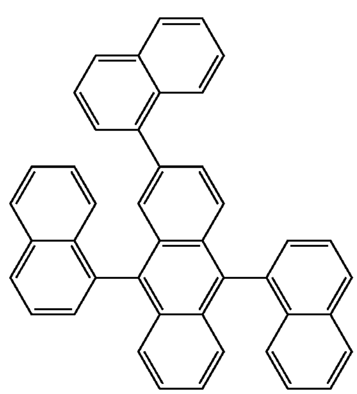
-continued -continued
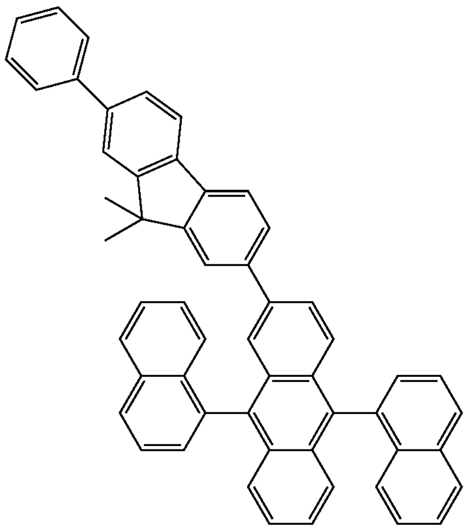
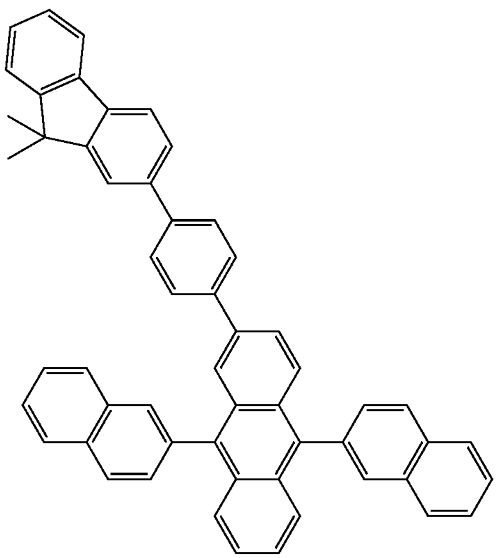
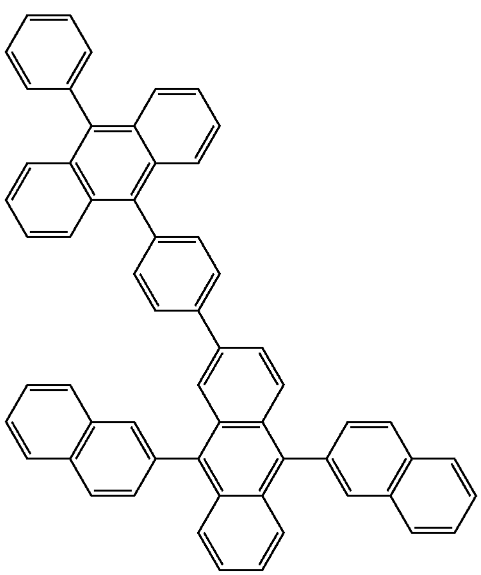
-continued
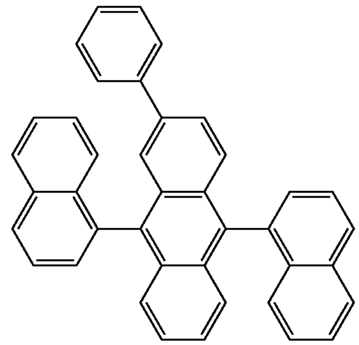
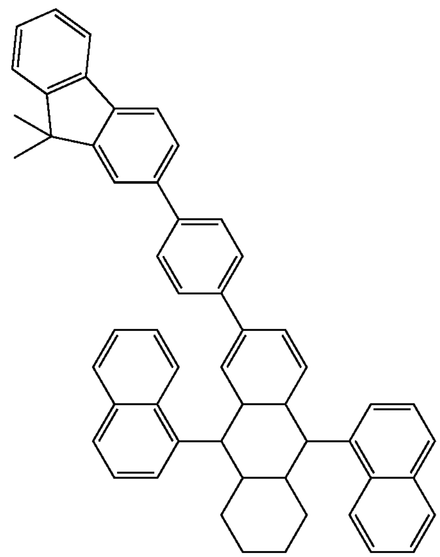
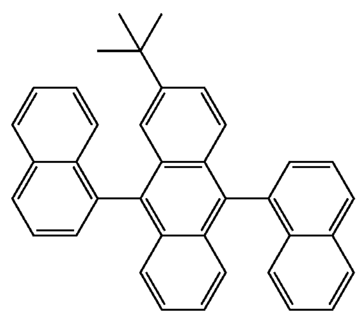
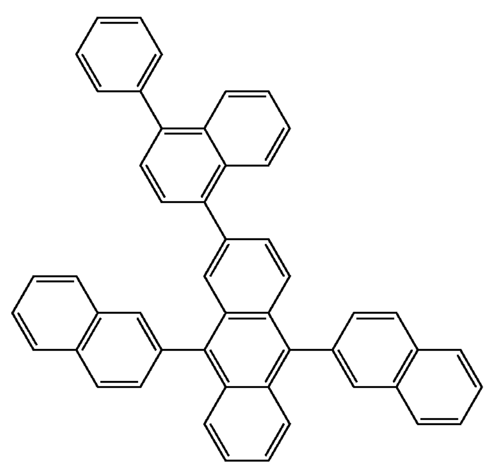

-continued
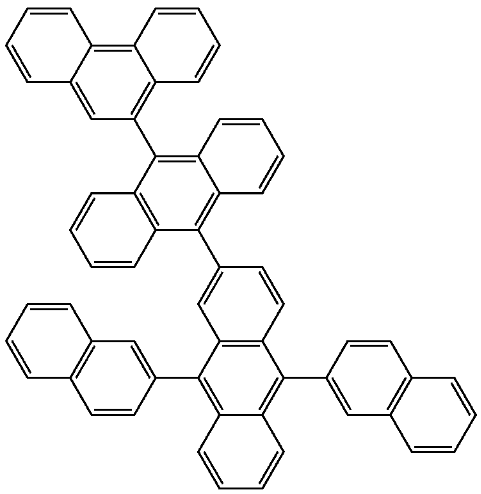
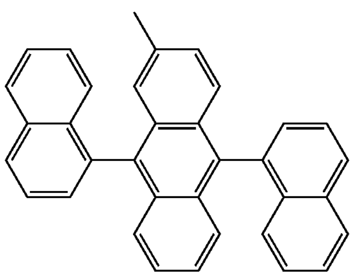
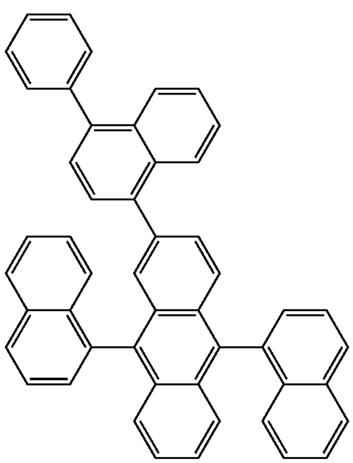
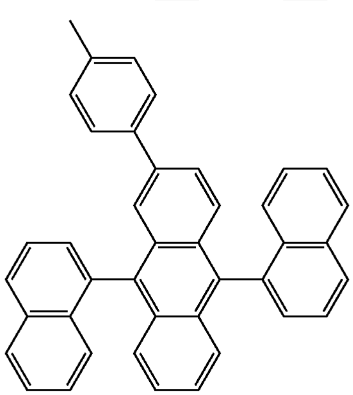
-continued
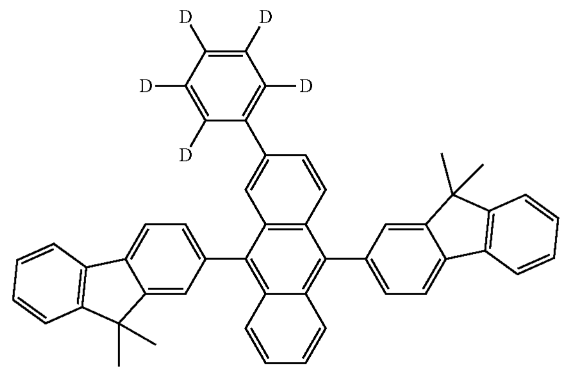
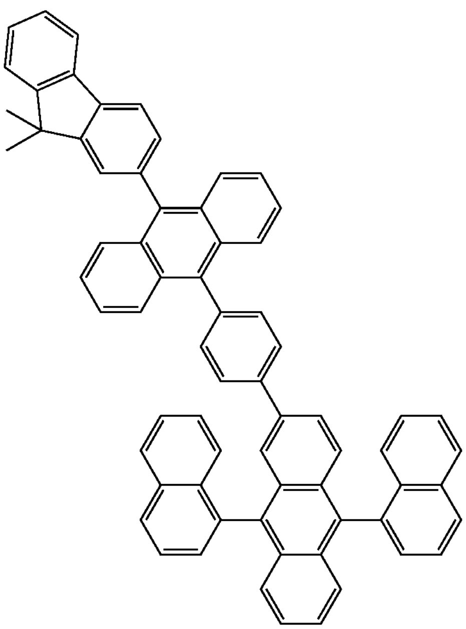
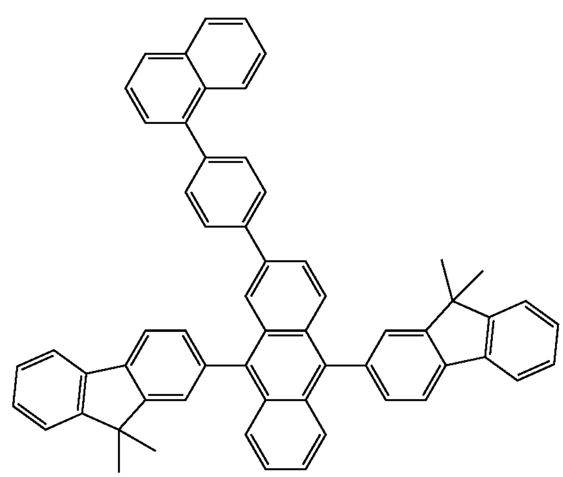

-continued
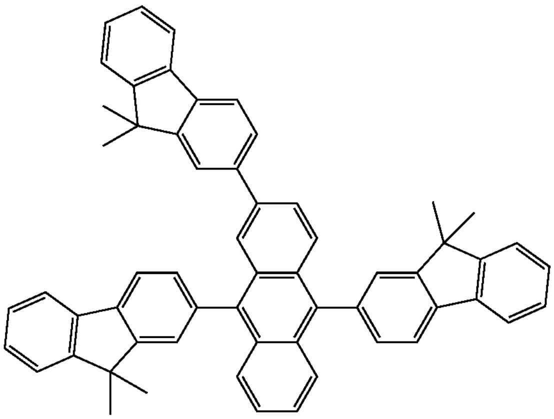
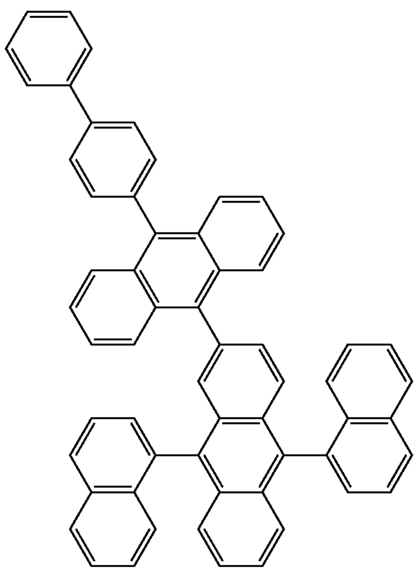
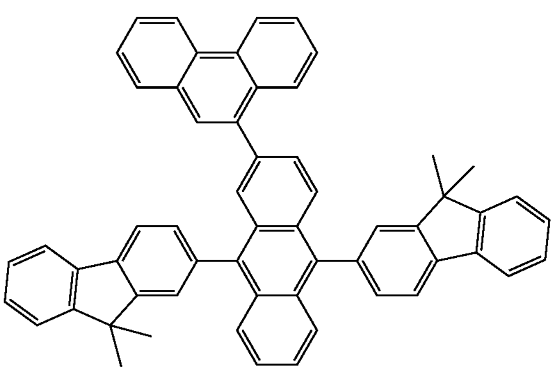
-continued
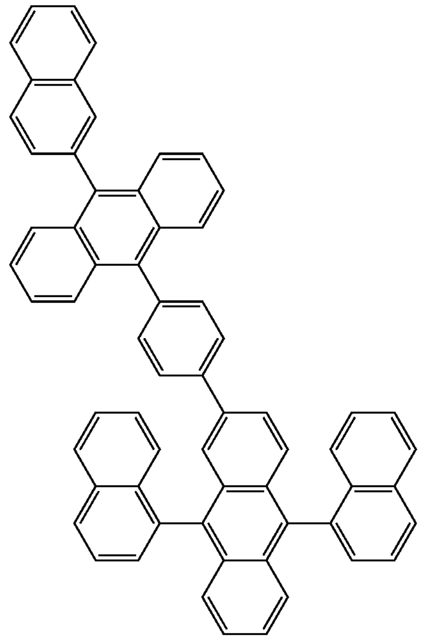
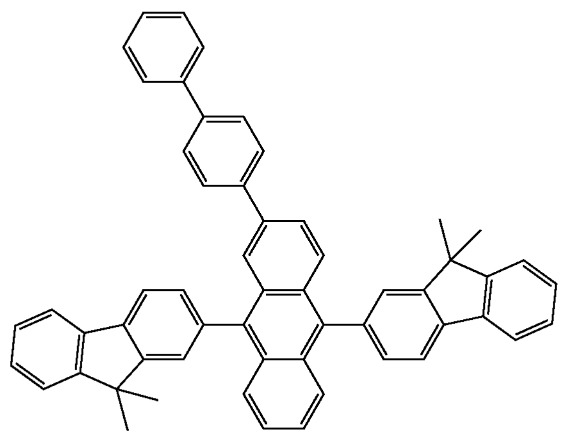
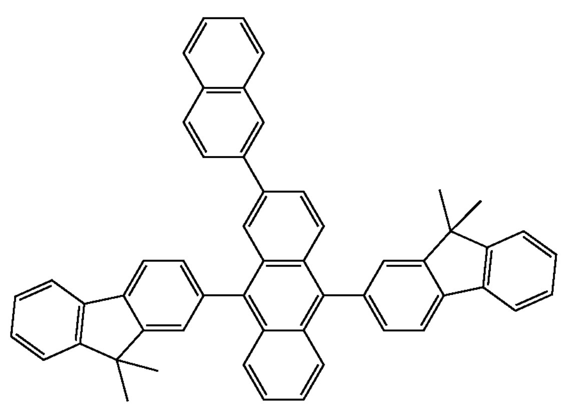

-continued
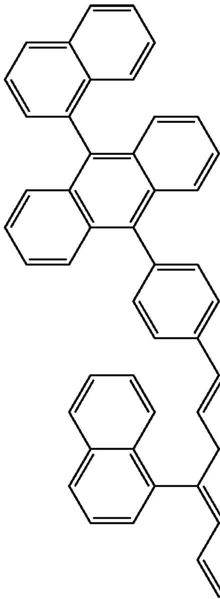
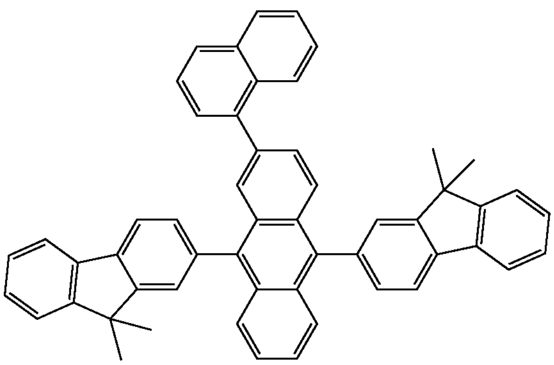
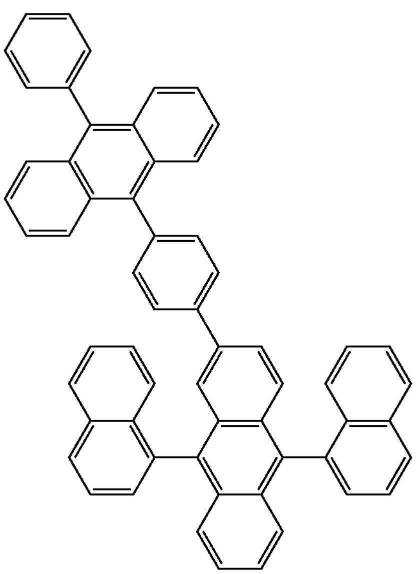
-continued
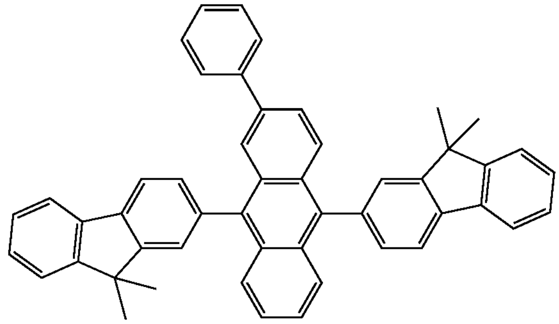
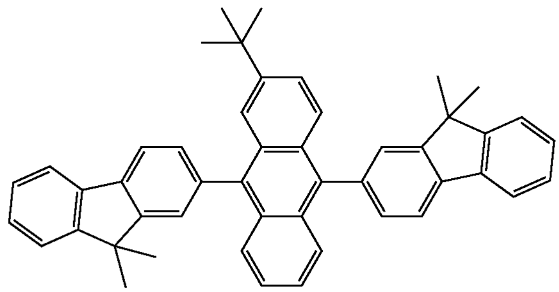
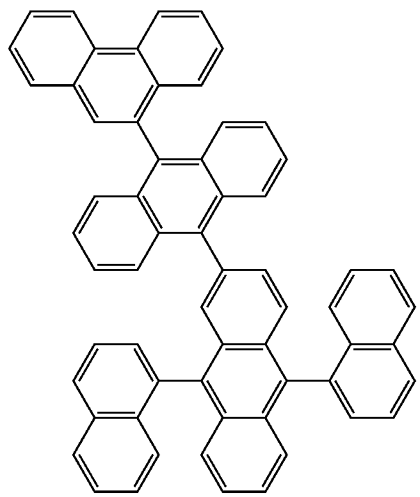
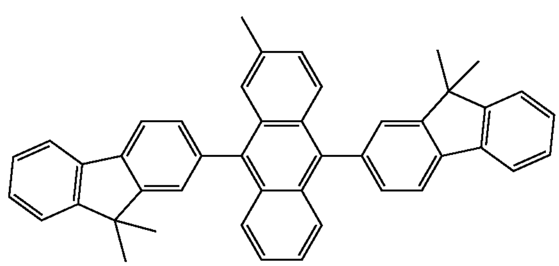

-continued
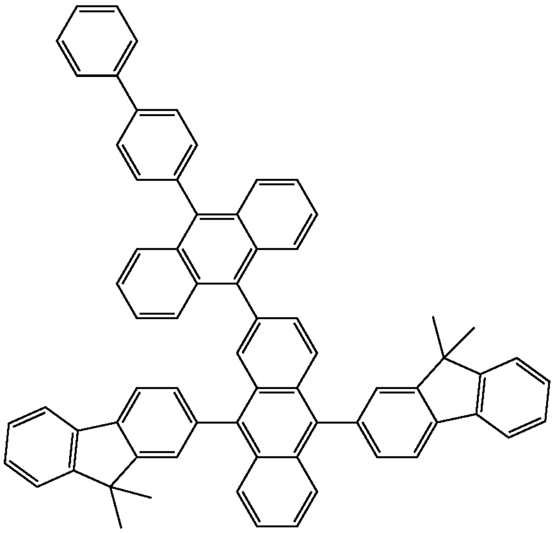
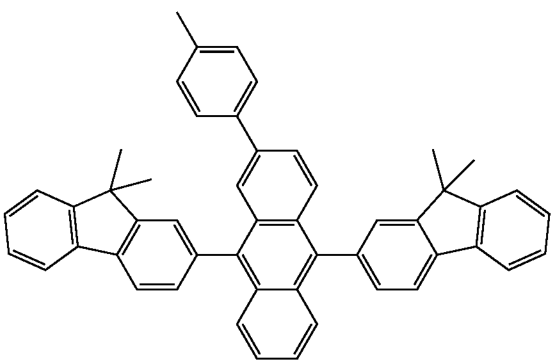
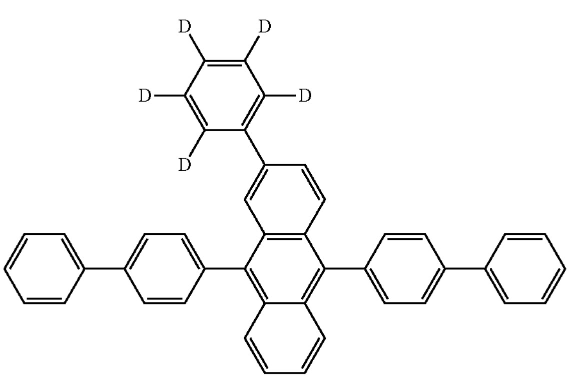
-continued
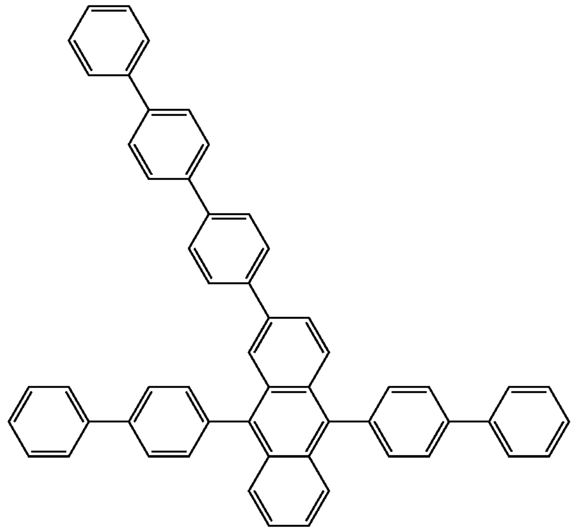
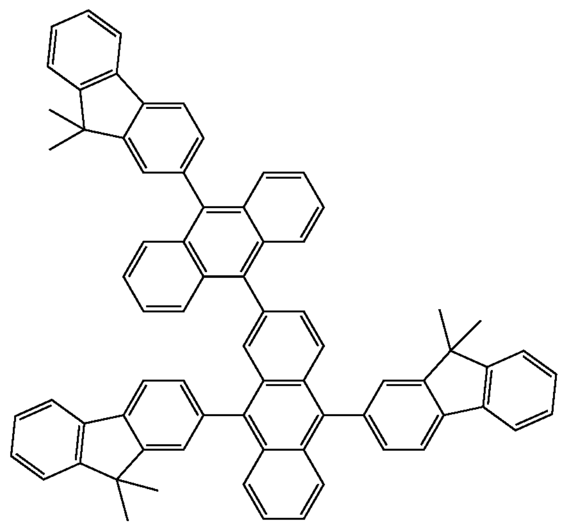
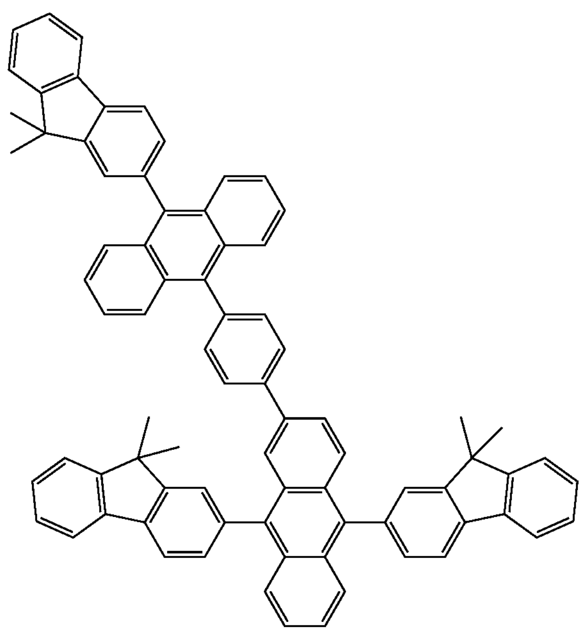

-continued
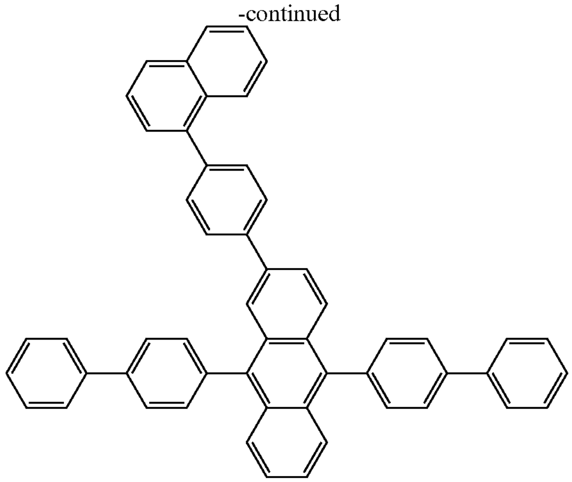
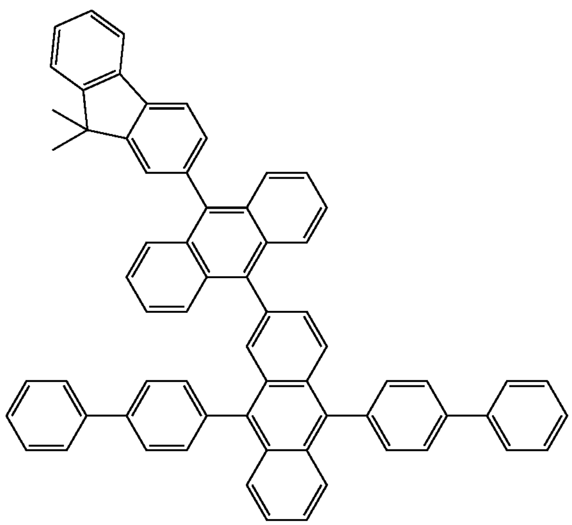
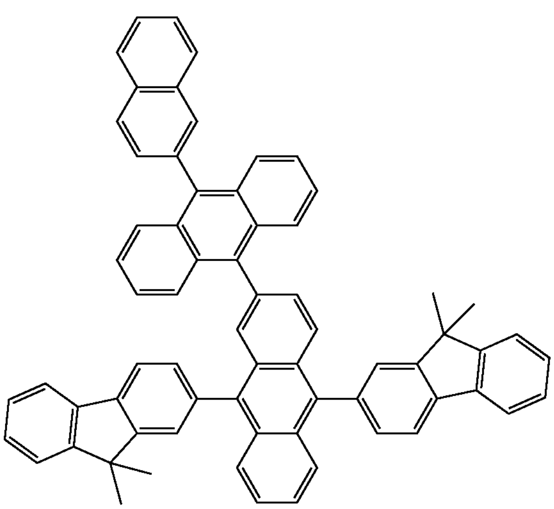
-continued
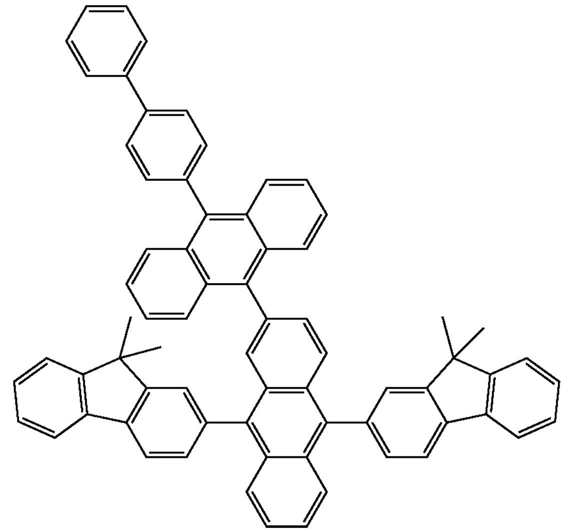
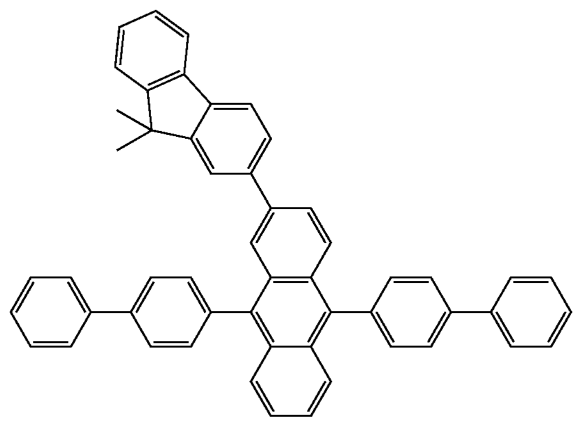
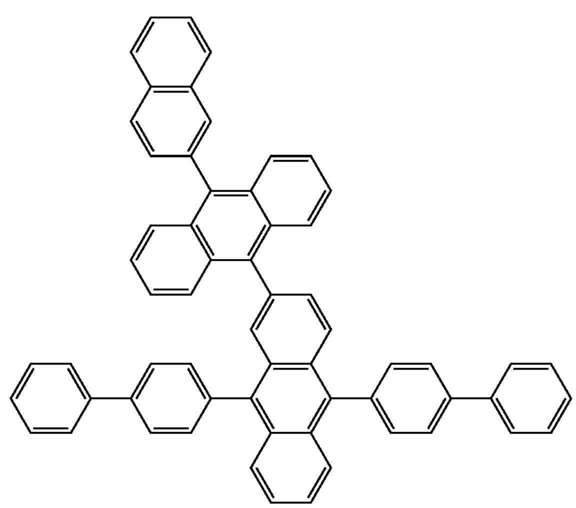

-continued
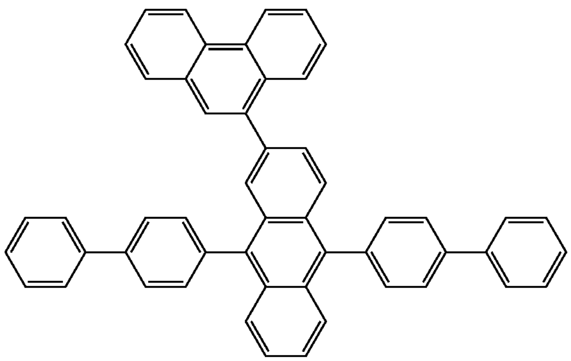
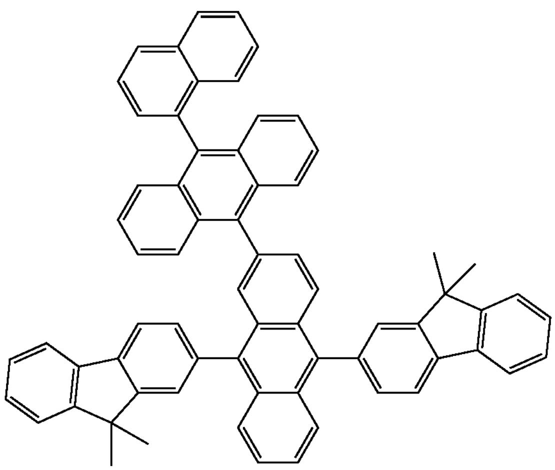
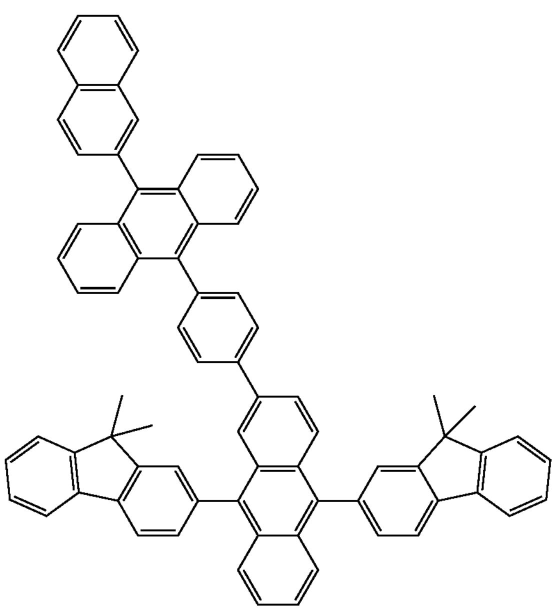
-continued
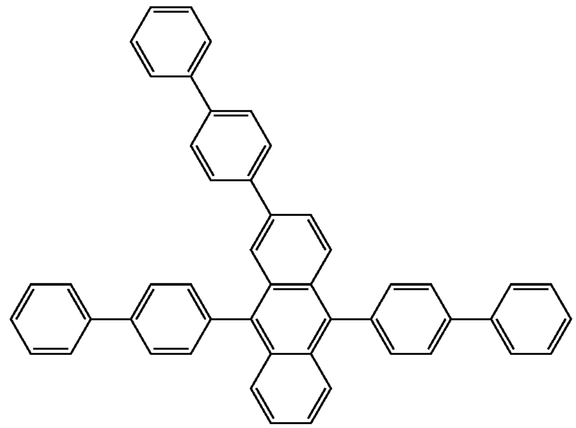
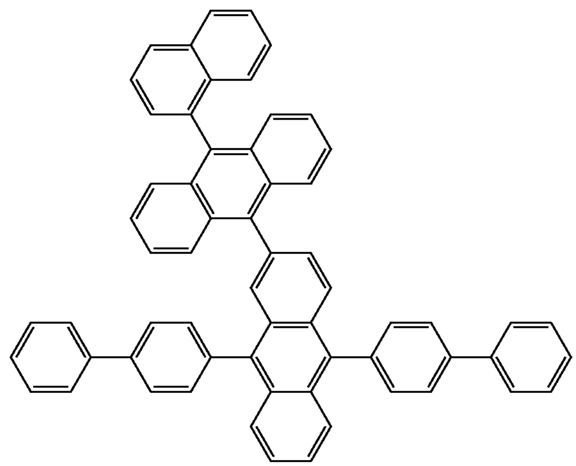
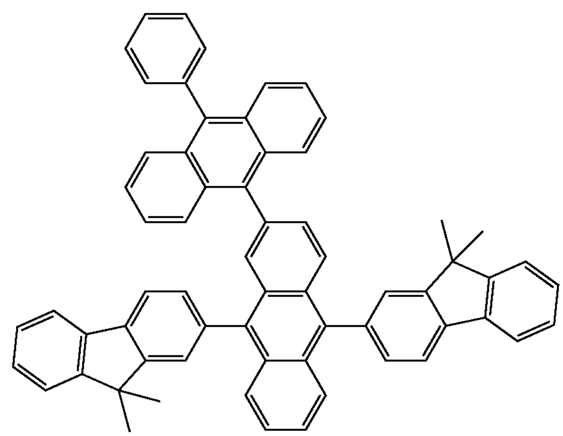
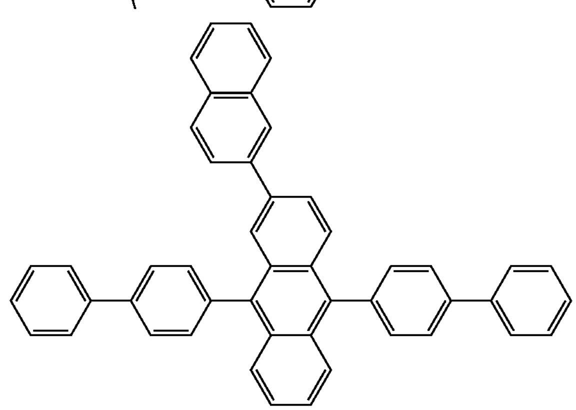

-continued
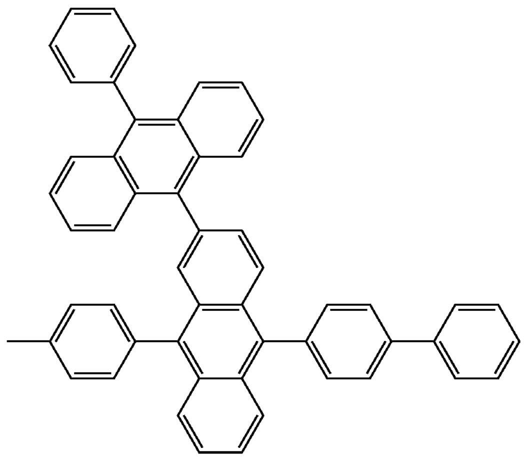
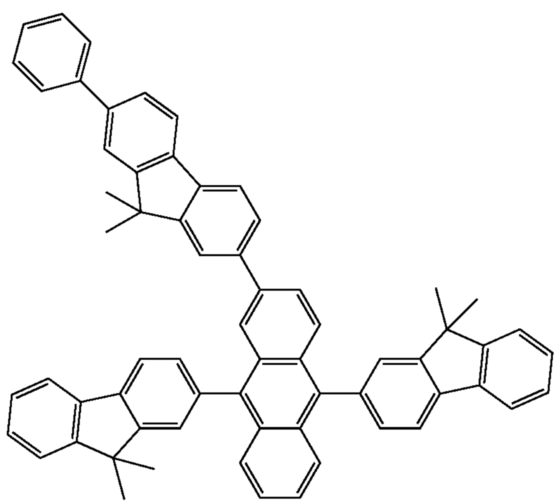
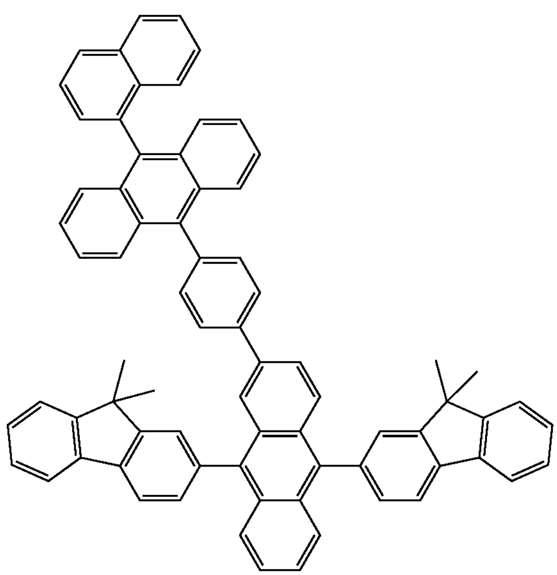
-continued
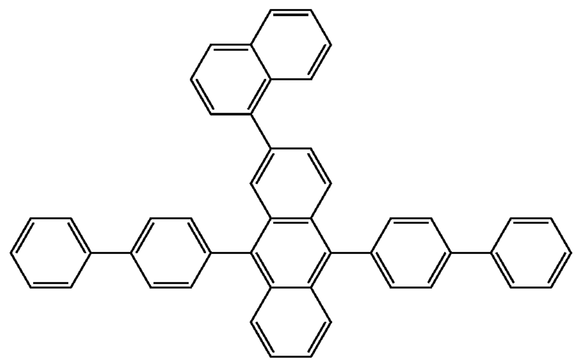
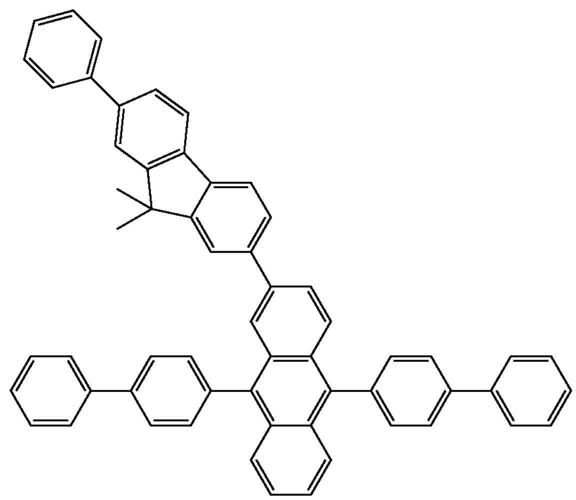
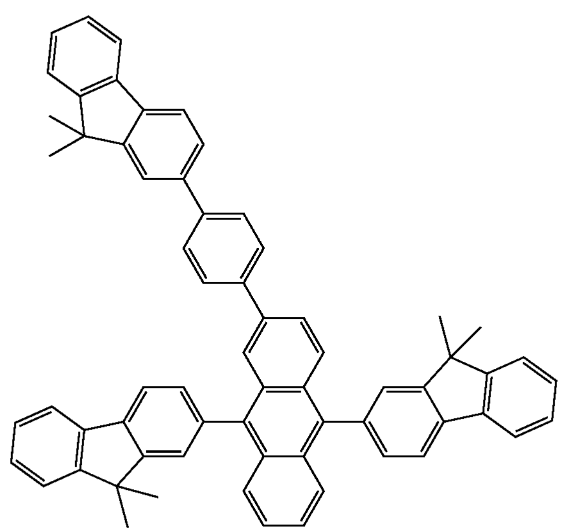

-continued
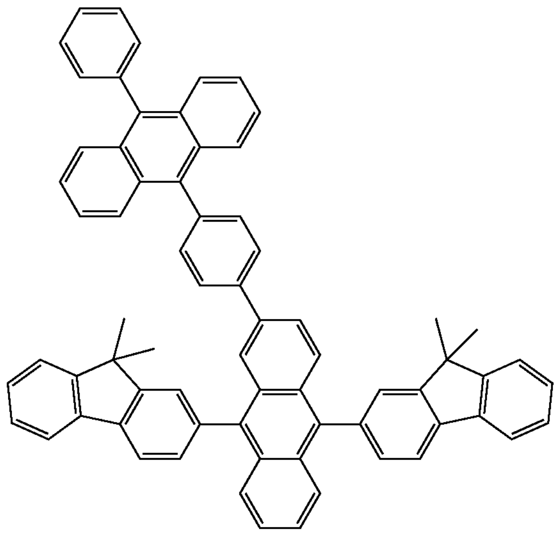
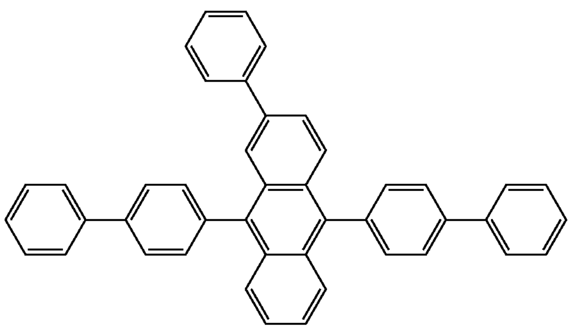
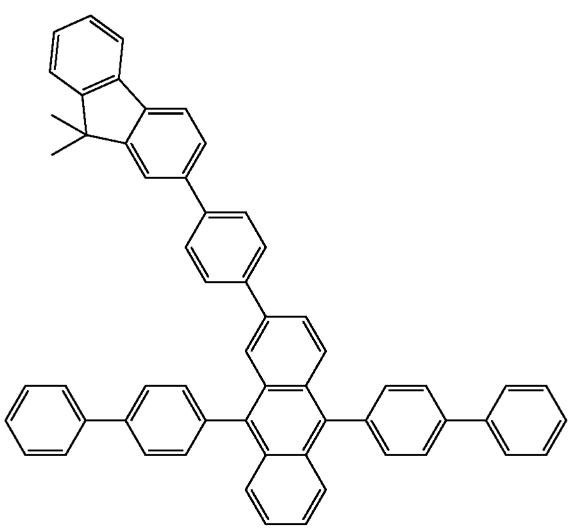
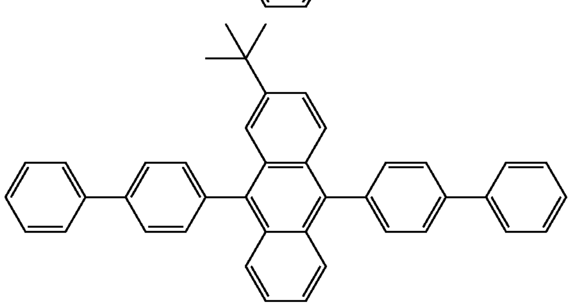
-continued
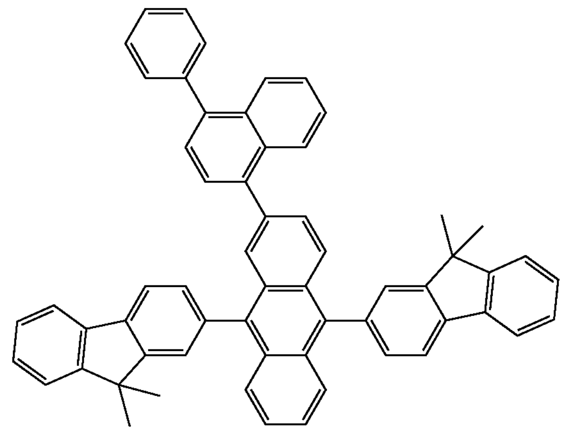
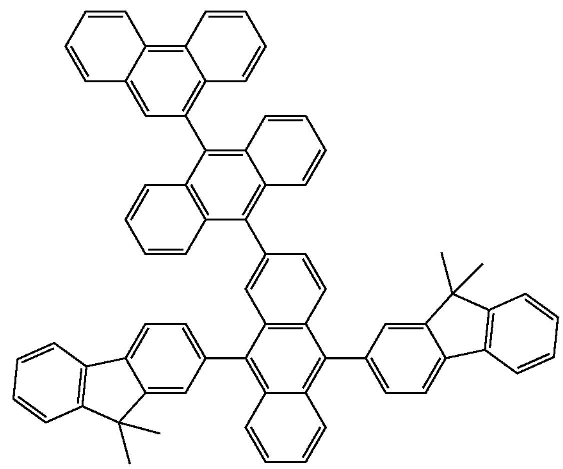
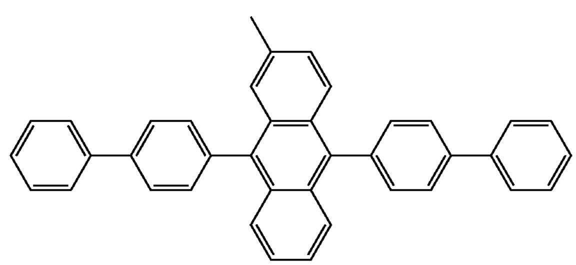
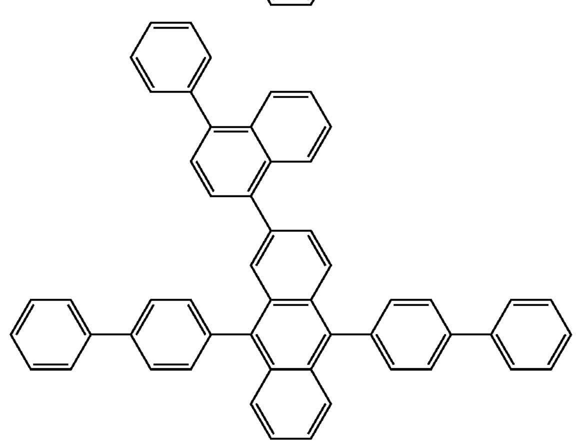

-continued
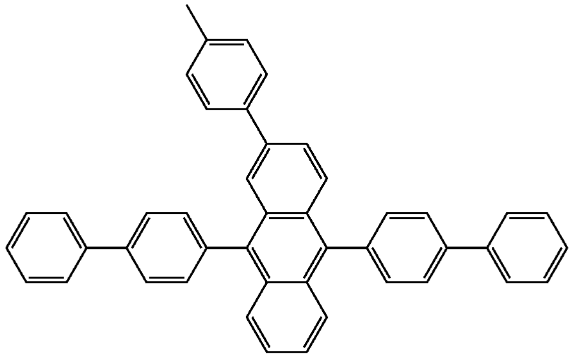
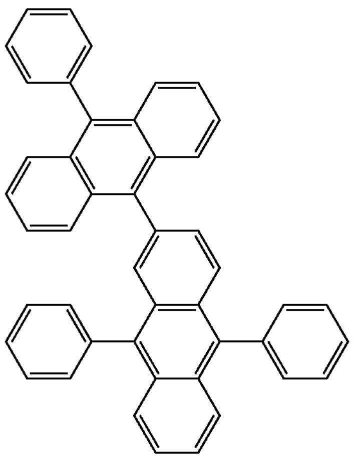
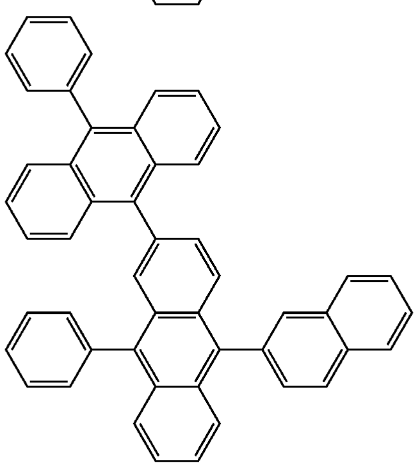
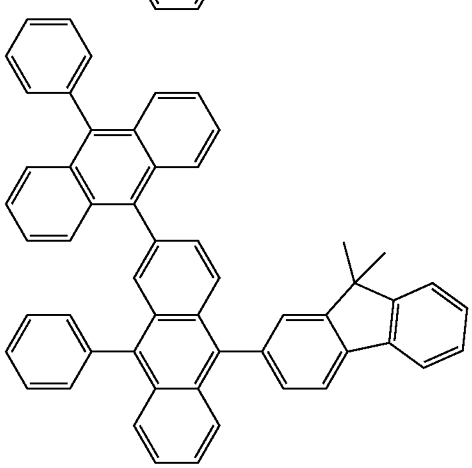
-continued
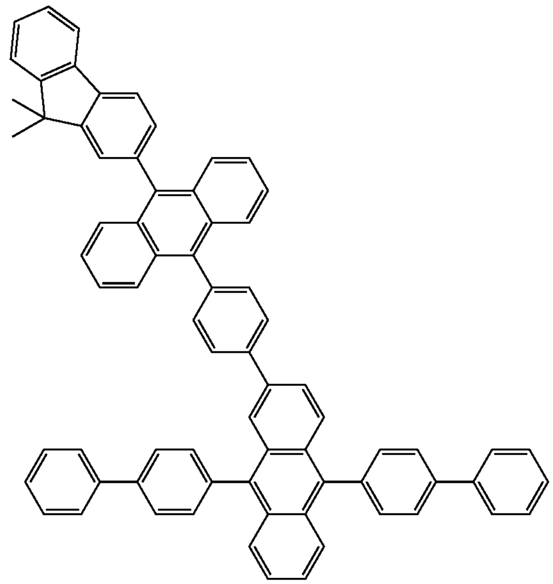
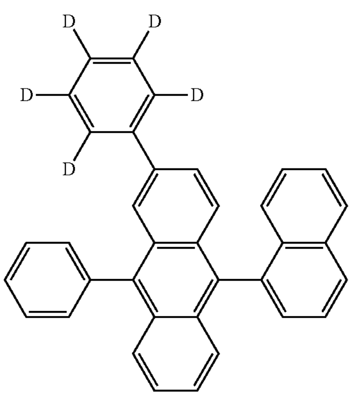
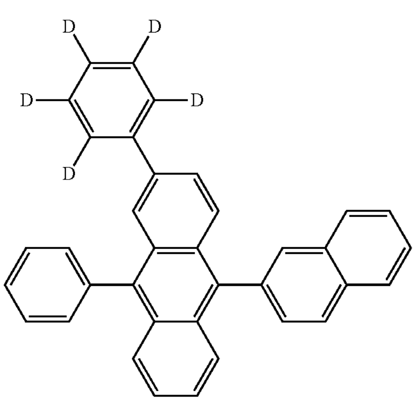

-continued
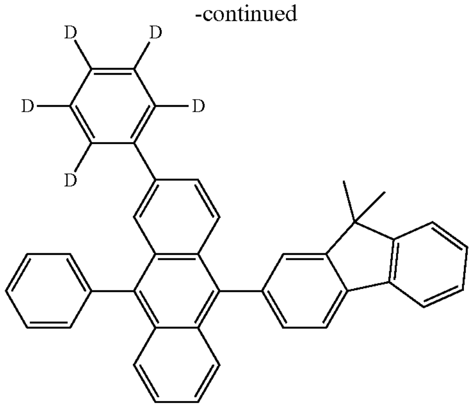
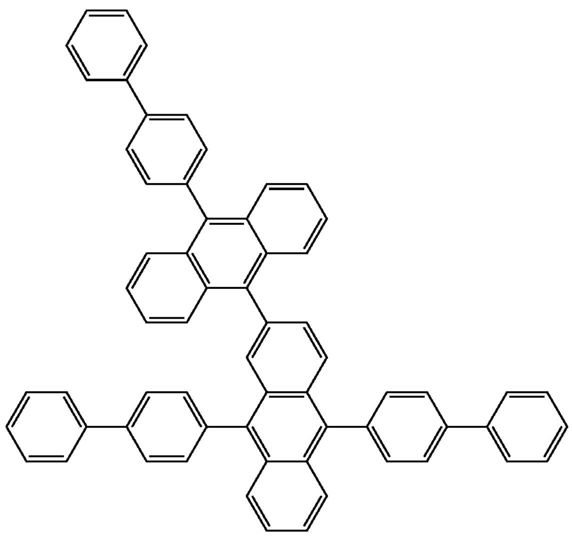
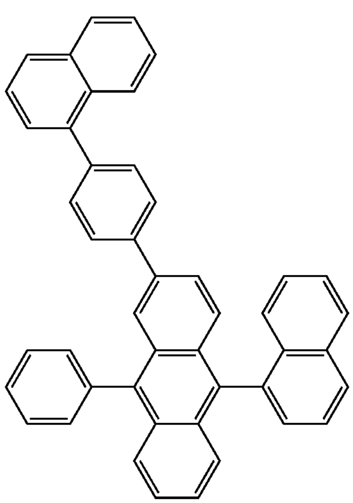
-continued
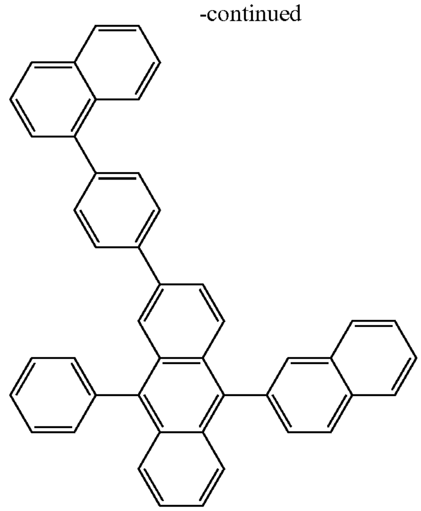
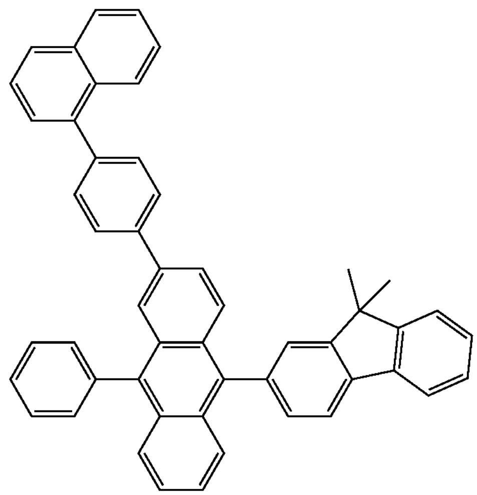
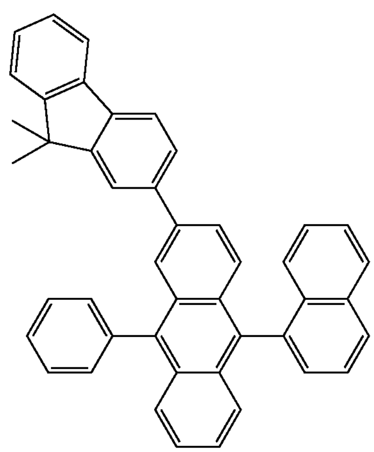

-continued
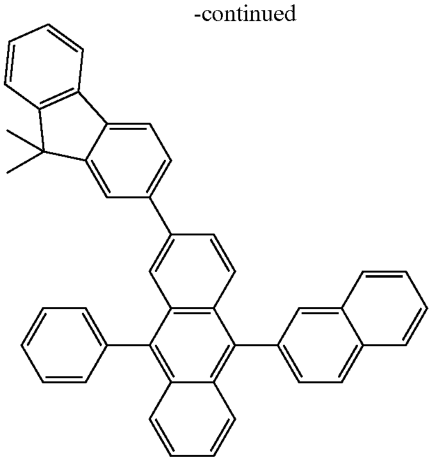
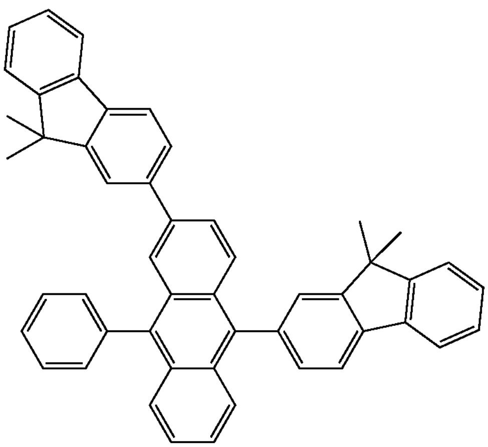
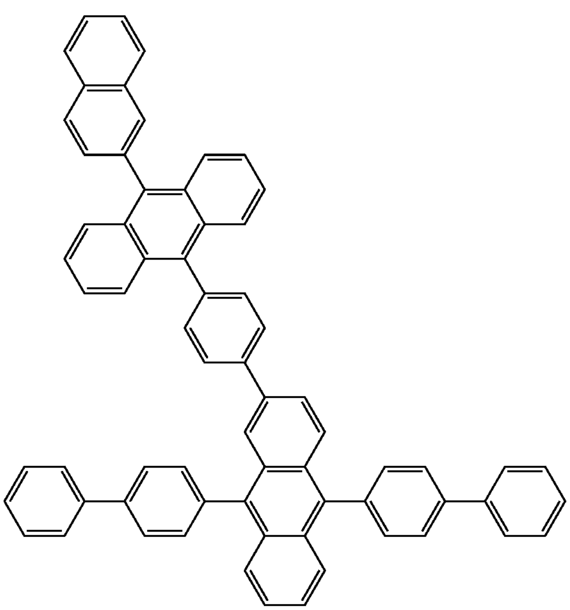
-continued
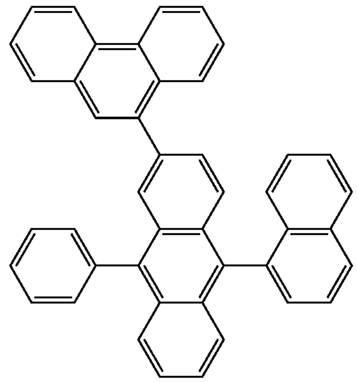
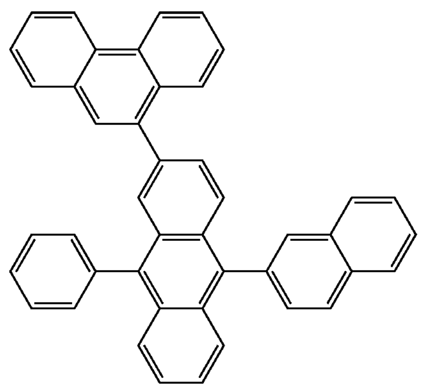
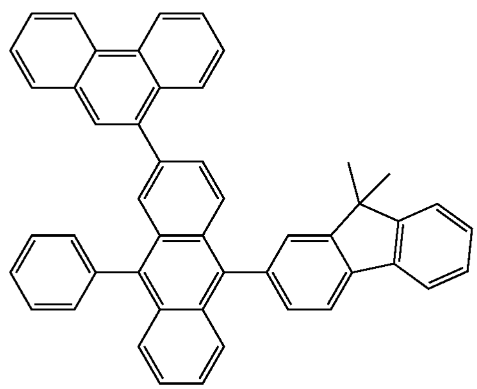
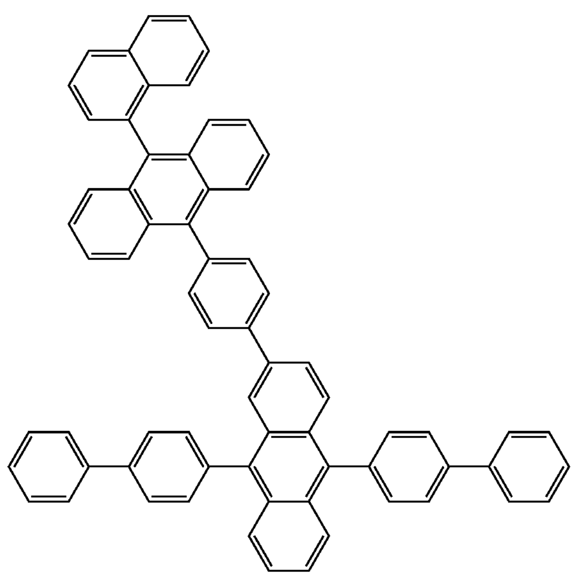

-continued
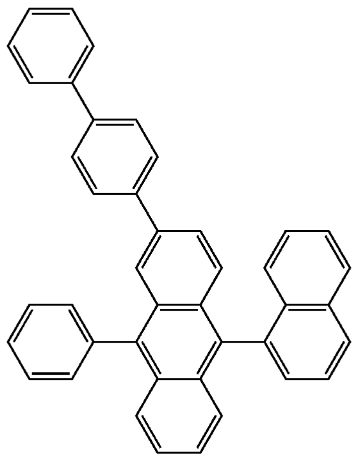
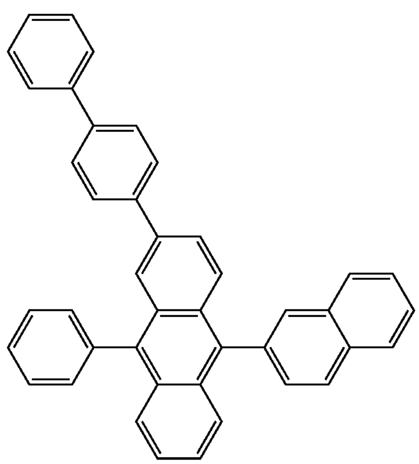
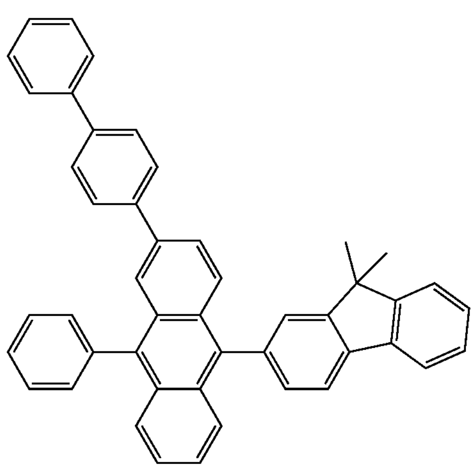
-continued
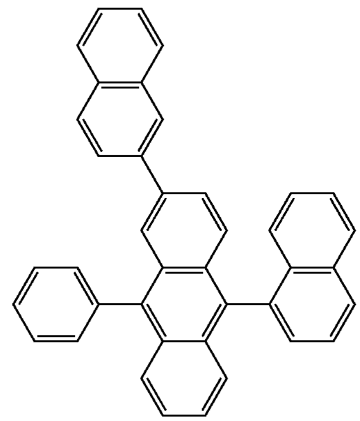
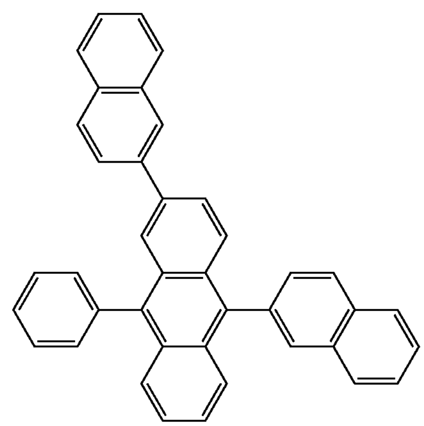
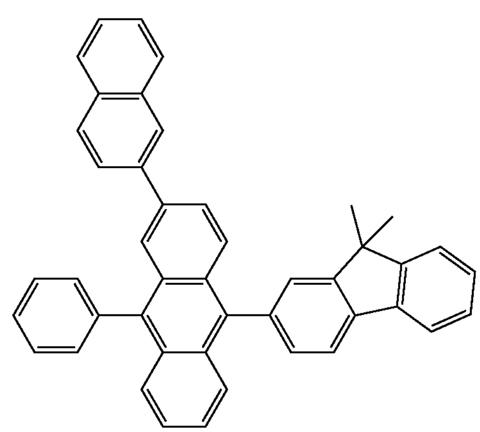

-continued
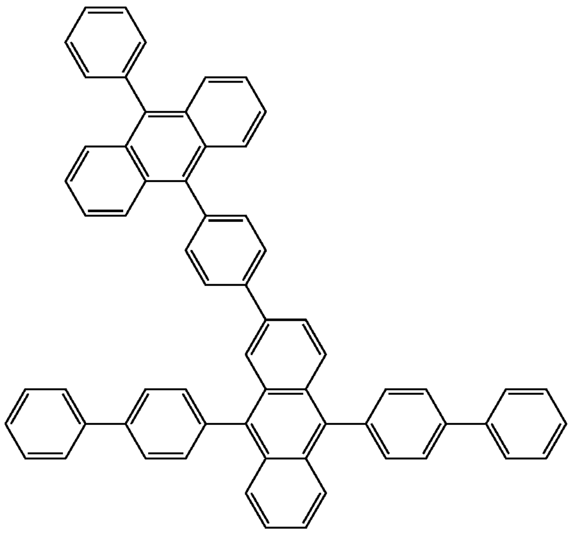
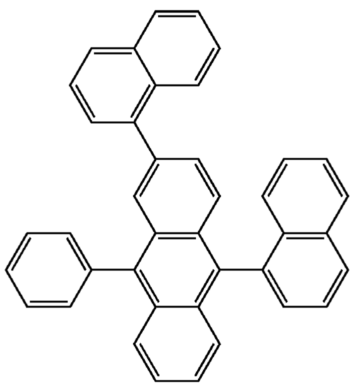
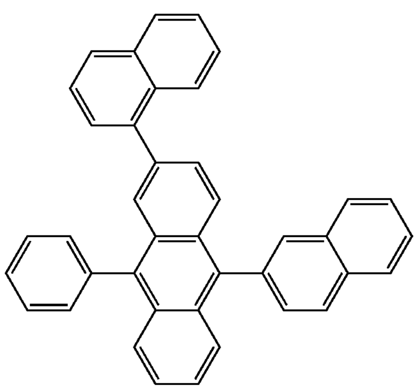
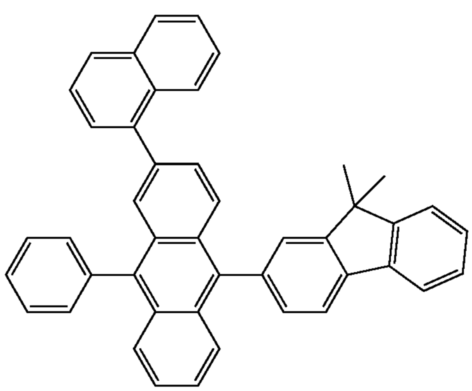
-continued
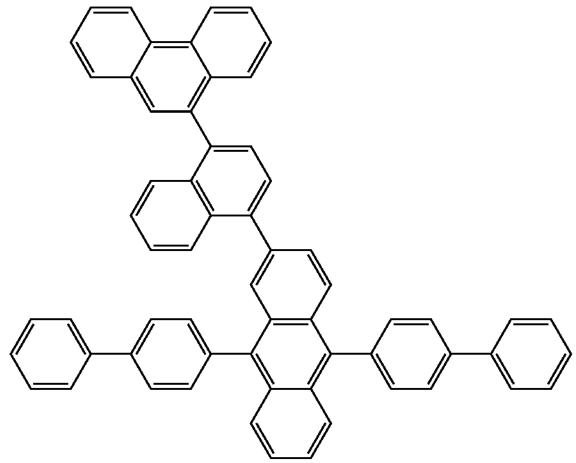
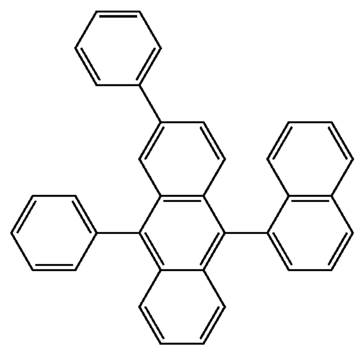
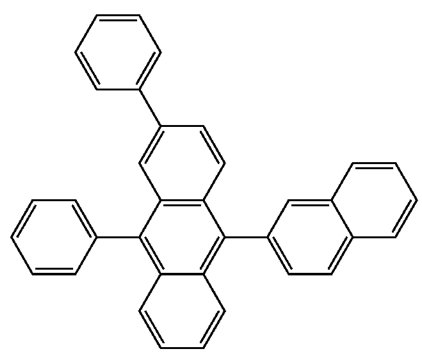
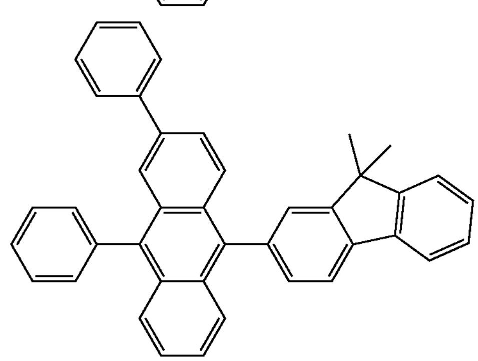

-continued
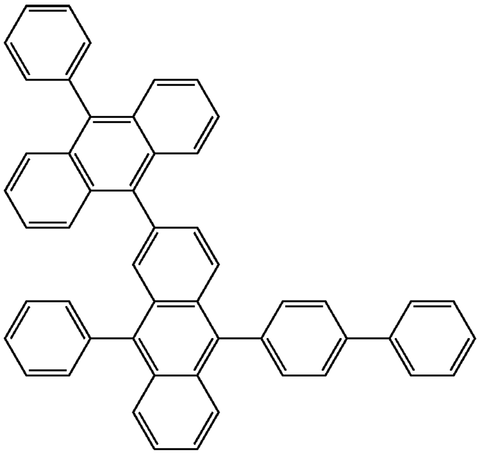
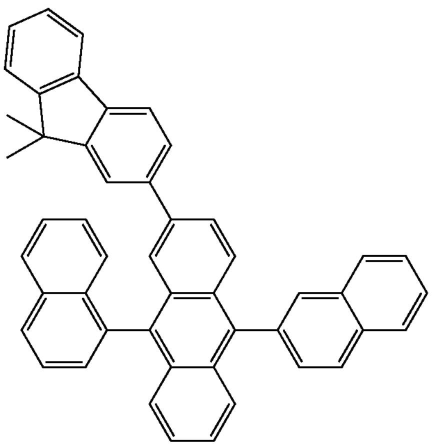
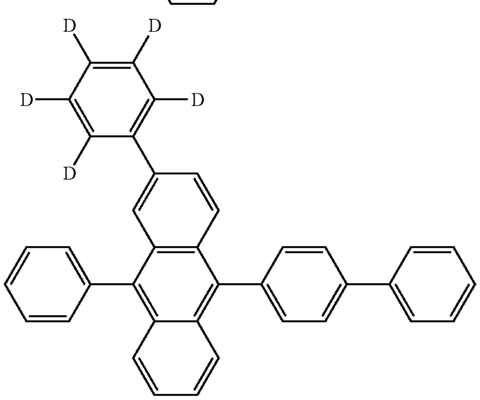
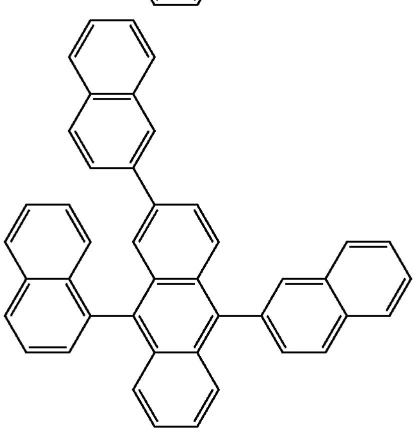
-continued
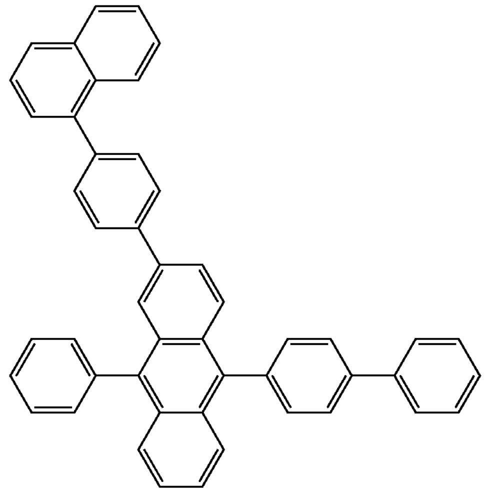
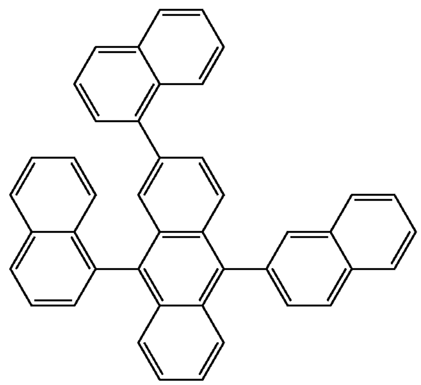
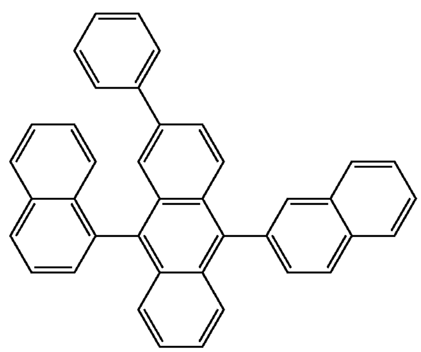
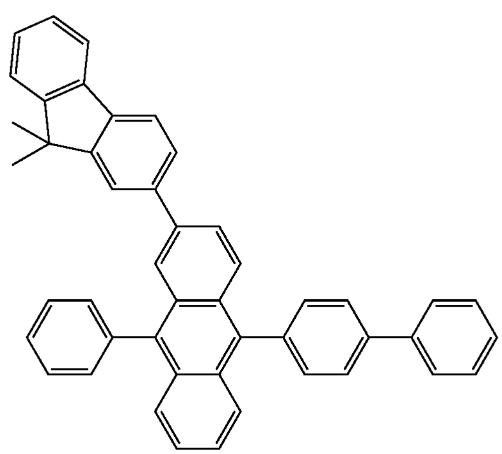

-continued
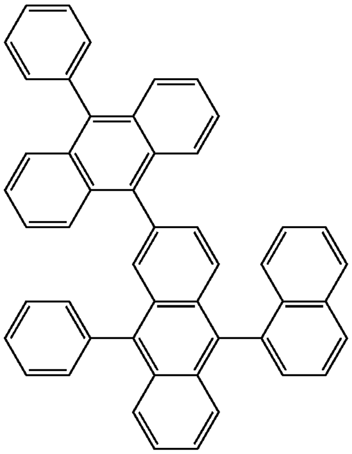
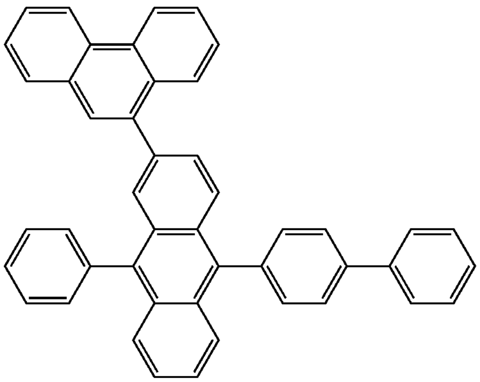
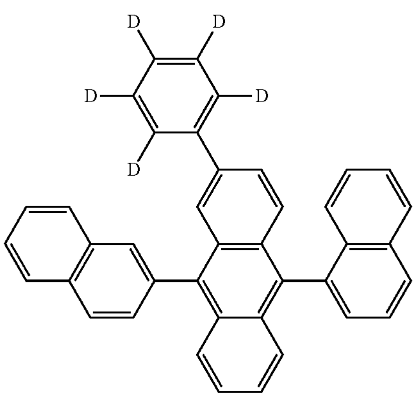
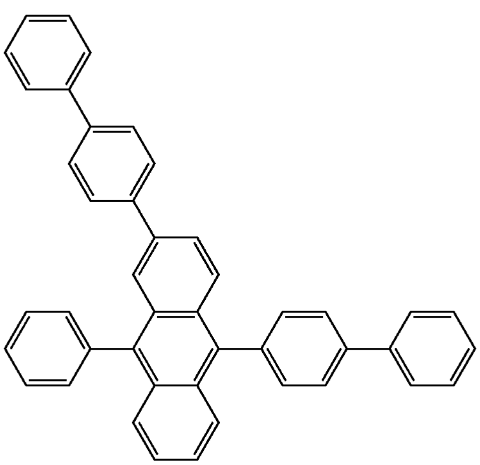
-continued
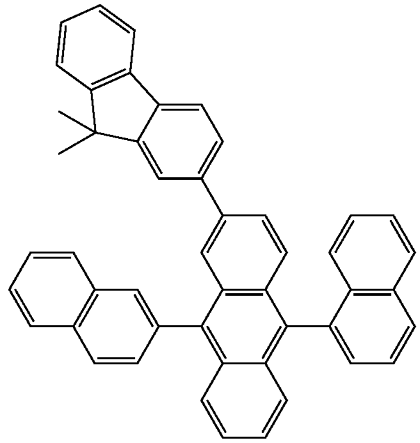
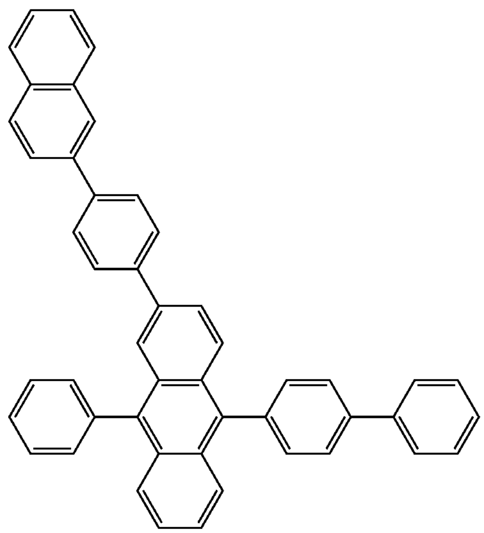
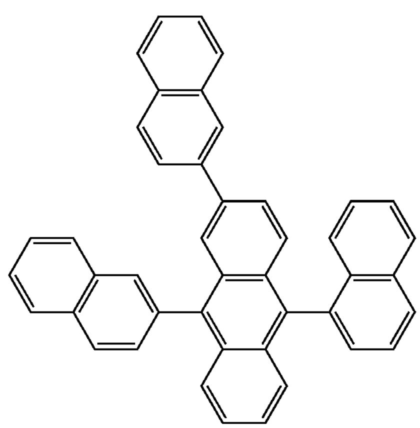

-continued
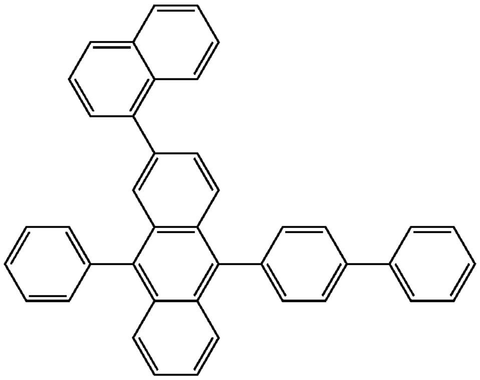
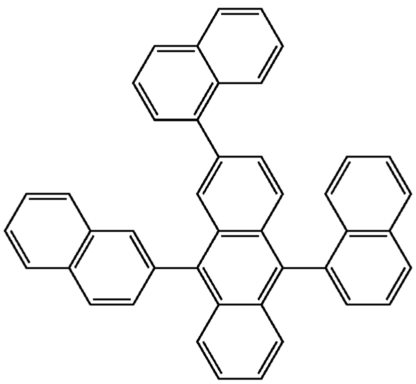
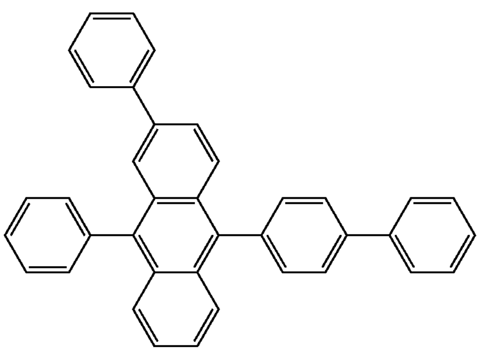
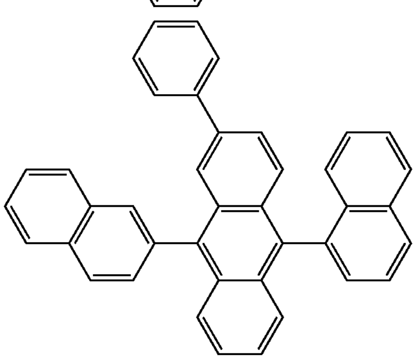
-continued
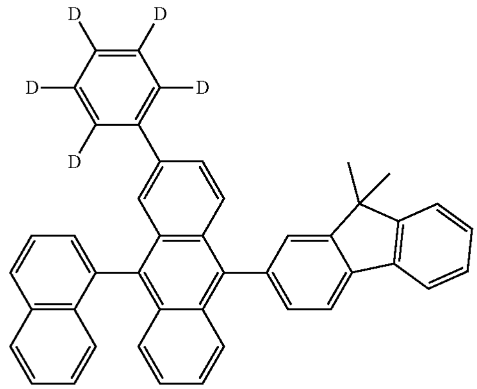
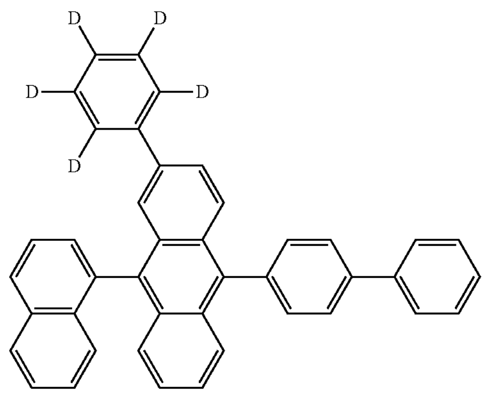
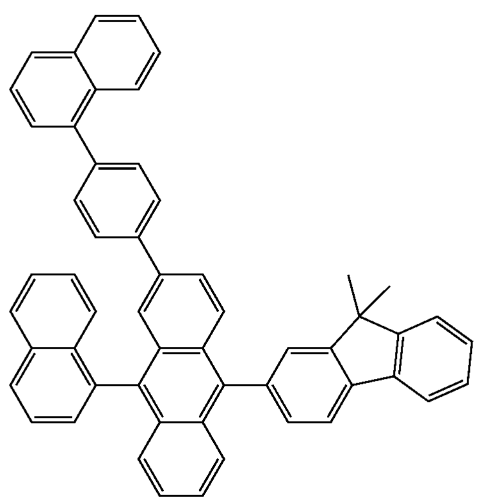

-continued
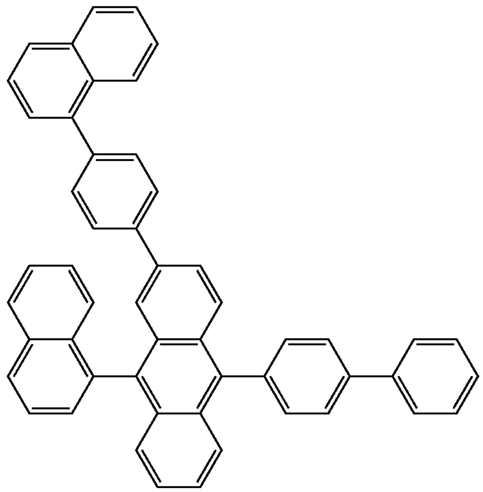
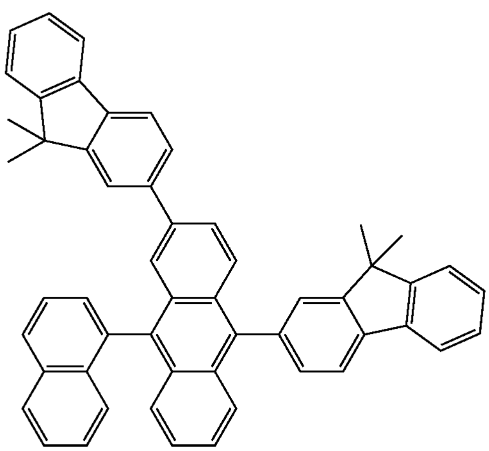
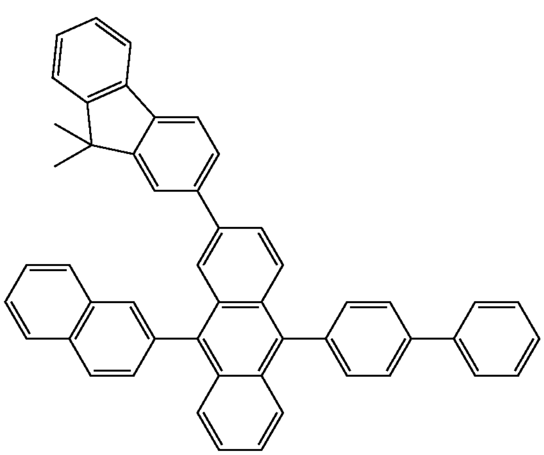
-continued
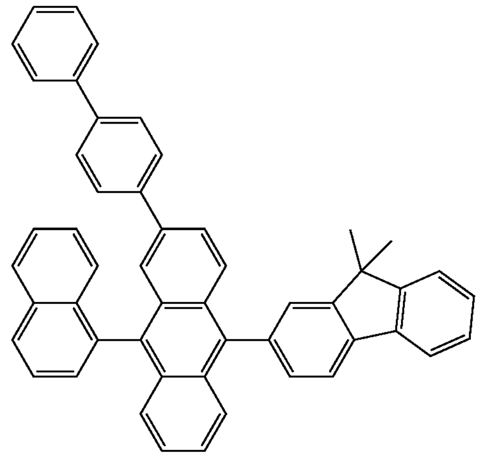
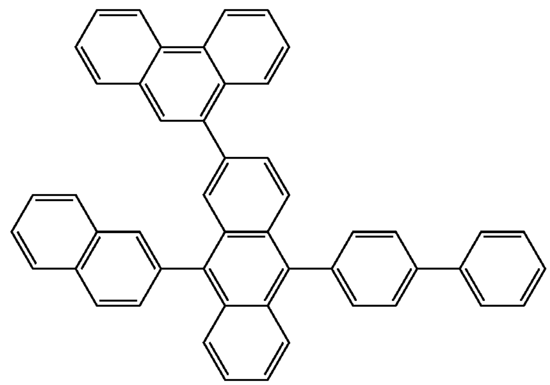
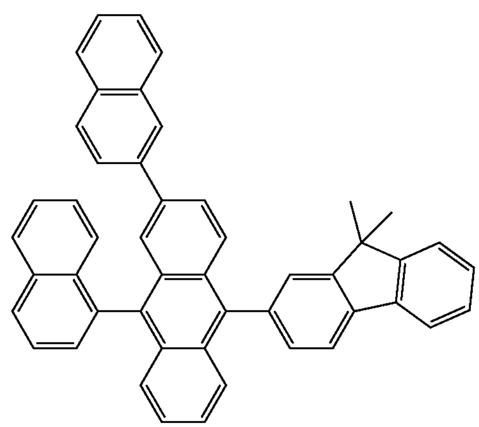
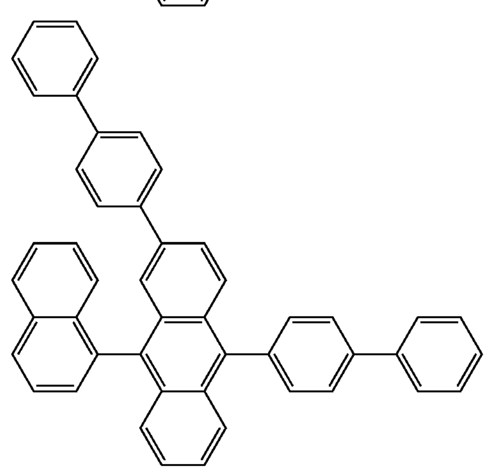

-continued
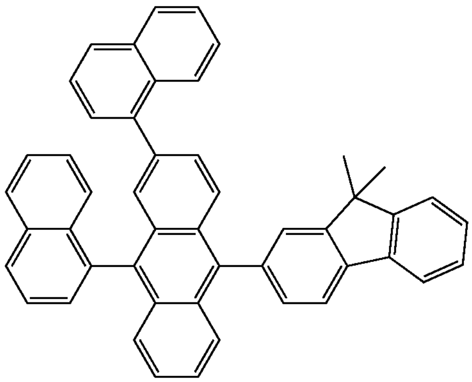
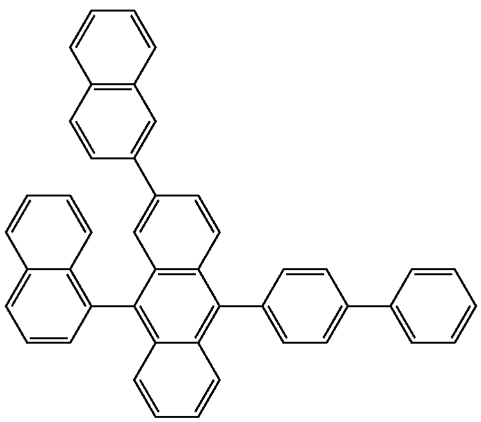
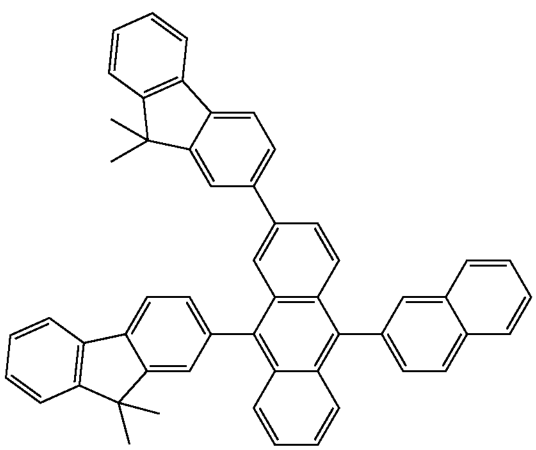
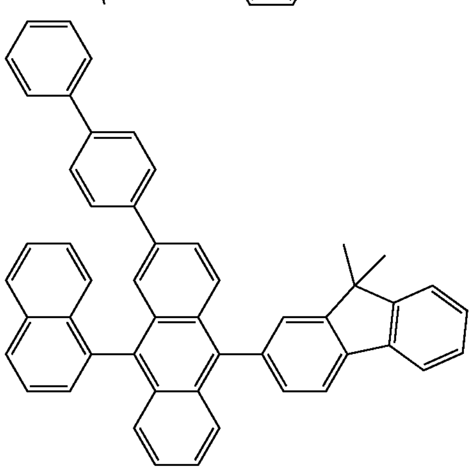
-continued
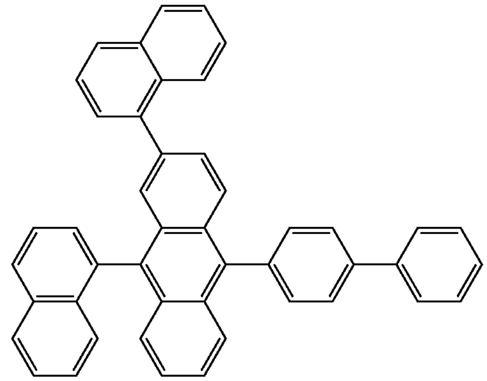
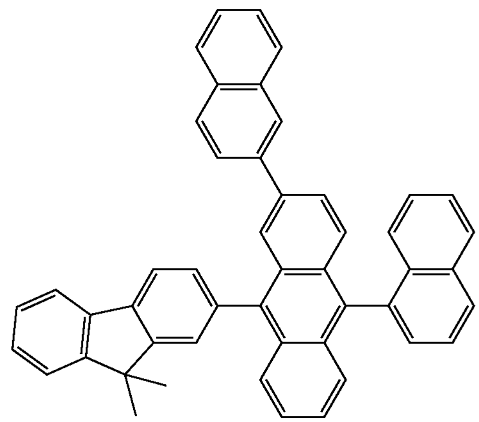
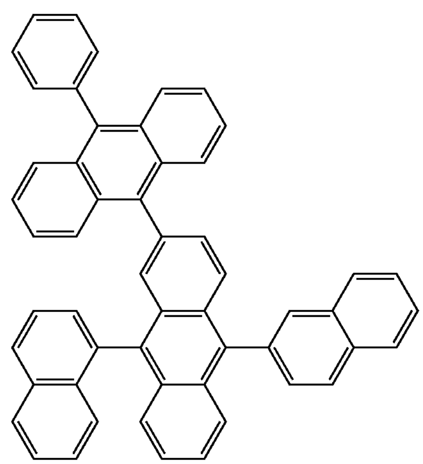
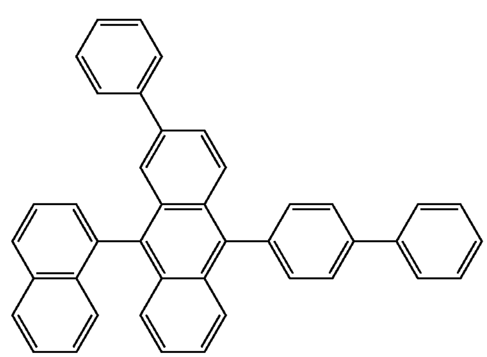

-continued
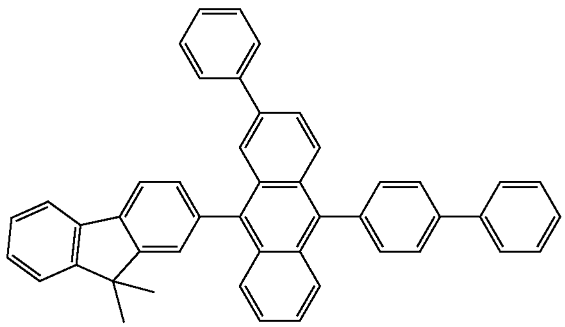
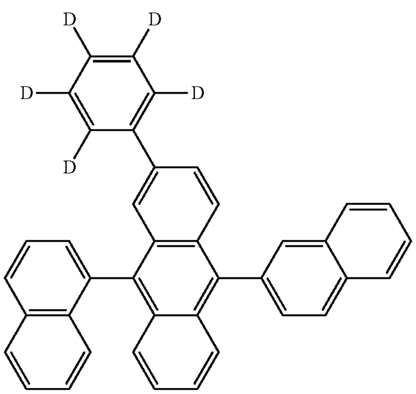
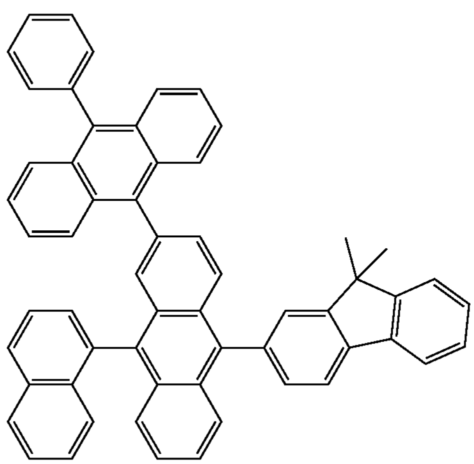
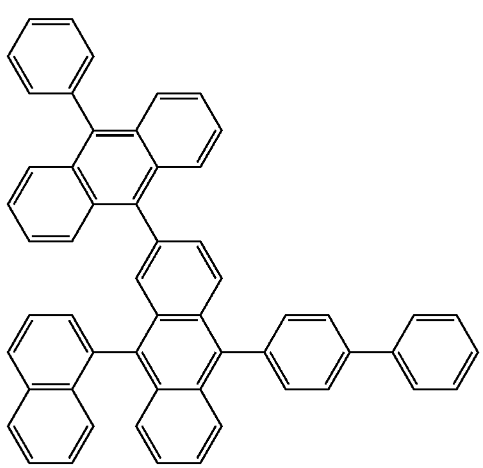
-continued
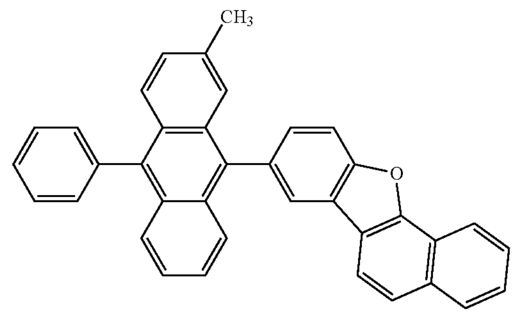
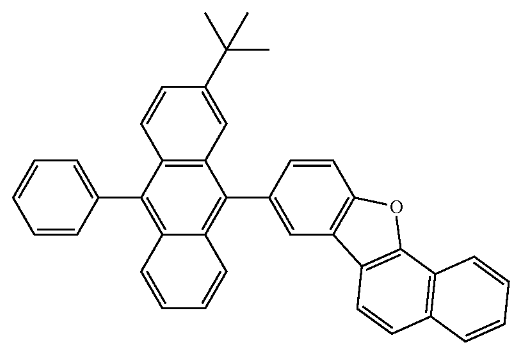
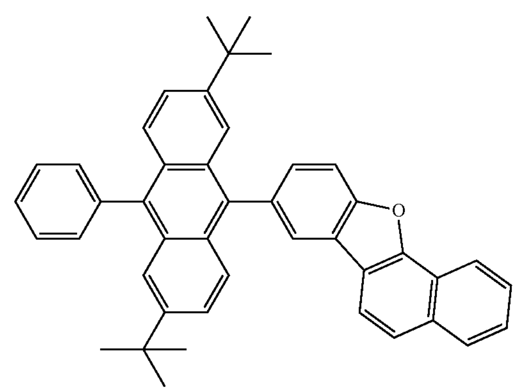
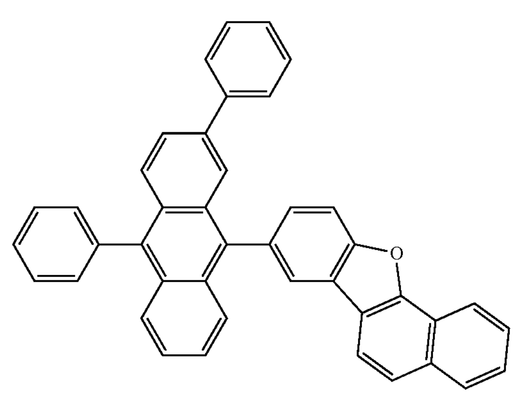

-continued
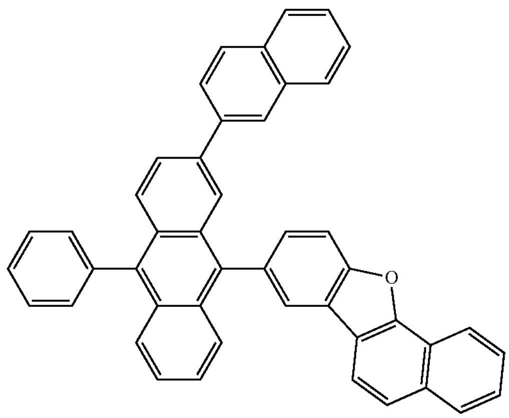
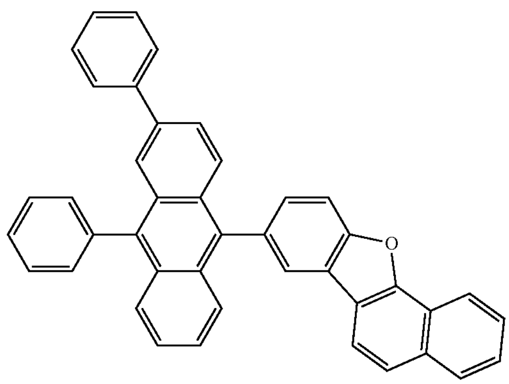
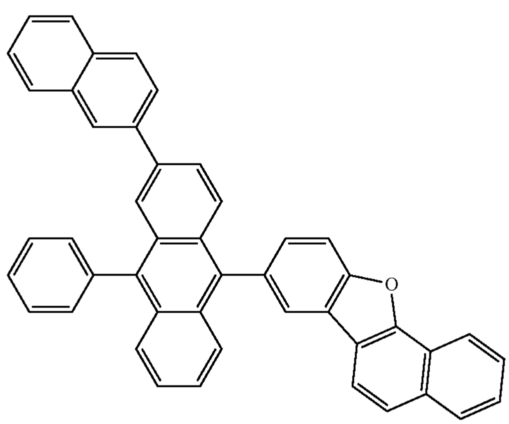
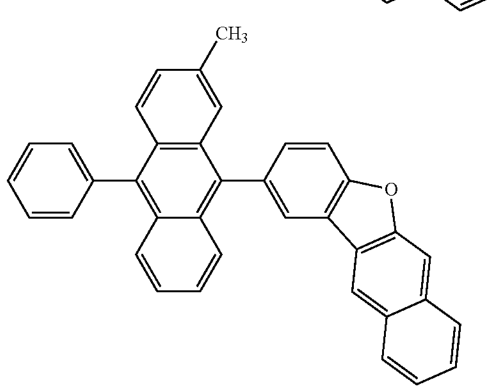
-continued
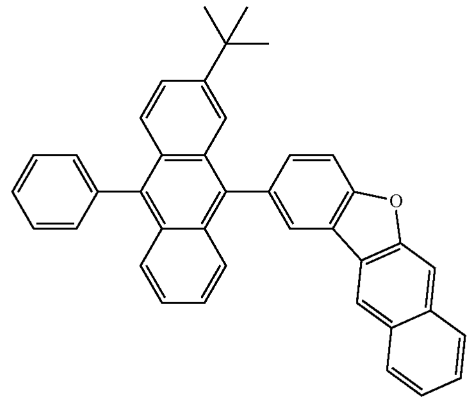
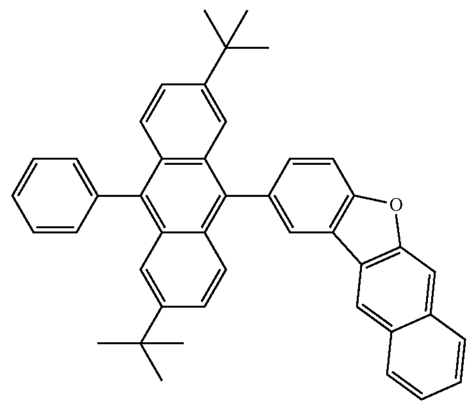
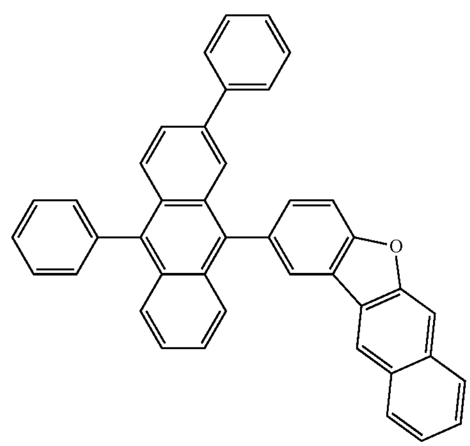
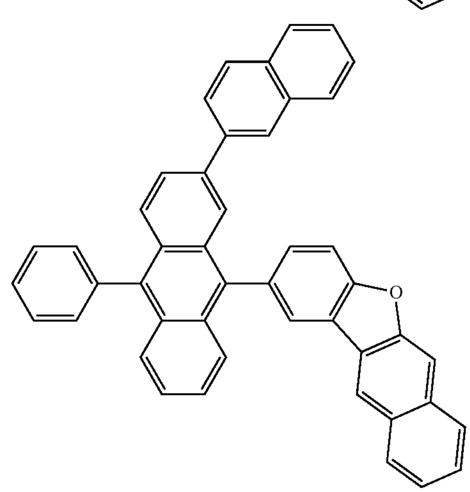

-continued

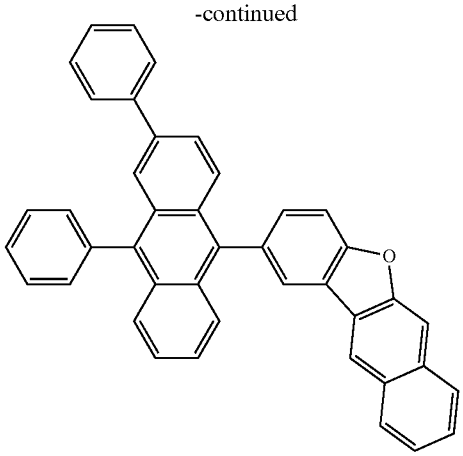

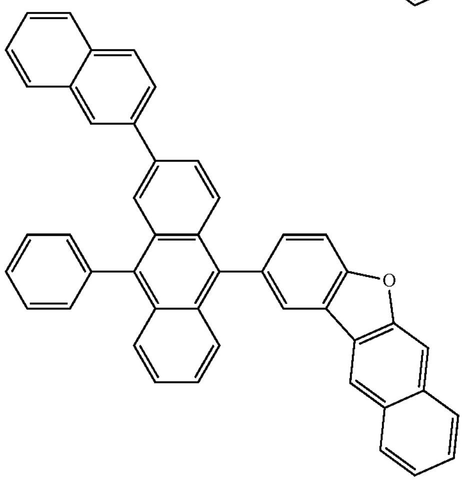

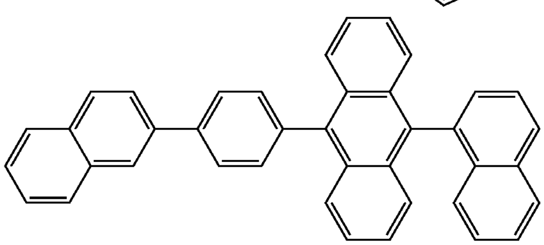

In one embodiment, when the emitting layer contains the compound represented by the formula (1) and the compound represented by the formula (10), a content of the compound represented by the formula (1) is preferably 1% by mass or more and 20% by mass or less based on the total mass of the emitting layer.

In one embodiment, when the emitting layer contains the compound represented by the formula (1) and the compound represented by the formula (10), a content of the compound represented by the formula (10) is preferably 80% by mass or more and 99% by mass or less based on the total mass of the emitting layer.

Hereinafter, a layer configuration of the organic EL device according to an aspect of the invention will be described.

The organic EL device according to an aspect of the invention has an organic layer between a pair of electrodes, that are the cathode and the anode. The organic layer contains at least one layer composed of an organic compound. Alternatively, the organic layer is formed by stacking two or more layers composed of an organic compound. The organic layer may further contain an inorganic compound in addition to the organic compound.

In one embodiment, at least one layer of the organic layers is the emitting layer. The organic layer may be formed, for example, as one layer of the emitting layer, or may contain other layers which can be adopted in the layer configuration of the organic EL device. The layer which can be adopted in the layer configuration of the organic EL device is not particularly limited, but specific examples thereof include a hole-transporting zone provided between the anode and the emitting layer (a hole-transporting layer, a hole-injecting layer, an electron blocking layer, an exciton blocking layer, etc.), an emitting layer, a space layer, and an electron-transporting zone provided between the cathode and the emitting layer (an electrontransporting layer, an electron-injecting layer, a hole blocking layer, etc.).

The organic EL device according to an aspect of the invention may be, for example, a monochromatic emitting device of a fluorescent or phosphorescent type, or a white emitting device of a fluorescent/phosphorescent hybrid type. In addition, the organic EL device according to an aspect of the invention may be a simple type containing a single emitting unit or a tandem type containing two or more emitting units.

The "emitting unit" described in the present specification refers to the smallest unit which contains an organic layer, and at least one of the organic layers is an emitting layer, and emits light by recombination of injected holes and electrons.

The "emitting layer" described in the present specification is an organic layer having an emitting function. The emitting layer is, for example, a phosphorescent emitting layer, a fluorescent emitting layer, or the like, and may be a single layer or two or more layers.

The emitting unit may be of a layered type having two or more layers of a phosphorescent emitting layer and a fluorescent emitting layer, wherein, for example, a space layer may be provided between the emitting layers to prevent exciton generated in the phosphorescent emitting layer from diffusing into the fluorescent emitting layer.

The simple type organic EL device includes, for example, a device configuration such as anode/emitting unit/cathode.

Typical layer configurations of the emitting unit are shown below. The layers in parentheses are optional layers.

(a) (hole-injecting layer/) hole-transporting layer/fluorescent emitting layer (/electron-transporting layer/electron-injecting layer)

(b) (hole-injecting layer/) hole-transporting layer/phosphorescent emitting layer (/electron-transporting layer/electron-injecting layer)

(c) (hole-injecting layer/) hole-transporting layer/first fluorescent emitting layer/second fluorescent emitting layer (/electron-transporting layer/electron-injecting layer)

(d) (hole-injecting layer/) hole-transporting layer/first phosphorescent emitting layer/second phosphorescent emitting layer (/electron-transporting layer/electron-injecting layer)

(e) (hole-injecting layer/) hole-transporting layer/phosphorescent emitting layer/spacing layer/fluorescent emitting layer (/electron-transporting layer/electron-injecting layer)

(f) (hole-injecting layer/) hole-transporting layer/first phosphorescent emitting layer/second phosphorescent emitting layer/spacing layer/fluorescent emitting layer (/electron-transporting layer/electron-injecting layer)

(g) (hole-injecting layer/) hole-transporting layer/first phosphorescent layer/spacing layer/second phosphorescent emitting layer/spacing layer/fluorescent emitting layer (/electron-transporting layer/electron-injecting layer)

(h) (hole-injecting layer/) hole-transporting layer/phosphorescent emitting layer/spacing layer/first fluorescent emitting layer/second fluorescent emitting layer (/electron-transporting layer/electron-injecting layer)

(i) (hole-injecting layer/) hole-transporting layer/electron-blocking layer/fluorescent emitting layer (/electron-transporting layer/electron-injecting layer)

(j) (hole-injecting layer/) hole-transporting layer/electron-blocking layer/phosphorescent emitting layer (/electron-transporting layer/electron-injecting layer)

(k) (hole-injecting layer/) hole-transporting layer/exciton-blocking layer/fluorescent emitting layer (/electron-transporting layer/electron-injecting layer)

(l) (hole-injecting layer/) hole-transporting layer/exciton-blocking layer/phosphorescent emitting layer (/electron-transporting layer/electron-injecting layer)

(m) (hole-injecting layer) first hole-transporting layer/second hole-transporting layer/fluorescent emitting layer (/electron-transporting layer/electron-injecting layer)

(n) (hole-injecting layer) first hole-transporting layer/second hole-transporting layer/fluorescent emitting layer (/first electron-transporting layer/second electron-transporting layer/electron-injecting layer)

(o) (hole-injecting layer) first hole-transporting layer/second hole-transporting layer/phosphorescent emitting layer (/electron-transporting layer/electron-injecting layer)

(p) (hole-injecting layer) first hole-transporting layer/second hole-transporting layer/phosphorescent emitting layer (/first electron-transporting layer/second electron-transporting layer/electron-injecting layer)

(q) (hole-injecting layer,) hole-transporting layer/fluorescent emitting layer/hole-blocking layer (/electron-transporting layer/electron-injecting layer)

(r) (hole-injecting layer) hole-transporting layer/phosphorescent emitting layer/hole-blocking layer (/electron-transporting layer/electron-injecting layer)

(s) (hole-injecting layer,) hole-transporting layer/fluorescent emitting layer/exciton-blocking layer (/electron-transporting layer/electron-injecting layer)

(t) (hole-injecting layer,) hole-transporting layer/phosphorescent emitting layer/exciton-blocking layer (/electron-transporting layer/electron-injecting layer)

The layer configuration of the organic EL device according to an aspect of the invention is not limited thereto. For example, when the organic EL device has a hole-injecting layer and a hole-transporting layer, it is preferred that a hole-injecting layer be provided between the hole-transporting layer and the anode. Further, when the organic EL device has an electron-injecting layer and an electron-transporting layer, it is preferred that an electron-injecting layer be provided between the electron-transporting layer and the cathode. Further, each of the hole-injecting layer, the hole-transporting layer, the electron-transporting layer, and the electron-injecting layer may be composed of a single layer or two or more layers.

The two or more phosphorescence emitting layers, and a combination of the phosphorescence emitting layer and the fluorescent emitting layer may be emitting layers which emit mutually different colors. For example, the emitting unit (f) may contain hole-transporting layer/first phosphorescent layer (red light emission)/second phosphorescent emitting layer (green light emission)/spacing layer/fluorescent emitting layer (blue light emission)/electron-transporting layer.

An electron-blocking layer may be provided between each light emitting layer and the hole-transporting layer or the spacing layer. Further, a hole-blocking layer may be provided between each emitting layer and the electron-transporting layer. By providing the electron-blocking layer or the hole-blocking layer, it is possible to confine electrons or holes in the emitting layer, thereby to improve the recombination probability of carriers in the emitting layer, and to improve luminous efficiency.

As a representative device configuration of a tandem type organic EL device, for example, a device configuration such as anode/first emitting unit/intermediate layer/second emitting unit/cathode can be given.

The first emitting unit and the second emitting unit are independently selected from the above-mentioned emitting units, for example.

The intermediate layer is also generally referred to as an intermediate electrode, an intermediate conductive layer, a charge generating layer, an electron withdrawing layer, a connecting layer, a connector layer, or an intermediate insulating layer. The intermediate layer is a layer that supplies electrons to the first emitting unit and holes to the second emitting unit, and can be formed of known materials.

FIG. 1 shows a schematic view of one example of the layer configuration of the organic EL device. An organic EL device 1 has a substrate 2, an anode 3, a cathode 4, and an emitting unit (organic layer) 10 arranged between the anode 3 and the cathode 4. The emitting unit 10 has at least one emitting layer 5.

A hole-transporting zone 6 (hole-injecting layer, hole-transporting layer, etc.) may be formed between the emitting layer 5 and the anode 3, and an electron-transporting zone 7 (electron-injecting layer, electron-transporting layer, etc.) may be formed between the emitting layer 5 and the cathode 4. An electron-blocking layer (not shown) may be provided on the anode 3 side of the emitting layer 5, and a hole-blocking layer (not shown) may be provided on the cathode 4 side of the emitting layer 5. Due to such a configuration, electrons or holes are confined in the emitting layer 5, whereby efficiency of formation of excitons in the emitting layer 5 can be further enhanced.

Figure 2:
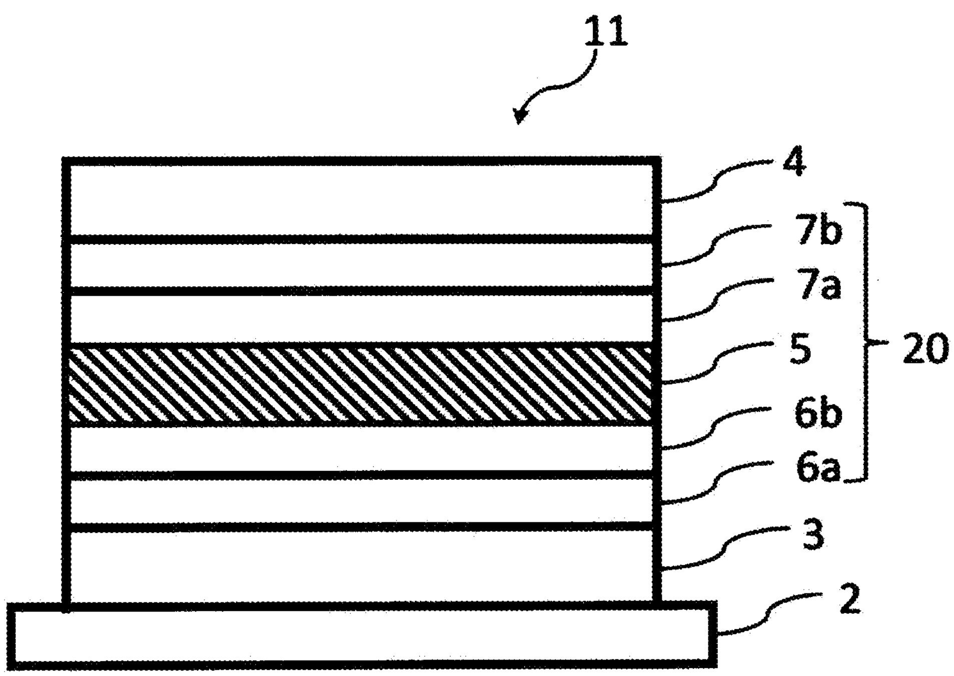
FIG. 2 is a diagram showing schematic configuration of another embodiment of an organic EL device of the invention.

FIG. 2 shows a schematic view of another example of the layer configuration of the organic EL device. In an organic EL device 11 shown in FIG. 2, in an emitting unit 20, the hole-transporting layer in the hole-transporting zone 6 and the electron-transporting layer in the electron-transporting zone 7 of the emitting unit 10 of the organic EL device 1 in FIG. 1 are respectively composed of two layers. The hole-transporting zone 6 has a first hole-transporting layer **6*a* on the anode side and a second hole-transporting layer 6*b* on the cathode side. The electron-transporting zone 7 has a first electron-transporting layer 7*a* on the anode side and a second hole-transporting layer 7*b* on the cathode side. As for the other numerical references, since they are the same as those in FIG. 1**, their explanations are omitted.

Hereinbelow, an explanation will be made on function, materials, etc. of each layer constituting the organic EL device described in the present specification.

(Substrate)

The substrate is used as a support of the organic EL device. The substrate preferably has a light transmittance of 50% or more in the visible light region with a wavelength of 400 to 700 nm, and a smooth substrate is preferable. Examples of the material of the substrate include soda-lime glass, aluminosilicate glass, quartz glass, plastic and the like.

As a substrate, a flexible substrate can be used. The flexible substrate means a substrate that can be bent (flexible), and examples thereof include a plastic substrate and the like. Specific examples of the material for forming the plastic substrate include polycarbonate, polyallylate, polyether sulfone, polypropylene, polyester, polyvinyl fluoride, polyvinyl chloride, polyimide, polyethylene naphthalate and the like. Also, an inorganic vapor deposited film can be used.

(Anode)

As the anode, for example, it is preferable to use a metal, an alloy, a conductive compound, a mixture thereof or the like having a high work function (specifically, 4.0 eV or more). Specific examples of the material of the anode include indium oxide-tin oxide (ITO: Indium Tin Oxide), indium oxide-tin oxide containing silicon or silicon oxide, indium oxide-zinc oxide, indium oxide containing tungsten oxide or zinc oxide, graphene and the like. In addition, it is also possible to use gold, silver, platinum, nickel, tungsten, chromium, molybdenum, iron, cobalt, copper, palladium, titanium, and nitrides of these metals (e.g. titanium nitride).

The anode is normally formed by depositing these materials on the substrate by a sputtering method. For example, indium oxide-zinc oxide can be formed by a sputtering method by using a target in which 1 to 10% by mass zinc oxide is added relative to indium oxide. Further, indium oxide containing tungsten oxide or zinc oxide can be formed by a sputtering method by using a target in which 0.5 to 5% by mass of tungsten oxide or 0.1 to 1% by mass of zinc oxide is added relative to indium oxide.

As the other methods for forming the anode, a vacuum deposition method, a coating method, an inkjet method, a spin coating method or the like can be given. When silver paste or the like is used, it is possible to use a coating method, an inkjet method or the like.

The hole-injecting layer formed in contact with the anode is formed by using a material that allows easy hole injection regardless of the work function of the anode. For this reason, it is possible to use for the anode a common electrode material, e.g. a metal, an alloy, a conductive compound and a mixture thereof. Specifically, a material having a small work function such as alkaline metals such as lithium and cesium; magnesium; alkaline earth metals such as calcium and strontium; alloys containing these metals (for example, magnesium-silver and aluminum-lithium); rare earth metals such as europium and ytterbium; and an alloy containing rare earth metals can also be used for the anode.

(Hole-Injecting Layer)

A hole-injecting layer is a layer that contains a substance having high hole-injection property and has a function of injecting holes from the anode to the organic layer. As the substance having high hole-injection property, molybdenum oxide, titanium oxide, vanadium oxide, rhenium oxide, ruthenium oxide, chromium oxide, zirconium oxide, hafnium oxide, tantalum oxide, silver oxide, tungsten oxide, manganese oxide, an aromatic amine compound, an electron-attracting (acceptor) compound or a polymeric compound (oligomer, dendrimer, polymer, etc.) and the like can be given. Among these, an aromatic amine compound and an acceptor compound are preferable, with an acceptor compound being more preferable.

As specific examples of an aromatic amine compound, 4,4',4"-tris(N,N-diphenylamino)triphenylamine (abbreviation: TDATA), 4,4',4"-tris[N-(3-methylphenyl)-N-phenylamino] triphenylamine (abbreviation: MTDATA), 4,4'-bis[N-(4-diphenylaminophenyl)-N-phenylamino] biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl) amino]-9-phenylcarbazole (abbreviation: PCzPCN1) and the like can be given.

As the acceptor compound, for example, a heterocyclic derivative having an electron attracting group, a quinone derivative having an electron attracting group, an aryl borane derivative, a heteroaryl borane derivative and the like are preferable. As specific examples, hexacyanohexaazatriphenylene, 2,3,5,6-tetrafluoro-7,7,8,8-tetracyanoquinodimethane (abbreviation: F4TCNQ), 1,2,3-tris[(cyano)(4-cyano-2,3,5,6-tetrafluorophenyl)methylene]cyclopropane and the like can be given.

When the acceptor compound is used, it is preferred that the hole-injecting layer further comprise a matrix material. As the matrix material, a material known as the material for an organic EL device can be used. For example, an electron-donating (donor) compound is preferable. More preferably, the above-mentioned aromatic amine compound can be used.

(Hole-Transporting Layer)

The hole-transporting layer is a layer that contains a high hole-transporting property, and has a function of transporting holes from the anode to the organic layer.

As the substance having a high hole-transporting property, a material having a hole mobility of $10^{-6}$ $cm^2/(V \cdot s)$ or more is preferable. For example, aromatic amine compounds, carbazole derivatives, anthracene derivatives, polymeric compounds, and the like can be given, for example.

Specific examples of the aromatic amine compound include 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4-phenyl-4'-(9-phenylfluoren-9-yl)triphenylamine (abbreviation: BAFLP), 4,4'-bis[N-(9,9-dimethylfluoren-2-yl)-N-phenylamino]biphenyl (abbreviation: DFLDPBi), 4,4', 4"-tris(N,N-diphenylamino)triphenylamine (abbreviation: TDATA), 4,4', 4"-tris[N-(3-methylphenyl)-N-phenylamino] triphenylamine (abbreviation: MTDATA), 4,4'-bis[N-(spiro-9,9'-bifluoren-2-yl)-N-phenylamino]biphenyl (abbreviation: BSPB) and the like.

Specific examples of the carbazole derivatives include 4,4'-di(9-carbazolyl)biphenyl (abbreviation: CBP), 9-[4-(9-carbazolyl)phenyl]-10-phenylanthracene (abbreviation: CzPA), 9-phenyl-3-[4-(10-phenyl-9-anthryl)phenyl]-9H-carbazole (abbreviation: PCzPA) and the like.

Specific examples of anthracene derivatives include 2-t-butyl-9,10-di(2-naphthyl)anthracene (t-BuDNA), 9,10-di(2-naphthyl)anthracene (DNA), 9,10-diphenylanthracene (DPAnth), and the like.

Specific examples of the polymeric compounds include poly(N-vinylcarbazole) (abbreviation: PVK), poly(4-vinyltriphenylamine) (abbreviation: PVTPA) and the like.

As long as it is a compound having a higher hole-transporting property as compared with electron-transporting property, such a compound other than those mentioned above can be used for the hole-transporting layer.

The hole-transporting layer may be a single layer or may be a stacked layer of two or more layers. In this case, it is preferred that a layer that contains a substance having a larger energy gap among substances having higher hole-transporting property be arranged on a side nearer to the emitting layer.

(Emitting Layer)

The emitting layer is a layer containing a substance having a high emitting property (dopant material). As the dopant material, various types of material can be used. For example, a fluorescent emitting compound (fluorescent dopant), a phosphorescent emitting compound (phosphorescent dopant) or the like can be used. A fluorescent emitting compound is a compound capable of emitting light from the singlet excited state, and an emitting layer containing a fluorescent emitting compound is called as a fluorescent emitting layer. Further, a phosphorescent emitting compound is a compound capable of emitting light from the triplet excited state, and an emitting layer containing a phosphorescent emitting compound is called as a phosphorescent emitting layer.

The emitting layer normally contains a dopant material and a host material that allows the dopant material to emit light efficiently. In some literatures, a dopant material is also called as a guest material, an emitter or an emitting material. In some literatures, a host material is called a matrix material.

A single emitting layer may contain two or more dopant materials and two or more host materials. Further, two or more emitting layers may be present.

In the present specification, a host material combined with the fluorescent dopant is referred to as a "fluorescent host" and a host material combined with the phosphorescent dopant is referred to as the "phosphorescent host." Note that the fluorescent host and the phosphorescent host are not classified only by the molecular structure. The phosphorescent host is a material for forming a phosphorescent emitting layer containing a phosphorescent dopant, but it does not mean that it cannot be used as a material for forming a fluorescent emitting layer. The same can be applied to the fluorescent host.

It is preferred that the emitting layer contain the compound represented by the formula (1) (hereinafter, the compound may be referred to as "the compound (1)"). More preferably, it contains the compound (1) as a dopant material. Further, it is preferred that the compound (1) be contained in the emitting layer as a fluorescent dopant.

The content of the compound (1) in the emitting layer as the dopant material is not particularly limited, but from the viewpoint of adequate luminescence and concentration quenching, it is preferable, for example, to be 0.1 to 70% by mass, more preferably 0.1 to 30% by mass, more preferably 1 to 30% by mass, still more preferably 1 to 20% by mass, and particularly preferably 1 to 10% by mass.

(Fluorescent Dopant)

As the fluorescent dopant other than the compound (1), a fused polycyclic aromatic derivative, a styrylamine derivative, a fused ring amine derivative, a boron-containing compound, a pyrrole derivative, an indole derivative, and a carbazole derivative can be given, for example. Among these, a fused ring amine derivative, a boron-containing compound, and a carbazole derivative are preferable.

As the fused ring amine derivative, a diaminopyrene derivative, a diaminochrysene derivative, a diaminoanthracene derivative, a diaminofluorene derivative, a diaminofluorene derivative with which one or more benzofuro skeletons are fused, and the like can be given.

As the boron-containing compound, a pyrromethene derivative, a triphenylborane derivative and the like can be given.

Examples of the blue fluorescent dopant include a pyrene derivatives, a styrylamine derivatives, a chrysene derivative, a fluoranthene derivative, a fluorene derivative, a diamine derivative, a triarylamine derivative, and the like. Specifically, N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(10-phenyl-9-anthryl)-4'-(9-phenyl-9H-carbazol-3-yl)triphenylamine (abbreviation: PCBAPA) and the like can be given.

As the green fluorescent dopant, an aromatic amine derivative and the like can be given, for example. Specifically, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracene-2-amine (abbreviation: 2YGABPhA), N,N,9-triphenylanthracene-9-amine (abbreviation: DPhAPhA) and the like can be given, for example.

As the red fluorescent dopant, a tetracene derivative, a diamine derivative and the like can be given. Specifically, N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD) and the like can be given.

(Phosphorescent Dopant)

As the phosphorescent dopant, a phosphorescent light-emitting heavy metal complex and a phosphorescent light-emitting rare earth metal complex can be given.

As the heavy metal complex, an iridium complex, an osmium complex, a platinum complex and the like can be given. As the heavy metal complex, an ortho-metalated complex of a metal selected from iridium, osmium and platinum.

Examples of rare earth metal complexes include terbium complexes, europium complexes and the like. Specifically, tris(acetylacetonate)(monophenanthroline)terbium(III) (abbreviation: $Tb(acac)_3(Phen)$), tris(1,3-diphenyl-1,3-propandionate)(monophenanthroline)europium(III) (abbreviation: $Eu(DBM)_3(Phen)$), tris[1-(2-thenoyl)-3,3,3-trifluoroacetonate](monophenanthroline)europium(III) (abbreviation: $Eu(TTA)_3(Phen)$) and the like can be given. These rare earth metal complexes are preferable as phosphorescent dopants since rare earth metal ions emit light due to electronic transition between different multiplicity.

As the blue phosphorescent dopant, an iridium complex, an osmium complex, a platinum complex, or the like can be given, for example. Specifically, bis[2-(4', 6'-difluorophenyl)pyridinato-N,C2']iridium(Ill) tetrakis(1-pyrazolyl)borate (abbreviation: Flr6), bis[2-(4', 6'-difluorophenyl)pyridinato-N,C2']iridium(III) picolinate (abbreviation: Flrpic), bis[2-(3', 5'-bistrifluoromethylphenyl)pyridinato-N,C2']iridium(III) picolinate (abbreviation: $Ir(CF3ppy)_2(pic)$), bis[2-(4', 6'-difluorophenyl)pyridinato-N,C2']iridium(III) acetylacetonate (abbreviation: Flracac) and the like can be given.

As the green phosphorescent dopant, an iridium complex or the like can be given, for example. Specifically, tris(2-phenylpyridinato-N,C2') iridium(III) (abbreviation: $Ir(ppy)_3$), bis(2-phenylpyridinato-N,C2')iridium(III) acetylacetonate (abbreviation: $Ir(ppy)_2(acac)$), bis(1,2-diphenyl-1H-benzimidazolato)iridium(III) acetylacetonate (abbreviation: $Ir(pbi)_2(acac)$), bis(benzo[h]quinolinato)iridium(III) acetylacetonate (abbreviation: $Ir(bzq)_2(acac)$) and the like can be given.

As the red phosphorescent dopant, an iridium complex, a platinum complex, a terbium complex, a europium complex and the like can be given. Specifically, bis[2-(2'-benzo[4,5-a]thienyl)pyridinato-N,C3']iridium(III) acetylacetonate (abbreviation: $Ir(btp)_2(acac)$), bis(1-phenylisoquinolinato-N, C2')iridium(III) acetylacetonate (abbreviation: $Ir(piq)_2(acac)$), (acetylacetonato)bis[2,3-bis(4-fluorophenyl) quinoxalinato]iridium(III) (abbreviation: $Ir(Fdpq)_2(acac)$), 2,3,7,8,12,13,17,18-octaethyl-21H,23H-porphyrin platinum (II) (abbreviation PtOEP) and the like can be given.

(Host Material)

As the host material, metal complexes such as an aluminum complex, a beryllium complex and a zinc complex; heterocyclic compounds such as an indole derivative, a pyridine derivative, a pyrimidine derivative, a triazine derivative, a quinoline derivative, an isoquinoline derivative, a quinazoline derivative, a dibenzofuran derivative, a dibenzothiophene derivative, an oxadiazole derivative, a benzimidazole derivative, and a phenanthroline derivative; fused aromatic compounds such as a naphthalene derivative, a triphenylene derivative, a carbazole derivative, an anthracene derivative, a phenanthrene derivative, a pyrene derivative, a chrysene derivative, a naphthacene derivative, and a fluoranthene derivative; and aromatic amine compound such as a triarylamine derivative and fused polycyclic aromatic amine derivatives can be given, for example. Two or more types of host materials can be used in combination.

As specific examples of the metal complexes, tris(8-quinolinolato)aluminum(III) (abbreviation: Alq), tris(4-methyl-8-quinolinolato)aluminum(III) (abbreviation: Almq3), bis(10-hydroxybenzo[h]quinolinato)beryllium(II) (abbreviation: BeBq2), bis(2-methyl-8-quinolinolato)(4-phenylphenolato)aluminum(III) (abbreviation: BAlq), bis (8-quinolinolato)zinc(II) (abbreviation: Znq), bis[2-(2-benzoxazolyl)phenolato]zinc(II) (abbreviation: ZnPBO), bis[2-(2-benzothiazolyl)phenolate]zinc(II) (abbreviation: ZnBTZ) and the like can be given.

As specific examples of the heterocyclic compounds, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2', 2"-(1,3,5-benzenetriyl)tris(1-phenyl-1H-benzoimidazole)(abbreviation: TPBI), bathophenanthroline (abbreviation: BPhen), bathocuproine (abbreviation: BCP) and the like can be given.

As specific examples of the fused aromatic compounds, 9-[4-(10-phenyl-9-anthryl)pheny]-9H-carbazole (abbreviation: CzPA), 3,6-diphenyl-9-[4-(10-phenyl-9-anthryl) pheny]-9H-carbazole (abbreviation: DPCzPA), 9,10-bis(3, 5-diphenylphenyl)anthracene (abbreviation: DPPA), 9,10-di (2-naphthyl)anthracene (abbreviation: DNA), 2-tert-butyl-9, 10-di(2-naphthyl)anthracene (abbreviation: t-BuDNA), 9,9'-bianthryl (abbreviation: BANT), 9,9'-(stilbene-3,3'-diyl) diphenanthrene (abbreviation: DPNS), 9,9'-(stilbene-4,4'-diyl)diphenanthrene (abbreviation: DPNS2), 3,3', 3"-(benzene-1,3,5-triyl)tripyrene (abbreviation: TPB3), 9,10-diphenylanthracene (abbreviation: DPAnth), 6,12-dimethoxy-5,11-diphenylcrysene and the like can be given.

As specific examples of the aromatic amine compounds, N,N-diphenyl-9-[4-(10-phenyl-9-anthryl)phenyl]-9H-carbazole-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazole-3-amine (abbreviation: PCAPA), N,9-diphenyl-N-{4-[4-(10-phenyl-9-anthryl)phenyl]phenyl}-9H-carbazole-3-amine (abbreviation: PCAPBA), N-(9,10-diphenyl-2-anthryl)-N,9-diphenyl-9H-carbazole-3-amine (abbreviation: 2PCAPA), 4,4'-bis[N-(1-naphthyl)-N-phenylamino]biphenyl (abbreviation: NPB or a-NPD), N,N'-bis(3-methylphenyl)-N,N'-diphenyl-[1,1'-biphenyl]-4,4'-diamine (abbreviation: TPD), 4,4'-bis[N-(9,9-dimethylfluoren-2-yl)-N-phenylamino]biphenyl (abbreviation: DFLDPBi), 4,4'-bis[N-(spiro-9,9'-bifluoren-2-yl)-N-phenylamino]biphenyl (abbreviation: BSPB) and the like can be given.

As the fluorescent host, a compound having a higher singlet energy level as compared with a fluorescent dopant is preferable. For example, a heterocyclic compound, a fused aromatic compound and the like can be given. As the fused aromatic compound, an anthracene derivative, a pyrene derivative, a chrysene derivative, a naphthacene derivative and the like are preferable.

As the phosphorescent host, a compound having a higher triplet energy level as compared with a phosphorescent dopant is preferable. For example, a metal complex, a heterocyclic compound, a fused aromatic compound and the like can be given. Among these, an indole derivative, a carbazole derivative, a pyridine derivative, a pyrimidine derivative, a triazine derivative, a quinoline derivative, an isoquinoline derivative, a quinazoline derivative, a dibenzofuran derivative, a dibenzothiophene derivative, a naphthalene derivative, a triphenylene derivative, a phenanthrene derivative, a fluoranthene derivative and the like can be given.

(Electron-Transporting Layer)

An electron-transporting layer is a layer that contains a substance having high electron-transporting property. As the substance having high electron-transporting property, a substance having an electron mobility of $10^{-6}$ $cm^2/Vs$ or more is preferable. For example, a metal complex, an aromatic heterocyclic compound, an aromatic hydrocarbon compound, a polymeric compound and the like can be given.

As the metal complex, an aluminum complex, a beryllium complex, a zinc complex or the like can be given. Specifically, tris(8-quinolinolato)aluminum(III) (abbreviation: Alq), tris(4-methyl-8-quinolinolato)aluminum (abbreviation: Almq3), bis(10-hydroxybenzo[h]quinolinolato)beryllium (abbreviation: BeBq2), bis(2-methyl-8-quinollinolato) (4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), bis [2-(2-benzothiazolyl)phenolato]zinc(II) (abbreviation: ZnBTZ) and the like can be given, for example.

As the aromatic heterocyclic compound, imidazole derivatives such as a benzimidazole derivative, an imidazopyridine derivative and a benzimidazophenanthridine derivative; azine derivatives such as a pyrimidine derivative and a triazine derivative; compounds having a nitrogen-containing six-membered ring structure such as a quinoline derivative, an isoquinoline derivative, and a phenanthroline derivative (including one having a phosphine oxide-based substituent on the heterocyclic ring) and the like can be given. Specifically, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), 4,4'-bis(5-methylbenzoxazol-2-yl)stilbene (abbreviation: BzOs) and the like can be given.

As the aromatic hydrocarbon compound, an anthracene derivative, afluoranthene derivative and the like can be given, for example.

As specific examples of the polymeric compounds, poly[(9,9-dihexylfluoren-2,7-diyl)-co-(pyridine-3,5-diyl)](abbreviation: PF-Py), poly[(9,9-dioctylfluoren-2,7-diyl)-co-(2,2'-bipyridine-6,6'-diyl)] (abbreviation: PF-BPy) and the like can be given.

As long as it is a compound having a higher electron-transporting property as compared with hole-transporting property, such a compound other than those mentioned above may be used in the electron-transporting layer.

The electron-transporting layer may be a single layer, or a stacked layer of two or more layers. In this case, it is preferable to arrange a layer that includes a substance having a larger energy gap, among substances having a high electron-transporting property, on the side nearer to the emitting layer. For example, as shown in FIG. 2, a configuration including the first electron-transporting layer 7*a* on the anode side and the second electron-transporting layer 7*b* on the cathode side may be employed.

The electron-transporting layer may contain a metal such as an alkali metal, magnesium, an alkaline earth metal, or an alloy containing two or more of these metals; a metal compound such as an alkali metal compound such as 8-quinolinolato lithium (abbreviation: Liq), or an alkaline earth metal compound. When a metal such as an alkali metal, magnesium, an alkaline earth metal, or an alloy containing two or more of these metals is contained in the electron-transporting layer, the content of the metal is not particularly limited, but is preferably from 0.1 to 50% by mass, more preferably from 0.1 to 20% by mass, and further preferably from 1 to 10% by mass.

When a metal compound such as an alkali metal compound or an alkaline earth metal compound is contained in the electron-transporting layer, the content of the metal compound is preferably 1 to 99% by mass, more preferably from 10 to 90% by mass. When the electron-transporting layer is composed of two or more layers, a layer on the emitting layer side can be formed only of these metal compounds.

(Electron-Injecting Layer)

The electron-injecting layer is a layer that contains a substance that has a high electron-injecting property, and has the function of efficiently injecting electrons from a cathode to an emitting layer. Examples of the substance that has a high electron-injecting property include an alkali metal, magnesium, an alkaline earth metal, and a compound thereof. Specific examples thereof include lithium, cesium, calcium, lithium fluoride, cesium fluoride, calcium fluoride, lithium oxide, and the like. In addition, an electron-transporting substance having electron-transporting property in which an alkali metal, magnesium, an alkaline earth metal, or a compound thereof is incorporated, for example, Alq incorporated with magnesium, and the like may also be used.

Alternatively, a composite material that includes an organic compound and a donor compound may also be used for the electron-injecting layer. Such a composite material is excellent in the electron-injecting property and the electron-transporting property since the organic compound receives electrons from the donor compound.

The organic compound is preferably a material excellent in transporting property of the received electrons, and specifically, for example, a metal complex, an aromatic heterocyclic compound, or the like, which is a substance that has a high electron-transporting property mentioned above, can be used.

Any material capable of donating its electron to the organic compound can be used as the donor compound. Examples thereof include an alkali metal, magnesium, an alkaline earth metal, a rare earth metal, and the like. Specific examples thereof include lithium, cesium, magnesium, calcium, erbium, ytterbium, and the like. Further, an alkali metal oxide and an alkaline earth metal oxide are preferred, and examples thereof include lithium oxide, calcium oxide, barium oxide, and the like. Lewis bases such as magnesium oxide can also be used. Alternatively, an organic compound such as tetrathiafulvalene (abbreviation: TTF) can be used.

(Cathode)

For the cathode, a metal, an alloy, an electrically conductive compound, a mixture thereof, and the like, each having a small work function (specifically, a work function of 3.8 eV or less) are preferably used. Specific examples of the material for a cathode include an alkali metal such as lithium and cesium; magnesium; an alkaline earth metal such as calcium, and strontium; an alloy containing these metals (for example, magnesium-silver, aluminum-lithium); a rare earth metal such as europium and ytterbium; an alloy containing a rare earth metal, and the like.

The cathode is usually formed by a vacuum vapor deposition or a sputtering method. Further, in the case of using a silver paste or the like, a coating method, an inkjet method, or the like can be employed.

Moreover, when the electron-injecting layer is provided, various electrically conductive materials such as aluminum, silver, ITO, graphene, indium oxide-tin oxide containing silicon or silicon oxide, selected independently from the work function, can be used to form a cathode. These electrically conductive materials are made into films using a sputtering method, an inkjet method, a spin coating method, or the like.

(Insulating Layer)

In the organic EL device, pixel defects based on leakage or a short circuit are easily generated since an electric field is applied to a thin film. In order to prevent this, an insulating thin layer may be inserted between a pair of electrodes.

Examples of materials used for the insulating layer include aluminum oxide, lithium fluoride, lithium oxide, cesium fluoride, cesium oxide, magnesium oxide, magnesium fluoride, calcium oxide, calcium fluoride, aluminum nitride, titanium oxide, silicon oxide, germanium oxide, silicon nitride, boron nitride, molybdenum oxide, ruthenium oxide, vanadium oxide, and the like. A mixture thereof may be used for the insulating layer, and a stacked body of two or more layers that contain these materials can be also used for the insulating layer.

(Spacing Layer)

When the fluorescent emitting layer and the phosphorescent emitting layer are stacked the spacing layer is a layer provided between the fluorescent emitting layer and the phosphorescent emitting layer in order to prevent diffusion of excitons generated in the phosphorescent emitting layer to the fluorescent emitting layer or in order to adjust the carrier balance. The spacing layer can be provided between two or more phosphorescent emitting layers.

Since the spacing layer is provided between two or more emitting layers, the material used for the spacing layer is preferably a material having both electron-transporting property and hole-transporting property. In order to prevent diffusion of the triplet energy in adjacent phosphorescent emitting layers, it is preferred that the spacing layer have a triplet energy of 2.6 eV or more.

As the material used for the spacing layer, the same materials as those used for the above-mentioned hole-transporting layer can be given.

(Electron-Blocking Layer, Hole-Blocking Layer, Exciton-Blocking Layer)

An electron-blocking layer, a hole-blocking layer, an exciton (triplet)-blocking layer, or the like may be provided in adjacent to the emitting layer.

The electron-blocking layer has a function of preventing leakage of electrons from the emitting layer to the hole-transporting layer. The hole-blocking layer has a function of preventing leakage of holes from the emitting layer to the electron-transporting layer. The exciton-blocking layer has a function of preventing diffusion of excitons generated in the emitting layer to the adjacent layers and confining the excitons within the emitting layer.

(Method for Forming a Layer)

The method for forming each layer of the organic EL device is not particularly limited unless otherwise specified. A known film-forming method such as a dry film-forming method, a wet film-forming method or the like can be used. Specific examples of the dry film-forming method include a vacuum deposition method, a sputtering method, a plasma method, an ion plating method, and the like. Specific examples of the wet film-forming method include various coating methods such as a spin coating method, a dipping method, a flow coating method, an inkjet method, and the like.

(Film Thickness)

The film thickness of each layer of the organic EL device of the invention is not particularly limited unless otherwise specified. If the film thickness is too small, defects such as pinholes are likely to occur to make it difficult to obtain an enough luminance. If the film thickness is too large, a high driving voltage is required to be applied, leading to a lowering in efficiency. In this respect, the film thickness is usually preferably 0.1 nm to 10 μm, more preferably 5 nm to 10 μm, and more preferably 10 nm to 0.2 μm.

[Electronic Appliance]

The electronic appliance according to an aspect of the invention includes the above-described organic EL device according to an aspect of the invention. Examples of the electronic appliance include display parts such as an organic EL panel module; display devices of television sets, mobile phones, smart phones, and personal computers, and the like; and emitting devices of alighting device and a vehicle lighting device.

EXAMPLES

Next, the invention will be explained in more detail in accordance with the following Synthesis Examples, Examples, and Comparative Examples, which should not be construed as limiting the scope of the invention.

Example 1

(Synthesis of Compound 1)

(1) Synthesis of Intermediate 1A

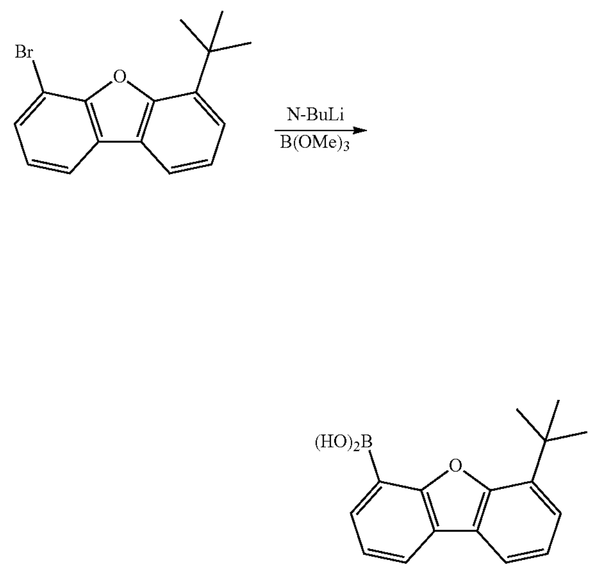

1A

Under an argon atmosphere, 4-bromo-6-tert-butyl-dibenzofuran (10 g, 33 mmol) was dissolved in tetrahydrofuran (THF) (200 mL) and 1.6 mol/L n-butyllithium (n-BuLi) hexane solution (25 mL) was added thereto at −78° C., and the mixture was stirred for 1 hour. Thereafter, trimethyl borate ($B(OMe)_3$) (5.5 mL) was added dropwise thereto and the mixture was stirred at room temperature for 1 hour. After adding 1 mol/L hydrochloric acid thereto and stirring the mixture for 2 hours, ethyl acetate was added thereto and the solution was separated to collect the organic phase. The collected organic phase was dried with magnesium sulfate and the residue obtained by concentration was purified by column chromatography to obtain a white solid (7.2 g, 92% yield). The obtained solid was Intermediate 1A, which was an intended product, and the results of mass spectrometric analysis were: m/e (ratio of mass to charge)=268 for a molecular weight of 268.

(2) Synthesis of Intermediate 1B

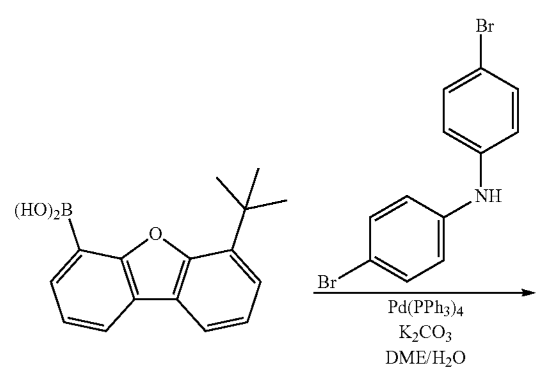

-continued

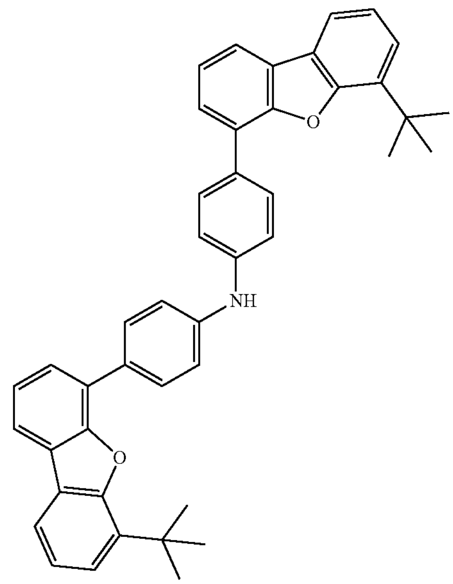

1B

Under an argon atmosphere, 1,2-dimethoxyethane (DME) (60 mL) and water (15 mL) were added to the obtained Intermediate 1A (6.2 g, 23 mmol), 4-bromo-N-(4-bromophenyl)aniline (3.0 g, 9.2 mmol), tetrakis(triphenylphosphine)palladium ($Pd(PPha)_4$) (532 mg, 0.46 mmol), and potassium carbonate (3.9 g, 28 mmol), and the mixture was refluxed for 8 hours. After completion of the reaction, the organic phase was collected by extracting with ethyl acetate. The obtained organic phase was dried with sodium sulfate. The solid was removed by filtration, the filtrate was concentrated, and the resulting residue was purified by silica gel column chromatography to obtain a white solid (4.0 g, 71% yield). The obtained solid was Intermediate 1B, which was an intended product, and the results of mass spectrometric analysis were: m/e=613 for a molecular weight of 613.

(3) Synthesis of Intermediate 1C

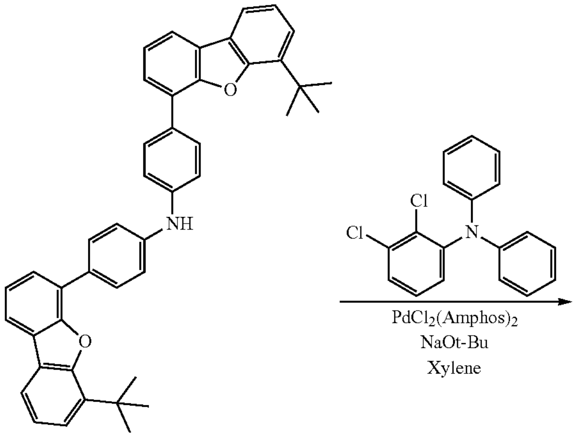

-continued

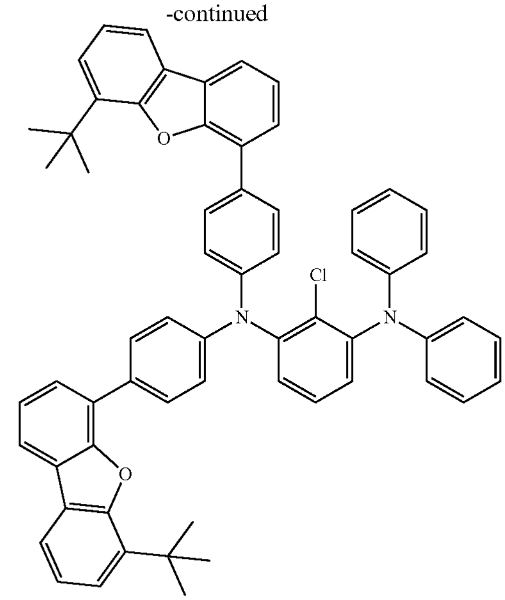

1C

Under an argon atmosphere, xylene (20 mL) was added to the obtained Intermediate 1B (4.0 g, 6.5 mmol), 2,3-dichloro-N,N-diphenylaniline (2.0 g, 6.4 mmol), bis[di-tert-butyl(4-dimethylaminophenyl)phosphine]dichloropalladium(II) ($PdCl_2(AmPhos)_2$) (227 mg, 0.32 mmol), and sodium t-butoxide (NaOt-Bu) (738 mg, 7.7 mmol), and the mixture was refluxed for 5 hours. After completion of the reaction, the organic phase was collected by extracting with ethyl acetate. The obtained organic phase was dried with sodium sulfate. The solid was removed by filtration, the filtrate was concentrated, and the resulting residue was purified by silica gel column chromatography to obtain a white solid (4.6 g, 81% yield). The obtained solid was Intermediate 1C, which was an intended product, and the results of mass spectrometric analysis were: m/e=891 for a molecular weight of 891.

(4) Synthesis of Compound 1

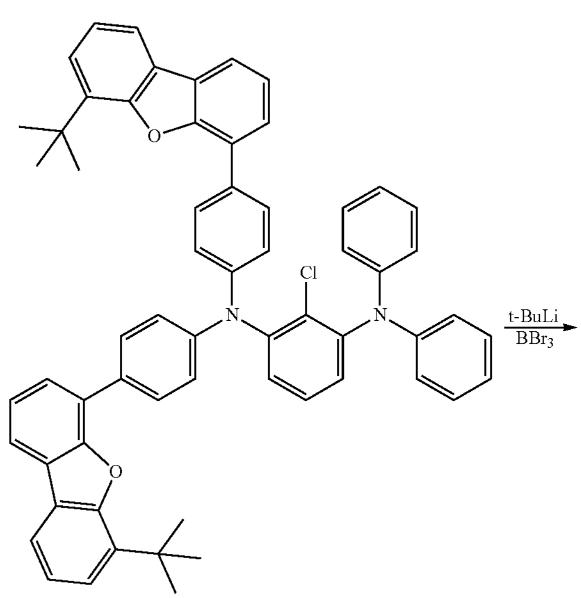

-continued

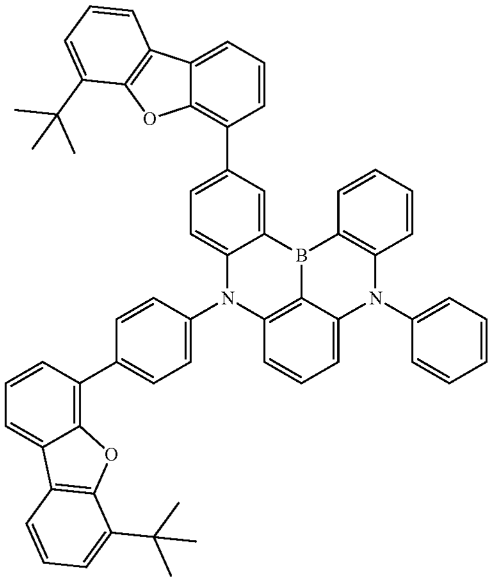

1

-continued

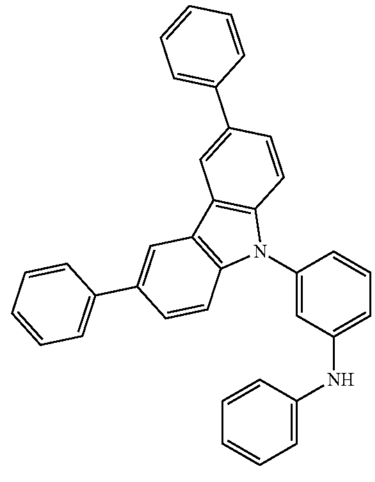

2A

Under an argon atmosphere, the obtained Intermediate 1C (4.0 g, 4.5 mmol) was dissolved in t-butylbenzene (30 mL), the solution was cooled to −40° C., and 1.9 mol/L t-butyllithium (t-BuLi) pentane solution (4.8 mL) was added dropwise thereto. After stirring at −40° C. for 30 minutes, the temperature of the solution was raised to 60° C. and stirred for 3 hours. Thereafter, the solution was cooled to 40° C. again, and boron tribromide (1.2 g) was added dropwise thereto. The mixture was stirred at room temperature for 1 hour, N,N-diisopropylethylamine (2 mL) was added thereto, and heated and stirred at 120° C. for 1 hour. After completion of the reaction, an aqueous solution of sodium acetate was added thereto, and the reaction mixture was extracted with toluene to collect the organic phase. The obtained organic phase was concentrated and the residue was purified by silica gel column chromatography to obtain a yellow solid (427 mg, 11% yield). The obtained solid was Compound 1, which was an intended product, and the results of mass spectrometric analysis were: m/e=864 for a molecular weight of 864.

Example 2

(Synthesis of Compound 2)

(1) Synthesis of Intermediate 2A

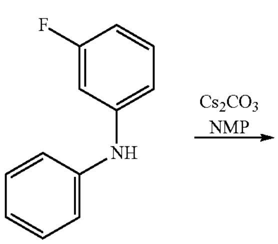

Under an argon atmosphere, N-methyl-2-pyrrolidone (NMP) (200 mL) was added to 3-fluoro-N-phenylaniline (15 g, 80 mmol), 3,6-diphenylcarbazole (25.5 g, 80 mmol), and cesium carbonate (32.5 g, 100 mmol), and the mixture was refluxed for 2 days. After completion of the reaction, the organic phase was collected by extracting with ethyl acetate. The obtained organic phase was dried with sodium sulfate. The solid was removed by filtration, the filtrate was concentrated, and the resulting residue was purified by silica gel column chromatography to obtain a white solid (32 g, 83%,yield). The obtained solid was Intermediate 2A, which was an intended product, and the results of mass spectrometric analysis were: m/e=486 fora molecular weight of 486.

(2) Synthesis of Intermediate 2B

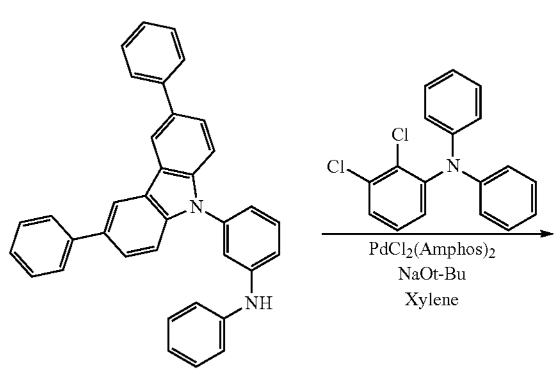

-continued

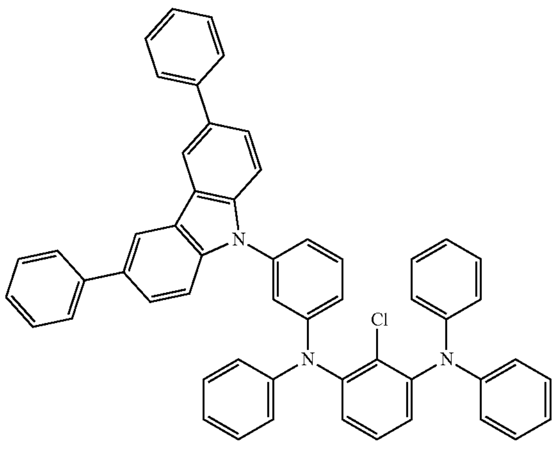

2B

Under an argon atmosphere, xylene (200 mL) was added to the obtained Intermediate 2A (20 g, 41 mmol), 2,3-dichloro-N,N-diphenyanilline (12.6 g, 40 mmol), $PdCl_2(AmPhos)_2$ (1.4 g, 2.0 mmol), and NaOt-Bu (5.8 g, 60 mmol), and the mixture was refluxed for 5 hours. After completion of the reaction, the organic phase was collected by extracting with ethyl acetate. The obtained organic phase was dried with sodium sulfate. The solid was removed by filtration, the filtrate was concentrated, and the resulting residue was purified by silica gel column chromatography to obtain a white solid (23 g, 75% yield). The obtained solid was Intermediate 2B, which was an intended product, and the results of mass spectrometric analysis were: m/e=764 for a molecular weight of 764.

(3) Synthesis of Compound 2

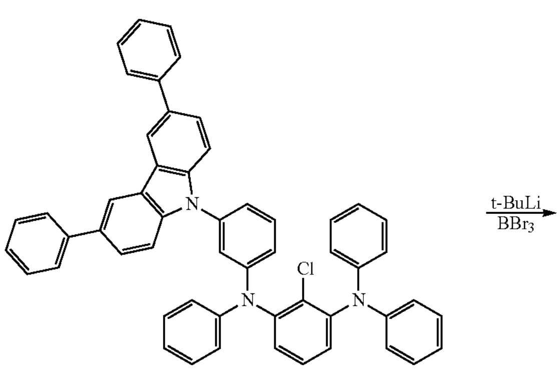

-continued

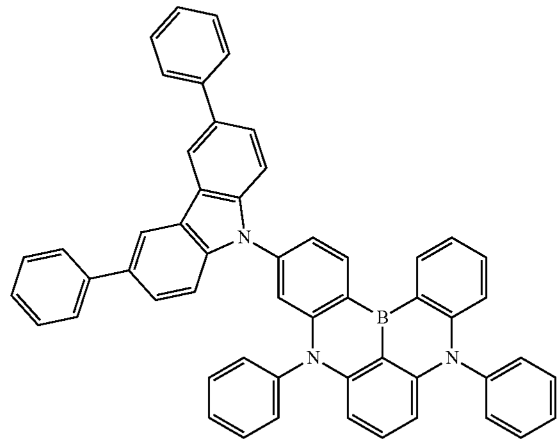

2

Under an argon atmosphere, the obtained Intermediate 2B (10g, 13 mmol) was dissolved in t-butylbenzene (100 mL), the solution was cooled to −40° C., and 1.99 mol/L t-BuLi pentane solution (13.7 mL) was added dropwise thereto. After stirring at −40° C. for 30 minutes, the temperature of the solution was raised to 60° C. and stirred for 3 hours. Thereafter, the solution was cooled to −40C again, and boron tribromide (3.4 g) was added dropwise thereto. The mixture was stirred at room temperature for 1 hour, N,N-diisopropylethylamine (5 mL) was added thereto, and the mixture was heated and stirred at 120° C. for 1 hour. After completion of the reaction, an aqueous solution of sodium acetate was added thereto, and the reaction mixture was extracted with toluene to collect the organic phase. The obtained organic phase was concentrated and the residue was purified by silica gel column chromatography to obtain a yellow solid (2.5 g, 26% yield). The obtained solid was a Compound 2, which was an intended product, and the results of mass spectrometric analysis were: m/e=737 for a molecular weight of 737.

Example 3

(Synthesis of Compound 3)

(1) Synthesis of Intermediate 3A

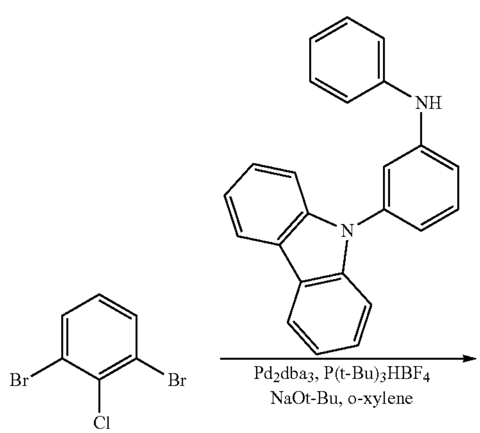

-continued

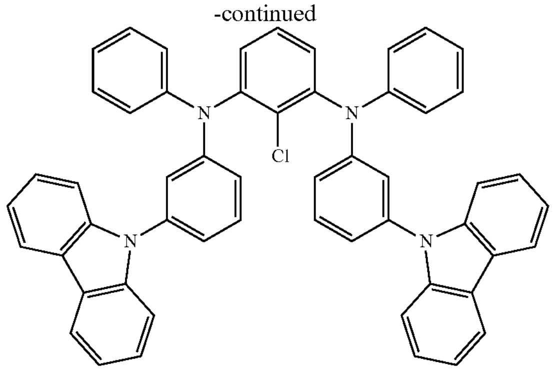

3A

Under an argon atmosphere, 1,3-dibromo-2-chlorobenzene (2.00 g, 7.40 mmol), 3-(9H-carbazol-9-yl)-N-phenylaniline (5.15 g, 15.4 mmol), sodium t-butoxide (5.69 g, 15.4 mmol), tris(dibenzylideneacetone)dipalladium ($Pd_2dba_3$) (135 mg, 0.148 mmol), ti-t-butylphosphonium tetrafluoroborate ($P(t\text{-}Bu)_3HBF_4$) (172 mg, 0.592 mmol) were suspended in o-xylene (40 mL), and the mixture was stirred at 100° C. for 4 hours. After completion of the reaction, methanol was added, and the precipitated solid was collected by filtration. The solid was washed with water and methanol to obtain Intermediate 3A (5.11 g, 84% yield), which was an intended product. The results of mass spectrometric analysis were: m/e=778 for a molecular weight of 777.

(2) Synthesis of Compound 3

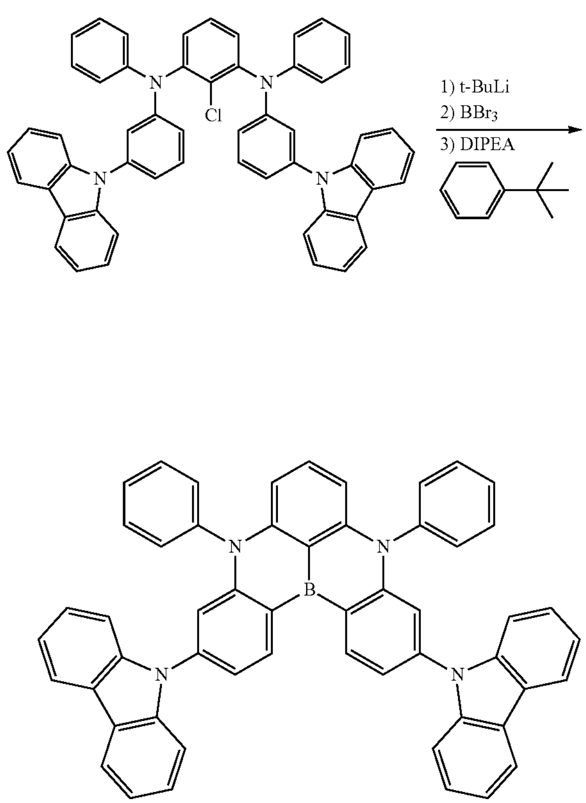

3

Under an argon atmosphere, Intermediate 3A (5.00 g, 6.43 mmol) was dissolved in t-butylbenzene (60 mL), and 1.7 mol/L of t-butyllithium pentane solution (7.57 mL, 12.9 mmol) was added thereto at 0° C. Thereafter, the temperature of the solution was raised to 60° C. and pentane was removed from the solution while stirring for 3 hours. The solution was cooled to −50° C., boron tribromide (3.22 g, 12.9 mmol) was added thereto, followed by stirring at 25° C. for 30 minutes, and N,N-diisopropylethylamine (DIPEA) (1.65 g, 12.9 mmol) was added thereto at 0° C. The solution was stirred at 120° C. for 3 hours. After completion of the reaction, the reaction solution was poured into a 15% aqueous solution of sodium acetate and extracted with ethyl acetate. The organic phase was dried with magnesium sulfate and the solvents were removed. The residue was purified by column chromatography to obtain Compound 3 (740 mg, 15% yield), which was an intended product. The results of mass spectrometric analysis were: m/e=751 for a molecular weight of 750.

Example 4

(Synthesis of Compound 4)

(1) Synthesis of Intermediate 4A

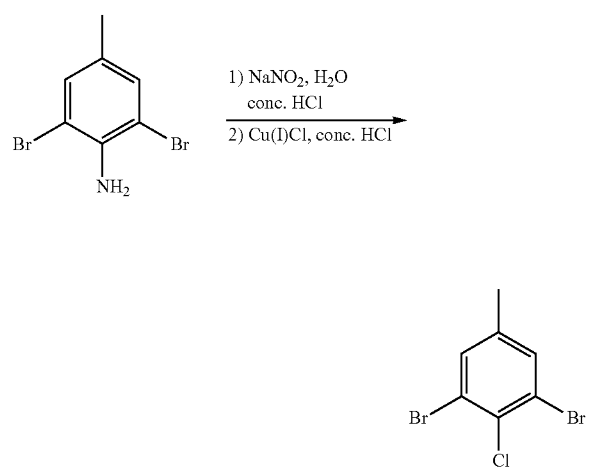

4A

Under an argon atmosphere, 2,6-dibromo-4-methylaniline (40.0 g, 151 mmol) was suspended in concentrated hydrochloric acid (conc. HCl) (370 mL). The suspension was cooled to 0° C., sodium nitrite (12.5 g, 181 mmol) dissolved in water (68 mL) was added thereto, and copper(I) chloride (22.4 g, 226 mmol) dissolved in 120 mL of concentrated hydrochloric acid was added dropwise thereto. After completion of the dropwise addition, the temperature of the suspension was raised to room temperature, and the suspension was stirred for 90 minutes, and 600 mL of water was added thereto. The suspension was filtered, and the obtained solid was washed with water and 10% aqueous ammonia solution, and then extracted with heptane. The solvent of the suspension was concentrated by short-pass silica gel column chromatography. The obtained residue was recrystallized by ethanol to obtain Intermediate 4A (28.5 g, 66% yield), which was an intended product. The results of mass spectrometric analysis were: m/e=285 for a molecular weight of 284.

(2) Synthesis of Intermediate 4B

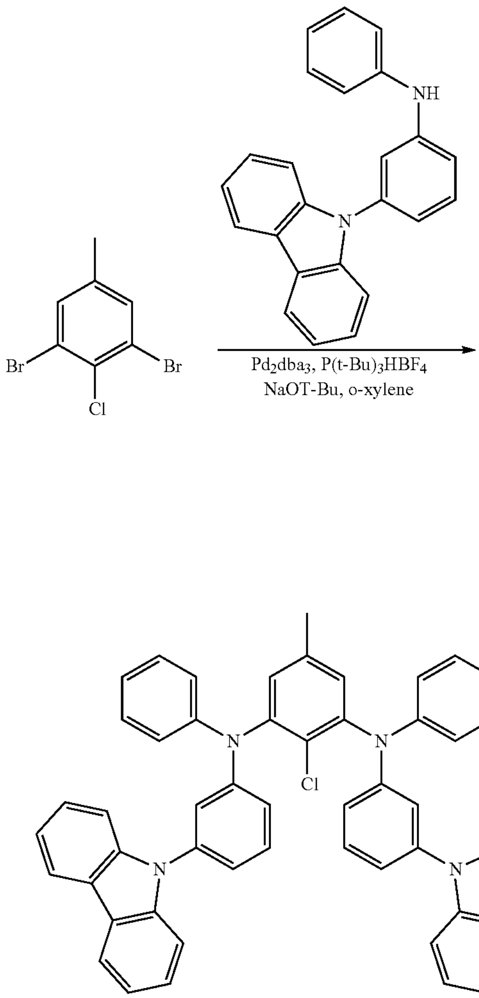

4B

Except for the use of Intermediate 4A (12.1 g, 36.0 mmol) in place of 1,3-dibromo-2-chlorobenzene, Intermediate 4B (4.1 g, 29% yield), which was an intended product, was synthesized in the same manner as the synthesis of Intermediate 3A. The results of mass spectrometric analysis were: m/e=792 for a molecular weight of 791.

(3) Synthesis of Compound 4

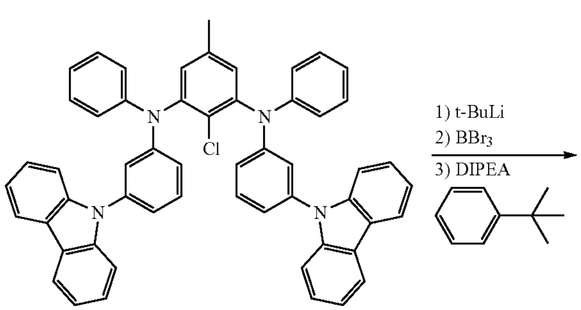

-continued

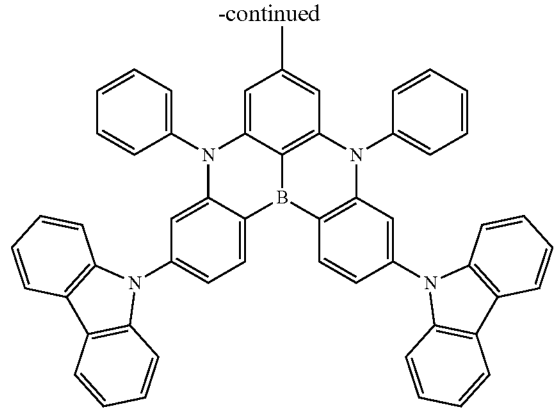

4

Except for the use of Intermediate 4B (4.00 g, 5.05 mmol) in place of Intermediate 3A, Compound 4 (0.31 g, 8% yield), which was an intended product, was synthesized in the same manner as Compound 3. The results of mass spectrometric analysis were: m/e=765 for a molecular weight of 764.

Example 5

(Synthesis of Compound 5)

(1) Synthesis of Intermediate 5A

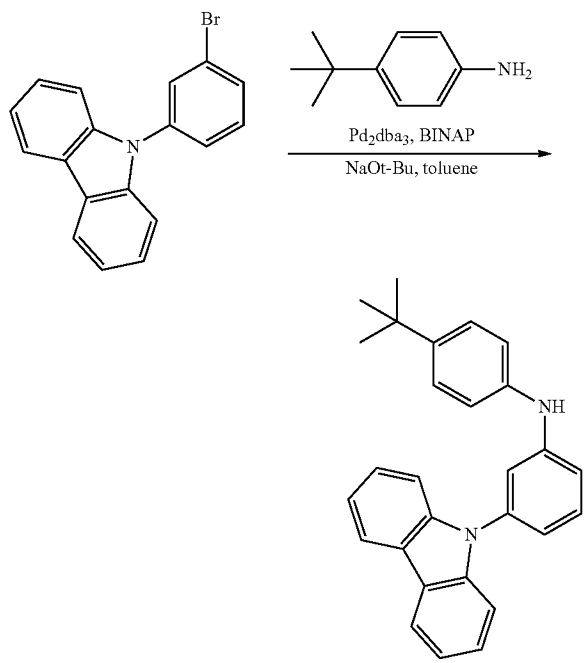

5A

Under an argon atmosphere, 9-(3-bromophenyl)-9H-carbazole (50.0 g, 155 mmol), 4-t-butylaniline (25.5 g, 171 mmol), sodium t-butoxide (44.7 g, 466 mmol), tris(dibenzylideneacetone)dipalladium (2.84 g, 3.10 mmol), 2,2'-bis (diphenylphosphino)-1,1'-binaphthyl (BINAP) (3.87 g, 6.21 mmol) were suspended in toluene (300 mL) and the suspension was stirred at 100° C. for 1 hour. After completion of the reaction, the solvent of the suspension was concentrated by short-pass silica gel column chromatography. The obtained residue was recrystallized by ethanol to obtain Intermediate 5A (36.8 g, 61% yield), which was an intended product. The results of mass spectrometric analysis were: m/e=391 for a molecular weight of 390.

(2) Synthesis of Intermediate 5B

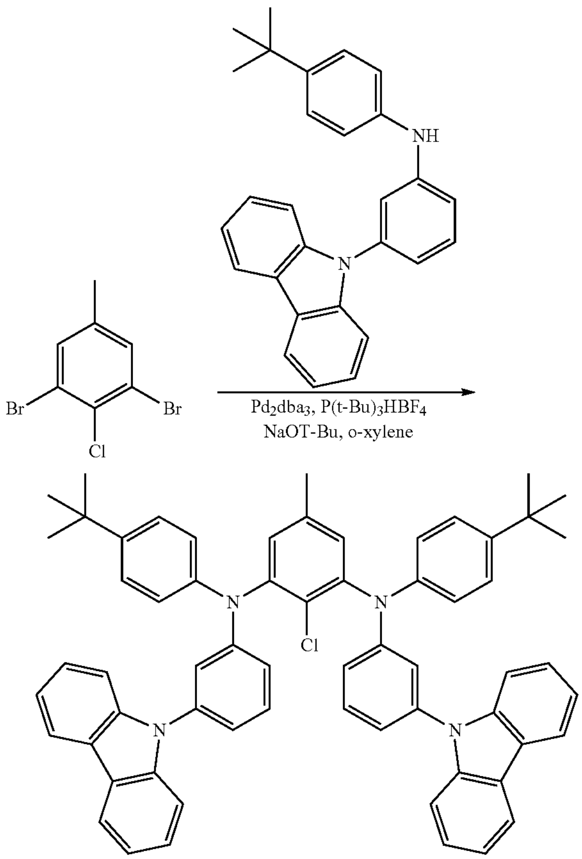

5B

Except for the use of Intermediate 5A (28.2 g, 72.1 mmol) in place of 3-(9H-carbazole-9-yl)-N-phenylaniline, Intermediate 5B (15.1 g, 43% yield), which was an intended product, was synthesized in the same manner as in the synthesis of Intermediate 4B. The results of mass spectrometric analysis were: m/e=904 for a molecular weight of 903.

(3) Synthesis of Compound 5

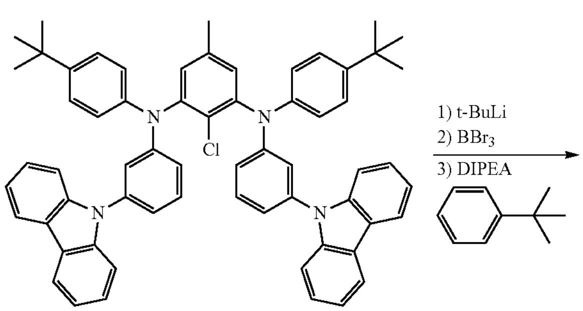

-continued

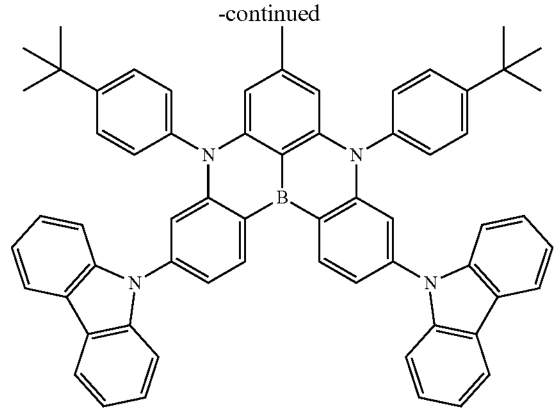

5

Except for the use of Intermediate 5B (6.00 g, 6.64 mmol) in place of Intermediate 4B, Compound 5 (0.64 g, 11% yield), which was an intended product, was synthesized in the same manner as in the synthesis of Compound 4. The results of mass spectrometric analysis were: m/e=878 for a molecular weight of 877.

Example 6

(Synthesis of Compound 6)

(1) Synthesis of Intermediate 6A

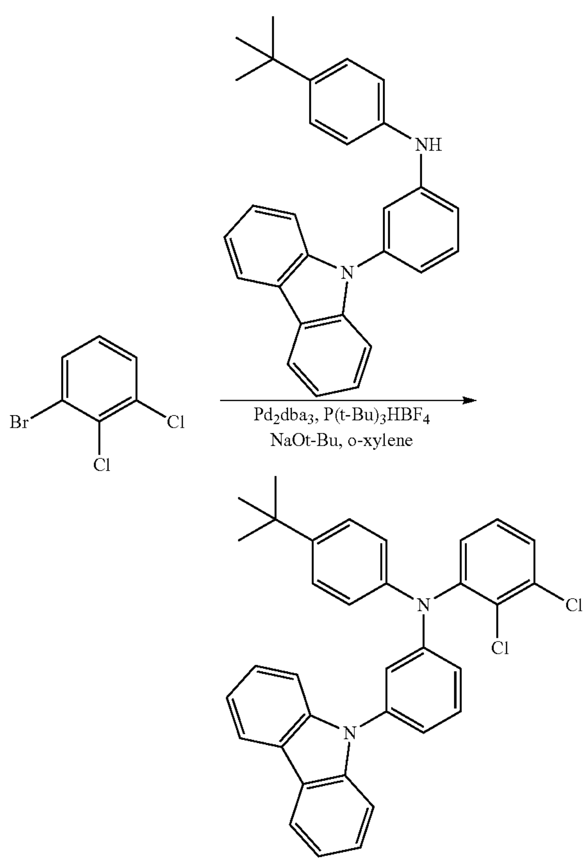

6A

Under an argon atmosphere, 1-bromo-2,3-dichlorobenzene (8.68 g, 38.4 mmol), Intermediate 5A (10.0 g, 72.1 mmol), sodium t-butoxide (6.15 g, 64.0 mmol), tris(dibenzylideneacetone)dipalladium (234 mg, 0.260 mmol), tri-t-butylphosphonium tetrafluoroborate (297 mg, 1.02 mmol) were suspended in o-xylene (100 mL) and the suspension was stirred at 100° C. for 2 hours. After completion of the reaction, water was added thereto, and the suspension was extracted with toluene. The organic phase was concentrated, and the obtained residue was purified by column chromatography to obtain Intermediate 6A (9.6 g, 71% yield), which was an intended product. The results of mass spectrometric analysis were: m/e=536 for a molecular weight of 535.

(2) Synthesis of Intermediate 6B

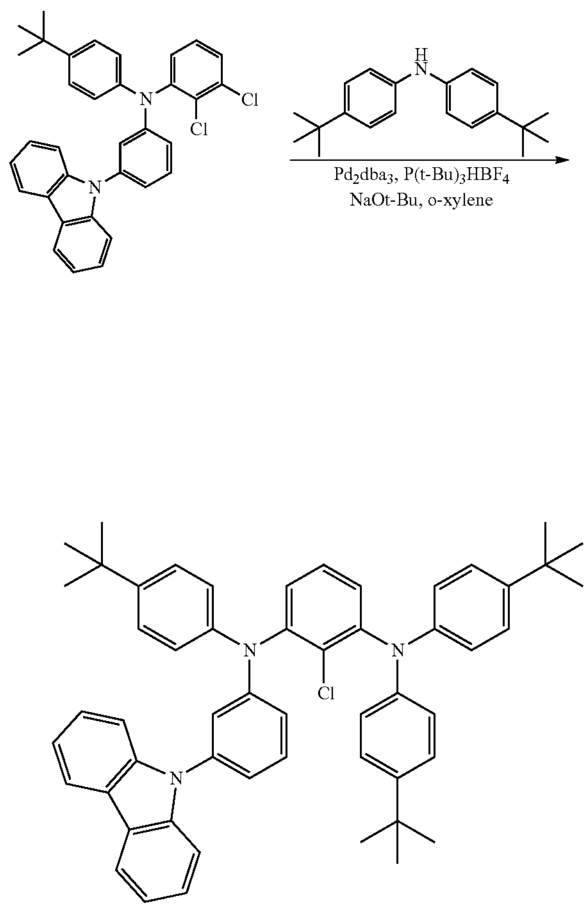

6B

Under an argon atmosphere, Intermediate 6A (9.60 g, 17.9 mmol), bis(4-t-butylphenyl)amine (5.30 g, 18.8 mmol), sodium t-butoxide (4.31 g, 44.8 mmol), tris(dibenzylideneacetone)dipalladium (328 mg, 0.360 mmol), tri-t-butylphosphonium tetrafluoroborate (416 mg, 1.43 mmol) were suspended in o-xylene (80 mL) and the suspension was stirred at 120° C. for 3 hours. After completion of the reaction, water was added thereto, and the suspension was extracted with toluene. The organic phase was concentrated and the resulting residue was purified by column chromatography to obtain Intermediate 6B (5.94 g, 43% yield), which was an intended product. The results of mass spectrometric analysis were: m/e=781 for a molecular weight of 780.

(Synthesis of Compound 6)

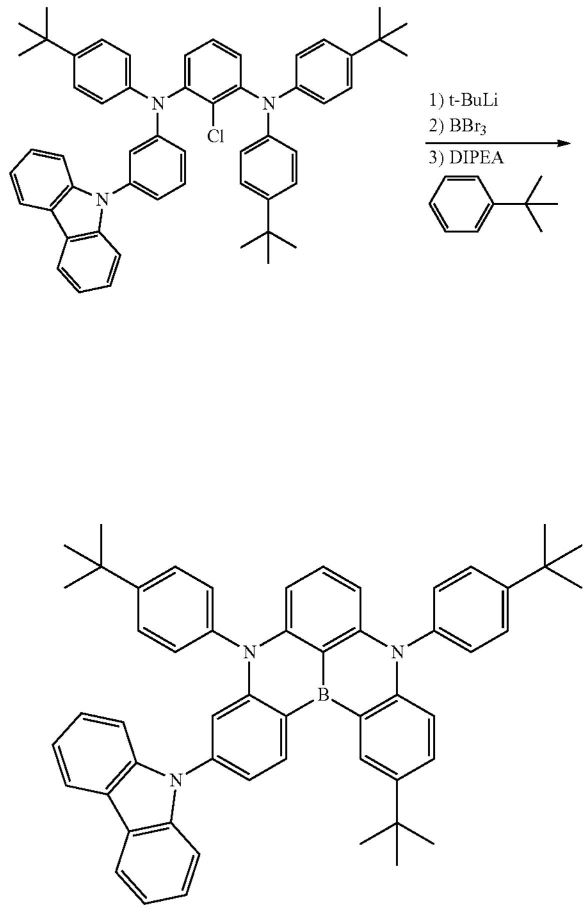

6

Except for the use of Intermediate 6B (5.80 g, 7.43 mmol) in place of Intermediate 3A, Compound 6 (1.66 g, 29% yield), which was an intended product, was synthesized in the same manner as in the synthesis of Compound 3. The results of mass spectrometric analysis were: m/e=755 for a molecular weight of 754.

Example 7

(Synthesis of Compound 7)

(1) Synthesis of Intermediate 7A

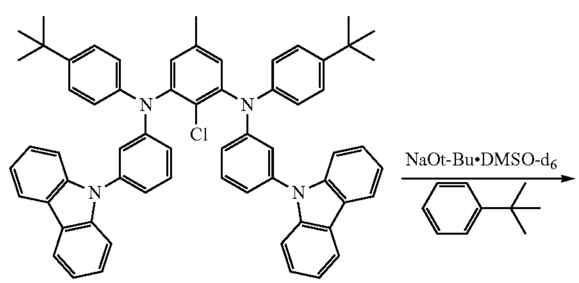

-continued

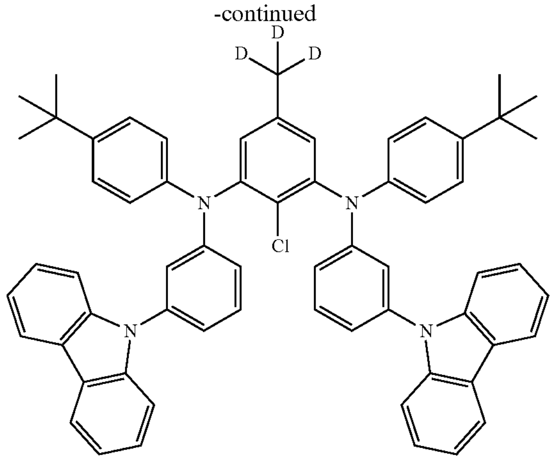

7A

Under an argon atmosphere, Intermediate 5B (8.80 g, 9.74 mmol), sodium t-butoxide (468 mg, 4.87 mmol), dimethyl sulfoxide-$d_6$(DMSO-$d_6$) (24.6 g, 292 mmol) were suspended in 4-t-butylbenzene (30 mL) and the suspension was stirred at 130° C. for 6 hours. After completion of the reaction, the suspension was cooled to room temperature and ethanol was added thereto, and the solid was collected by filtration. The solid was washed with ethanol and dichloromethane, and was purified by column chromatography to obtain Compound 7A (4.98 g, 63% yield), which was an intended product. The results of mass spectrometric analysis were: m/e=906 for a molecular weight of 905.

(2) Synthesis of Compound 7

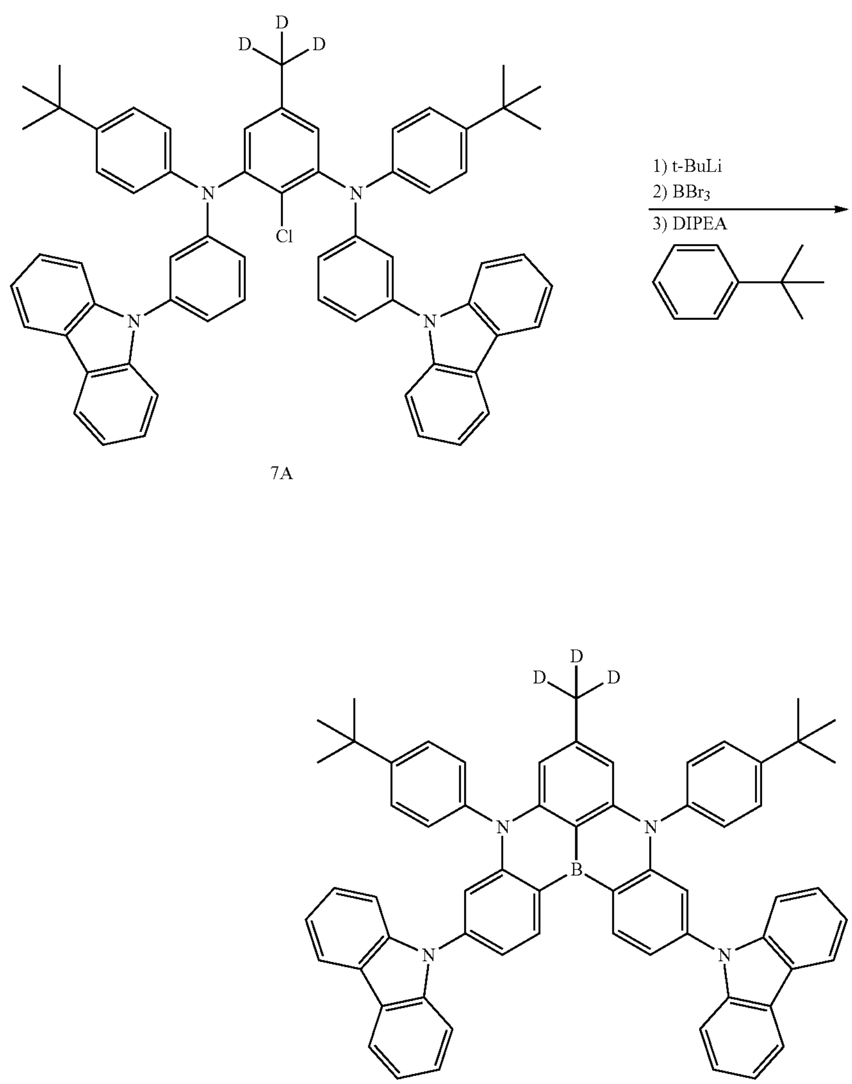

7A

7

Except for the use of Intermediate 7A (4.80 g, 5.29 mmol) in place of Intermediate 5B, Compound 7 (325 mg, 7% yield), which was an intended product, was synthesized in the same manner as in the synthesis of Compound 5. The results of mass spectrometric analysis were: m/e=881 for a molecular weight of 880.

The compounds within the scope of the invention can be synthesized by using known alternative reactions or raw materials adopted for the target compound in accordance with the above reaction.

Example 11

(Fabrication of Organic EL Device)

A25 mm×75 mm×1.1 mm-thick glass substrate with an ITO transparent electrode (anode) (manufactured by GEOMATEC Co., Ltd.) was subjected to ultrasonic cleaning in isopropyl alcohol for 5 minutes, and then subjected to UV-ozone cleaning for 30 minutes. The thickness of ITO was adjusted to 130 nm.

The glass substrate after being cleaned was mounted onto a substrate holder in a vacuum vapor deposition apparatus. Compound HI was deposited on a surface on the side on which the transparent electrode was formed so as to cover the transparent electrode to form a Compound HI film having a thickness of 5 nm. This HI film functions as a hole-injecting layer.

Following the formation of the HI film, Compound HT1 was deposited to form an 80 nm-thickness HT1 film on the HI film. The HT1 film functions as a first hole-transporting layer.

After formation of the HT1 film, Compound HT2 was deposited to form a HT2 film having a thickness of 10 nm on the HT1 film. The HT2 film functions as a second hole-transporting layer.

BH-1 (host material) and Compound 1 obtained in Example 1 (dopant material) were co-deposited on the HT2 film to be 4% in a proportion (mass ratio) of the Compound 1 to form an emitting layer having a thickness of 25 nm.

HBL was deposited on the emitting layer to form an electron-transporting layer having a thickness of 10 nm. ET as an electron-injecting material was deposited on the electron-transporting layer to form an electron-injecting layer having a thickness of 15 nm. LiF was deposited on the electron-injecting layer to form a LiF film having a thickness of 1 nm. Metal Al was deposited on the LiF film to form a metal cathode having a thickness of 80 nm.

As described above, an organic EL device was fabricated. The compounds used are shown below.

HI

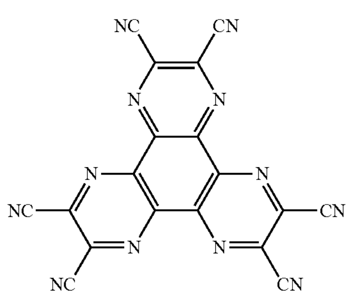

-continued

HT 1

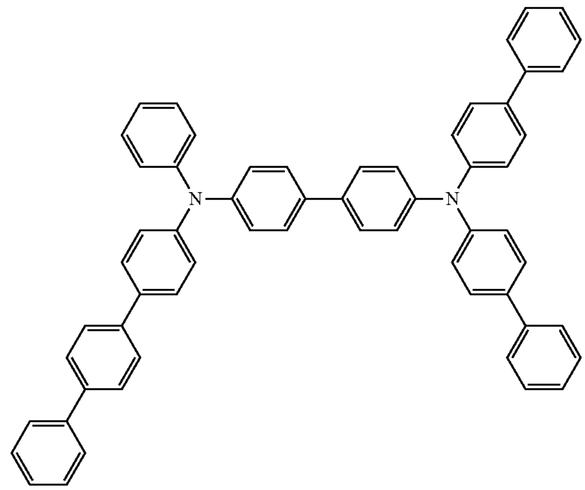

HT 2

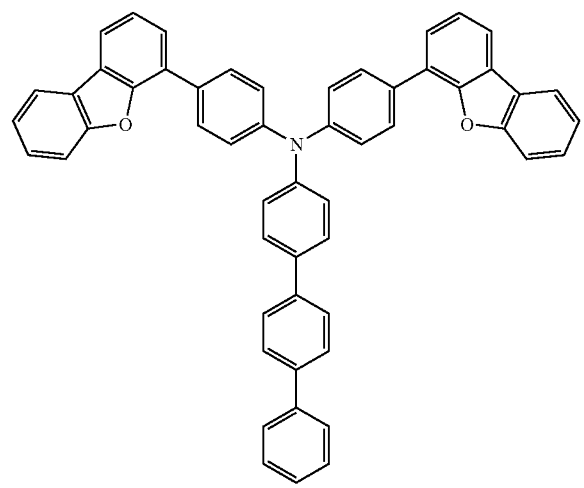

BH-1

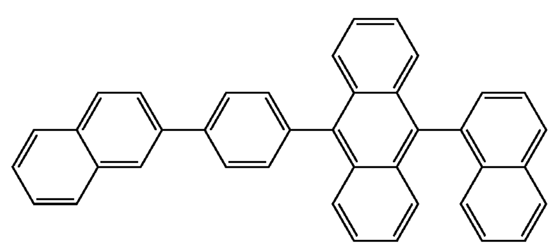

-continued

HBL

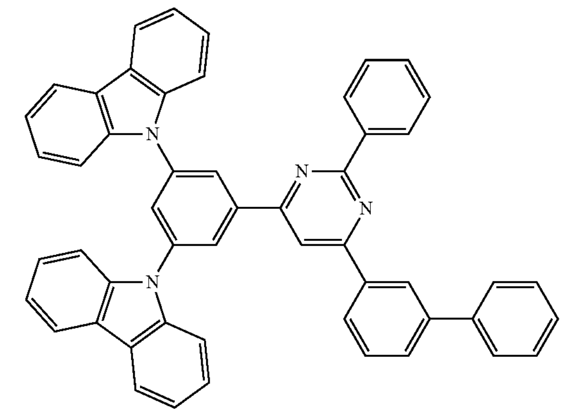

ET

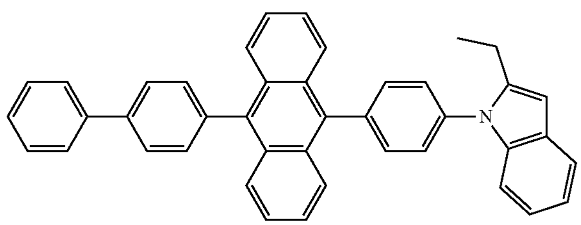

Compound 1

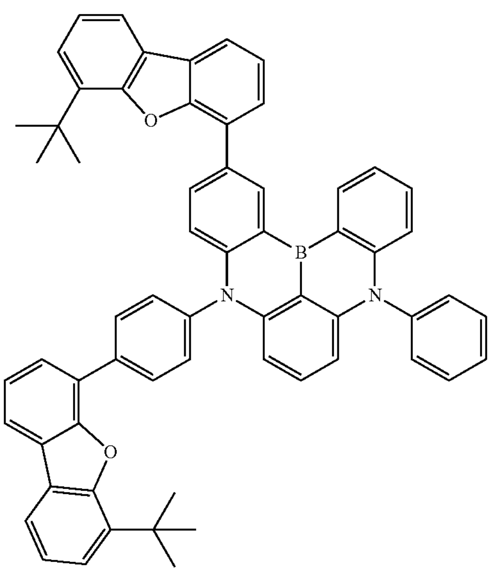

(Evaluation of Organic EL Device)

Voltage was applied to the organic EL device to be 10 mA/cm$^2$ in current density, thereby measuring an EL emission spectrum of the obtained organic EL device by using Spectroradiometer CS-1000 (manufactured by Konica Minolta, Inc.). External quantum efficiency (EQE) (%) was calculated from the obtained spectral radiance spectrum. The results are shown in Table 1.

Example 12 and Comparative Example 1

The organic EL devices were fabricated and evaluated in the same manner as in Example 11 except that the compounds shown in the following Table 1 were used as dopant materials. The results are shown in Table 1.

The compounds used is shown below.

Compound 2

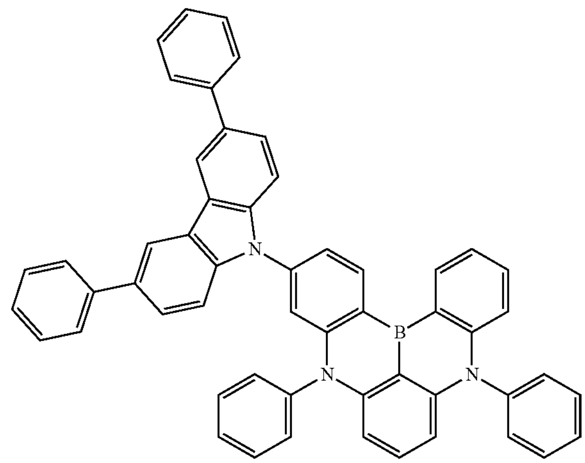

Comparative Compound 1

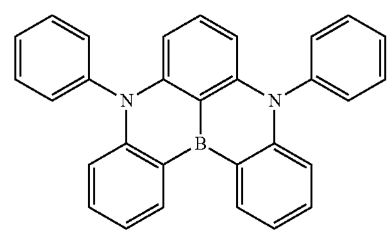

TABLE 1

| | Dopant material | EQE (%) |
|---|---|---|
| Example 11 | Compound 1 | 7.8 |
| Example 12 | Compound 2 | 8.0 |
| Comp. Ex. 1 | Comparative Compound 1 | 6.1 |

Examples 13 to 17 and Comparative Examples 11 to 12

The organic EL devices were fabricated and evaluated in the same manner as in Example 11 except that the compounds shown in the following Table 2 were used as dopant materials. The results are shown in Table 2.

The compounds used is shown below.

-continued

Compound 3

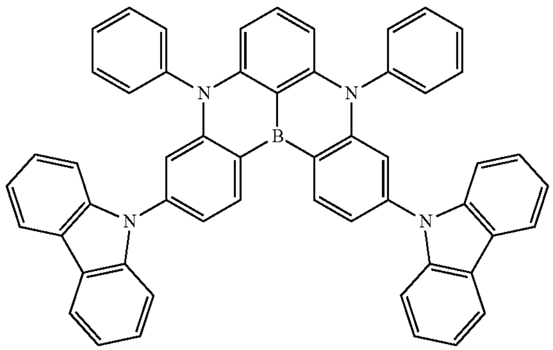

Compound 4

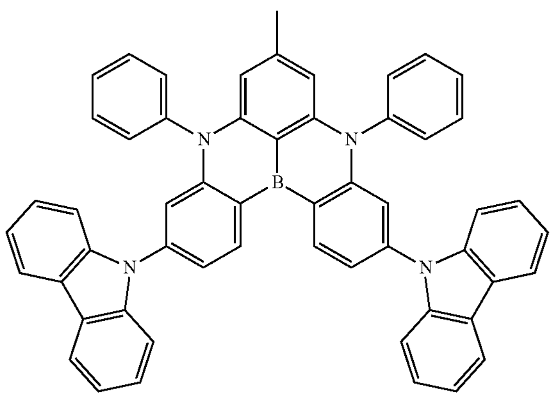

Compound 5

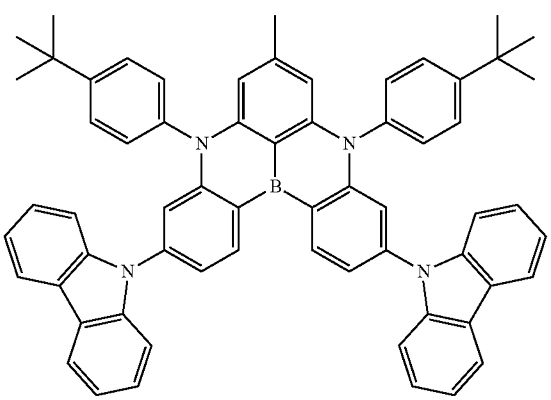

Compound 6

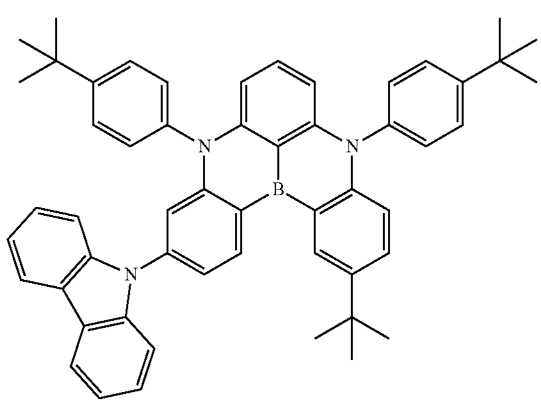

Compound 7

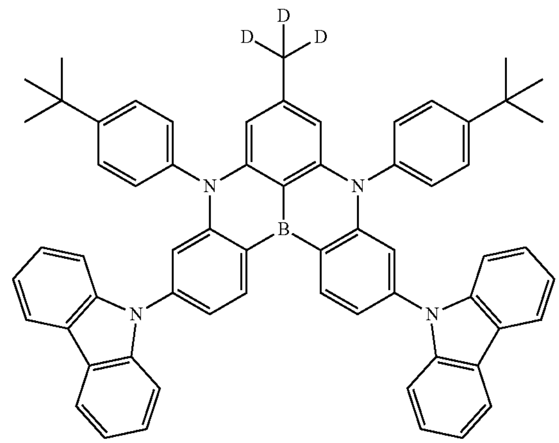

Comparative Compound 1

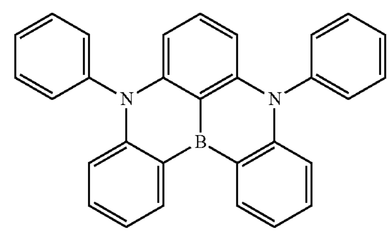

Comparative Compound 2

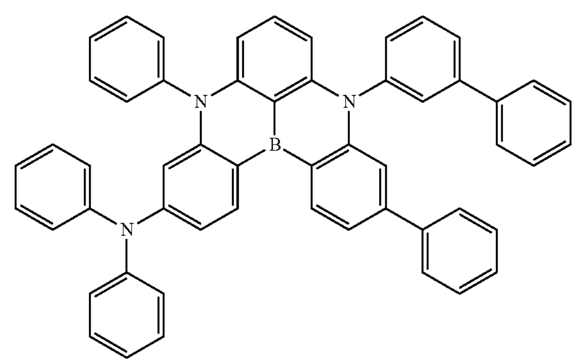

TABLE 2

| | Dopant material | EQE (%) |
|---|---|---|
| Example 13 | Compound 3 | 8.8 |
| Example 14 | Compound 4 | 9.1 |
| Example 15 | Compound 5 | 8.8 |
| Example 16 | Compound 6 | 8.8 |
| Example 17 | Compound 7 | 8 8 |
| Comp. Ex. 11 | Comparative Compound 1 | 6.1 |
| Comp. Ex. 12 | Comparative Compound 2 | 8.0 |

Compound 2

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification are incorporated herein by reference in its entirety.

The invention claimed is:

1. A compound represented by the following formula (1):

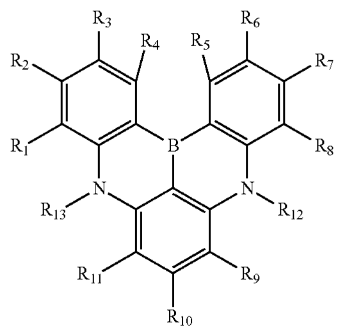

(1)

wherein in the formula (1), each of $R_1$, $R_4$, $R_5$, $R_8$, $R_9$ and $R_{11}$ is a hydrogen atom;

each of $R_2$ and $R_7$ is independently a hydrogen atom or a group represented by the following formula (2);

each of $R_3$ and $R_6$ is independently a hydrogen atom, an unsubstituted alkyl group including 1 to 5 carbon atoms or a group represented by the following formula (2);

$R_{10}$ is a hydrogen atom or an unsubstituted alkyl group including 1 to 5 carbon atoms;

each of $R_{12}$ and $R_{13}$ is independently a substituted or unsubstituted phenyl group;

when two or more groups represented by the following formula (2) are present, the two or more groups represented by the following formula (2) may be the same or different:

$$L_1\text{-HAr} \quad (2)$$

wherein in the formula (2), $L_1$ is a single bond;

HAr is a substituted or unsubstituted carbazolyl group;

at least one of $R_2$ and $R_7$ is a group represented by the formula (2), and N on the carbazoyl group in the formula (2) is bonded with $L_1$; and the substituent in the case of "substituted or unsubstituted" in the compound represented by the formula (1) is selected from the group consisting of an alkyl group including 1 to 5 carbon atoms, a phenyl group, a dibenzofuranyl group, and a dibenzofuranyl group substituted by an alkyl group including 1 to 5 carbon atoms.

2. The compound according to claim 1, wherein the compound is represented by the following formula (4):

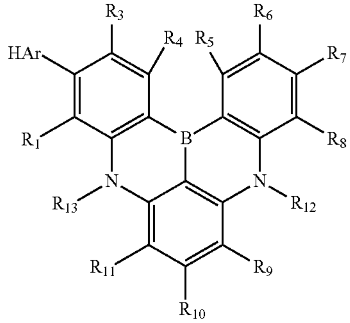

(4)

wherein in the formula (4), $R_1$, $R_3$ to $R_{13}$ and HAr are as defined in the formula (1).

3. The compound according to claim 1, wherein the compound is represented by the following formula (5):

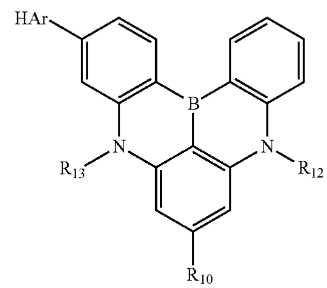

(5)

wherein in the formula (5), $R_7$, $R_{10}$, $R_{12}$, $R_{13}$ and HAr are as defined in the formula (1).

4. The compound according to claim 1, wherein the compound is a material for an organic electroluminescence device.

5. A material for an organic electroluminescence device, comprising the compound according to claim 1.

6. An organic electroluminescence device, comprising:

a cathode;

an anode; and at least one organic layer disposed between the cathode and the anode, wherein at least one layer of the at least one organic layer comprises the compound according to claim 1.

7. The organic electroluminescence device according to claim 6, wherein at least one layer of the at least one organic layer is an emitting layer.

8. The organic electroluminescence device according to claim 7, wherein the emitting layer further comprises a compound represented by the following formula (10):

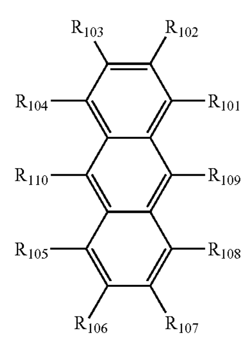

(10)

wherein in the formula (10), one or more pairs of adjacent two or more among $R_{101}$ to $R_{110}$ form a substituted or unsubstituted, saturated or unsaturated ring, or do not form a substituted or unsubstituted, saturated or unsaturated ring;

$R_{101}$ to $R_{110}$ which do not form the substituted or unsubstituted, saturated or unsaturated ring are independently a hydrogen atom, a substituted or unsubstituted alkyl group including 1 to 50 carbon atoms, a substituted or unsubstituted haloalkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 carbon atoms, a substituted or unsubstituted alkoxy group including 1 to 50 carbon atoms, a substituted or unsubstituted alkylthio group including 1 to 50 carbon atoms, a substituted or unsubstituted aryloxy group including 6 to 50 ring carbon atoms, a substituted or unsubstituted arylthio group including 6 to 50 ring carbon atoms, a substituted or unsubstituted aralkyl group including 7 to 50 carbon atoms, $—Si(R_{121})(R_{122})(R_{123})$, $—C(=O)R_{124}$, $—COOR_{125}$, $—N(R_{126})(R_{127})$, a halogen atom, a cyano group, a nitro group, a substituted or unsubstituted aryl group including 6 to 50 carbon atoms, a substituted or unsubstituted monovalent heterocyclic group including 5 to 50 ring atoms, or a group represented by the following formula (31);

$R_{121}$ to $R_{127}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

when two or more of each of $R_{121}$ to $R_{127}$ are present, the two or more of each of $R_{121}$ to $R_{127}$ may be the same or different;

provided that at least one of $R_{101}$ to $R_{110}$ which do not form the substituted or unsubstituted, saturated or unsaturated ring is a group represented by the following formula (31); and when two or more of groups represented by the following formula (31) are present, the two or more groups represented by the following formula (31) may be the same or different:

$$-L_{101}-Ar_{101} \quad (31)$$

wherein, in the formula (31), $L_{101}$ is a single bond, a substituted or unsubstituted arylene group including 6 to 30 ring carbon atoms, or a substituted or unsubstituted divalent heterocyclic group including 5 to 30 ring atoms; and $Ar_{101}$ is a substituted or unsubstituted aryl group including 6 to 50 ring carbon atoms, or a substituted or unsubstituted monovalent heterocyclic group including 5 to 50 ring atoms.

9. The organic electroluminescence device according to claim 8, wherein the compound represented by the formula (10) is represented by the following formula (10-1) or (10-2):

(10-1)

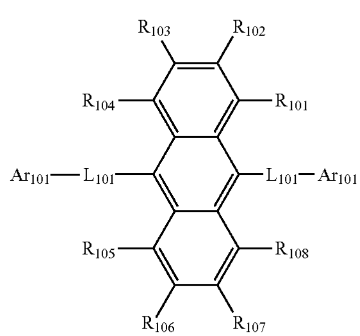

-continued (10-2)

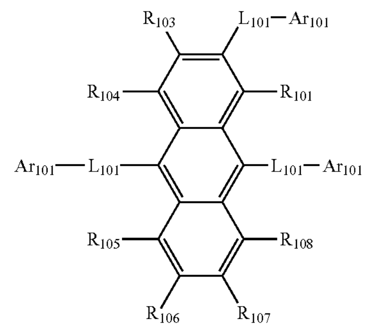

wherein in the formula (10-1), $R_{101}$ to $R_{108}$, $L_{101}$ and $Ar_{101}$ are as defined in the formula (10); and wherein in the formula (10-2), $R_{101}$, $R_{103}$ to $R_{108}$, $L_{101}$ and $Ar_{101}$ are as defined in the formula (10).

10. The organic electroluminescence device according to claim 8, wherein the compound represented by the formula (10) is represented by the following formula (10-3):

(10-3)

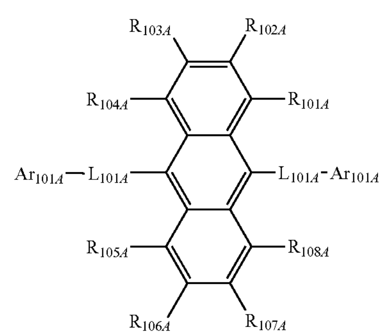

wherein in the formula (10-3), $R_{101A}$ to $R_{108A}$ are independently a hydrogen atom, or a substituted or unsubstituted aryl group including 6 to 50 ring carbon atoms;

$L_{101A}$ is a single bond, or a substituted or unsubstituted arylene group including 6 to 30 ring carbon atoms;

two $L_{101A}$ may be the same or different;

$Ar_{101A}$ is a substituted or unsubstituted aryl group including 6 to 50 ring carbon atoms; and two $Ar_{101A}$ may be the same or different.

11. The organic electroluminescence device according to claim 8, wherein the compound represented by the formula (10) is represented by the following formula (10-4):

(10-4)

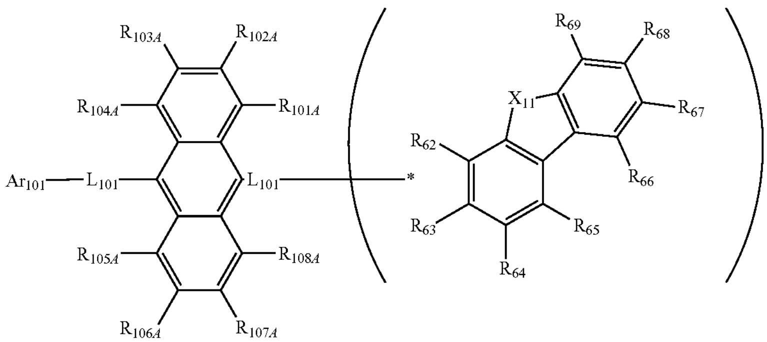

wherein in formula (10-4), $L_{101}$ and $Ar_{101}$ are as defined in the formula (10);

$R_{101A}$ to $R_{108A}$ are independently a hydrogen atom, or a substituted or unsubstituted aryl group including 6 to 50 ring carbon atoms;

$X_{11}$ is O, S, or $N(R_{61})$;

$R_{61}$ is a hydrogen atom, a substituted or unsubstituted alkyl group including 1 to 50 carbon atoms, or a substituted or unsubstituted aryl group including 6 to 50 ring carbon atoms;

one of $R_{62}$ to $R_{69}$ is bonded with * of $L_{101}$;

one or more pairs of adjacent among $R_{62}$ to $R_{69}$ which are not bonded with * of $L_{101}$ form a substituted or unsubstituted, saturated or unsaturated ring, or do not form a substituted or unsubstituted, saturated or unsaturated ring; and $R_{62}$ to $R_{69}$ which are not bonded with * of $L_{101}$ and do not form the substituted or unsubstituted, saturated or unsaturated ring are independently a hydrogen atom, a substituted or unsubstituted alkyl group including 1 to 50 carbon atoms, or a substituted or unsubstituted aryl group including 6 to 50 ring carbon atoms.

12. The organic electroluminescence device according to claim 11, wherein the compound represented by the formula (10) is represented by the following formula (10-6):

(10-6)

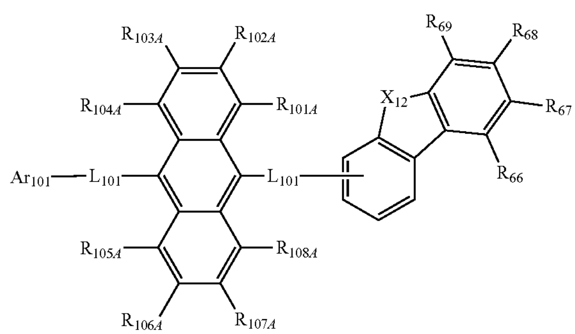

wherein in the formula (10-6), $L_{101}$ and $Ar_{101}$ are as defined in the formula (10);

$R_{101A}$ to $R_{108A}$ are as defined in the formula (10-4);

$R_{66}$ to $R_{69}$ are as defined in the formula (10-4); and $X_{12}$ is O or S.

13. The organic electroluminescence device according to claim 11, wherein the compound represented by the formula (10) is represented by the following formula (10-7):

(10-7)

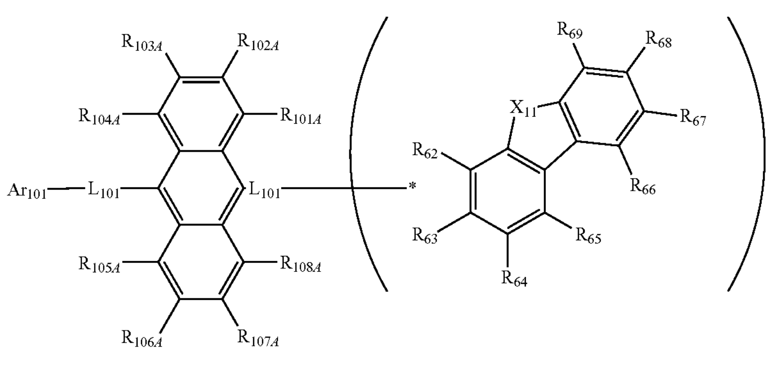

wherein in the formula (10-7), $L_{101}$ and $Ar_{101}$ are as defined in the formula (10);

$R_{101A}$ to $R_{108A}$ are as defined in the formula (10-4);

$X_{11}$ is as defined in the formula (10-4);

$R_{62}$ to $R_{69}$ are as defined in the formula (10-4); and provided that one pair among $R_{66}$ and $R_{67}$, $R_{67}$ and $R_{68}$, and $R_{68}$ and $R_{69}$ is bonded with each other to form a substituted or unsubstituted, saturated or unsaturated ring.

14. The organic electroluminescence device according to claim 11, wherein the compound represented by the formula (10) is represented by the following formula (10-8):

(10-8)

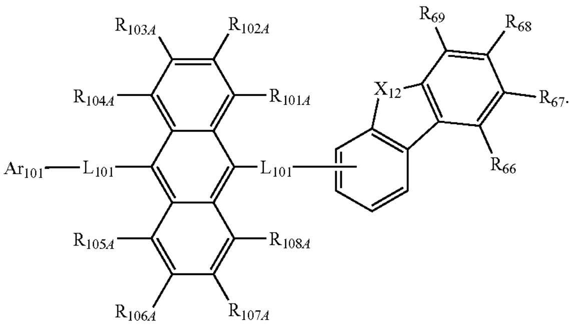

wherein in the formula (10-8), $L_{101}$ and $Ar_{101}$ are as defined in the formula (10);

$R_{101A}$ to $R_{108A}$ are as defined in the formula (10-4);

$X_{12}$ is O or S;

$R_{66}$ to $R_{69}$ are as defined in the formula (10-4); and provided that one pair among $R_{66}$ and $R_{67}$, $R_{67}$ and $R_{68}$, and $R_{68}$ and $R_{69}$ is bonded with each other to form a substituted or unsubstituted, saturated or unsaturated ring.

15. The organic electroluminescence device according to claim 13, wherein one pair among $R_{66}$ and $R_{67}$, $R_{67}$ and $R_{68}$, and $R_{68}$ and $R_{69}$ is bonded with each other to form a ring represented by the following formula (10-8-1) or (10-8-2); and $R_{66}$ to $R_{69}$ which do not form the ring represented by the formula (10-8-1) or (10-8-2) do not form a substituted or unsubstituted, saturated or unsaturated ring:

(10-8-1)

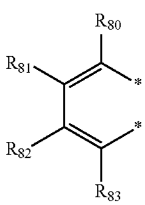

-continued (10-8-2)

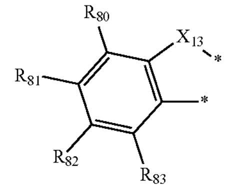

wherein in the formulas (10-8-1) and (10-8-2), two "*" s are bonded with one pair among $R_{66}$ and $R_{67}$, $R_{67}$ and $R_{68}$, and $R_{68}$ and $R_{69}$;

$R_{80}$ to $R_{83}$ are independently a hydrogen atom, a substituted or unsubstituted alkyl group including 1 to 50 carbon atoms, or a substituted or unsubstituted aryl group including 6 to 50 ring carbon atoms; and $X_{13}$ is O or S.

16. The organic electroluminescence device according to claim 11, wherein the compound represented by the formula (10) is represented by the following formula (10-9):

(10-9)

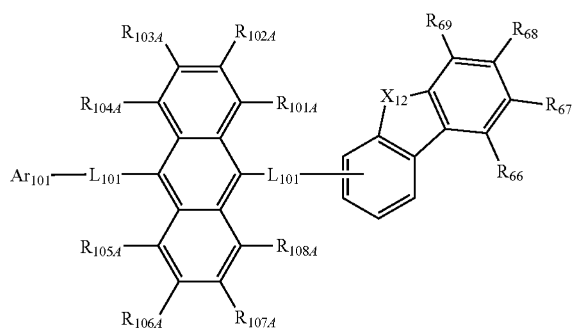

wherein in the formula (10-9), $L_{101}$ and $Ar_{101}$ are as defined in the formula (10);

$R_{101A}$ to $R_{108A}$ are as defined in the formula (10-4);

$R_{66}$ to $R_{69}$ are as defined in the formula (10-4);

provided that $R_{66}$ and $R_{67}$, $R_{67}$ and $R_{68}$, and $R_{69}$ and $R_{67}$ are not bonded with each other and do not form a substituted or unsubstituted, saturated or unsaturated ring; and $X_{12}$ is O or S.

17. The organic electroluminescence device according to claim 8, wherein the compound represented by the formula (10) is represented by the following formula (10-4A):

(10-4A)

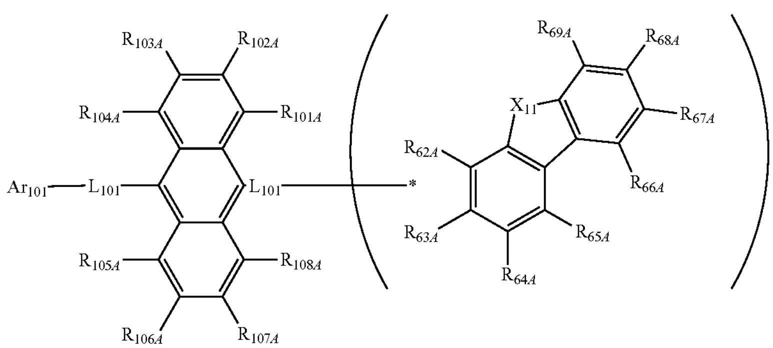

wherein in the formula (10-4A), $L_{101}$ and $Ar_{101}$ are as defined in the formula (10);

$R_{101A}$ to $R_{108A}$ are independently a hydrogen atom, or a substituted or unsubstituted aryl group including 6 to 50 ring carbon atoms;

$X_{11}$ is O, S, or $N(R_{61})$;

$R_{61}$ is a hydrogen atom, a substituted or unsubstituted alkyl group including 1 to 50 carbon atoms, or a substituted or unsubstituted aryl group including 6 to 50 ring carbon atoms;

one or more pairs of adjacent two or more among $R_{62A}$ to $R_{69A}$ may form a substituted or unsubstituted, saturated or unsaturated ring, and the adjacent two among $R_{62A}$ to $R_{69A}$ form a ring represented by the following formula (10-4A-1); and $R_{62A}$ to $R_{69A}$ which do not form a substituted or unsubstituted, saturated or unsaturated ring are independently a hydrogen atom, a substituted or unsubstituted alkyl group including 1 to 50 carbon atoms, or a substituted or unsubstituted aryl group including 6 to 50 ring carbon atoms:

(10-4A-1)

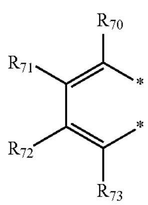

wherein in the formula (10-4A-1), two "*" s are bonded with adjacent two among $R_{62A}$ to $R_{69A}$;

one of $R_{70}$ to $R_{73}$ is bonded with $L_{101}$; and $R_{70}$ to $R_{73}$ which do not bonded with $L_{101}$ are independently a hydrogen atom, a substituted or unsubstituted alkyl group including 1 to 50 carbon atoms, or a substituted or unsubstituted aryl group including 6 to 50 ring carbon atoms.

18. The organic electroluminescence device according to claim 7, which further comprises a hole-transporting layer between the anode and the emitting layer.

19. The organic electroluminescence device according to claim 7, which further comprises an electron-transporting layer between the cathode and the emitting layer.

20. An electronic appliance, wherein the organic electroluminescence device according to claim 6 is provided.

21. The compound according to claim 1, wherein at least one of $R_2$ and $R_3$ is the group represented by the formula (2), at least one of $R_6$ and $R_7$ is the group represented by the formula (2), the substituent in the case of "substituted or unsubstituted" is an alkyl group including 1 to 5 carbon atoms.

22. The compound according to claim 21, wherein $R_3$ and $R_6$ are hydrogen atoms.

23. The compound according to claim 21, which comprises at least one deuterium in a molecule thereof.

24. The compound according to claim 1, selected from the group consisting of:

Compound 2

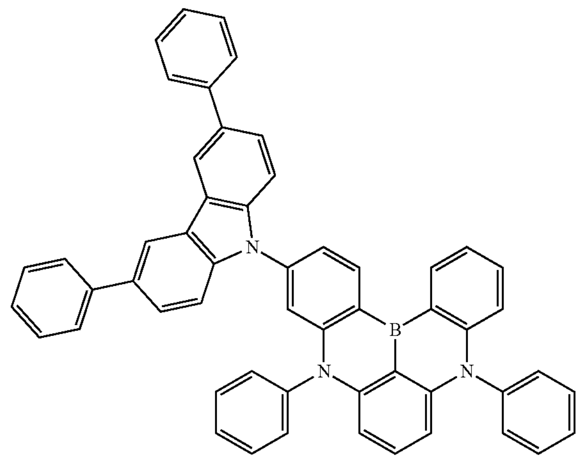

Compound 3

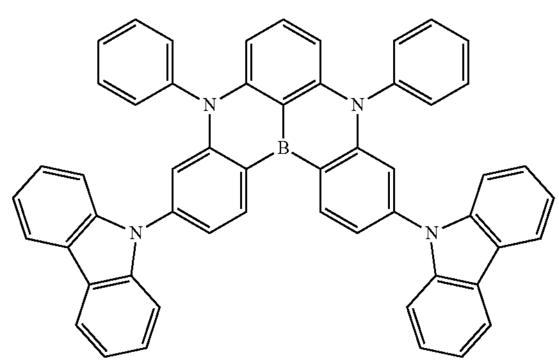

-continued
Compound 4
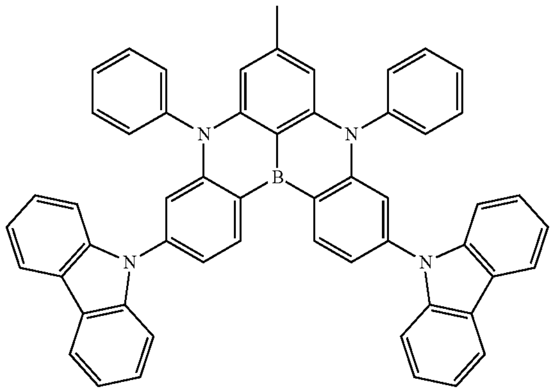
Compound 5
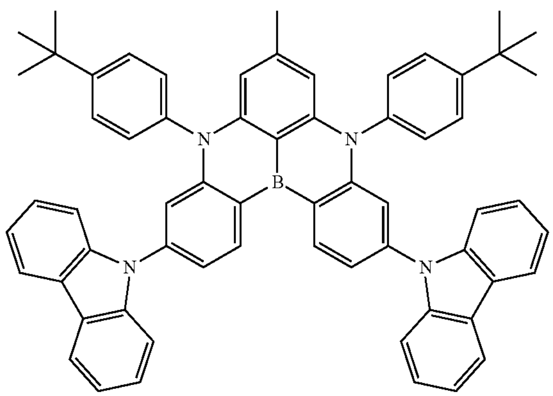
-continued
Compound 6
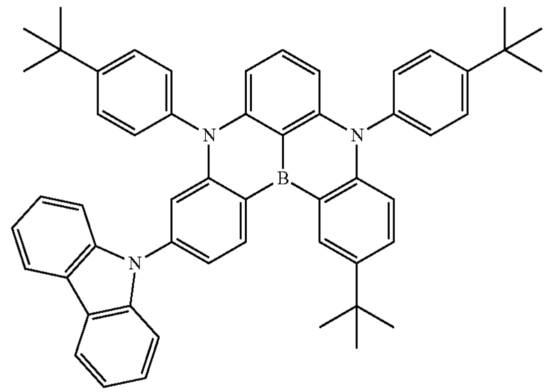
Compound 7
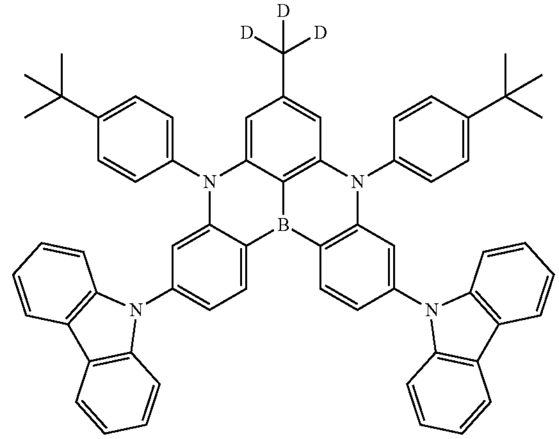
* * * * *